United States Patent
Cheng et al.

(10) Patent No.: US 9,574,107 B2
(45) Date of Patent: Feb. 21, 2017

(54) FLUORO-ALCOHOL ADDITIVES FOR ORIENTATION CONTROL OF BLOCK COPOLYMERS

(71) Applicant: International Business Machines Corporation, Armonk, NY (US)

(72) Inventors: Joy Cheng, San Jose, CA (US); Anindarupa Chunder, San Jose, CA (US); Daniel P. Sanders, San Jose, CA (US); Melia Tjio, San Jose, CA (US); Ankit Vora, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/623,395

(22) Filed: Feb. 16, 2015

(65) Prior Publication Data
US 2016/0237307 A1    Aug. 18, 2016

(51) Int. Cl.
*C09D 125/14*    (2006.01)
*C09D 169/00*    (2006.01)
(Continued)

(52) U.S. Cl.
CPC ........... *C09D 169/00* (2013.01); *C08F 114/18* (2013.01); *C08F 214/182* (2013.01);
(Continued)

(58) Field of Classification Search
USPC ....................................... 524/548; 525/327.3
See application file for complete search history.

(56) References Cited

U.S. PATENT DOCUMENTS

| 4,080,491 A | 3/1978 | Kobayashi et al. |
| 5,965,256 A | 10/1999 | Barrera |

(Continued)

FOREIGN PATENT DOCUMENTS

| CN | 101053082 A | 10/2007 |
| WO | 2011080016 A2 | 7/2011 |

OTHER PUBLICATIONS

Bates, et al., "Polarity-Switching Top Coats Enable Orientation of Sub-10-nm Block Copolymer Domains", Science vol. 338 Nov. 9, 2012.*

(Continued)

*Primary Examiner* — Peter D Mulcahy
*Assistant Examiner* — Henry Hu
(74) *Attorney, Agent, or Firm* — Michael R. Roberts

(57) ABSTRACT

A film layer comprising a high-chi ($\chi$) block copolymer for self-assembly and a hexafluoroalcohol-containing surface active polymer (SAP) was prepared on a substrate surface that was neutral wetting to the domains of the self-assembled block copolymer. The block copolymer comprises at least one polycarbonate block and at least one other block (e.g., a substituted or unsubstituted styrene-based block). The film layer, whose top surface has contact with an atmosphere, self-assembles to form a lamellar or cylindrical domain pattern having perpendicular orientation with respect to the underlying surface. Other morphologies (e.g., islands and holes of height 1.0Lo) were obtained with films lacking the SAP. The SAP is preferentially miscible with, and lowers the surface energy of, the domain comprising the polycarbonate block.

30 Claims, 59 Drawing Sheets

(51) Int. Cl.
| | |
|---|---|
| C08F 114/18 | (2006.01) |
| C08F 214/18 | (2006.01) |
| H01L 21/027 | (2006.01) |
| C08F 120/22 | (2006.01) |
| C08F 220/22 | (2006.01) |
| C08F 220/24 | (2006.01) |

(52) U.S. Cl.
CPC ...... C08F 214/186 (2013.01); H01L 21/0271 (2013.01); *C08F 120/22* (2013.01); *C08F 220/22* (2013.01); *C08F 220/24* (2013.01)

(56) References Cited

U.S. PATENT DOCUMENTS

| | | | |
|---|---|---|---|
| 6,127,507 | A | 10/2000 | Santerre |
| 6,770,725 | B2 | 8/2004 | Santerre |
| 6,899,983 | B2 | 5/2005 | Tamoto et al. |
| 7,129,314 | B2 | 10/2006 | Miyata et al. |
| 7,521,090 | B1 | 4/2009 | Cheng et al. |
| 7,807,332 | B2 | 10/2010 | Huang et al. |
| 8,017,194 | B2 | 9/2011 | Colburn et al. |
| 8,080,615 | B2 | 12/2011 | Millward et al. |
| 8,124,327 | B2 * | 2/2012 | Breyta .................. G03F 7/0046 430/273.1 |
| 8,445,613 | B2 | 5/2013 | Ito et al. |
| 8,507,640 | B2 | 8/2013 | Coady et al. |
| 8,623,458 | B2 | 1/2014 | Cheng et al. |
| 8,691,925 | B2 | 4/2014 | Wu et al. |
| 2005/0266338 | A1 | 12/2005 | Kishimura et al. |
| 2006/0235161 | A1 | 10/2006 | Heller et al. |
| 2008/0083991 | A1 | 4/2008 | Yang et al. |
| 2009/0214606 | A1 | 8/2009 | Bujard et al. |
| 2010/0069537 | A1 | 3/2010 | Breiner |
| 2011/0207051 | A1 * | 8/2011 | Sanders ................ G03F 7/0046 430/285.1 |
| 2011/0224373 | A1 | 9/2011 | Carpentier et al. |
| 2012/0088188 | A1 | 4/2012 | Trefonas et al. |
| 2012/0322006 | A1 | 12/2012 | Kato et al. |
| 2013/0017189 | A1 | 1/2013 | Pierre et al. |
| 2013/0274380 | A1 | 10/2013 | Cheng et al. |
| 2014/0273476 | A1 | 9/2014 | Cheng et al. |
| 2014/0346141 | A1 | 11/2014 | Brizard et al. |
| 2014/0377465 | A1 | 12/2014 | Trefonis, III et al. |
| 2014/0377518 | A1 | 12/2014 | Trefonis, III et al. |
| 2014/0378592 | A1 | 12/2014 | Trefonis, III et al. |
| 2015/0329664 | A1 * | 11/2015 | Cheng .................. C09D 169/00 427/256 |

OTHER PUBLICATIONS

Son, et al., "Surfactant-Assisted Orientation of Thin Diblock Copolymer Films", Adv. Mater. 2008, 20, 3643-3648.*
Kim, et al., "Consequences of Surface Neutralization in Diblock Copolymer Thin Films", ACSNano, 2013, vol. 7, p. 9905-9919; published online Oct. 16, 2013.*
IBM, List of patents or patent applications treated as related, Feb. 13, 2015.
Ji, et al., "Generalization of the Use of Random Copolymers to Control the Wetting Behavior of Block Copolymer Films", Macromolecules 2008, 41, 9098-9103.
Vora, et al., "Directed Self Assembly of Topcoat-free, Integration-friendly High-X Block Copolymers", Presentation, Photopolymer Conference, Jul. 2014, Chiba, JP.
Vora, et al., "Organic High-c Block Copolymers for Directed Self-Assembly", 2014 SPIE, Poster.
Vora, et al., "Organic High-X Block Copolymers for Directed Self-Assembly", Journal of Photopolymer Science and Technology, 2014, 27, 419-424.
Zhang, et al., "New materials for directed self-assembly for advanced patterning", Dow Chemical, presentation overheads, SPIE San Jose, California, Feb. 23, 2014.
Jackson, et al., "The formation of core cross-linked star polymer and nanogel assembliesfacilitated by the formation of dynamic covalent imine bonds", Polym. Chem., 2011, 2, 2500.
Keen, et al., "Control of the Orientation of Symmetric Poly(styrene)-blockpoly(D,L•lactide) Block Copolymers Using Statistical Copolymers of Dissimilar Composition," Langmuir 2012, 28, 15876-15888; Published: Oct. 22, 2012.
Koulic, et al., "Premade versus in situ formed compatibilizer at the PS/PMMA interface: contribution of the Raman confocal microscopy to the fracture analysis", Polymer 42 (2001) 2947-2957.
Men'Shikov, et al., "Determination of the Flory-Huggins Parameter for a Pair of Polymer Units from AFM Data for Thin Films of Block Copolymers", Protection of Metals and Physical Chemistry of Surfaces, 2009, vol. 45, No. 3, pp. 295-299. © Pleiades Publishing, Ltd., 2009.
Pratt, et al., "Exploration, Optimization, and Application of Supramolecular Thiourea-Amine Catalysts for the Synthesis of Lactide (Co)polymers", Macromolecules 2006, 39, 7863-7871; Published on Web Oct. 18, 2006.
Vora, et al., "Directed Self Assembly of Topcoat-free, Integration-friendly High-c Block Copolymers", slides of talk given at Photopolymer Conference, Jul. 2014, Chiba, Japan.
Vora, et al., "Organic High-Chi Block Copolymers for Directed Self-Assembly", Poster, SPIE Advanced Lithography Conference, Feb. 25, 2014, San Jose, California.
Yasukawa, et al., "Polymer-Incarcerated Chiral Rh/Ag Nanoparticles for Asymmetric 1,4-Addition Reactions of Arylboronic Acids to Enones: Remarkable Effects of Bimetallic Structure on Activity and Metal Leaching", J. Am. Chem. Soc. 2012, 134, 16963-16966; Published: Sep. 24, 2012.
Zhou, et al., "Synthesis and properties of novel biodegradable triblock copolymers of poly(5-methyl-5-methoxycarbony1-1,3-dioxan-2-one) and poly(ethylene glycol)", Polymer 45 (2004) 5459-5463.
USPTO, non-final office action, mailing date Jun. 21, 2016, for U.S. Appl. No. 14/280,167, to Cheng et al., filed May 16, 2014.
ISA/CN International Search Report and Written Opinion, PCT application PCT/IB2016/050642, filed Feb. 8, 2016, mailed Jun. 6, 2016.
USPTO, non-final office action, mailing date Apr. 13, 2016, for U.S. Appl. No. 14/280,167, to Cheng et al., filed May 16, 2014.
USPTO, non-final office action, mailing date Apr. 22, 2016, for U.S. Appl. No. 14/526,884, to Cheng et al., filed Oct. 29, 2014.

* cited by examiner

1. Coat
2. Optional PAB

1. Coat
2. Optional PAB

Self-Assemble

Selective Domain Removal

Transfer

Selective Domain Removal

Transfer

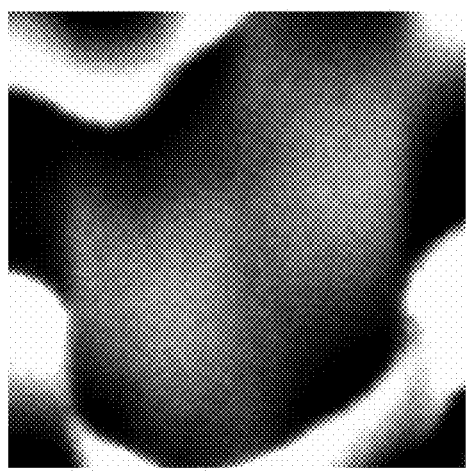
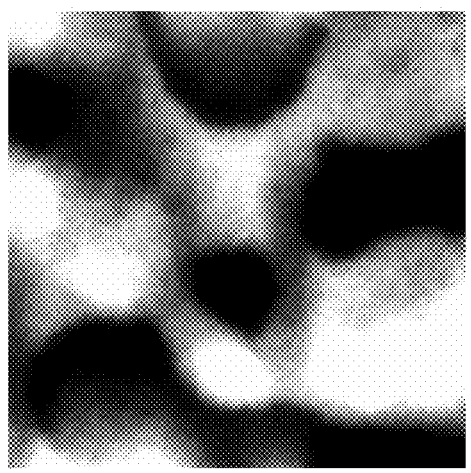
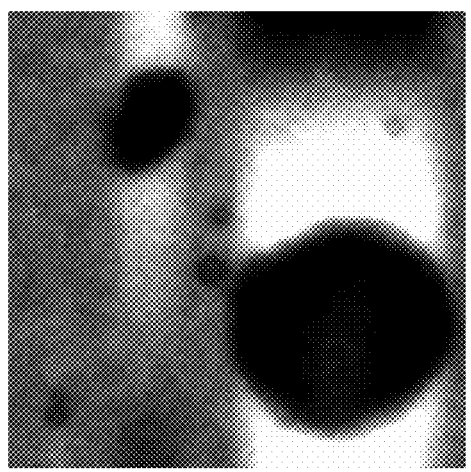

Example 106

Example 105

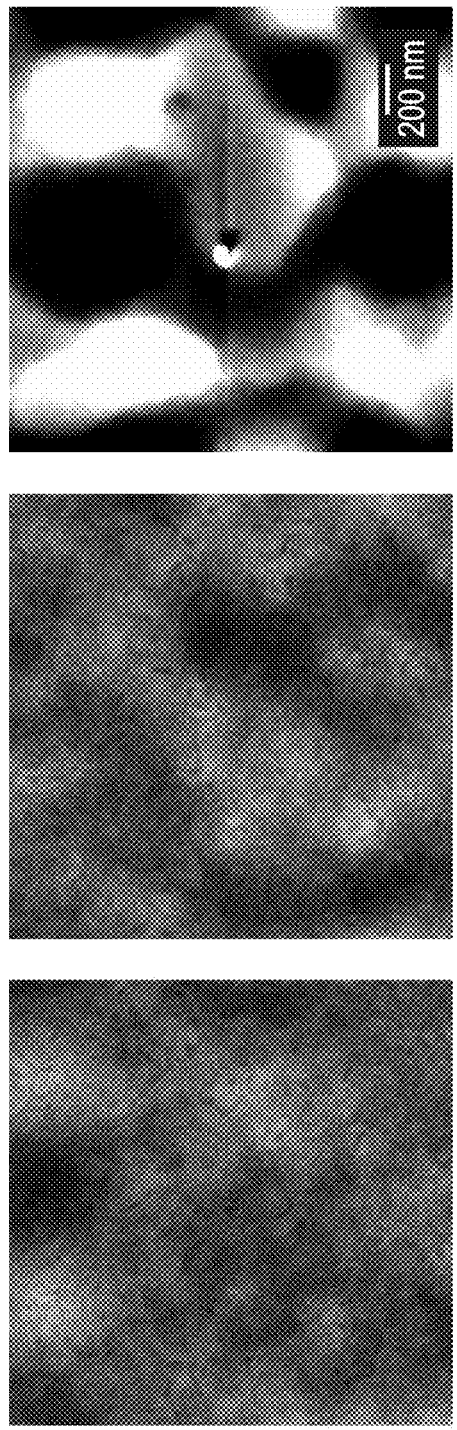

Example 131

Example 130

Example 133

Example 132

Example 134

Example 135

Example 137

Example 136

Example 141

Example 140

Example 156

Example 155

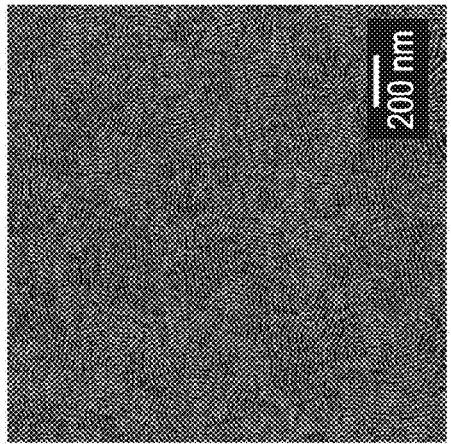
FIG. 66 Example 159
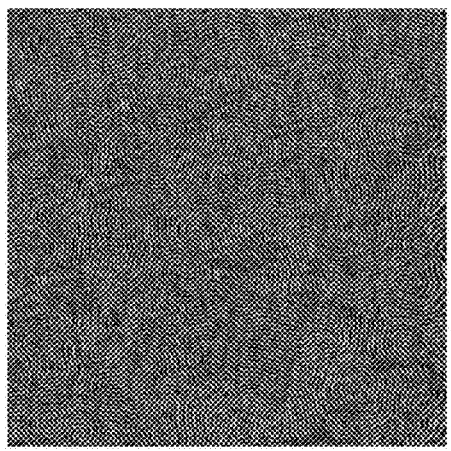
FIG. 65 Example 158
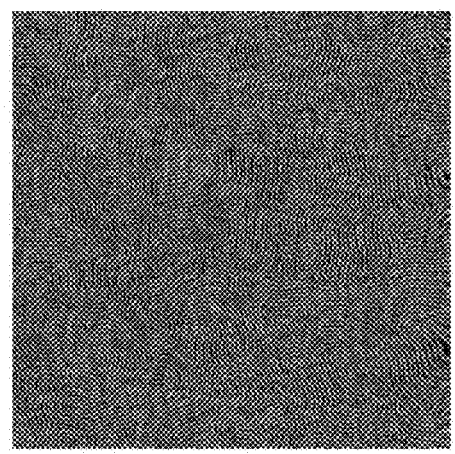
FIG. 64 Example 157

Example 164

Example 163

Example 166

Example 165

Example 174

Example 173

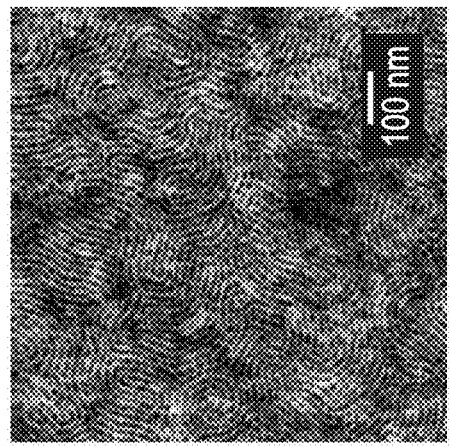
Example 177  FIG. 84
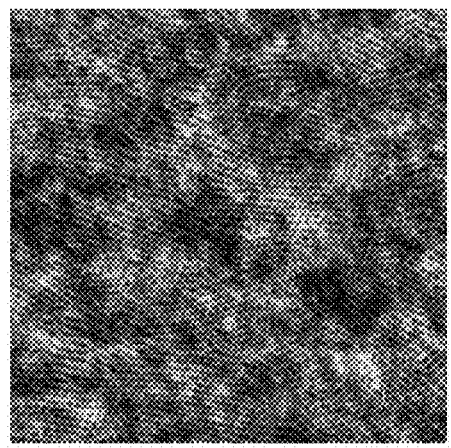
Example 176  FIG. 83
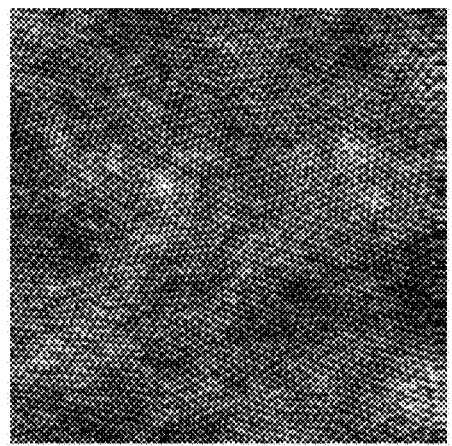
Example 175  FIG. 82

Example 178

Example 180 (SAP6-40)

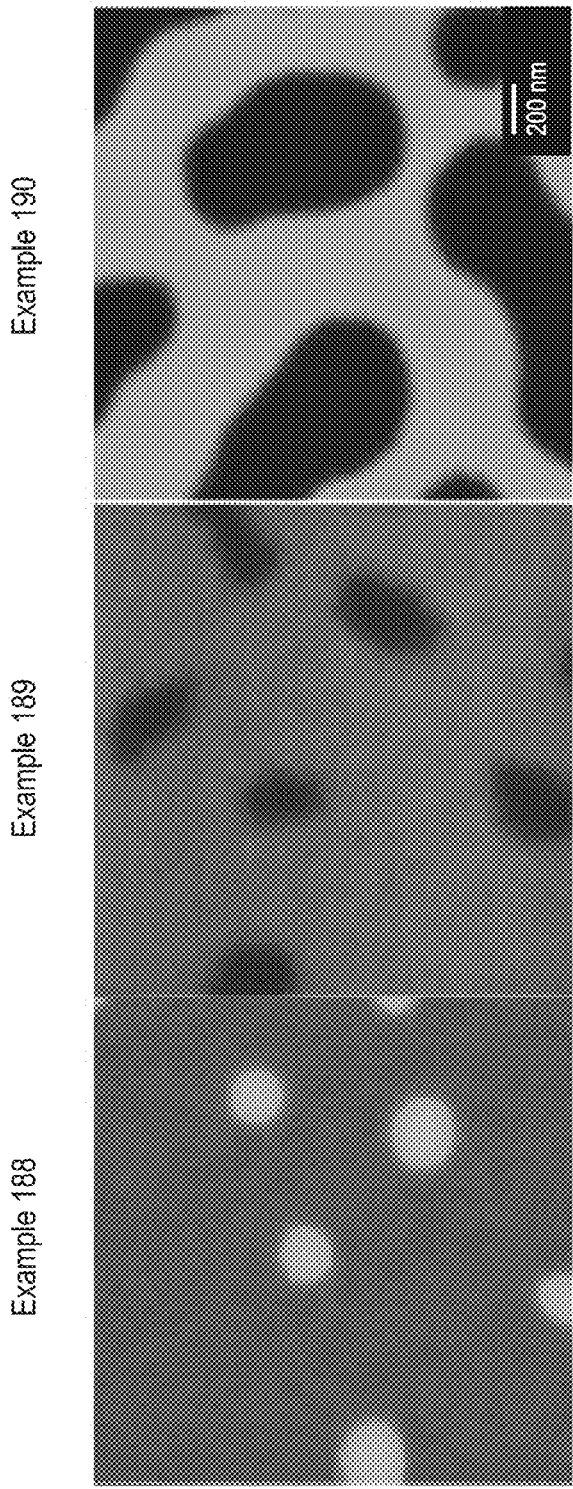

Example 200

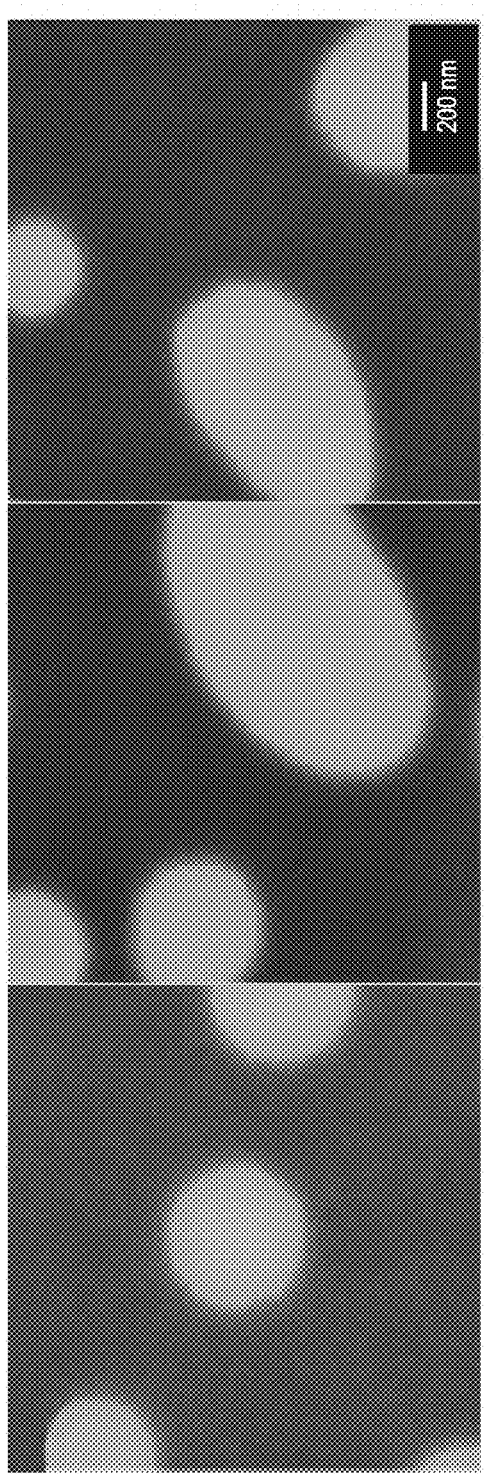

Example 204

Example 205

Example 206

Example 207

Example 208

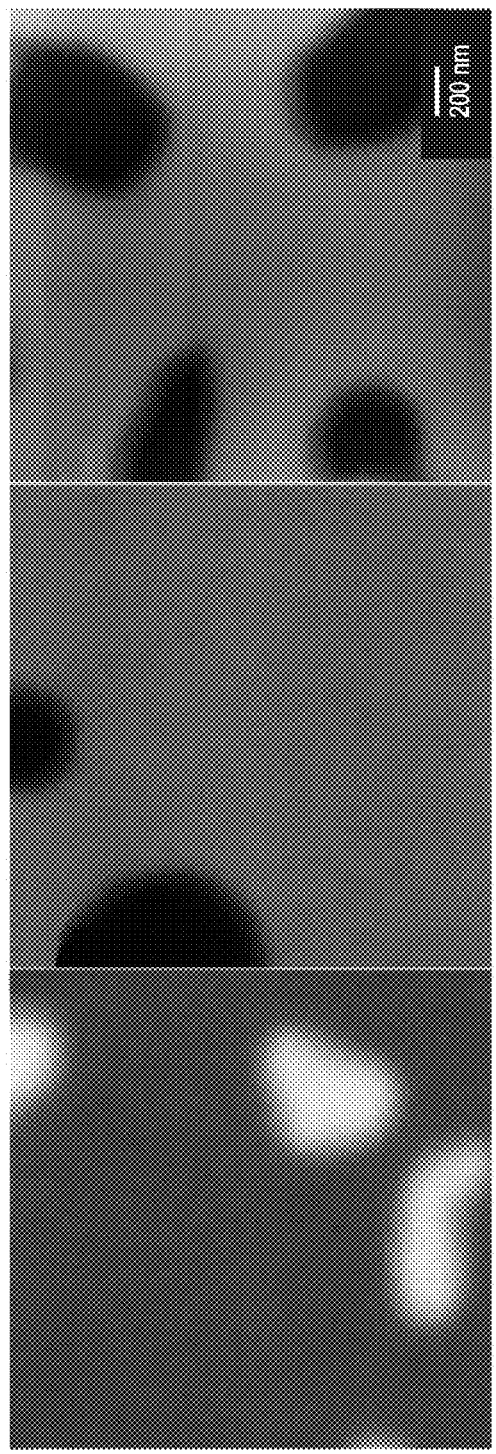

Example 216

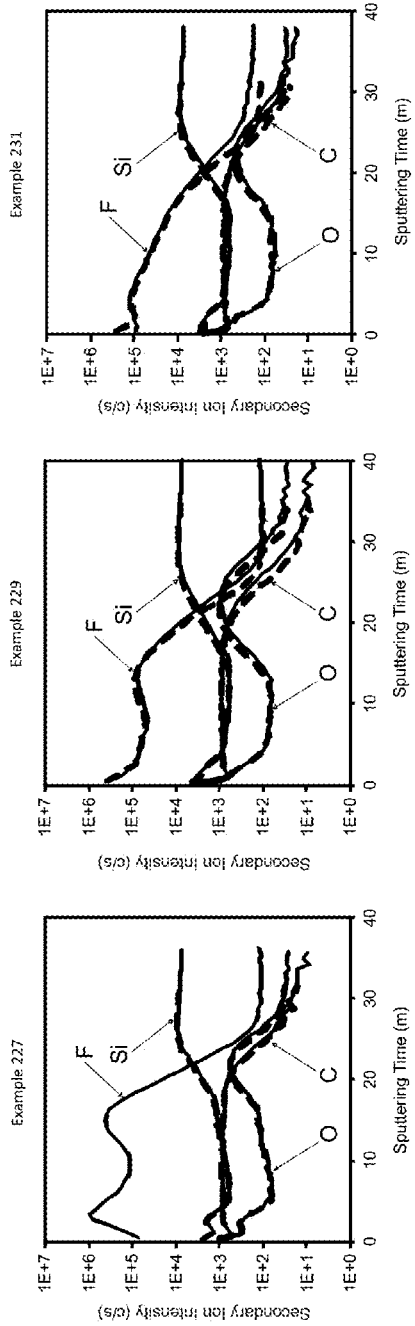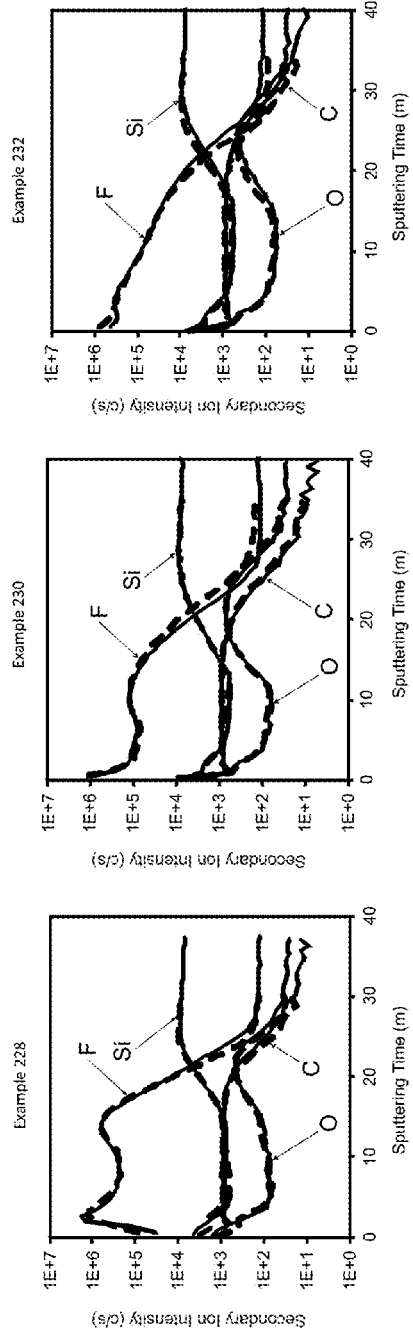

FLUORO-ALCOHOL ADDITIVES FOR ORIENTATION CONTROL OF BLOCK COPOLYMERS

STATEMENT REGARDING PRIOR DISCLOSURES BY THE INVENTOR OR A JOINT INVENTOR

The following disclosure(s) are submitted under 35 U.S.C. 102(b)(1)(A):

i) Vora, et al., "Organic High-χ Block Copolymers for Directed Self-Assembly", Poster, SPIE Advanced Lithography Conference, February 2014, San Jose, Calif., USA;

ii) Vora, et al., "Directed Self Assembly of Topcoat-free, Integration-friendly High-χ Block Copolymers", presentation overheads, International Conference of Photopolymer Science and Technology, ICPST 31, July 2014, Chiba, Japan; and iii) Vora, et al., "Directed Self Assembly of Topcoat-free, Integration-friendly High-χ Block Copolymers", Journal of Photopolymer Science and Technology, volume 27, number 3, 2014, pages 419-424.

BACKGROUND

The present invention relates to fluoro-alcohol additives for orientation control of block copolymers used in directed self-assembly applications, and more specifically to materials for top orientation-control of high-chi ($\chi$) block copolymers containing a polycarbonate block.

Block copolymers (BCPs) find many applications in solution, bulk and thin films. Thin film applications of BCPs are particularly attractive for nanolithography and patterning due to the ability of some BCPs to form periodic self-assembled structures ranging in feature size from 5 nm to 50 nm. The thin-film self-assembly property of BCPs can be utilized with existing photolithographic techniques to provide a unique approach to long range order for semiconductor applications. This approach, called directed self-assembly (DSA) of block copolymers, promises to extend the patterning capabilities of conventional lithography.

BCPs for directed self-assembly (DSA) applications comprise two or more polymer blocks that can phase separate into domains characterized by ordered nanoscopic arrays of spheres, cylinders, gyroids, and lamellae. The ability of a BCP to phase separate depends on the Flory Huggins interaction parameter chi ($\chi$) and degree of polymerization of the block copolymer. Poly(styrene)-b-poly(methyl methacrylate), abbreviated as PS-b-PMMA, is the most widely used block copolymer for DSA. For PS-b-PMMA, the poly(styrene) block (PS) and the poly(methyl methacrylate) block (PMMA) have similar surface energies at the polymer-air interface at elevated temperatures. In this instance, annealing a thin layer of the BCP, which is disposed on an orientation control layer, induces phase separation to produce BCP domains that are perpendicularly oriented to the orientation control layer. Typically, for PS-b-PMMA the orientation control layer is a crosslinkable or brush-type random copolymer formed with styrene and methyl methacrylate. The neutral wetting properties of the orientation control layer (underlayer) can be controlled by adjusting the composition of styrene and methyl methacrylate in order to enable perpendicular orientation of the BCP lamellar domains.

The minimum half-pitch of PS-b-PMMA is limited to about 10 nm because of the lower interaction and interaction parameter chi ($\chi$) between PS and PMMA. Typically when the product of chi and N of the block copolymer is less than 10, such a block copolymer tends to form disordered aggregates rather than ordered phase-separated domains. To enable further feature miniaturization (i.e., using block copolymers having lower degree of polymerization), a block copolymer with higher interaction parameter between two blocks (higher chi) is desirable. Several block copolymers having higher interaction parameter between the two blocks have been studied to obtain smaller feature sizes. Of particular interest are block copolymers comprising a block derived from ring opening of a cyclic carbonyl monomer from a reactive end-group on the first polymer block. Block copolymers formed by ring opening polymerization (ROP) of cyclic monomers (e.g., lactides, lactones, ethylene oxide) have been used to generate sub-10 nm feature size for patterning application.

As the interaction parameter between the two blocks of the block copolymer increases, neutral underlayer properties alone may not be sufficient for forming perpendicularly oriented block copolymer domains due to the increased mismatch between the polymer-air surface energies of the two blocks. This causes parallel orientation of the block copolymer domains with only the lower surface energy block present at the polymer-air interface, rendering the thin-film undesirable for lithographic applications. Top-coat based orientation control strategies have been employed to control the surface energy at the polymer-air interface of the blocks. However, these strategies introduce additional process complexity in the integration of high-chi block copolymers into standard lithography processes.

There exists a need to develop a top-coat free method for perpendicularly orienting block copolymer domains of a high-chi block copolymer with sub-10 nm half-pitch.

SUMMARY

Accordingly, a composition is disclosed, comprising:
i) a solvent;
ii) a block copolymer comprising:
a) a first block comprising a repeat unit of formula (B-1):

(B-1)

wherein I) $R^w$ is a monovalent radical selected from the group consisting of H, methyl, ethyl, and trifluoromethyl (*—$CF_3$) and II) $R^d$ is a monovalent radical comprising an aromatic ring linked to carbon 1, and
b) an aliphatic polycarbonate second block (polycarbonate block) linked to the first block; and
iii) a surface active polymer (SAP) comprising a fluoro-alcohol repeat unit (HFA repeat unit), the HFA repeat unit comprising at least one hexafluoroisopropyl alcohol group (HFA group), the HFA group having a structure

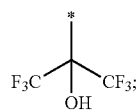

wherein the block copolymer and the SAP are dissolved in the solvent.

Also disclosed is a method, comprising:

providing a first layered structure comprising a top layer (underlayer);

disposing the composition of claim 1 on the underlayer and removing any solvent, thereby forming a second layered structure comprising a film layer disposed on the underlayer, wherein the film layer comprises the block copolymer and the SAP in non-covalent association, and the film layer has a top surface in contact with an atmosphere; and allowing or inducing the block copolymer of the film layer to self-assemble, thereby forming a third layered structure comprising a phase separated domain pattern having a characteristic pitch Lo, the domain pattern comprising alternating domains comprising respective chemically distinct blocks of the block copolymer;

wherein each of the domains has contact with the underlayer and the atmosphere, and a domain comprising the polycarbonate block has a higher concentration of the SAP compared to a domain comprising the first block of the block copolymer.

Another method is disclosed, comprising:

providing a first layered structure comprising a top layer (underlayer);

forming a topographical resist pattern disposed on the underlayer, the resist pattern comprising features having recessed regions, the recessed regions having a bottom surface which is a portion of a surface of the underlayer;

disposing the composition of claim 1 substantially in the recessed regions of the resist pattern and removing any solvent, thereby forming a second layered structure comprising a film layer, the film layer comprising the block copolymer and the SAP, wherein the film layer is in contact with the bottom surface, the bottom surface is neutral wetting to the block copolymer, and the film layer has a top surface in contact with an atmosphere; and allowing or inducing the block copolymer to self-assemble, thereby forming a third layered structure comprising a pattern of phase separated domains (domain pattern) of the block copolymer in the recessed regions, wherein each of the domains is in contact with the bottom surface and the atmosphere, and each of domains is oriented perpendicular to a main plane of the underlayer.

Also disclosed is a surface active polymer (SAP) of formula (H-2):

E'-P'-E''  (H-2), wherein

E' is a first end group,

E'' is a second end group,

E' and/or E'' comprises 1-25 fluorines, and

P' is a polymer chain comprises a fluoro-alcohol repeat unit (HFA repeat unit) of formula (H-1):

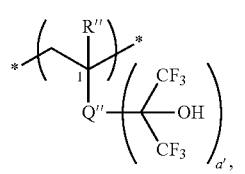

(H-1)

wherein a' is 1 or 2,

Q'' is a linking group having a valency of a'+1, and Q'' comprises at least one carbon, and R'' is a monovalent radical selected from the group consisting of *—H, methyl (*—CH$_3$), ethyl (*-Et), and trifluoromethyl (*—CF$_3$).

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 3-84 are atomic force microscopy (AFM) height images of the self-assembled block copolymer films of Examples 92-100 and 105-177, respectively. Each AFM image of FIGS. 3-44 and 47-84 is labelled with the corresponding Example number.

FIGS. 87-89 are AFM height images of the self-assembled block copolymer film Examples 188-190, respectively.

FIGS. 92-96 are AFM height images of the self-assembled block copolymer film Examples 200-204, respectively.

FIGS. 97-103 are AFM height images of the self-assembled block copolymer film Examples 205-211, respectively.

FIGS. 107-112 are graphs showing the SIMS (Secondary Ion Mass Spectroscopy) analysis of the self-assembled block copolymer film Examples 227, 229, 231, 228, 230, and 232, respectively.

DETAILED DESCRIPTION

Figure 1A:
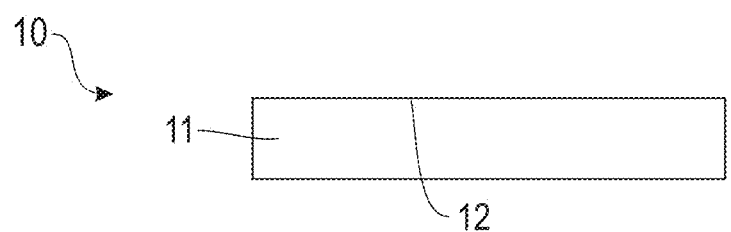
FIGS. 1A to 1F are cross-sectional layer diagrams showing a process of forming a perpendicularly oriented lamellar domain pattern using a self-assembly layer (SA layer) comprising a disclosed high-chi block copolymer comprising a polycarbonate block and a disclosed surface active polymer (SAP). The underlayer is neutral wetting to the block copolymer.
Figure 1B:
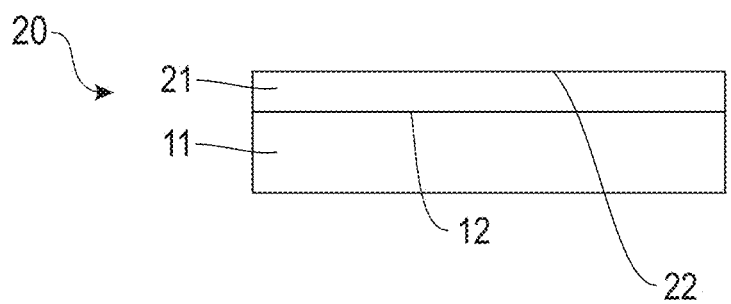

Disclosed are phase-selective and surface active polymers (SAPs) for lithographic processes utilizing self-assembly of block copolymers. The SAPs are also referred to below as "fluoro-alcohol additives" or "polymer additives". The SAPs provide orientation control of phase domains formed by self-assembly of high-chi block copolymers (BCPs) comprising a polycarbonate block. "High-chi" means the BCPs have a large Flory-Huggins interaction parameter chi ($\chi$). The higher the chi parameter, the poorer the miscibility of the different BCP blocks with one another, and the sharper the phase boundaries separating the phase domains containing the different blocks of the BCP after self-assembly. The SAPs are preferentially soluble in the polycarbonate domain formed by self-assembly (i.e., the domain comprising the polycarbonate block of the block copolymer). The SAPs also lower the surface energy of the polycarbonate domain compared to an otherwise identical polycarbonate domain lacking the SAP, thereby allowing the polycarbonate domain to wet the atmosphere interface resulting in lamellae and cylinders having a perpendicular orientation.

Herein, an "atmosphere" is a gas, which can include air and/o one or more other gases at any suitable pressure in contact with the top surface of the SA layer.

An "SA material" is a material capable of self-assembling into compositionally different phase-separated domains. Self-assembly (SA) refers to a process in which the SA material undergoes phase separation to produce a pattern of immiscible solid phase domains under suitable conditions. Self-assembly can occur spontaneously upon formation of the SA layer or it can be induced (e.g., by annealing an SA layer comprising an SA material at an elevated temperature for a suitable period of time). The SA material is preferably a block copolymer (BCP).

A block copolymer for self-assembly comprises at least two blocks that are immiscible with each other. Non-limiting block copolymers include diblock and triblock copolymers. Self-assembly of the block copolymer occurs by phase separation of the blocks to form a pattern of segregated solid phase domains. Depending on the volume fraction of the blocks, the domains can have the form of lamellae, spheres, cylinders, and/or gyroids. As an example, self-assembly of a diblock copolymer can produce a domain pattern comprising a first lamellar domain containing substantially a first block A of the diblock copolymer and a second lamellar domain containing substantially a second block B of the diblock copolymer. In this instance, the first and second lamellar domains are linked by the covalent bond joining block A to block B of the block copolymer.

Herein, an "SA layer" is a layer comprising an SA material and an SAP. The SA layer is disposed on a top surface of a substrate. The SA layer can comprise other materials.

Herein, any material of the top surface of the substrate that has contact with the bottom of the SA layer is referred to generally as "underlayer material" or "orientation control material". A layer comprising underlayer material is an "underlayer" or "orientation control layer". The underlayer surface influences self-assembly of an SA material of the SA layer.

A surface is said to have a "preferential affinity for" or is "preferential to" a referenced domain of a self-assembled SA material if the referenced domain can wet the surface in preference to another domain of the self-assembled SA material. Otherwise, the surface is said to be "non-preferential" to the referenced domain.

The substrate is the layered structure on which the SA layer is disposed. The substrate can comprise one or more layers of materials arranged in a stack, more specifically materials used in the fabrication of semiconductor devices. As non-limiting examples, the substrate can include a bottom layer (e.g., silicon wafer, metal foil), hard mask layer, dielectric layer, metal oxide layer, silicon oxide layer, silicon nitride, titanium nitride, hafnium oxide, an anti-reflection layer (ARC), and/or an orientation control layer (underlayer) for self-assembly. The SA layer is disposed on the top surface of the substrate, which is typically the top surface of the orientation control layer. When a resist pattern is formed on the orientation control layer, the substrate includes the resist pattern. In this instance, the SA layer can be disposed in the trenches of the resist pattern.

The top surface of the substrate can be a "graphoepitaxial pre-pattern" or a "chemical pre-pattern" for self-assembly. Each type of pre-pattern can be composed of topographical features, such as in a resist pattern. A graphoepitaxial pre-pattern influences self-assembly by the topography and surface properties of the pre-pattern. A "chemical pre-pattern" influences self-assembly predominantly by surface properties of different regions of the pre-pattern. No sharp dimensional limits exist between these two pre-pattern categories because the extent of topographical influence on self-assembly is also dependent on the thickness of the SA layer in relation to the underlying relief surface. In general, however, when graphoepitaxial pre-patterns are used, the thickness of the SA layer is less than or equal to the height of the topographical features of the pre-pattern. For chemical pre-patterns, the SA layer thickness is greater than any height of the underlying topographical features of the pre-pattern.

The term "interface" refers to a contact boundary between two substantially immiscible phases. Each phase can, independently, be a solid, a liquid, or a gas.

A lamellar or cylindrical domain can be oriented parallel or perpendicular to the plane of the underlying orientation control layer (underlayer) or the main plane of the SA layer. A lamellar domain has a parallel orientation when the main plane or plate of the lamellar domain is oriented parallel to the main plane of the underlying surface (or SA layer). A lamellar domain has a perpendicular orientation when the main plane or plate of the lamellar domain is oriented perpendicular to the main plane of the underlying surface (or SA layer). A cylindrical domain has a parallel orientation when the cylinder axis is oriented parallel to the main plane of the underlying surface (or SA layer). A cylindrical domain has a perpendicular orientation when the cylinder axis is oriented perpendicular to the main plane of the underlying surface (or SA layer).

Perpendicular orientation of lamellar domains is desirable for forming high resolution line patterns by selective etching of a given lamellar domain. Parallel orientation is not desirable for forming high resolution line patterns.

The term "disposed" refers to a layer in contact with a surface of another layer. "Disposing" or "applying" refer to forming a layer to be in contact with a surface of another layer, without limitation as to the method employed unless otherwise stated, with the proviso that the desirable characteristics of the disposed or applied layer are obtained, such as uniformity and thickness.

The term "casting" refers to forming a layer of a material by disposing on a surface a solution of the material dissolved in a solvent, and removing the solvent.

Random copolymers are indicated by "-co-", or "-r-" in the name. Block copolymers are indicated by "-b-" or "-block-" in the name. Alternating block copolymers are indicated by "-alt-" in the name.

Herein, "symmetrical wetting" means the underlayer surface and the atmosphere interface are wetted by the same domain(s) of the self-assembled SA material. "Non-symmetrical" wetting means the underlayer surface and the atmosphere interface are wetted by different domain(s) of the self-assembled SA material.

Herein, a surface or an atmosphere interface is said to be "neutral" to an SA material, or "neutral wetting" with respect to an SA material if each domain of the self-assembled SA material has contact with the surface or the atmosphere interface after self-assembly. Otherwise, the surface or atmosphere interface is said to be "non-neutral" to the SA material. For example, an underlayer surface is "neutral wetting" to a block copolymer if after self-assembly each domain of the self-assembled block copolymer has contact with the underlayer surface. It should be understood that each domain of the self-assembled SA material can comprise SAP, and each domain can have a different concentration of SAP after self-assembly. A neutral underlayer surface allows orientation control but does not guide the lateral spatial arrangement of the self-assembled domains. A non-neutral underlayer surface can guide self-assembly. For purposes of the invention, it is desirable for the underlayer and the atmosphere to be neutral wetting to the domains formed by self-assembly of the SA layer comprising the SA material and the SAP.

For commercial purposes, the underlayer surface and the atmosphere interface must be non-preferential (neutral) to the SA material in order to obtain perpendicularly oriented lamellar domains when no other chemical or topographical features are available to influence self-assembly of the block copolymer. If only one interface is neutral to the SA material, the lamellar domains orient parallel to the underlayer surface to form an island/hole morphology having 0.5Lo ("L nought") step height. "Step height" refers to height difference relative to the surrounding SA material and Lo is the characteristic pitch (bulk periodicity) of the domains of the self-assembled SA material. The higher the chi parameter of the SA material, the smaller the potential Lo (pitch) of the domain pattern.

These parameters are illustrated in the diagrams of Schemes 1-3 further below. If only the underlayer surface is neutral, both block copolymer (BCP) domains initially wet the underlayer surface with 0.5Lo perpendicular lamellae, but eventually form parallel morphology as the atmosphere (e.g., air) is non-neutral, resulting in island/holes with parallel lamellae having 0.5Lo step height.

For purposes of demonstrating the present invention, the substrate comprises an orientation control layer (underlayer) disposed on a silicon wafer. The underlayer surface can be a planar surface having uniform surface properties (i.e., the underlayer surface has no topographical or chemical patterning). Most of the examples further below utilize a planar underlayer. Other examples utilize a substrate having a topographic resist pattern on the underlayer for graphoepitaxy. The SA layer is disposed on the underlayer and has a top surface in contact with an atmosphere. It is desirable that self-assembly of the SA layer comprising the SA material and the SAP forms a lamellar domain pattern comprising alternating perpendicularly oriented lamellae of each domain that are in contact with the underlayer and the atmosphere. The underlayer material can be any material having suitable neutral wetting properties to the domains of the given SA material.

The SA layer has the following characteristics. The SA layer comprises a high-chi BCP comprising an aliphatic polycarbonate block. Additionally, the BCP has a structure favoring formation of lamellar domains or cylindrical domains during self-assembly. That is, the volume fractions of the blocks of the block copolymer are in a range favorable to lamellar domain or cylindrical domain formation. Also, the SA layer is disposed on the underlayer surface, which is neutral wetting to the domains of the self-assembled BCP. Lastly, the SA layer has a top surface in contact with an atmosphere. The atmosphere interface, which is typically air, is not neutral to the BCP, meaning less than all domains at the top surface of the self-assembled SA layer are in contact with the atmosphere when the SA layer consists essentially of BCP. Under these conditions, typically only one domain of the self-assembled BCP has contact with the atmosphere (lamellae have a parallel orientation). In general, the higher the chi parameter of the BCP, the greater the mismatch in surface properties between the underlayer surface and the atmosphere, causing parallel orientation of lamellar domains.

Given the foregoing characteristics of the SA layer, an SA layer that contains no SAP self-assembles to form parallel oriented lamellar domains, due to less than all domains being capable of "wetting" the atmosphere. Parallel oriented lamellar domains are characterized by the appearance of islands and holes in atomic force microscopy (AFM) height images (Scheme 2 below). It is desirable that self-assembly of the SA layer comprising the SA material and the SAP forms a lamellar domain pattern wherein each domain is in contact with the underlayer and the atmosphere. The underlayer material can be any material having suitable neutral wetting properties to the domains of the given SA material.

The following discussion is focused on lamellar domain patterns formed by self-assembly of a diblock copolymer, but is applicable to other block copolymers (e.g., triblock copolymers) and other domain morphologies (e.g., cylindrical domains). It should be understood that the layer diagrams are not drawn to scale or meant to be limiting with respect to the possible structures that can be produced using the below-described processes. The diagrams are intended for illustration purposes.

Figure 113:
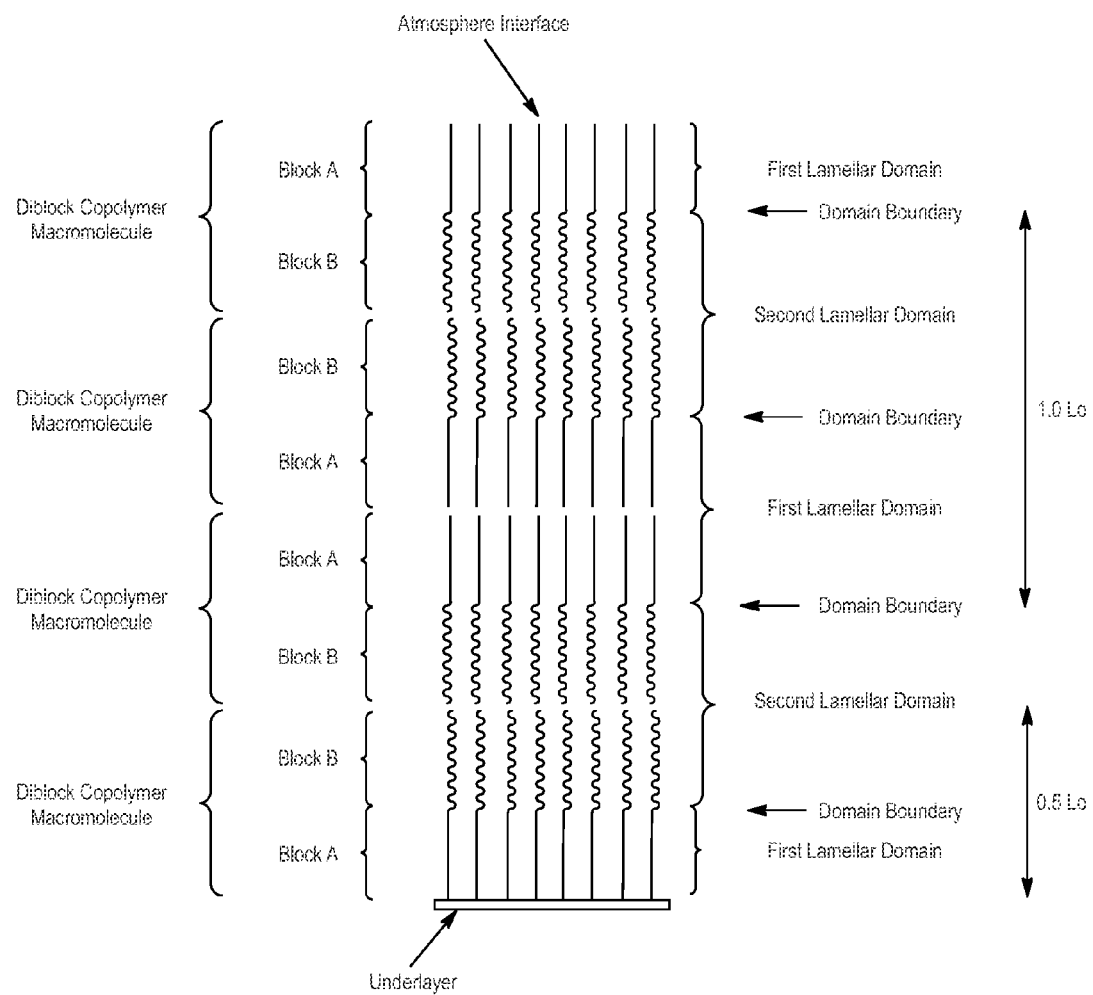
FIG. 113 is schematic representation (Scheme 1) of parallel oriented lamellar domains of a self-assembled diblock copolymer.

Without being bound by theory, Scheme 1 (FIG. 113) is a schematic representation of parallel oriented lamellar domains of a self-assembled diblock copolymer. The main plane of each lamellar domain is parallel to the plane of the underlayer surface.

Scheme 1 shows the arrangement of blocks A and B of a diblock copolymer after self-assembly of the diblock copolymer on an underlayer surface that is preferential to the domain containing block A. In this example, the underlayer and atmosphere interface have preferential affinity to the domain containing block A. The first lamellar domain comprises block A and the second lamellar domain comprises block B. The bulk periodicity Lo of the domains is indicated by 1.0Lo (1.0 times Lo). The individual diblock copolymer macromolecules, domain boundaries, and 0.5Lo are also indicated. It should be understood that within a given lamellar domain (e.g., the second lamellar domain of Scheme 1) blocks from different polymer macromolecules (e.g., B blocks) can be arranged end-to-end (shown) and/or interwoven (not shown). Each block can have a backbone that is rigid, non-rigid, or of intermediate rigidity. Each block can have any suitable coiling, rotational and/or flexural capability.

For purposes of the present invention, the atmosphere interface is always a non-neutral interface with respect to the high-chi BCPs. An SA layer consisting essentially of a high-chi BCP in contact with the atmosphere interface will almost certainly undergo self-assembly to form islands and holes whose boundaries represent a disruption in parallel oriented lamellae. This occurs regardless of whether the underlayer is neutral or non-neutral to the BCP.

Figure 114:
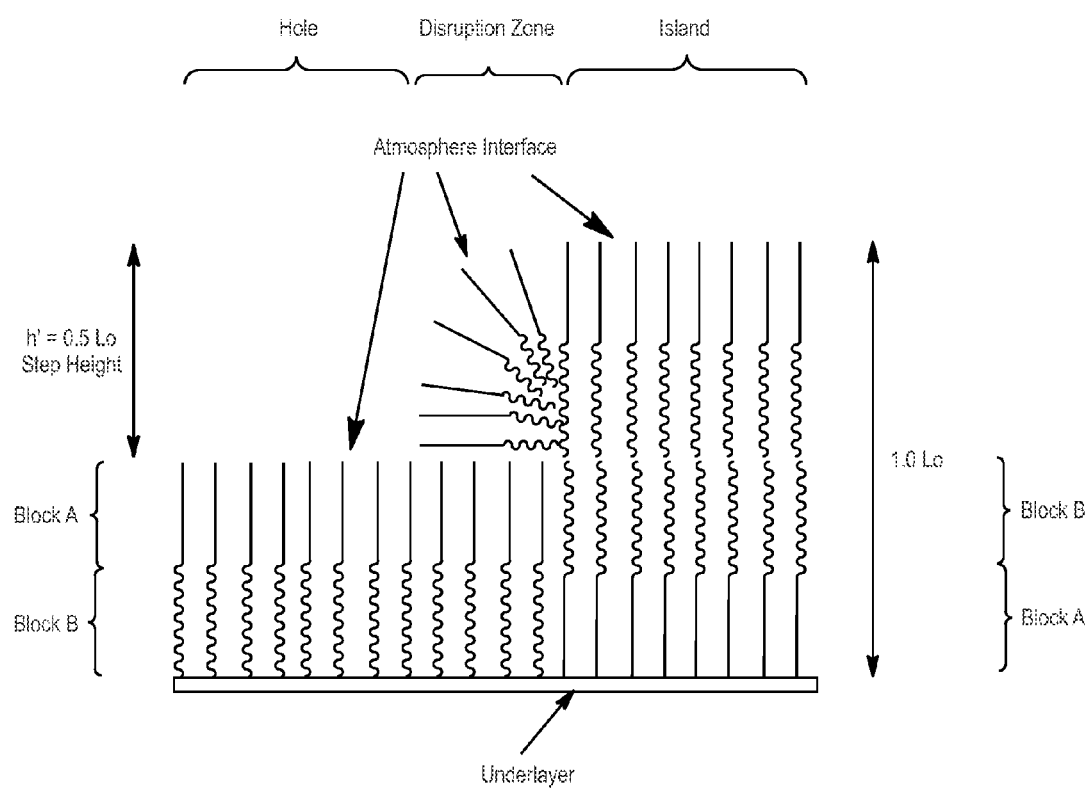
FIG. 114 is schematic representation (Scheme 2) of parallel oriented lamellar domains of a self-assembled block copolymer (BCP) when the atmosphere is non-neutral to the BCP, and the self-assembly process forms islands and holes on a neutral underlayer surface.

Scheme 2 (FIG. 114) is a schematic representation of parallel oriented lamellar domains of a self-assembled BCP when the atmosphere is non-neutral to the BCP, and the self-assembly process forms islands and holes on a neutral underlayer surface.

In Scheme 2, the underlayer surface is in contact with the domain containing block A and the domain containing block B, and only the block A domain has contact with the atmosphere. The neutral (non-preferential) wetting properties of the underlayer surface cause disruptions in the parallel oriented lamellar domains, resulting in formation of islands and holes having a step height h' by AFM of about 0.5 Lo. It should be understood that block A phase separates to retain contact with the atmosphere, including in the disruption zone of the lamellar domains (the boundary of the hole and the island). No attempt has been made to characterize the arrangement of blocks B in the disruption zone of Scheme 2.

The examples further below show that an SA layer comprising a BCP and a disclosed SAP can self-assemble to form perpendicularly oriented lamellar domains when the top surface of the SA layer has contact with the atmosphere. The SAP is preferentially miscible with the polycarbonate domain (i.e., the domain comprising the polycarbonate block of the self-assembled BCP) and substantially immiscible with non-polycarbonate domains of the self-assembled block copolymer (e.g., a block prepared from a vinyl polymerizable monomer such as styrene and/or substituted styrenes). As shown in the examples further below, an underlayer formed using an SAP has a preferential affinity for the polycarbonate domain of the BCP. (This is not the intended use of the SAP, but is useful to demonstrate the surface properties of the SAP).

Without being bound by theory, self-assembly is believed to produce a polycarbonate domain having a greater concentration of SAP than the non-polycarbonate domain. The higher SAP concentration of the polycarbonate domain after self-assembly may allow the SAP-enriched polycarbonate domain to wet the atmosphere interface, thereby allowing perpendicularly orientation of the lamellar domains. Non-polycarbonate domains having contact with the atmosphere can be essentially free of SAP at the atmosphere interface. When the block copolymer structure favors cylindrical domain formation, the presence of the SAP can allow formation of perpendicularly oriented cylindrical domains.

Figure 115:
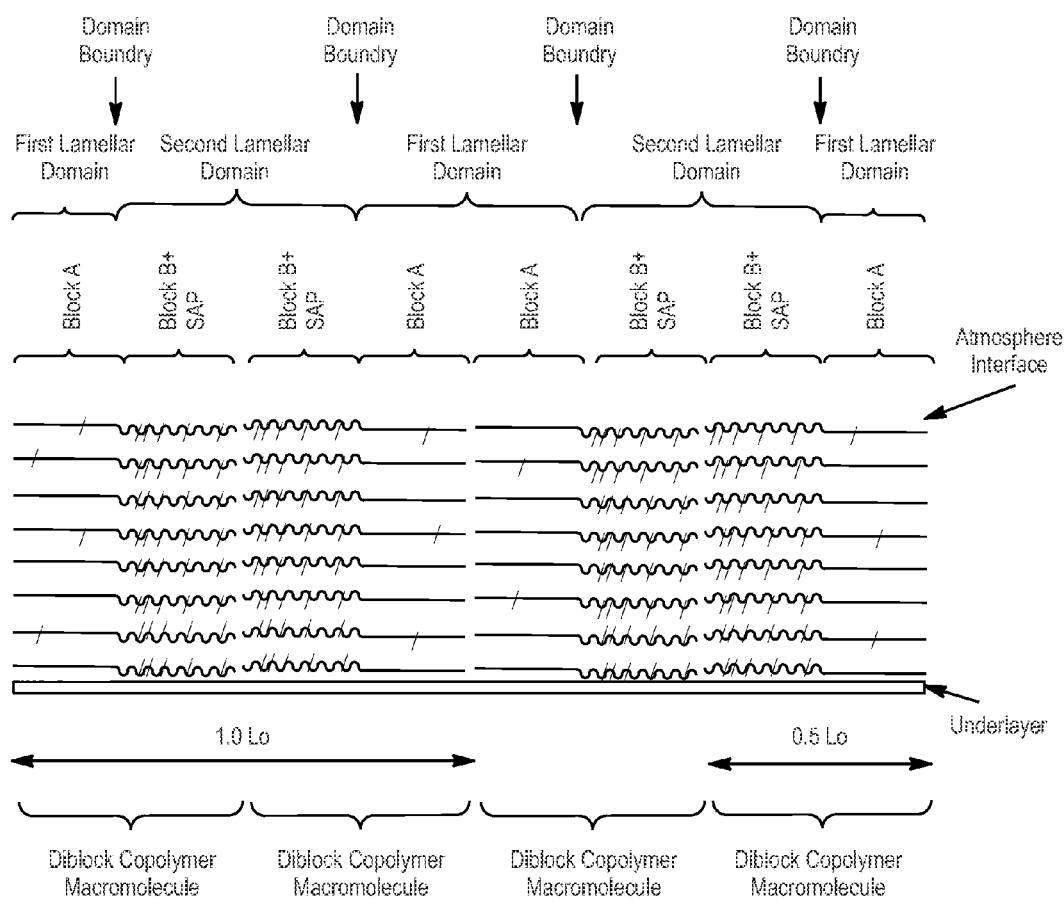
FIG. 115 is schematic representation (Scheme 3) of perpendicularly oriented lamellar domains of a self-assembled BCP in which the SA layer comprises an SAP that is preferentially soluble in the domain comprising block B.

Scheme 3 (FIG. 115) is a schematic representation of perpendicularly oriented lamellar domains of a self-assembled BCP in which the SA layer comprises an SAP that is preferentially soluble in the domain comprising block B. The SAP is represented by the forward slash marks within the block B and block A domains. The block B domain can comprise a concentration gradient in SAP, wherein the concentration of SAP is highest at the atmosphere interface (not shown). The block A domain can have essentially no SAP at the atmosphere interface.

In Scheme 3, the main planes of the lamellae are oriented perpendicular to the plane of the underlayer surface, and also to the main plane of the SA layer. The lamellae of each domain are in contact with the atmosphere and underlayer surface. The bulk periodicity, Lo, is indicated, as well as 0.5Lo. In this example, the underlayer surface has contact with block A and block B of the self-assembled diblock copolymer. The presence of the SAP allows the SAP-containing block B domain to contact the atmosphere interface.

In the examples further below, if an SA layer comprising a self-assembled BCP exhibits islands and/or holes by atomic force microscopy or parallel cylinders, the atmosphere interface (air interface) is non-neutral to the self-assembled SA layer (undesirable). If an SA layer comprising a self-assembled BCP exhibits perpendicularly oriented lamellae or cylinders, the atmosphere interface (air interface) is neutral to the self-assembled SA layer (desirable).

The examples further below show that the SAP allows perpendicularly oriented domain patterns to be formed without employing a top coat (i.e., a layer between the SA layer and the atmosphere interface) or a topographic pre-pattern to direct self-assembly of the high-chi BCP. Although a topographic pre-pattern is not essential for orientation control, a topographic pre-pattern can be present for other purposes. This is also demonstrated in the examples further below.

The lamellar domain patterns can have a bulk periodicity, Lo, in the range of about 4 nm to about 80 nm, which is useful for producing line features having a half-pitch of about 2 nm to about 40 nm, respectively, more particularly about 2 nm to about 20 nm.

Surface Active Polymers (SAPs)

The SAP is phase selective, meaning the SAP has preferential solubility in the polycarbonate domain formed by self-assembly. As a result, the polycarbonate domain has a higher concentration of SAP after self-assembly compared to other domains. The SAP concentration of the polycarbonate domain after self-assembly lowers the surface energy of the polycarbonate domain sufficiently to allow the polycarbonate domain to wet the atmosphere interface and provide perpendicular orientation of each domain. Perpendicular orientation can be achieved without forming a monolayer of SAP over the SA layer. For this reason, the SAP can be used in amounts of more than 0 wt % up to about 10 wt %, more specifically about 0.1 wt % to about 10 wt %, and even more specifically 0.1 wt % to about 5 wt %, based on total weight of the dry solids of the SA layer. In an embodiment, the formulation used to prepare the SA layer comprises about 0.5 wt % to about 5 wt % SAP based on total weight of dry solids of the SA layer.

The SAP is preferably a homopolymer or a random copolymer having preferential solubility in the polycarbonate domain. Other polymer architectures (e.g., dendritic polymers, star polymers, and block polymers) are not excluded as long as the SAP is preferentially soluble in the polycarbonate domain and does not form a discrete domain during self-assembly that is separate and distinct from the polycarbonate domain. A random copolymer is a polymer comprising a random distribution of the different repeat units making up the polymer backbone. Random copolymer names can include an "-r-" or "-random-" separating the abbreviated monomer names used to prepare the polymer.

The SAP can be prepared by any suitable polymerization technique. Exemplary polymerization techniques include radical polymerization, atom transfer radical polymerization (ATRP), reversible addition-fragmentation chain-transfer polymerization (RAFT), anionic polymerization, ring opening polymerization, and ring-opening metathesis polymerization (ROMP). Non-limiting monomers for forming an SAP include vinyl polymerizable monomers (e.g., styrenes, acrylates, methacrylates) and cyclic monomers (e.g., cyclic ethers, cyclic carbonates).

The SAP comprises a fluoro-alcohol repeat unit (HFA repeat unit) comprising at least one hexafluoroisopropyl alcohol group (HFA group) of structure:

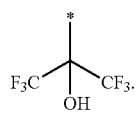

For this reason, the SAPs are also referred to herein as "fluoro-alcohol additives", or simply "polymer additive". Herein, starred bonds represent attachment points, not methyl groups.

The fluoro-alcohol repeat unit can have a structure in accordance with formula (H-1):

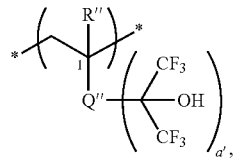

(H-1)

wherein a' is 1 or 2,

Q" is a linking group having a valency of a'+1, and Q" comprises at least one carbon, and R" is a monovalent radical selected from the group consisting of *—H, methyl (*—CH$_3$), ethyl (*-Et), and trifluoromethyl (*—CF$_3$).

Q" can comprise any suitable functionality. Non-limiting exemplary Q" groups include non-aromatic cyclic groups, aromatic groups, alkyl substituted aromatic groups, fluorine substituted aromatic groups, ester groups, and amide groups.

More specific Q" groups include those of Scheme 4, wherein the starred bond of carbon 1 of Q" is linked to carbon 1 bearing the R" group of formula (H-1), and each remaining starred bond of Q" is linked to an HFA group.

Scheme 4.

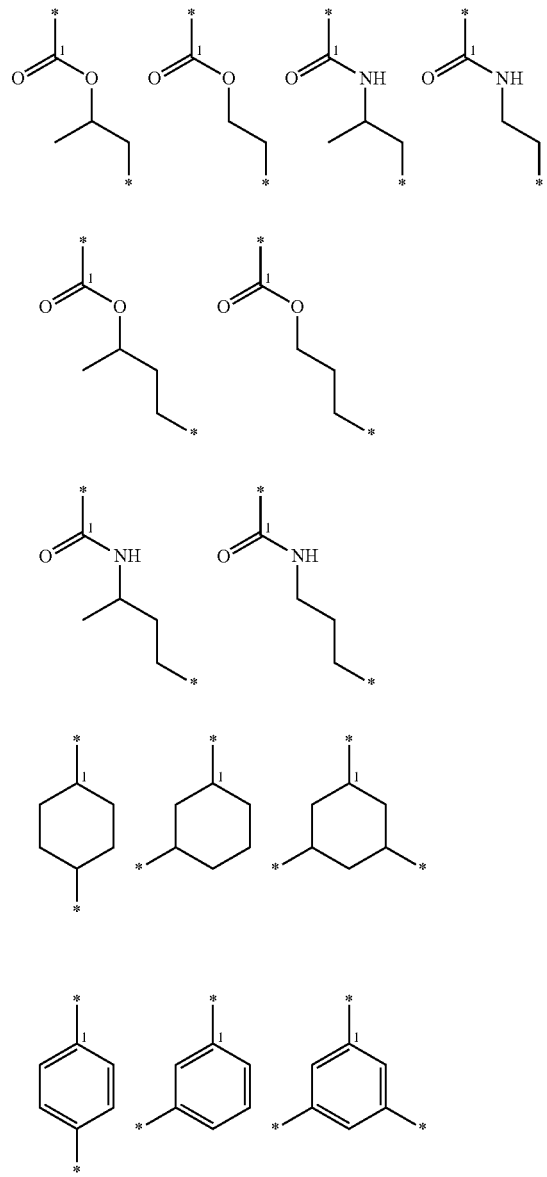

Non-limiting exemplary HFA repeat units include those of Scheme 5.

Scheme 5.

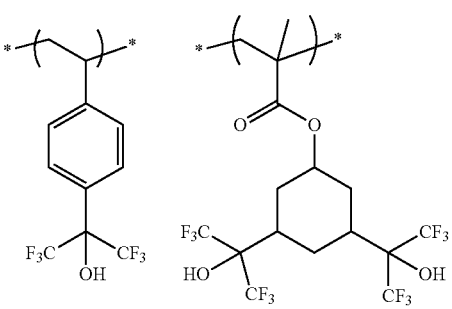

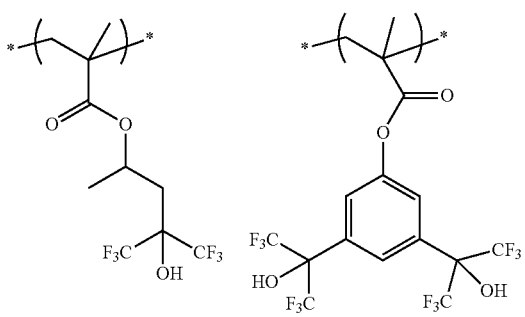

The SAP can comprise the HFA repeat units singularly or in combination. Non-limiting exemplary HFA-containing vinyl polymerizable monomers (HFA monomers) include those of Scheme 6.

Scheme 6.

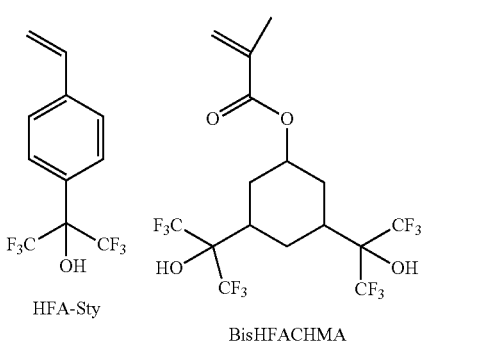

HFA-Sty

BisHFACHMA

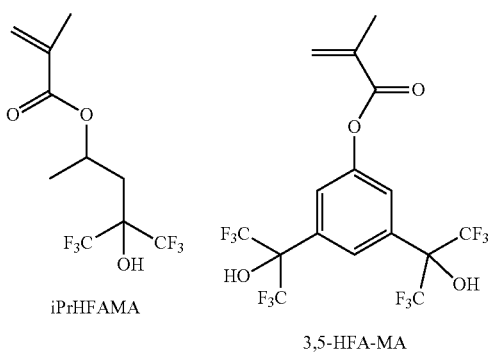

iPrHFAMA 3,5-HFA-MA

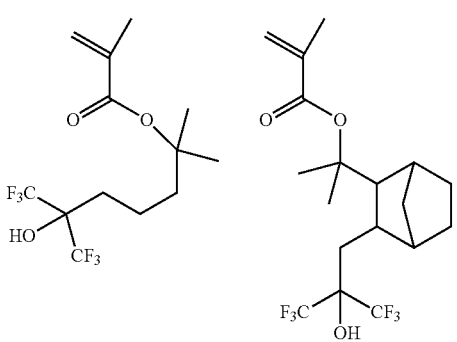

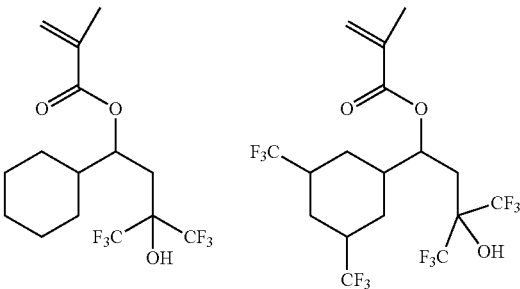

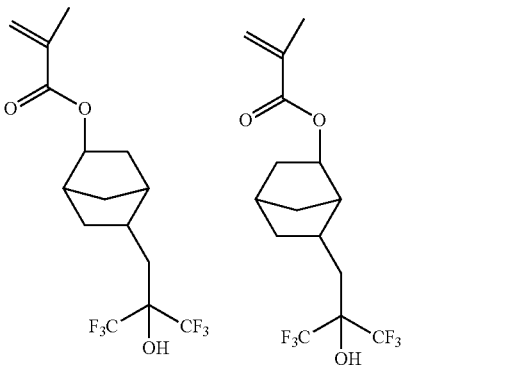

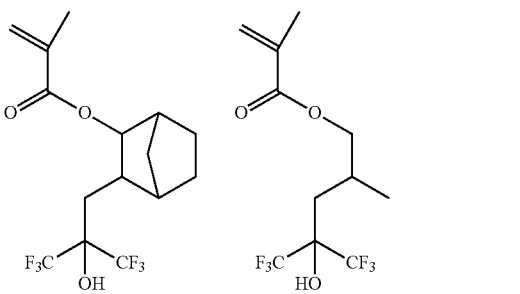

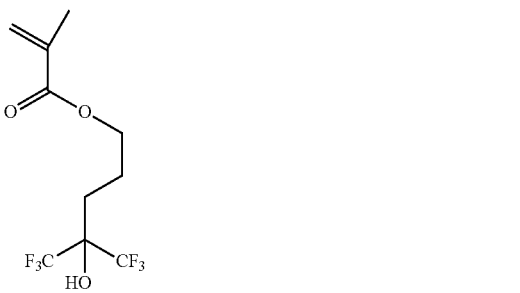

The SAP can further comprise one or more diluent repeat units of any suitable structure. As non-limiting examples, the SAP can comprise one or more divalent repeat units of Scheme 7, which can be formed by vinyl polymerization of the corresponding styrene monomers.

Scheme 7.

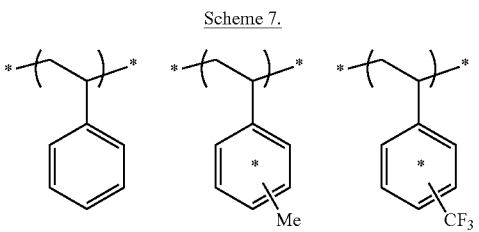

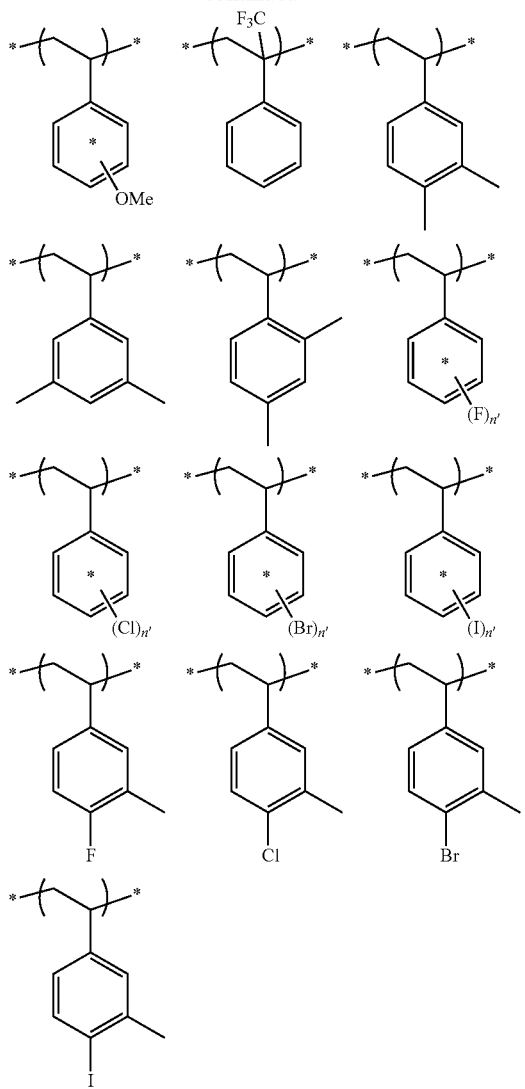

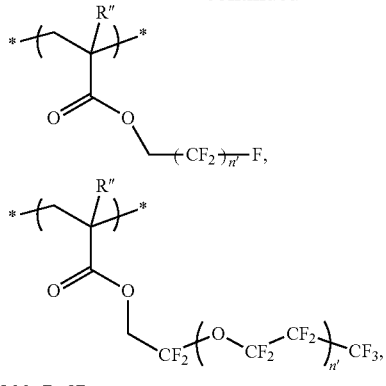

R″ = H, Me, Et, CF₃
n′ = 1-12

In an embodiment, the diluent repeat unit of the SAP comprises a functional group selected from the group consisting of phenyl, phenyl groups comprising one or more fluorides, ester groups comprising one or more fluorides, ether groups comprising one or more fluorides, and alkyl groups comprising one or more fluorides. In an embodiment the SAP comprises a diluent repeat unit comprising a pentafluorophenyl group. In another embodiment, the SAP is a random copolymer comprising the fluoro-alcohol repeat unit and one or more diluent repeat units selected from the group consisting of

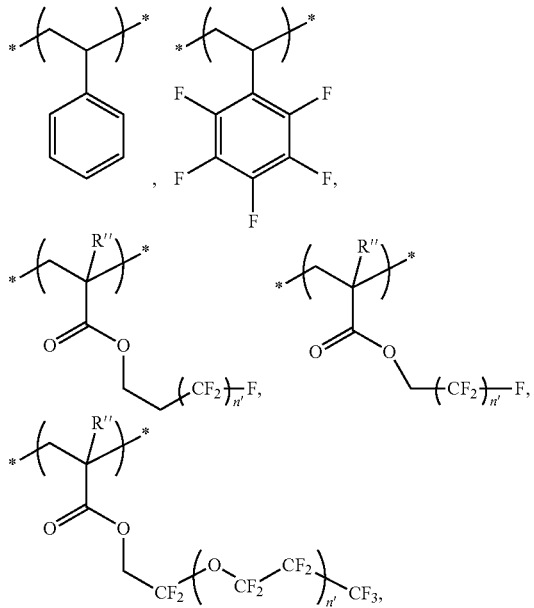

n′ = 1-5

When a starred bond of a given group crosses a bond of a ring as shown in the above diluent repeat units, the group can be present as any one of the available positional isomers of the ring or as a mixture of positional isomers of the ring. This convention is followed below also.

Other non-limiting diluent repeat units for the SAP include divalent fluorinated ester repeat units of Scheme 7A, which can be formed by vinyl polymerization of the corresponding (meth)acrylate monomers.

Scheme 7A.

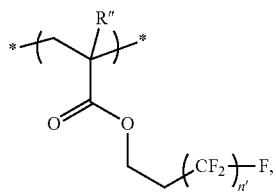

and combinations thereof, wherein each R″ is independently selected from the group consisting of *—H, *-Me, *-Et, and *—CF₃, and each n′ is an independent integer of 1 to 12.

When present, diluent repeat units can be used singularly or in combination.

The SAP can have any suitable end group functionality such as, for example, hydrogen, halide groups (e.g., fluoride, chloride, bromide, iodide), alkyl groups, alkoxy groups, ester groups, aromatic groups, non-aromatic cyclic groups, groups comprising combinations of the foregoing functionalities, and any of the foregoing groups substituted with one or more fluoride groups.

In an embodiment the SAP is a polymer of formula (H-2):

E'-P'-E''  (H-2), wherein
E' is a first end group,
E'' is a second end group,
E' and/or E'' comprises 1 to 25 fluorines, and
P' is a polymer chain comprising at least one fluoro-alcohol repeat unit (HFA repeat unit) of formula (H-1):

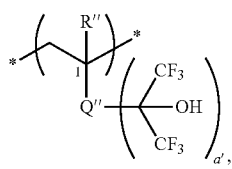

(H-1)

wherein
a' is 1 or 2,
Q'' is a linking group having a valency of a'+1, and Q'' comprises at least one carbon, and
R'' is a monovalent radical selected from the group consisting of *—H, methyl (*—CH$_3$), ethyl (*-Et), and trifluoromethyl (*—CF$_3$).

In another embodiment, E' and/or E'' of formula (H-2) comprises 10 to 25 fluorines In another embodiment, SAP end group E' and/or E'' comprises an ester group comprising 1 to 25 fluorines. Non-limiting examples of fluorinated ester groups include those of Scheme 8.

Scheme 8.

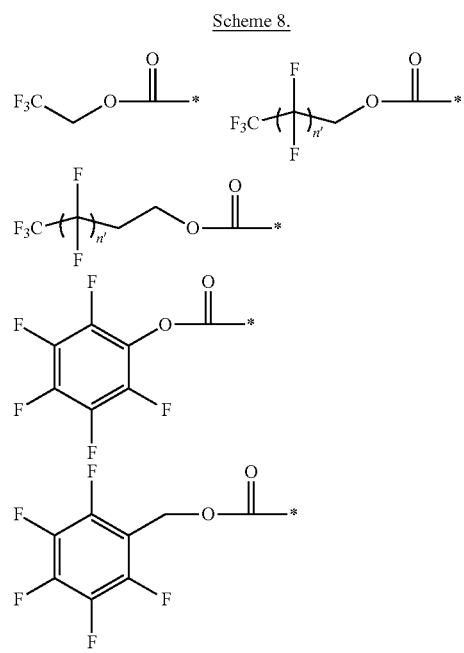

n' = 1 to 12

In a specific embodiment, the SAP polymer comprises a first end group E' containing an above-described fluorinated ester group and a second end group E'' that is bromide. As an example, Scheme 9 below illustrates the ATRP polymerization of Pf-OiBr to form surface active polymer SAP7-C.

Scheme 9.

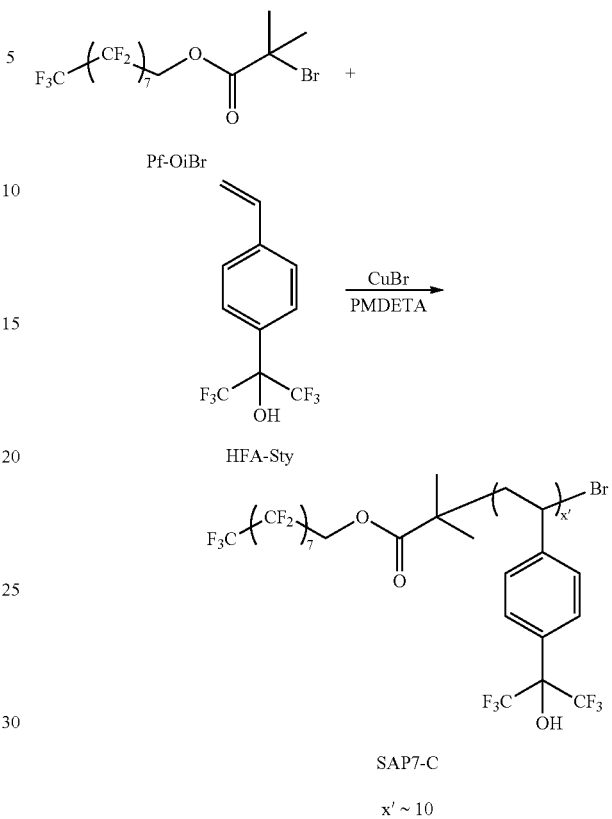

x' ~ 10

The SAP can comprise the fluoro-alcohol repeat unit in an amount of 20 mol % to 100%, preferably 40 mol % to 100 mol %, based on total moles of repeat units used to form the SAP.

The SAP can have a number average molecular weight (Mn) of about 1000 to about 50000, more particularly 1000 to about 25000. The SAP can have a polydispersity index of about 1.0 to about 3.0.

Random Copolymers for Orientation Control (Underlayer)

The underlayer polymer is preferably a random copolymer capable of undergoing a reaction to form a covalent bond with another layer of the substrate. A more specific underlayer polymer comprises a repeat unit comprising an ethylenic backbone portion and a side chain portion comprising a polycarbonate chain. The polycarbonate chain of the side chain can comprise 1 or more carbonate repeat units, preferably 2 to about 40 carbonate repeat units. In an embodiment, the carbonate repeat unit of the pendant polycarbonate chain of the underlayer polymer has the same chemical structure as the carbonate repeat unit of the polycarbonate block of the BCP used in the SA layer (described further below). The underlayer polymers comprising a pendant polycarbonate chain can be prepared by ring opening polymerization (ROP) of a cyclic carbonate using a polymeric macroinitiator having one or more pendant hydroxy groups capable of initiating the ROP. The polymeric macroinitiator can be prepared by random polymerization of one or more vinyl polymerizable monomers comprising a pendant alcohol group (e.g., hydroxyethyl methacrylate, HEMA) or a protected alcohol group that is subsequently deprotected.

More specifically, the random copolymers for the underlayer comprise a first repeat unit of formula (A-1):

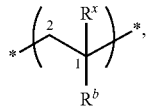
(A-1)

wherein $R^x$ is a monovalent radical selected from the group consisting of H, methyl, ethyl, and trifluoromethyl (*—CF$_3$), and $R^b$ is a monovalent radical comprising an aromatic ring.

It should be understood that the two starred bonds of formula (A-1) represent attachment points to other repeat units of the polymer chain or polymer chain end groups, carbons 1 and 2 are ethylenic carbons of the polymer backbone, $R^x$ is a first side chain linked to carbon 1 of the polymer backbone, and $R^b$ is a second side chain linked to carbon 1 of the polymer backbone.

Non-limiting $R^b$ groups of formula (A-1) include substituted and unsubstituted aryl groups. Exemplary $R^b$ groups are listed in Scheme 10 below, where the starred bond of the carbonyl group or the aromatic ring is linked to carbon labeled 1 of formula (A-1).

Scheme 10.

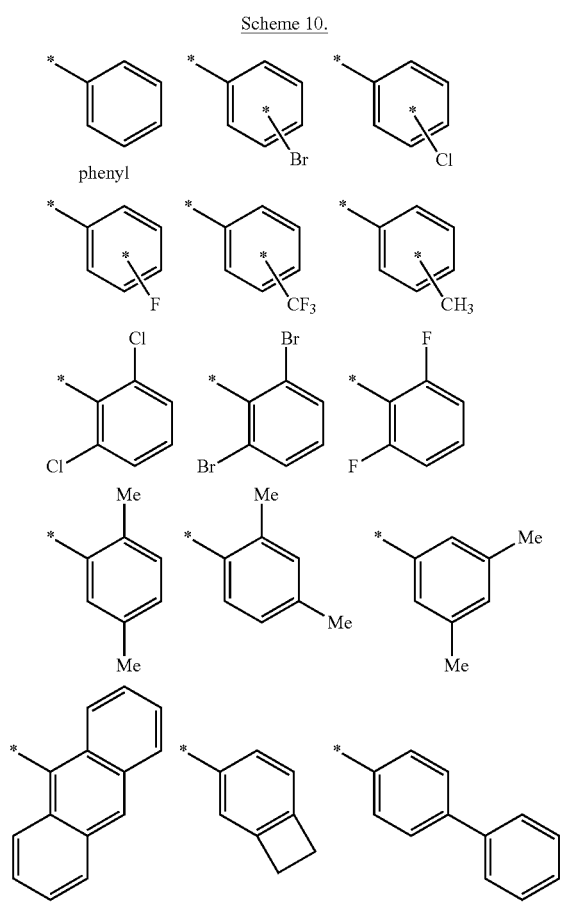

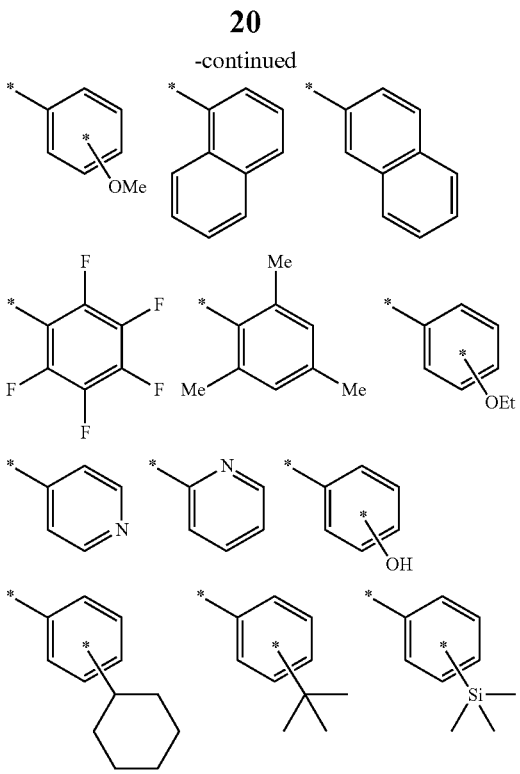

In an embodiment, $R^x$ of formula (A-1) is hydrogen, and $R^b$ is phenyl.

The random copolymers comprise a second repeat unit of formula (A-2):

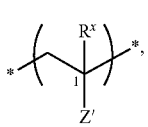
(A-2)

wherein $R^x$ is a monovalent radical selected from the group consisting of H, methyl, ethyl, and trifluoromethyl (*—CF$_3$), and Z' is a monovalent radical comprising two or more carbonyl-containing functional groups independently selected from the group consisting of ester groups, carbonate groups, amide groups, carbamate groups, and combinations thereof.

It should be understood that $R^x$ is a first side chain of the second repeat unit which is linked to polymer backbone carbon 1 of formula (A-2), and Z' is a second side chain of the second repeat unit linked to polymer backbone carbon 1 of formula (A-2).

Second repeat units of formula (A-2) include those obtained from styrenes, acrylates, methacrylates, acrylamides, methacrylamides, and the like, which are modified before or after vinyl polymerization to comprise the two or more carbonyl-containing functional groups.

More specific Z' groups of formula (A-2) include those of formula (A-2a):

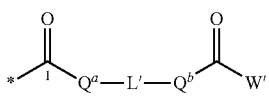

(A-2a)

wherein
L' is a divalent linking group comprising 2 to 10 carbons,
$Q^a$ is *—O—* or *—N(H)—*,
$Q^b$ is *—O—* or *—N(H)—*, and
W' is a group comprising at least one carbon.

The starred bond of formula (A-2a) is linked to carbon 1 of formula (A-2).

Non-limiting examples of Z' groups of formula (A-2a) include those of Scheme 11.

Scheme 11.

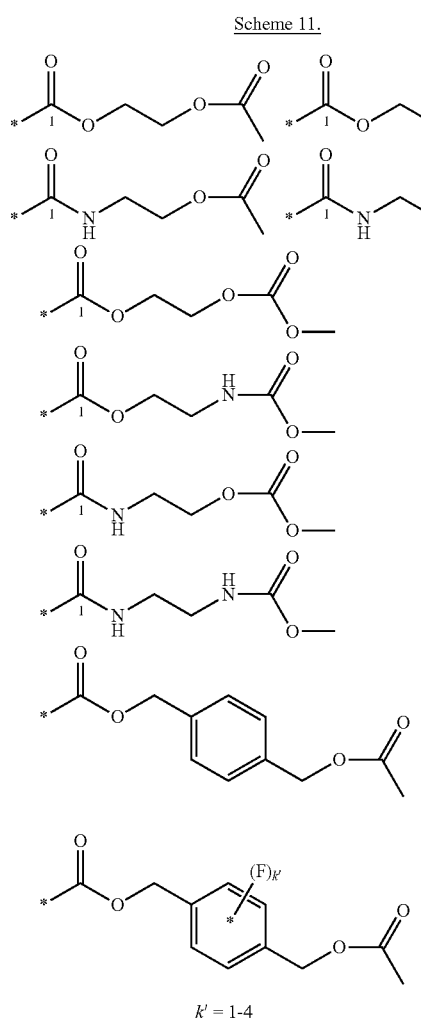

$k' = 1-4$

In an embodiment, Z' is

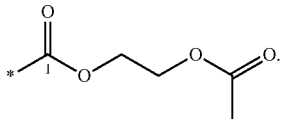 [SMILES: *C(=O)OCCOC(C)=O]

Other more specific Z' groups of formula (A-2) include those of formula (A-2b):

(A-2b)

$$Z' \left\{ *_1 Q^a - L' - Q^b \underset{\underbrace{\hspace{3cm}}_{Z' \text{ polymer}}}{\left( O \underset{J'}{\overset{R^a}{|}} O \right)_{a'}} E^1 \right\}^{Z' \text{ polymer, end group}}$$

wherein
a' represents the average number of repeat units and has a value of 1 or more, $E^1$ is a monovalent end group independently selected from the group consisting of hydrogen and groups comprising 1 to 10 carbons, each J' is an independent monovalent radical selected from the group consisting of hydrogen and groups comprising 1 to 10 carbons, L' is a divalent linking group comprising 2 to 10 carbons,
$Q^a$ is *—O—* or *—N(H)—*,
$Q^b$ is *—O—* or *—N(H)—*, and
each $R^a$ is an independent monovalent radical selected from the group consisting of hydrogen, methyl, and ethyl.

The starred bond of formula (A-2b) is linked to carbon 1 of formula (A-2). The average degree of polymerization, a', of the Z' polymer is preferably 1 to about 40, more preferably 1 to about 20. $R^a$ is a first side chain of the Z' polymer, and J' is a second side chain of the Z' polymer (labeled above).

Non-limiting examples of Z' groups of formula (A-2b) include those of Scheme 12.

Scheme 12.

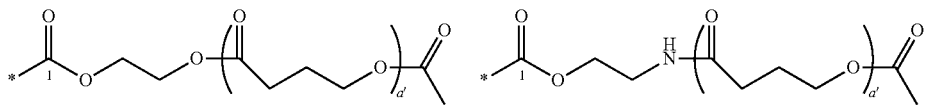

-continued

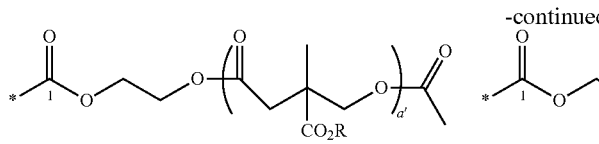
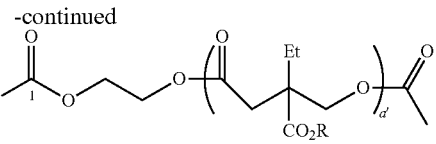

R = Me, Et, Pr, Bu, Benzyl

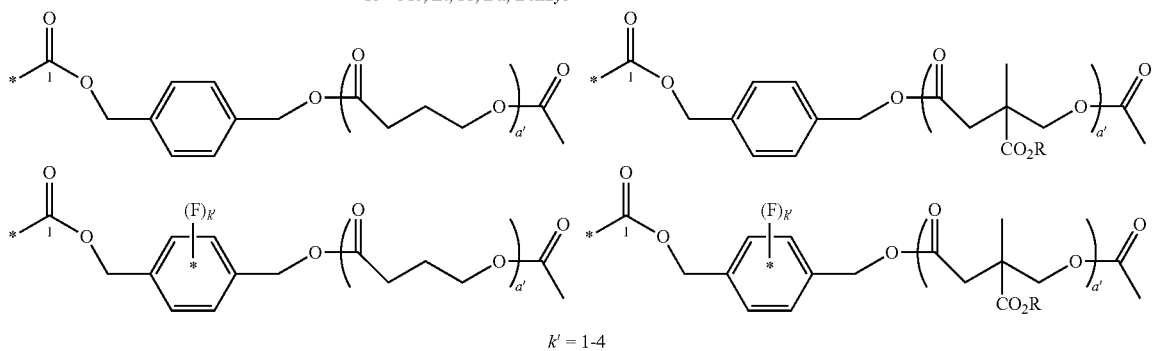

k' = 1-4

In an embodiment, $Q^a$ and $Q^b$ are *—O—*, L' is ethylene (*—CH$_2$CH$_2$—*), $R^a$ is hydrogen, and J' is hydrogen of formula (A-2b). In another embodiment, Z' is

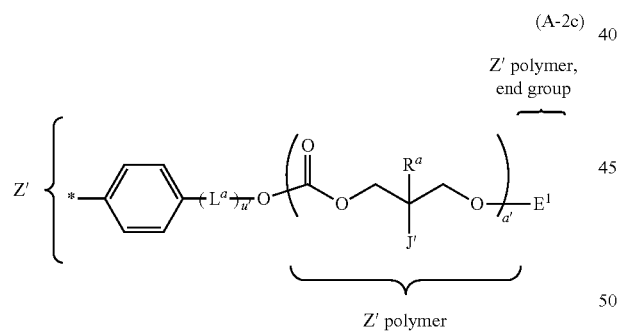

wherein a' represents the average number of repeat units and has a value of 1 or more.

Still other more specific Z' groups of formula (A-2) include those of formula (A-2c):

(A-2c)

$$Z'\left\{ *\!\!-\!\!\!\underbrace{\left(\!\!\phantom{\rule{0ex}{2ex}}\!\!\right)\!\!-\!\!(L^a)_{u'}\!\!-\!\!O\!\!-\!\!\overbrace{\left(\!\!\begin{array}{c}O\\ \|\\ \ \end{array}\!\!-\!\!O\!\!-\!\!\!\begin{array}{c}R^a\\ |\\ |\\ J'\end{array}\!\!-\!\!O\!\!\right)_{\!a'}\!\!\!-\!\!E^1}^{Z'\ polymer,\ end\ group}}_{Z'\ polymer} \right\}$$

wherein a' represents the average number of repeat units enclosed in the parentheses and has a value of 1 or more, u' is 0 or 1, $E^1$ is a monovalent end group independently selected from the group consisting of hydrogen and groups comprising 1 to 10 carbons, each J' is an independent monovalent radical selected from the group consisting of hydrogen and groups comprising 1 to 10 carbons, $L^a$ is a divalent linking group comprising 1 to 5 carbons, each $R^a$ is an independent monovalent radical selected from the group consisting of hydrogen, methyl, and ethyl, and when a' is 1, $L^a$, $R^a$, J' and/or E' comprises a carbonyl-containing functional group selected from the group consisting of esters, carbonates, carbamates, and combinations thereof.

The starred bond of formula (A-2c) is linked to carbon 1 of formula (A-2). The average degree of polymerization, a', of the Z' polymer is preferably 1 to about 40, more preferably 1 to about 20. $R^a$ is a first side chain of the Z' polymer, and J' is a second side chain of the Z' polymer.

Non-limiting examples of Z' groups of formula (A-2c) include those of Scheme 13, wherein a' has an average value of 1 to about 40, and $R^f$ is a group comprising 1 to 10 carbons (e.g., methyl, ethyl, propyl, butyl, benzyl).

Scheme 13.

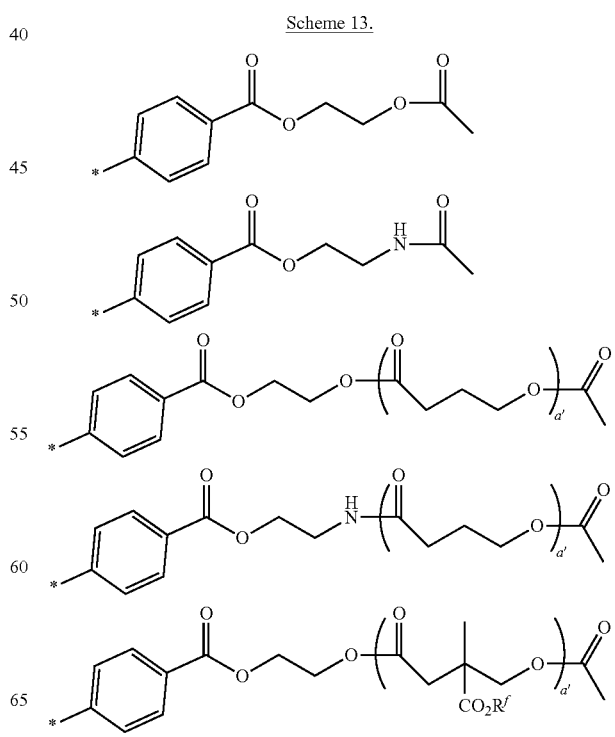

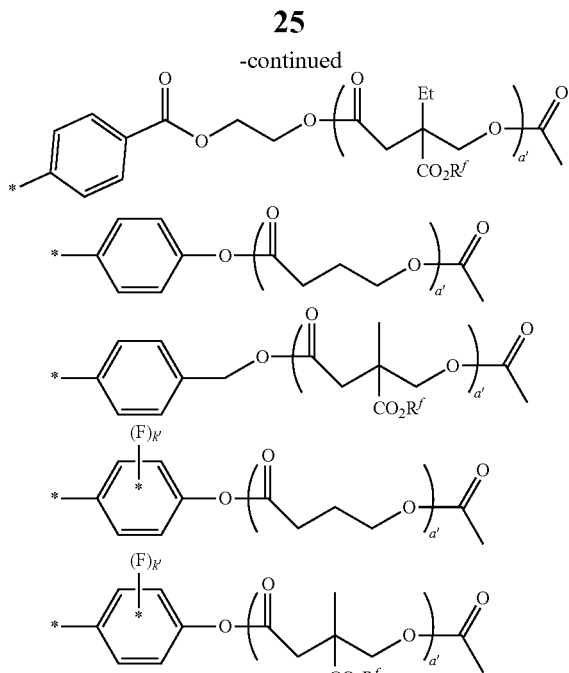

k' = 1-4

Non-limiting examples of second repeat units of formula (A-2) include those of Scheme 13b, wherein a' has an average value of 1 to about 40, and $R^f$ is a group comprising 1 to 10 carbons.

Scheme 13b.

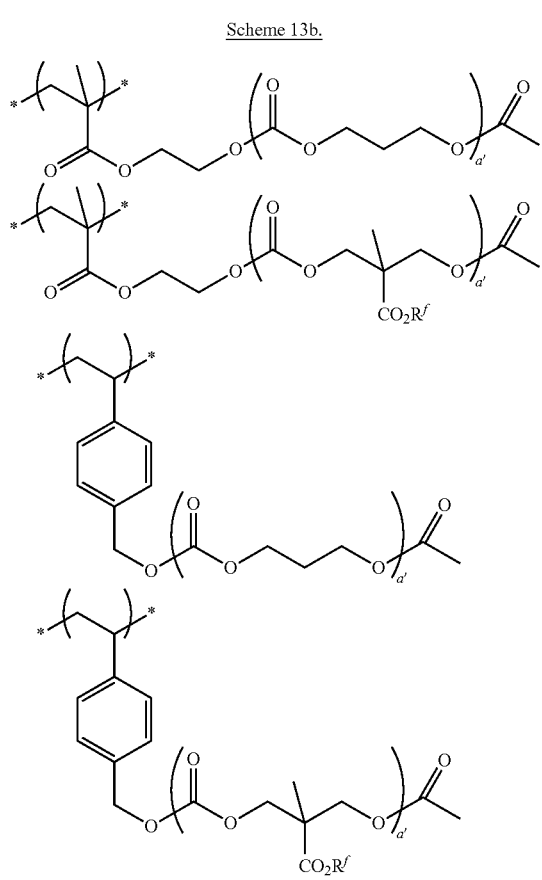

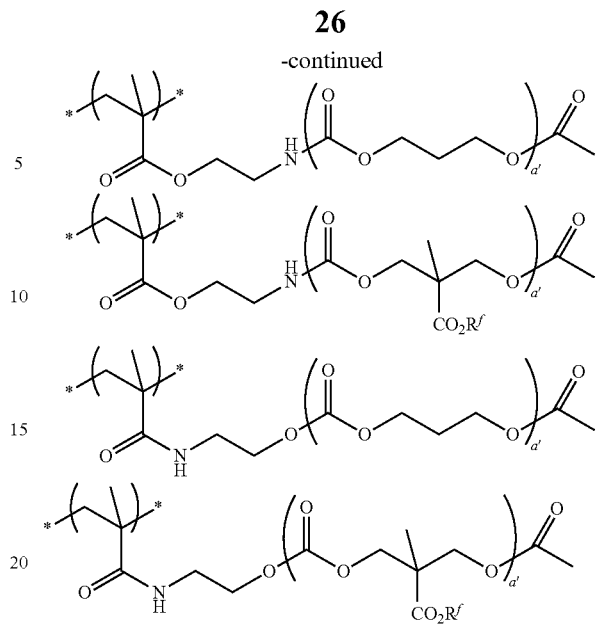

In an embodiment, the second repeat unit of the underlayer random copolymer is selected from the group consisting of

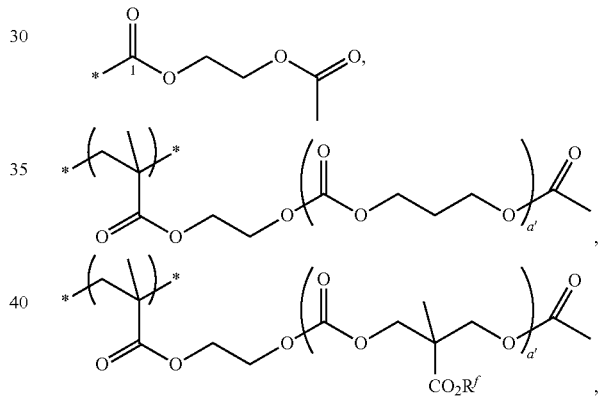

and
combinations thereof, wherein a' represents degree of polymerization and has an average value of about 1 to about 40 and $R^f$ is a member of the group consisting of methyl, ethyl, propyl, phenyl, and benzyl.

The random copolymer for the underlayer preferably comprises a first repeat unit:second repeat unit mole ratio between 24:76 to 88:12.

The random copolymer for the underlayer further comprises a third repeat unit of formula (A-3):

(A-3)

wherein
$R^z$ is a monovalent radical selected from the group consisting of H, methyl, ethyl, and trifluoromethyl (*—$CF_3$), L" is an independent divalent linking group comprising 1 to 10 carbons, and K' is a monovalent electrophilic group capable of reacting with a nucleophile to form a covalent bond.

Non-limiting L" groups of formula (A-3) include ester, amide, aryl, arylester and arylamide groups. Exemplary L" groups include those listed in Scheme 14 below, where the starred bond of the carbonyl group or the aromatic ring (i.e., the left-most starred bond in each structure) is linked to polymer backbone carbon 1 of formula (A-3).

Scheme 14.

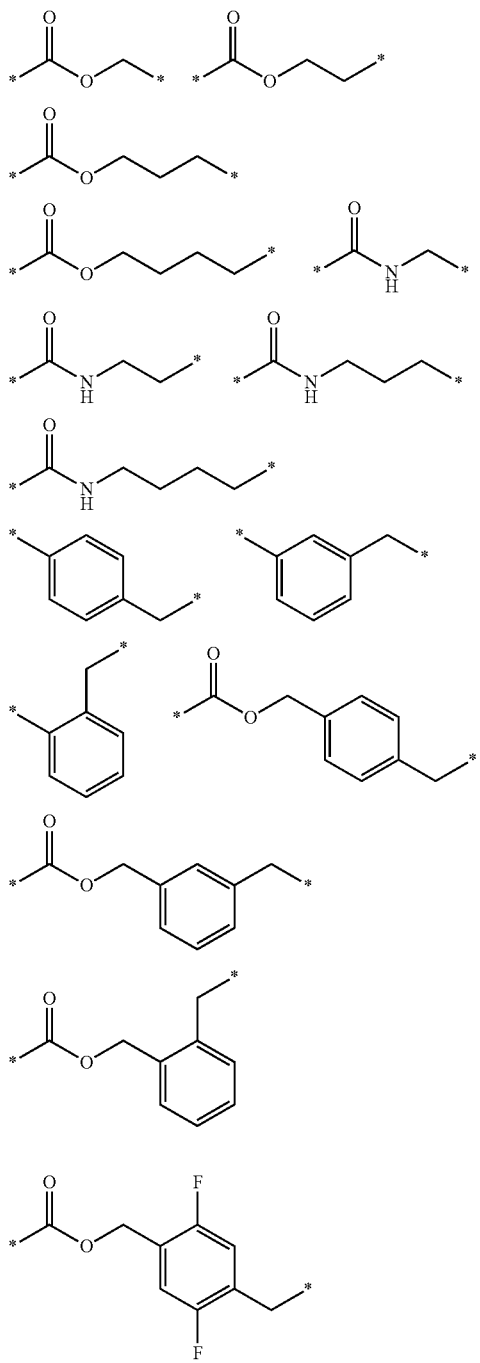

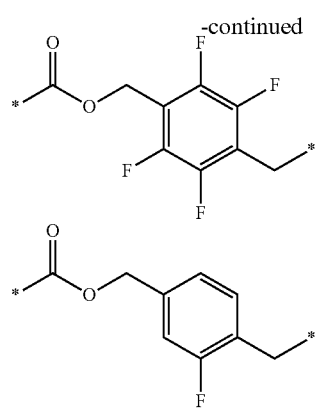

K' can comprise an electrophilic group selected from the group consisting of active carboxylic ester groups (e.g., p-nitrophenyl ester, pentafluorophenyl ester), halide groups (e.g., chloride, bromide, and iodide), sulfonate esters (e.g., p-toluenesulfonates, mesylates), groups containing an epoxide group, and the like. In an embodiment, K' comprises an epoxide group.

More specific L"-K' groups include those of Scheme 15, wherein the starred bond from the carbonyl group or the aromatic ring is linked to carbon labeled 1 of formula (A-3).

Scheme 15.

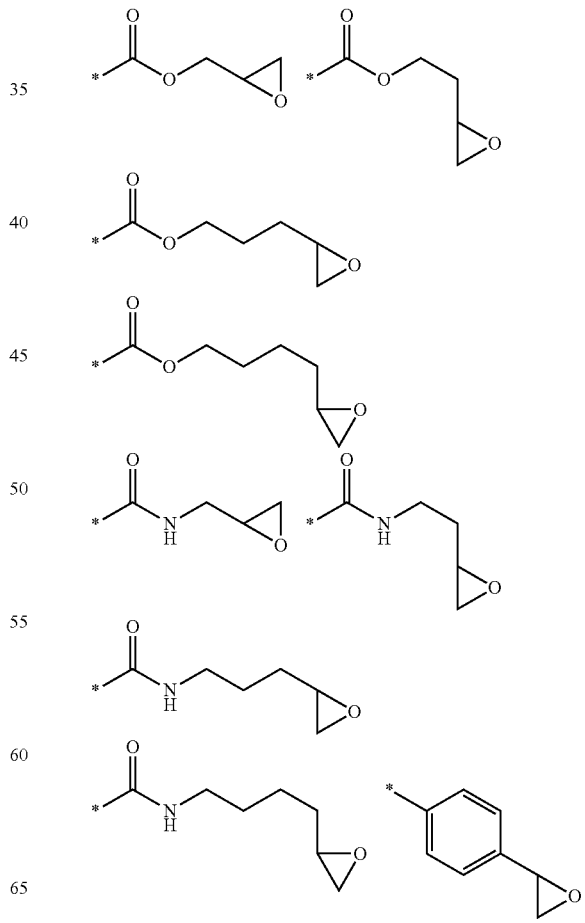

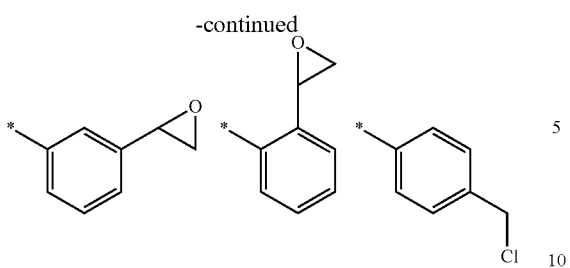

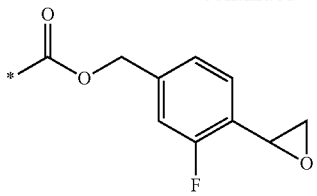

In an embodiment, $R^z$ is methyl of formula (A-3) and L"-K' is of formula (A-3) is

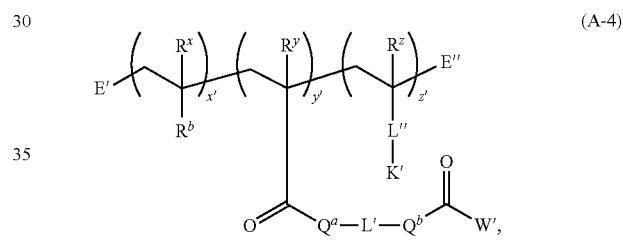

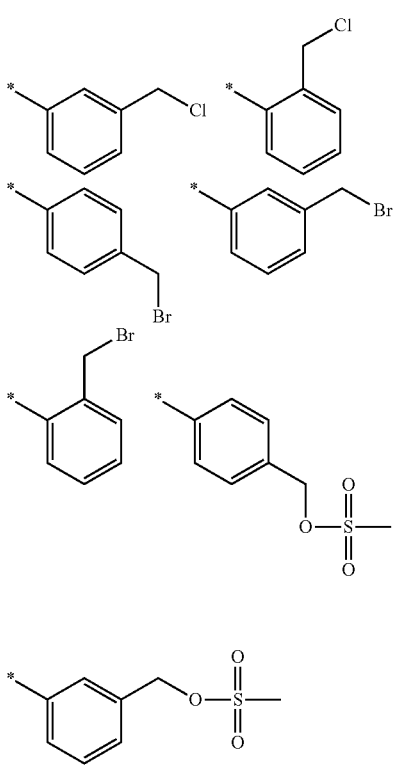

More specific random copolymers for the underlayer have structures in accordance with formula (A-4):

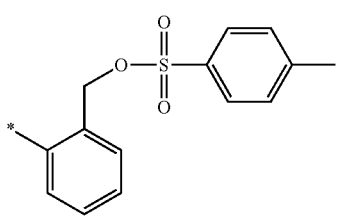

(A-4)

wherein each of subscripts x', y', and z' represents an average number of repeat units enclosed in the respective parentheses and independently has an average value greater than 1, E' and E" are monovalent end groups independently selected from the group consisting of hydrogen, halides, and groups comprising 1-10 carbons, each K' is a monovalent radical capable of reacting with a substrate surface to form a covalent bond, L' is a divalent linking group comprising 2 to 10 carbons, each L" is an independent divalent linking group comprising 1 to 10 carbons, $Q^a$ is *—O—* or *—N(H)—*, $Q^b$ is *—O—* or *—N(H)—*, each $R^b$ is an independent monovalent radical comprising 1 or more aromatic rings, each of $R^x$, $R^y$, and $R^z$ is a monovalent radical independently selected from the group consisting of hydrogen, methyl, ethyl, and trifluoromethyl (*—$CF_3$), and W' is a group comprising at least one carbon.

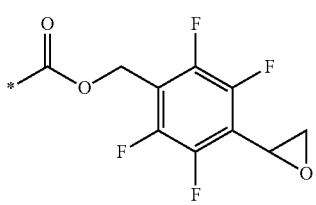

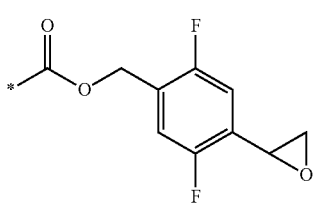

In an embodiment, each $R^x$ is hydrogen, each $R^b$ is phenyl, $Q^a$ is *—O—* and $Q^b$ is *—O—*. In another embodiment, L' is ethylene (*—$CH_2CH_2$—*) and W' is methyl.

Herein, formula A-4 can also be written as formula (A-5):

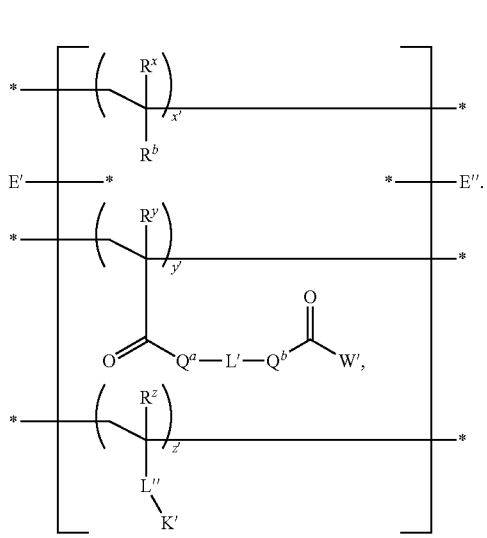

(A-5)

The vertical stacking of the repeat units within the square brackets indicates a random distribution of the repeat units in the polymer chain. In a random distribution of the repeat units, a given repeat unit whose starred bond overlaps the left square bracket can be linked to an atomic center of a different repeat unit whose starred bond overlaps the right square bracket, or an end group E. Likewise, a given repeat unit whose starred bond overlaps the right squared bracket can be linked to an atomic center of a different repeat unit whose starred bond overlaps the left square bracket, or to end group E". End group E' can be linked to any one of the repeat units having a starred bond overlapping the left square bracket. End group E" can be linked to any one of the repeat units having a starred bond overlapping the right square bracket.

Other more specific random copolymers for the underlayer have structures in accordance with formula (A-6):

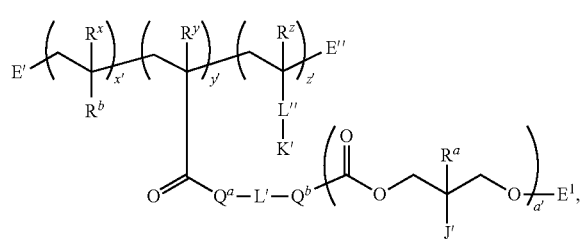

(A-6)

wherein each of subscripts a', x', y', and z' represents an average number of repeat units enclosed in the respective parentheses and independently has an average value greater than 1, E' and E" are monovalent end groups independently selected from the group consisting of hydrogen, halides, and groups comprising 1-10 carbons, $E^1$ is a monovalent end group independently selected from the group consisting of hydrogen and groups comprising 1 to 10 carbons, each J' is an independent monovalent radical selected from the group consisting of hydrogen and groups comprising 1 to 10 carbons, each K' is a monovalent radical capable of reacting with a substrate surface to form a covalent bond, each L' is a divalent linking group comprising 2 to 10 carbons, each L" is an independent divalent linking group comprising 1 to 10 carbons, $Q^a$ is *—O—* or *—N(H)—*,
$Q^b$ is *—O—* or *—N(H)—*, each $R^a$ is an independent monovalent radical selected from the group consisting of hydrogen, methyl, and ethyl, each $R^b$ is an independent monovalent radical comprising 1 or more aromatic rings, and each of $R^x$, $R^y$, and $R^z$ is a monovalent radical independently selected from the group consisting of hydrogen, methyl, ethyl, and trifluoromethyl (*—$CF_3$).

In an embodiment, each $R^x$ is hydrogen, each $R^b$ is phenyl, $Q^a$ is *—O—* and $Q^b$ is *—O—*, $R^a$ is hydrogen, and J' is hydrogen. In another embodiment, L' is ethylene (*—$CH_2CH_2$—*) and $E^1$ is acetyl.

Formula A-6 can also be written as formula (A-7):

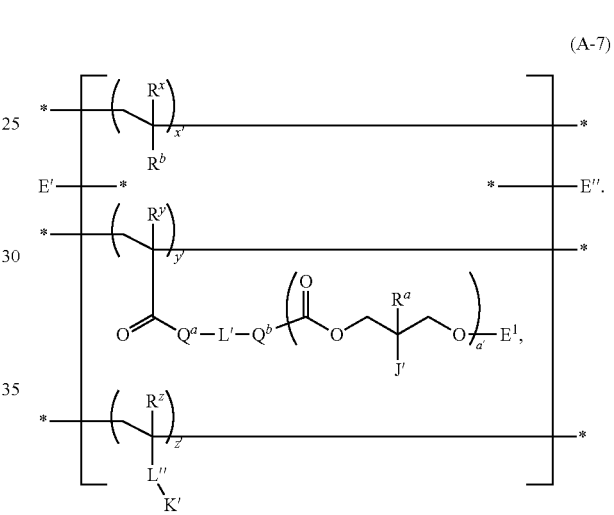

(A-7)

Other more specific random copolymers for the underlayer have a structure according to formula (A-8):

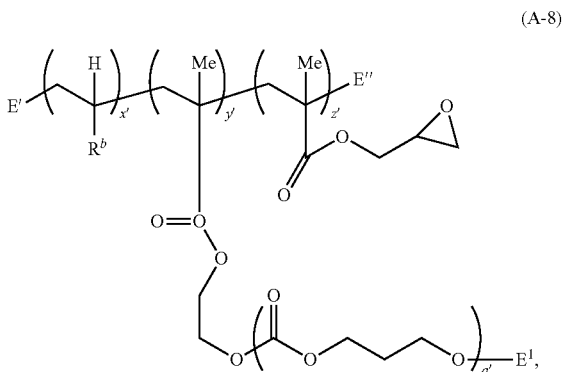

(A-8)

wherein each of x', y', and z' represents the average number of respective repeat units enclosed in the respective parentheses, and has an average value greater than 1, a' represents the number of respective repeat units enclosed in the parentheses, and has an average value of 1 or more, E' and E" are monovalent end groups independently selected from the group consisting of hydrogen, halides, and groups comprising 1-10 carbons, and E¹ is a monovalent end group independently selected from the group consisting of hydrogen and groups comprising 1-10 carbons.

Preferably, x' is 20 to 80, y' is 1 to 20, z' is 1 to 5, and a' is 1 to 40. In an embodiment, E¹ is acetyl. In another embodiment, a' is about 1 to about 10.

The structure of formula (A-8) can also be represented by the formula (A-9):

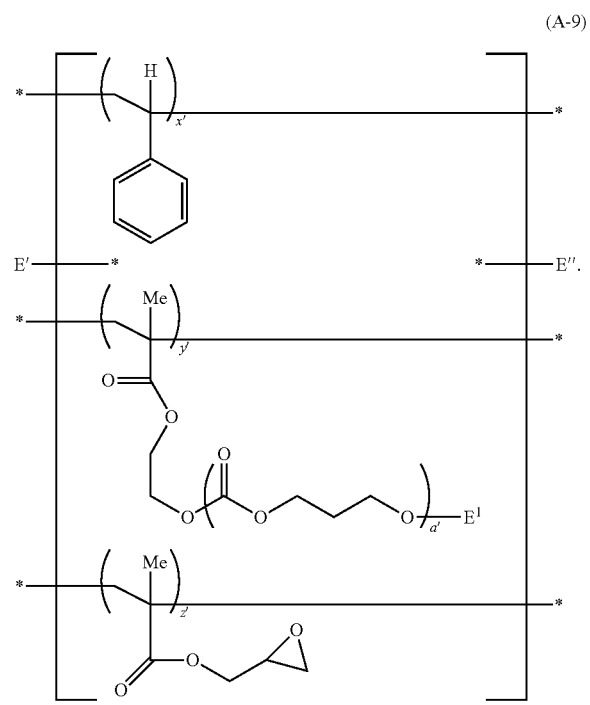

Preparation of Random Copolymers for Orientation Control Layers

A random copolymer for the underlayer can be prepared by copolymerization of a mixture comprising a vinyl polymerizable monomer comprising an aromatic ring, a second vinyl polymerizable monomer comprising a pendant polycarbonate or polyestercarbonate chain, and a third vinyl polymerizable monomer comprising an electrophilic group capable of reacting with a nucleophile to produce a covalent bond. This method is illustrated in Scheme 16 below using the monomers styrene (Sty), HEMA-PTMC, and glycidyl methacrylate (GMA). Catalysts for the vinyl polymerization include radical initiators (e.g., azobisisobutyronitrile (AIBN)).

Scheme 16.

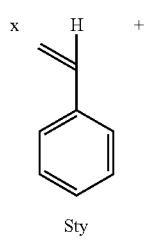

Sty

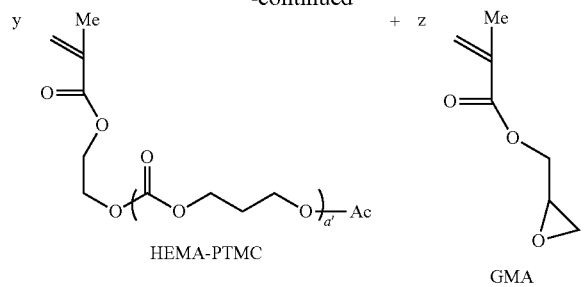

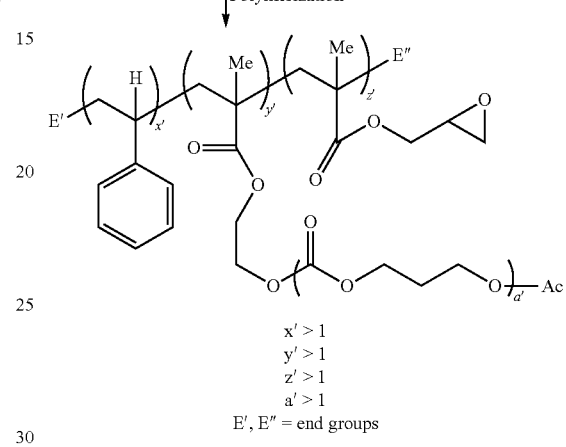

HEMA-PTMC can be prepared by an organocatalyzed ring opening polymerization (ROP) of trimethylene carbonate (TMC) using hydroxyethyl methacrylate (HEMA) as the polymerization initiator, and endcapping the resulting polycarbonate with acetyl chloride, as shown in Scheme 17 below. Catalysts for the ROP include organic bases (e.g., 1,8-diazabicyclo[5,4,0]undec-7-ene (DBU)) and phosphate esters (e.g., diphenyl phosphate (DPP)).

Scheme 17.

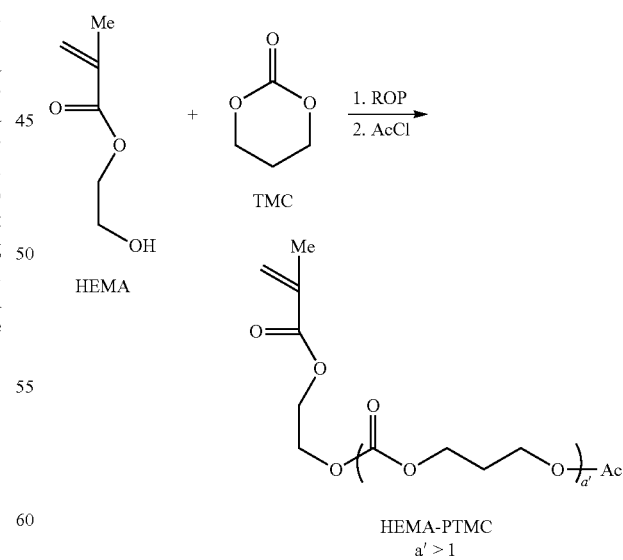

A second method of preparing the random copolymer for the underlayer comprises growing a polycarbonate or polyestercarbonate chain by ring opening polymerization from a nucleophilic site on a side chain of a precursor random copolymer, as illustrated in Scheme 18.

Scheme 18.

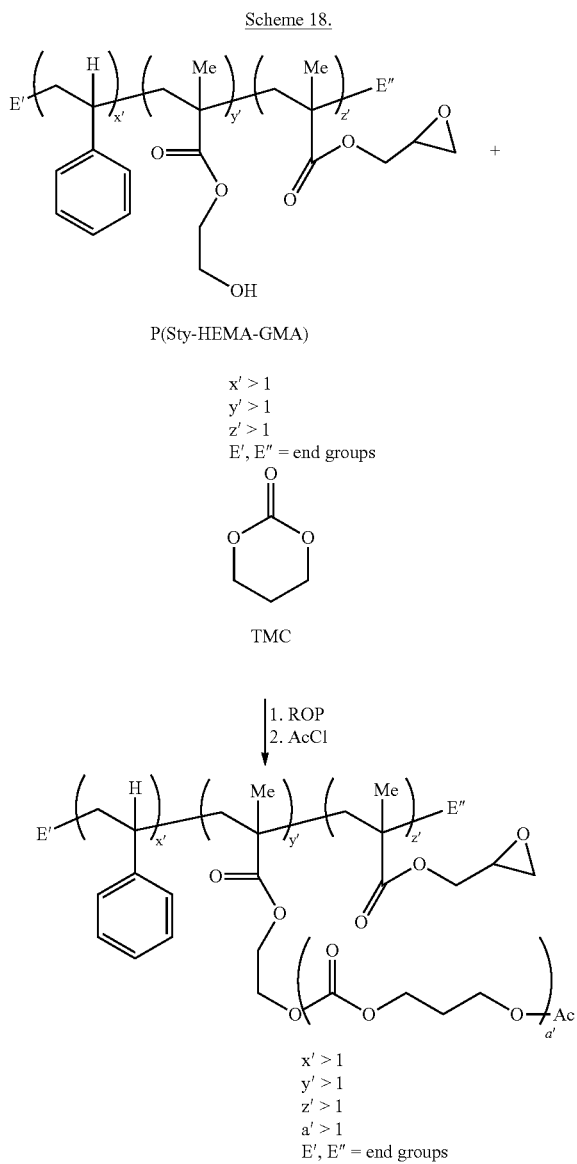

In this example, the random copolymer of styrene (Sty), hydroxyethyl methacrylate (HEMA), and glycidyl methacrylate GMA), referred to as P(Sty-HEMA-GMA), is a macroinitiator for the ring opening polymerization of TMC. Each nucleophilic hydroxy group of the macroinitiator P(Sty-HEMA-GMA) serves as a potential initiating site for ROP of TMC. The resulting polymer is a random graft copolymer comprising a plurality of side chains bearing a polycarbonate chain.

Block Copolymers for Self-Assembly

Block copolymer names can include a "-b-" or "-block-" separating the abbreviated monomer names used to prepare the polymer. The block copolymers for self-assembly can comprise two or more blocks, preferably 2 to 4 blocks. At least one block comprises a carbonate repeat unit. For example, the block copolymer can comprise one polystyrene (PS) block and one polycarbonate (PC) block joined by a linking group. As another example, the block copolymer can comprise two PS blocks and one PC block joined by one or two linking groups in the form of a linear polymer chain (i.e., not macrocyclic). As another example, the block copolymer can comprise two PS blocks and two PC blocks joined by one to three linking groups.

The following discussion is directed to diblock polymers (A-B) but can be applied to triblock polymers and other block polymer architectures (e.g., star polymers comprising 3 or more polymer arms linked to a multi-valent core, mikto-arm star polymers wherein or more arms comprise different repeat units compared to the other arms).

A first block (block A) comprises a backbone comprising repeating functionalized ethylenic units (e.g., as in a polystyrene backbone). A second block (block B) comprises at least one aliphatic carbonate repeat unit (i.e., comprising an aliphatic carbonate group in the polymer backbone). The blocks are selected so as to be substantially immiscible with each other. Additionally, it is preferable that the first block and the second block of the block polymer have the following solubility properties with respect to a solvent mixture used to precipitate the block polymer: i) the first block and the second block are substantially insoluble in a first solvent of the solvent mixture, ii) the first block is substantially insoluble in a second solvent of the solvent mixture, and iii) the second block is soluble in a second solvent of the solvent mixture. That is, the first solvent is a non-solvent for the first block and the second block, the second solvent is a non-solvent for the first block, and the second solvent is a solvent for the second block.

The specific bulk structural units formed by self-assembly of the block polymer are determined by the volume ratio of the first block to the second block. The volume of a given block means the volume occupied by the block, which depends on molecular mass of the block. For example, when the volume ratio of the first block A to the second block B is greater than about 80:20, the block polymer can form an ordered array of spheres composed of the second block in a matrix composed of the first block. When the volume ratio of the first block to the second block is in a range greater than about 80:20, the block copolymer can form an ordered array of spheres of the second block in a matrix composed of the first block. When the volume ratio of the first block to the second block is in a range of about 80:20 to about 60:40, the block polymer can form an ordered array of cylinders composed of the second block in a matrix composed of the first block. When the volume ratio of the first block to the second block is less than about 60:40 to about 40:60, the block polymer can form alternating lamellae (i.e., an array of domains composed of the first block alternating with domains composed of the second block). As an example, a polystyrene-b-polymethylmethacrylate block copolymer (PS-b-PMMA) comprising 20% or less by volume of the polystyrene (PS) block can self-assemble to form PS spheres in a polymethylmethacrylate (PMMA) matrix. As another example, a PS-b-PMMA block copolymer comprising about 20% to 40% PS by volume can self-assemble to form PS cylinders in a PMMA matrix. The volume ratio between the first block and the second block can be adjusted by controlling the average molecular weight of each block.

More specifically, the volume ratio of the first block to the second block can be about 15:85 to about 85:15, based on the average total volume of the block polymer macromolecule. Preferably, for alternating lamellae formation, the volume ratio of the first block to the second block can be about 40:60 to about 60:40, more preferably 45:55 to 55:45, and most preferably 48:52 to 52:48. For cylinder formation, the volume ratio of the first block to second block can be about 74:26 to about 63:37, and more preferably about 72:28 to about 65:35.

One of the blocks of the block polymer can be selectively removed (e.g., by etching techniques) relative to the other block to form structural features composed of the remaining block using known dry and/or wet etching techniques. The structural features can have any suitable form such as, for example, a line pattern, a hole pattern, and/or other patterns.

The ROP polymeric initiator is preferably the product of a vinyl polymerization. Vinyl polymerizable monomers include styrenes, acrylates, methacrylates, substituted derivatives thereof, and the like. The vinyl polymerizable monomers can be used singularly or in combination to form the ROP polymeric initiator using any suitable polymerization technique, including but not limited to free radical polymerization, anionic polymerization, cationic polymerization, atom transfer radical polymerization (ATRP), nitroxide mediated polymerization (NMP), and/or reversible addition-fragmentation chain transfer (RAFT) polymerization.

More specifically, the first block of the block copolymer comprises a repeat unit of formula (B-1):

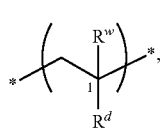

(B-1)

wherein $R^w$ is a monovalent radical selected from the group consisting of H, methyl, ethyl, and trifluoromethyl (*—$CF_3$), and $R^d$ is a monovalent radical comprising an aromatic ring linked to carbon 1.

Non-limiting $R^d$ groups of formula (B-1) include substituted and unsubstituted aryl groups. Exemplary $R^d$ groups are listed in Scheme 19 below, where the starred bond of the carbonyl group or the aromatic ring is linked to carbon labeled 1 of formula (B-1).

Scheme 19.

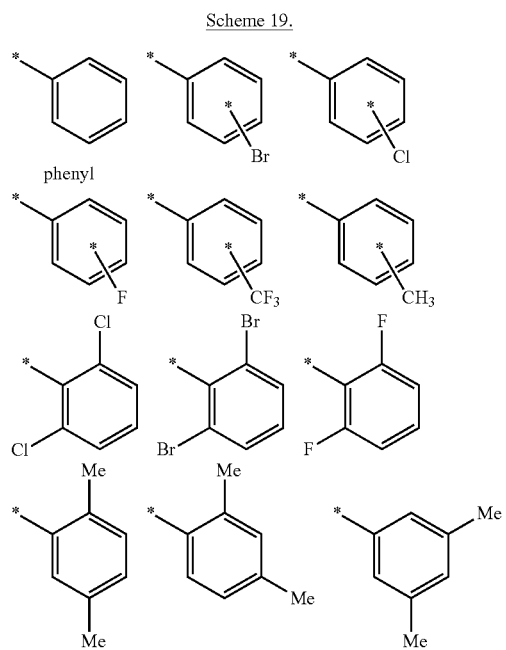

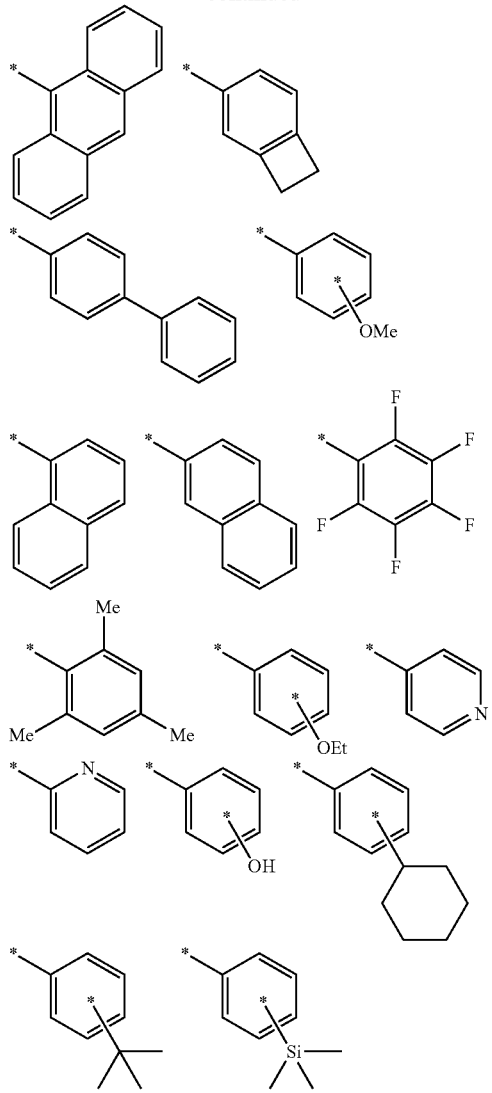

In an embodiment, $R^w$ of formula (B-1) is hydrogen, and $R^d$ is phenyl. Repeat units of formula (B-1) can be present singularly or in combination.

The first block can be a homopolymer of a repeat unit of formula (B-1) or a random copolymer chain comprising a combination of repeat units of formula (B-1) and/or a second repeat unit.

The second block of the diblock copolymer comprises at least one aliphatic carbonate repeat unit of formula (B-2):

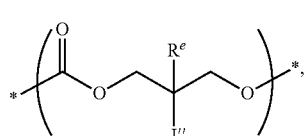

(B-2)

wherein $R^e$ is an independent monovalent radical selected from the group consisting of hydrogen, methyl, and ethyl, and J" is an independent monovalent radical selected from the group consisting of hydrogen and groups comprising 1 to 20 carbons.

More specific block copolymers for self-assembly and directed self-assembly have a structure according to formula (B-3), wherein the square brackets represent separate blocks A and B of the block copolymer:

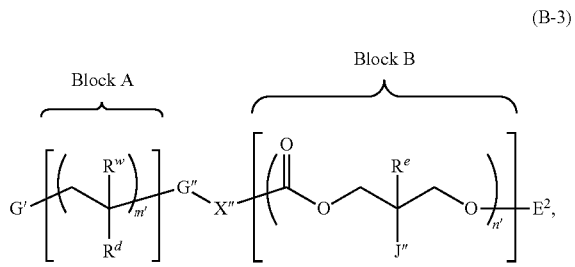

(B-3)

wherein each subscript m' and n' represents the average number of respective repeat units enclosed in parentheses, and independently has an average value greater than 1, $E^2$ is a monovalent end group selected from the group consisting of hydrogen and groups comprising 1-10 carbons, G' is a monovalent end group selected from the group consisting of hydrogen, halides, and groups comprising 1-10 carbons, G" is a divalent linking group comprising 1-20 carbons, each J" is an independent monovalent radical selected from the group consisting of hydrogen and groups comprising 1 to 20 carbons, each $R^d$ is an independent monovalent radical comprising an aromatic ring, each $R^w$ is an independent monovalent radical selected from the group consisting of H, methyl, ethyl, and trifluoromethyl (*—$CF_3$), each $R^e$ is an independent monovalent radical selected from the group consisting of hydrogen, methyl, and ethyl, and each X" is an independent divalent radical selected from the group consisting of *—O—*, *—S—*, *—N(H)—*, and *—N(R")—*, wherein R" is a monovalent radical comprising 1 to 6 carbons.

In an embodiment, each J" is hydrogen, each $R^e$ is hydrogen, each $R^w$ is hydrogen, each $R^d$ is phenyl, $E^2$ is acetyl, and X" is *—O—*.

A more specific example of a block copolymer for self-assembly has a structure according to formula (B-4):

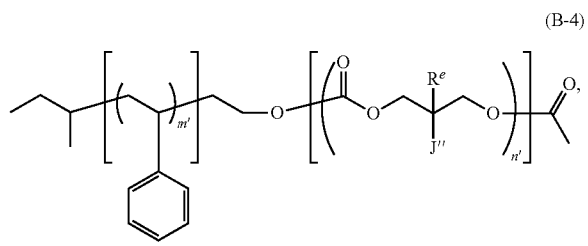

(B-4)

wherein each subscript m' and n' represents the average number of respective repeat units enclosed in parentheses, and independently has an average value greater than 1, each $R^e$ is an independent monovalent radical selected from the group consisting of hydrogen, methyl, and ethyl, and each J" is an independent monovalent radical selected from the group consisting of hydrogen and groups comprising 1 to 20 carbons.

In an embodiment, each $R^e$ is hydrogen and each J" is hydrogen. In another embodiment, each $R^e$ is methyl and each J" is *—$CO_2$Et.

Preparation of the Block Copolymers for Self-Assembly

The block copolymers for self-assembly are preferably prepared by ring opening polymerization of a cyclic carbonate monomer using a polymeric initiator having a backbone derived from a vinyl polymerizable monomer. For diblock and triblock copolymer formation, the polymeric initiator can comprise, respectively, 1 and 2 nucleophilic groups (e.g., *—OH, *—NH) capable of initiating the ROP of the cyclic carbonyl monomer. The ROP reaction mixture comprises a cyclic carbonyl monomer, a ROP catalyst, a solvent, and the polymeric initiator. The ROP catalyst is preferably an acid catalyst (e.g., diphenyl phosphate).

The following methods of forming a diblock copolymer can be applied to the preparations of triblock polymers and other block polymer architectures. The methods provide a block copolymer that is substantially free of any polycarbonate homopolymer and/or polycarbonate random copolymer.

Method 1

This method utilizes a solvent mixture to fractionate an initial block polymer formed when the ROP is conducted for a duration time corresponding to about 50% to 100%, more particularly about 85% to 100% consumption of a cyclic carbonate monomer. For a given set of reaction conditions (e.g., temperature, solvent, type of atmosphere, relative molar amounts, and other reaction parameters), the consumption of the cyclic carbonate monomer can be monitored using any suitable analytical technique (e.g., proton nuclear magnetic resonance ($^1$H NMR)).

The ROP produces an initial block polymer containing a living end group, which is a nucleophilic group capable of undergoing further chain growth and/or initiating a ROP of a different cyclic carbonyl monomer. Preferably, the active living end group is deactivated by addition of an endcapping agent to the reaction mixture, thereby terminating the polymerization and forming an endcapped initial block polymer containing a protected nucleophilic end group. The endcapped initial block polymer is not capable of initiating a ROP. As an example, a polycarbonate formed by ROP of a cyclic carbonate monomer has a living end containing a nucleophilic hydroxy group, which can be deactivated by addition of a suitable acylating agent (e.g., acetic anhydride) to form a protected hydroxy group (e.g., as an acetyl ester).

The isolated initial block polymer or the endcapped initial block polymer ("crude block polymer") can contain polymeric impurities derived from the cyclic carbonyl monomer that are not covalently linked to the polymeric initiator. Polymeric impurities can include polycarbonate homopolymer initiated by traces of water, and/or cyclic polycarbonate formed by backbiting of the living hydroxy end group on the polycarbonate backbone of the initial block polymer. These impurities can adversely affect the self-assembly properties of the initial block polymer.

The polymeric impurities can be removed by the following fractionation process. A first solution is prepared containing the initial block polymer dissolved in a minimal amount of a solvent (e.g., THF) capable of dissolving each block of the block polymer. The first solution contains the initial block polymer at a concentration of about 20 wt % based on total weight of the first solution. The first solution is then added to an excess amount (about 200 to 400 times the amount of crude polymer by weight) of a solvent mixture comprising a first solvent and a second solvent in a volume ratio of about 40:60 to about 60:40, respectively, wherein the first solvent is a non-solvent for the first block and the second block, and the second solvent is a non-solvent for the first block and a solvent for the second block. In an embodiment, the first solvent is MeOH and the second solvent is acetonitrile. The solvent mixture selectively dissolves the polymeric impurities, allowing the final block polymer to precipitate as a solid that can be substantially free of the polymeric impurities. The fractionation procedure can be repeated one or more times as necessary to form the block polymer used for self-assembly applications.

Method 2

In a second method, a trial ROP is performed using the given set of reaction conditions that includes the polymeric initiator. The amount of consumed cyclic carbonyl monomer is monitored (e.g., % consumption) as a function of ROP duration time t as in Method 1, allowing the ROP to proceed to 85% to 100% consumption of the cyclic carbonyl monomer. A graph is plotted of the percent consumption of the cyclic carbonate as a function of ROP duration time t in minutes.

From the scatter plot of the collected data points, a second order polynomial function F(t) (i.e., a trendline) can be fitted to the plotted points, wherein F(t) expresses the amount of consumed cyclic carbonyl monomer as a function of ROP duration time t. The $R^2$ (R-squared) coefficient for F(t) preferably has a value of about 0.85 to 1.0, more preferably 0.9 to 1.0.

Using the expression of F(t), a time $t_1$ corresponding to 50% consumption of the cyclic carbonyl monomer can be calculated.

The first derivative of F(t), denoted F'(t), is then calculated for each measurement time t.

The value of F'(t) at 50% cyclic monomer conversion is then determined. Using the value of F'($t_1$) at 50% cyclic monomer conversion, ROP duration times $t_2$ and $t_3$ are determined corresponding to a slope change of −10% and −20% relative to the slope at 50% consumption of cyclic carbonyl monomer.

The ROP is then conducted using the given reaction conditions, stopping the ROP at duration time (t'), wherein $t_1 \leq t' \leq t_3$, and more preferably $t_2 \leq t' \leq t_3$. Using these modified reaction conditions, a block polymer for self-assembly can be obtained directly that is free of, or substantially free of, polymer impurities that do not comprise a block derived from the polymeric initiator. Optionally, the block polymer can be further treated with the solvent mixture as described above under Method 1 to remove any remaining polymeric impurities.

Method 3

In Method 3, the mathematical expression for F'(t) is obtained as described above under Method 2. The value of F'(t) is then calculated for each ROP duration time t. Using the values of F'(t), the change in F'(t) between adjacent ROP duration times is calculated for each ROP duration time greater than 0. For example, the change in F'(t) at duration time $t_n$, denoted as $\Delta F'(t_n)$, is equal to $F'(t_n)-F'(t_{n-1})$, where n is a positive integer and $t_n>0$.

A second order polynomial trendline D(t) is obtained for a scatter plot of $\Delta F'(t)$ as a function of t having the shape of an inverted parabola. D(t) has a first derivative D'(t) equal to zero at some ROP duration time t">0 that is less than the duration time corresponding to 100% consumption of the cyclic carbonyl monomer.

The ROP is repeated using the given reaction conditions, terminating the ROP at 0.8t" to about t". The resulting final block polymer can be free of, or substantially free of, polymer impurities that do not comprise a block derived from the polymeric initiator. Optionally, the block polymer can be further treated with the solvent mixture as described above under Method 1 to remove any polymeric impurities present.

Cyclic Carbonyl Monomers

Exemplary cyclic carbonyl monomers include cyclic carbonate compounds of Scheme 20, which can be used, for example, to form a polycarbonate block of the initial block polymer.

Scheme 20.

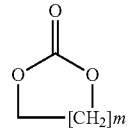

m = 1, Trimethylene carbonate (TMC)
m = 2, Tetramethylene carbonate (TEMC)
m = 3, Pentamethylene carbonate (PMC)

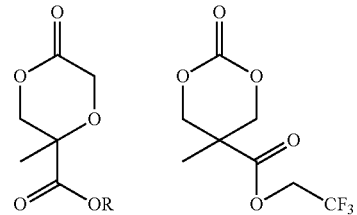

R = hydrogen (MTCOH)         (MTCTFE)
R = methyl (MTCOMe)
R = t-butyl (MTCO$^t$Bu)
R = ethyl (MTCOEt)
R = propyl (MTCOPr)

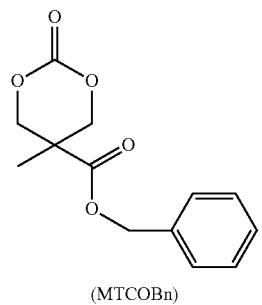

(MTCOBn)

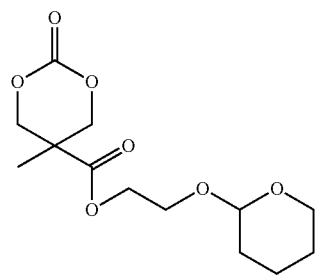

-continued

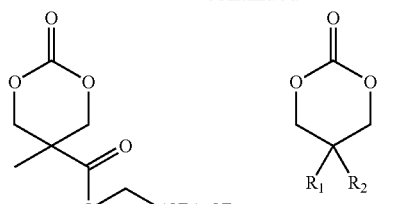

R₁ = R₂ = Methyl
R₁ = Methyl, R₂ = H
R₁ = R₂ = Ethyl
R₁ = Ethyl, R₂ = H

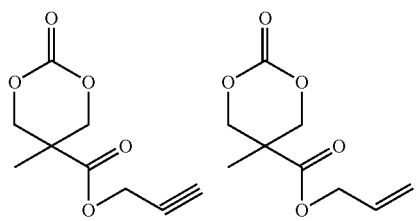

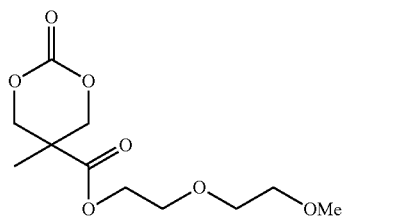

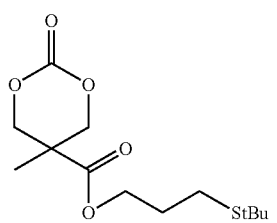

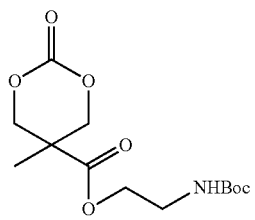

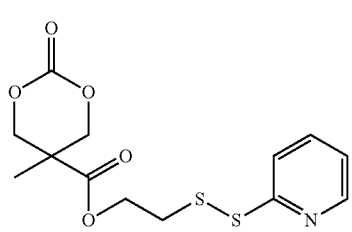

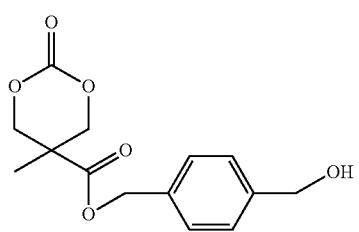

-continued

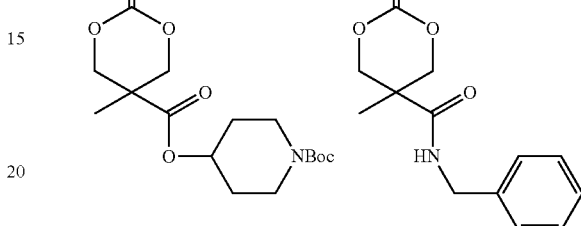

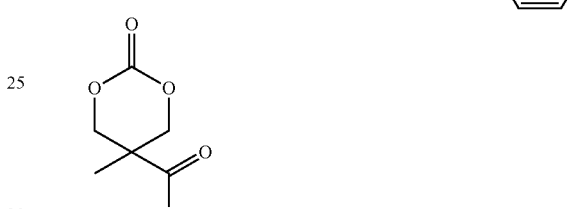

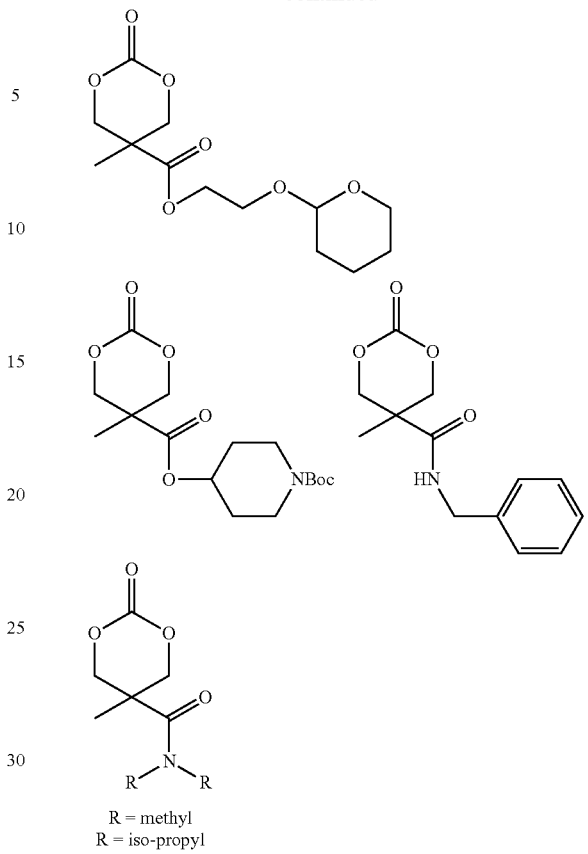

R = methyl
R = iso-propyl

Other cyclic carbonyl monomers include cyclic esters (lactones), such as the compounds of Scheme 21.

Scheme 21.

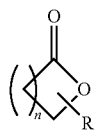

R = H, n = 1: beta-Propiolactone (b-PL)
R = H, n = 2: gamma-Butyrolactone (g-BL)
R = H, n = 3: delta-Valerolactone (d-VL)
R = H, n = 4: epsilon-Caprolactone (e-CL)
R = CH₃, n = 1: beta-Butyrolactone (b-BL)
R = CH₃, n = 2: gamma-Valerolactone (g-VL)

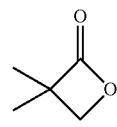

Pivalolactone (PVL)

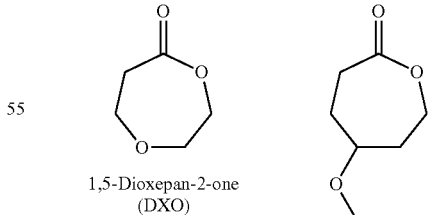

1,5-Dioxepan-2-one
(DXO)

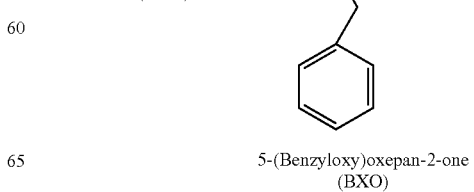

5-(Benzyloxy)oxepan-2-one
(BXO)

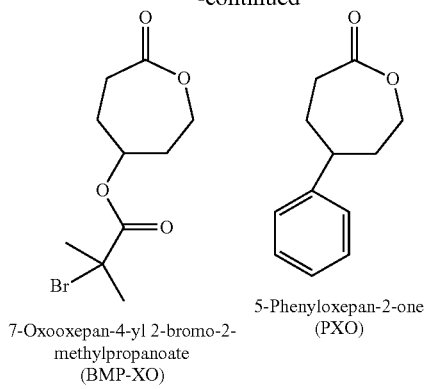

7-Oxooxepan-4-yl 2-bromo-2-methylpropanoate (BMP-XO)

5-Phenyloxepan-2-one (PXO)

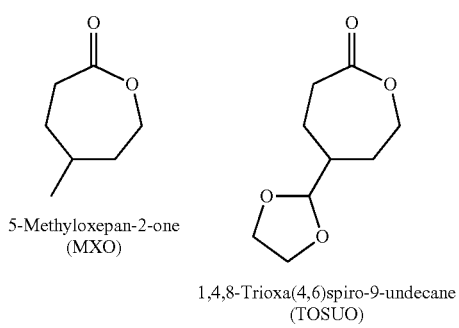

5-Methyloxepan-2-one (MXO)

1,4,8-Trioxa(4,6)spiro-9-undecane (TOSUO)

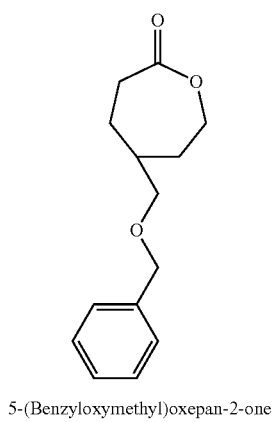

5-(Benzyloxymethyl)oxepan-2-one (BOMXO)

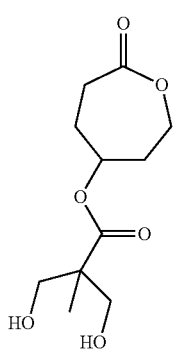

7-Oxooxepan-4-yl 3-hydroxy-2-(hydroxymethyl)-2-methylpropanoate (OX-BHMP)

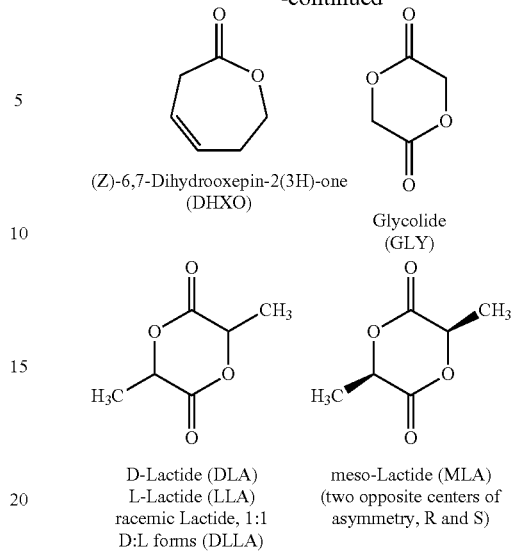

(Z)-6,7-Dihydrooxepin-2(3H)-one (DHXO)

Glycolide (GLY)

D-Lactide (DLA)
L-Lactide (LLA)
racemic Lactide, 1:1 D:L forms (DLLA)

meso-Lactide (MLA) (two opposite centers of asymmetry, R and S)

The above cyclic carbonyl monomers can be purified by recrystallization from a solvent such as ethyl acetate or by other known methods of purification, with particular attention being paid to removing as much water as possible from the monomer.

ROP Initiators for the Block Copolymers

Initiators for ring opening polymerizations generally include nucleophilic groups such as alcohols, primary amines, secondary amines, and thiols. Herein, the ROP initiator for the block copolymer is a polymeric initiator comprising a polymer backbone derived from a polymerizable vinyl monomer (styrenes, methacrylates, acrylates, methacrylamides, acrylamides, vinyl esters). An exemplary polymeric initiator is the functionalized polystyrene initiator PS-OH shown below.

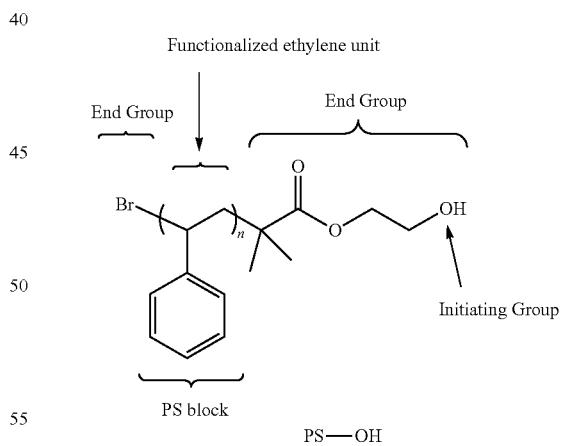

PS—OH

The polymeric initiator preferably comprises one or two nucleophilic hydroxy groups for initiating a ROP and forming diblock, triblock, and tetrablock copolymers, respectively. In an embodiment, the polymeric initiator comprises two nucleophilic initiating groups, and the block copolymer formed by the ROP is a mikto-armed star polymer comprising 4 arms. A mikto-arm star polymer has a chemical structure comprising 3 or more polymer arms linked to a core of the star polymer, and at least one arm has a different polymer composition compared to another of the arms.

The number average molecular weight of the polymeric initiator can be from 1000 to 1,000,000, more specifically 1000 to 100,000, and even more specifically, 1000 to 50,000.

An exemplary non-limiting reaction to form a block copolymer is illustrated in Scheme 22 using another macroinitiator AZPS-OH.

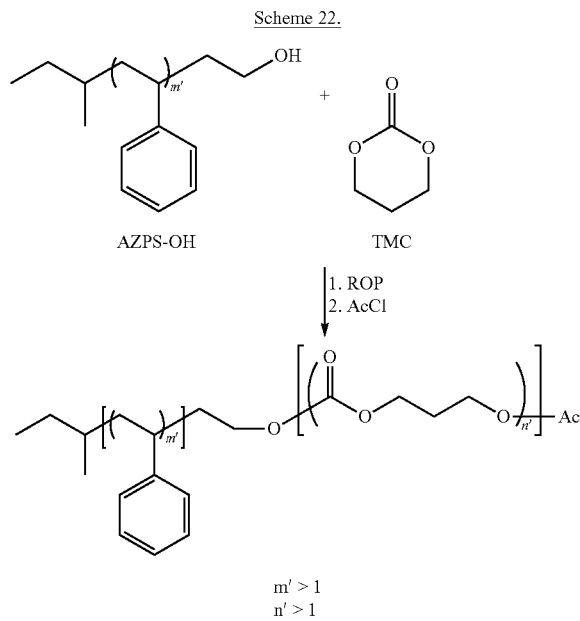

Ring Opening Polymerizations (ROP)

The following description of methods, conditions and materials for ring opening polymerizations is applicable to the preparation of the random copolymer for orientation control material and/or the block polymer for self-assembly.

The ring-opening polymerization can be performed at a temperature that is about ambient temperature or higher, 15° C. to 100° C., and more specifically ambient temperature. Reaction times vary with solvent, temperature, agitation rate, pressure, and equipment, but in general the polymerizations are complete within about 1 hour to about 48 hours.

The ROP reaction can be performed with or without the use of a solvent, preferably with a solvent. Exemplary solvents include dichloromethane, chloroform, benzene, toluene, xylene, chlorobenzene, dichlorobenzene, benzotrifluoride, petroleum ether, acetonitrile, pentane, hexane, heptane, 2,2,4-trimethylpentane, cyclohexane, diethyl ether, t-butyl methyl ether, diisopropyl ether, dioxane, tetrahydrofuran, or a combination comprising one of the foregoing solvents. When a solvent is present, a suitable monomer concentration is about 0.1 to 5 moles per liter, and more particularly about 0.2 to 4 moles per liter.

Whether performed in solution or in bulk, the ROP polymerizations are conducted using an inert (i.e., dry) atmosphere, such as nitrogen or argon, and at a pressure of from 100 to 500 MPa (1 to 5 atm), more typically at a pressure of 100 to 200 MPa (1 to 2 atm). At the completion of the reaction, the solvent can be removed using reduced pressure.

ROP Catalysts

No restriction is placed on the ROP catalyst. Less preferred catalysts for the ROP polymerization include metal oxides such as tetramethoxy zirconium, tetra-iso-propoxy zirconium, tetra-iso-butoxy zirconium, tetra-n-butoxy zirconium, tetra-t-butoxy zirconium, triethoxy aluminum, tri-n-propoxy aluminum, tri-iso-propoxy aluminum, tri-n-butoxy aluminum, tri-iso-butoxy aluminum, tri-sec-butoxy aluminum, mono-sec-butoxy-di-iso-propoxy aluminum, ethyl acetoacetate aluminum diisopropylate, aluminum tris(ethyl acetoacetate), tetraethoxy titanium, tetra-iso-propoxy titanium, tetra-n-propoxy titanium, tetra-n-butoxy titanium, tetra-sec-butoxy titanium, tetra-t-butoxy titanium, tri-iso-propoxy gallium, tri-iso-propoxy antimony, tri-iso-butoxy antimony, trimethoxy boron, triethoxy boron, tri-iso-propoxy boron, tri-n-propoxy boron, tri-iso-butoxy boron, tri-n-butoxy boron, tri-sec-butoxy boron, tri-t-butoxy boron, tri-iso-propoxy gallium, tetramethoxy germanium, tetraethoxy germanium, tetra-iso-propoxy germanium, tetra-n-propoxy germanium, tetra-iso-butoxy germanium, tetra-n-butoxy germanium, tetra-sec-butoxy germanium and tetra-t-butoxy germanium; halogenated compounds such as antimony pentachloride, zinc chloride, lithium bromide, tin(IV) chloride, cadmium chloride and boron trifluoride diethyl ether; alkyl aluminum such as trimethyl aluminum, triethyl aluminum, diethyl aluminum chloride, ethyl aluminum dichloride and tri-iso-butyl aluminum; alkyl zinc such as dimethyl zinc, diethyl zinc and diisopropyl zinc; tertiary amines such as triallylamine, triethylamine, tri-n-octylamine and benzyldimethylamine; heteropolyacids such as phosphotungstic acid, phosphomolybdic acid, silicotungstic acid and alkali metal salts thereof; zirconium compounds such as zirconium acid chloride, zirconium octanoate, zirconium stearate and zirconium nitrate. More particularly, the zirconium catalyst can be zirconium octanoate, tetraalkoxy zirconium or a trialkoxy aluminum compound.

Preferred ROP catalysts are organocatalysts whose chemical formulas contain no metal. Base organocatalysts for ROPs of cyclic carbonyl monomers include tertiary amines such as triallylamine, triethylamine, tri-n-octylamine and benzyldimethylamine 4-dimethylaminopyridine, phosphines, N-heterocyclic carbenes (NHC), bifunctional aminothioureas, phosphazenes, amidines, and guanidines.

A thiourea ROP organocatalyst is N-(3,5-trifluoromethyl)phenyl-N'-cyclohexyl-thiourea (TU):

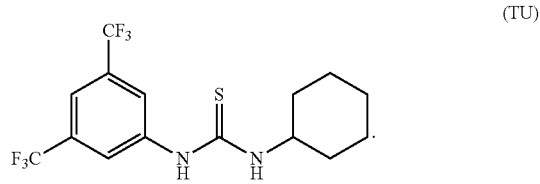 [SMILES: FC(F)(F)c1cc(NC(=S)NC2CCCCC2)cc(C(F)(F)F)c1]

Other ROP organocatalysts comprise at least one 1,1,1,3,3,3-hexafluoropropan-2-ol-2-yl (HFA) group. Singly-donating hydrogen bond catalysts have the formula (C-1):

$$R^2\text{—}C(CF_3)_2OH \quad (C\text{-}1),$$

wherein $R^2$ represents a hydrogen or a monovalent radical having from 1 to 20 carbons, for example an alkyl group, substituted alkyl group, cycloalkyl group, substituted cycloalkyl group, heterocycloalkyl group, substituted heterocycloalkyl group, aryl group, substituted aryl group, or a combination thereof. Exemplary singly-donating hydrogen bonding catalysts are listed in Scheme 23.

Scheme 23.

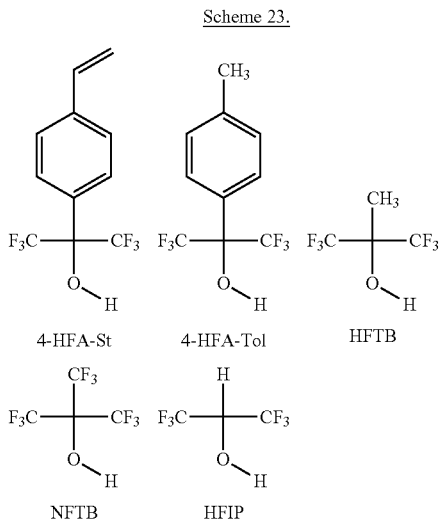

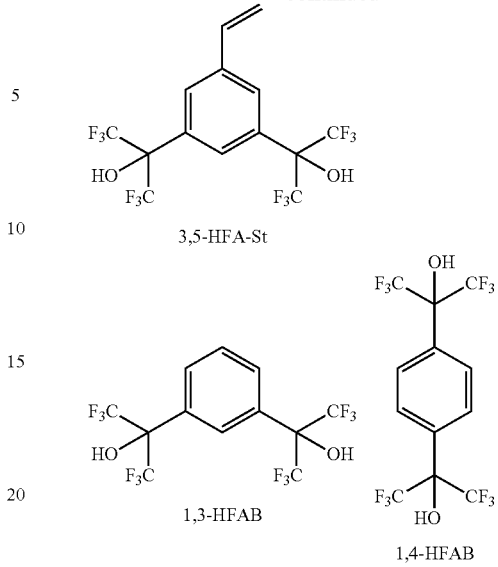

Doubly-donating hydrogen bonding catalysts have two HFA groups, represented by the general formula (C-2):

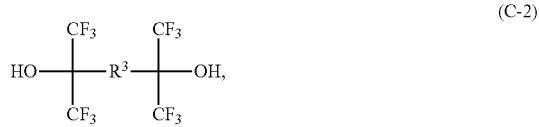

wherein $R^3$ is a divalent radical bridging group containing from 1 to 20 carbons, such as an alkylene group, a substituted alkylene group, a cycloalkylene group, substituted cycloalkylene group, a heterocycloalkylene group, substituted heterocycloalkylene group, an arylene group, a substituted arylene group, or a combination thereof. Representative double hydrogen bonding catalysts of formula (C-2) include those listed in Scheme 24. In a specific embodiment, $R^2$ is an arylene or substituted arylene group, and the HFA groups occupy positions meta to each other on the aromatic ring.

Scheme 24.

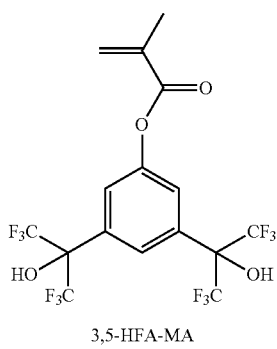

3,5-HFA-MA

Preferred hydrogen bonding catalysts include 4-HFA-St, 4-HFA-Tol, HFTB, NFTB, HPIP, 3,5-HFA-MA, 3,5-HFA-St, 1,3-HFAB, 1,4-HFAB, and combinations thereof.

The HFA catalyst can be bound to a support. In one embodiment, the support comprises a polymer, a crosslinked polymer bead, an inorganic particle, or a metallic particle. HFA-containing polymers can be formed by known methods including direct polymerization of an HFA-containing monomer (for example, the methacrylate monomer 3,5-HFA-MA or the styryl monomer 3,5-HFA-St). Functional groups in HFA-containing monomers that can undergo direct polymerization (or polymerization with a comonomer) include acrylate, methacrylate, alpha, alpha, alpha-trifluoromethacrylate, alpha-halomethacrylate, acrylamido, methacrylamido, norbornene, vinyl, vinyl ether, and other groups known in the art. Examples of linking groups include $C_1$-$C_{12}$ alkyl groups, $C_1$-$C_{12}$ heteroalkyl groups, ether groups, thioether groups, amino groups, ester groups, amide groups, and combinations thereof. Also contemplated are catalysts comprising charged HFA-containing groups bound by ionic association to oppositely charged sites on a polymer or a support surface.

Most preferably, the ROP catalyst is an acid organocatalyst (e.g., diphenylphosphate (DPP), triflic acid, and the like).

The ROP reaction mixture comprises at least one ROP catalyst and, when appropriate, several ROP catalysts together. The ROP catalyst is added in a proportion of 1/20 to 1/40,000 moles relative to the cyclic carbonyl monomers, and preferably in a proportion of 1/1,000 to 1/20,000 moles relative to the cyclic carbonyl monomers. ROP Accelerators.

The ROP polymerization can be conducted in the presence of an optional accelerator, in particular a nitrogen base. Exemplary nitrogen base accelerators are listed below and include pyridine (Py), N,N-dimethylaminocyclohexane ($Me_2NCy$), 4-N,N-dimethylaminopyridine (DMAP), trans 1,2-bis(dimethylamino)cyclohexane (TMCHD), 1,8-diazabicyclo[5.4.0]undec-7-ene (DBU), 1,5,7-triazabicyclo[4.4.0]dec-5-ene (TBD), 7-methyl-1,5,7-triazabicyclo[4.4.0]dec-5-ene (MTBD), (−)-sparteine, (Sp) 1,3-bis(2-propyl)-4,5-dimethylimidazol-2-ylidene (Im-1), 1,3-bis(2,4,6-trimethylphenyl)imidazol-2-ylidene (Im-2), 1,3-bis(2,6-di-i-propylphenyl(imidazol-2-ylidene) (Im-3), 1,3-bis(1- adamantyl)imidazol-2-ylidene (Im-4), 1,3-di-i-propylimidazol-2-ylidene (Im-5), 1,3-di-t-butylimidazol-2-ylidene (Im-6), 1,3-bis(2,4,6-trimethylphenyl)-4,5-dihydroimidazol-2-ylidene (Im-7), 1,3-bis(2,6-di-i-propylphenyl)-4,5-dihydroimidazol-2-ylidene, 1,3-bis(2,6-di-i-propylphenyl)-4,5-dihydroimidazol-2-ylidene (Im-8) or a combination thereof, shown in Scheme 25.

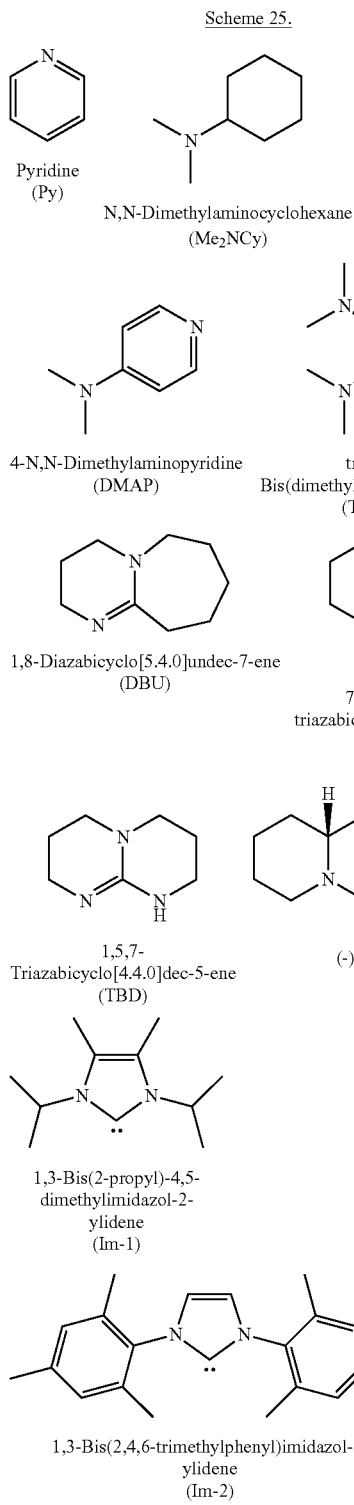
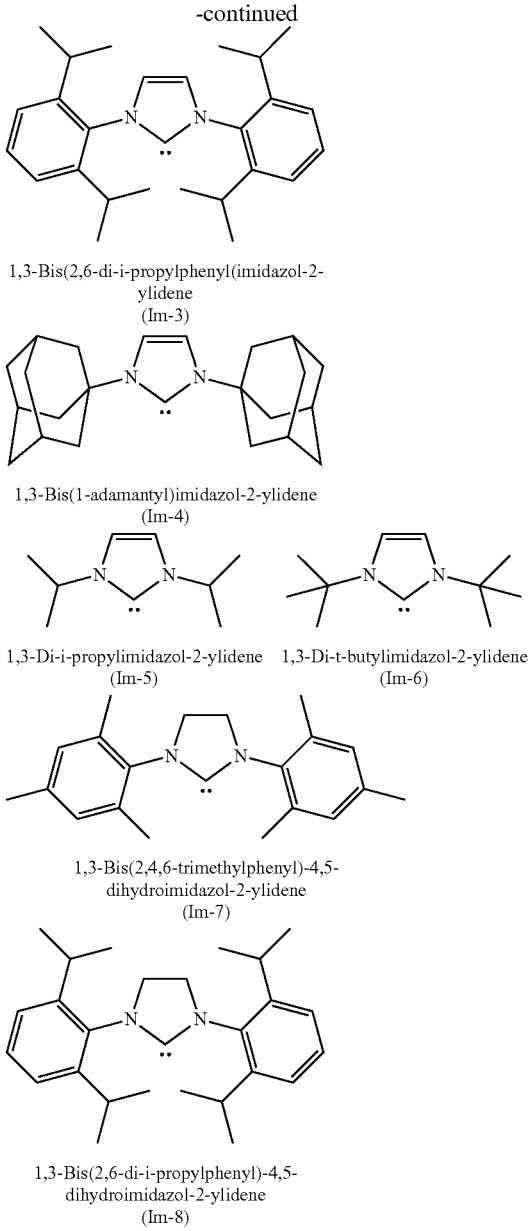

In an embodiment, the accelerator has two or three nitrogens, each capable of participating as a Lewis base, as for example in the structure (−)-sparteine. Stronger bases generally improve the polymerization rate.

The catalyst and the accelerator can be the same material. For example, some ring opening polymerizations can be conducted using 1,8-diazabicyclo[5.4.0]undec-7-ene (DBU) alone, with no another catalyst or accelerator present.

The catalyst is preferably present in an amount of about 0.2 to 20 mol %, 0.5 to 10 mol %, 1 to 5 mol %, or 1 to 2.5 mol %, based on total moles of cyclic carbonyl monomer.

The nitrogen base accelerator, when used, is preferably present in an amount of 0.1 to 5.0 mol %, 0.1 to 2.5 mol %, 0.1 to 1.0 mol %, or 0.2 to 0.5 mol %, based on total moles of cyclic carbonyl monomer. As stated above, in some instances the catalyst and the nitrogen base accelerator can be the same compound, depending on the particular cyclic carbonyl monomer.

The amount of initiator is calculated based on the equivalent molecular weight per nucleophilic initiator group in the dinucleophilic initiator. The initiator groups are preferably present in an amount of 0.001 to 10.0 mol %, 0.1 to 2.5 mol %, 0.1 to 1.0 mol %, and 0.2 to 0.5 mol %, based on total moles of cyclic carbonyl monomer. For example, if the molecular weight of the initiator is 100 g/mole and the initiator has 2 hydroxyl groups, the equivalent molecular weight per hydroxyl group is 50 g/mole. If the polymerization calls for 5 mol % hydroxyl groups per mole of monomer, the amount of initiator is 0.05×50=2.5 g per mole of monomer.

In a specific embodiment, the catalyst is present in an amount of about 0.2 to 20 mol %, the nitrogen base accelerator is present in an amount of 0.1 to 5.0 mol %, and the nucleophilic initiator groups of the initiator are present in an amount of 0.1 to 5.0 mol % based on the equivalent molecular weight per nucleophilic initiator group of the initiator.

The catalysts can be removed by selective precipitation or in the case of the solid supported catalysts, simply by filtration. The block polymer can comprise residual catalyst in an amount of 0 wt % (weight percent) or more, based on total weight of the block copolymer and the residual catalyst. The amount of residual catalyst can also be less than 20 wt %, less than 15 wt %, less than 10 wt %, less than 5 wt %, less than 1 wt %, or most specifically less than 0.5 wt % based on the total weight of the block copolymer and the residual catalyst.

Endcap Agents

An endcap agent can prevent further chain growth and stabilize the reactive end groups from unwanted side reactions, such as chain scission. Endcap agents include, for example, compounds for converting terminal hydroxyl groups to esters, such as acid anhydrides (e.g., acetic anhydride), acid chlorides (acetyl chloride), and/or active esters (e.g., p-nitrophenyl esters). Other endcap agents include alkyl and aryl isocyanates, which form carbamates (urethanes) with terminal hydroxy groups. Other endcap agents include alkylating agents capable of forming alkyl ethers, aromatic ethers including benzyl ethers, silyl ethers, acetals, ketals, and the like. Still other endcap agents include perhalogenated (e.g., perfluorinated) derivatives of any of the foregoing endcap agents. In an embodiment, the endcap agent is acetic anhydride, which converts reactive hydroxy end groups to acetate ester groups.

Average Molecular Weight.

The block polymer used for self-assembly preferably has a number average molecular weight Mn as determined by size exclusion chromatography of at least 1500 g/mol, more specifically 1500 g/mol to 1,000,000 g/mol, 4000 g/mol to 150000 g/mol, or 4000 g/mol to 50000 g/mol. In an embodiment, the final block polymer has a number average molecular weight Mn of 8,000 to 40,000 g/mole.

The block polymer used for self-assembly also preferably has a narrow polydispersity index (PDI), generally from 1.01 to 2.0, more particularly 1.01 to 1.30, and even more particularly 1.01 to 1.25.

Layered Structures

The substrate is a layered structure, which can comprise an orientation control layer (underlayer). The orientation control layer of the substrate comprises a covalently bound form of the above-described random copolymer of the underlayer linked to the surface of the underlying layer of the substrate. The covalently bound random copolymer comprises a divalent first repeat unit of formula (A-1), a divalent second repeat unit of formula (A-2), and a trivalent third repeat unit of formula (A-8):

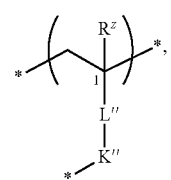

(A-8)

wherein $R^z$ is a monovalent radical selected from the group consisting of H, methyl, ethyl, and trifluoromethyl (*—$CF_3$), L" is an independent divalent linking group comprising 1 to 10 carbons, and K" is a divalent linking group, and the starred bond of K" is covalently linked to a surface group of the substrate, and the first repeat unit, second repeat unit, and third repeat are randomly covalently bound in the chemical structure of the random copolymer.

An orientation control layer can be formed by disposing on a first layered structure (first substrate) a solution containing an above-described random copolymer for the underlayer, a solvent, and optionally a member of the group consisting of thermal acid generators (TAGs), photo-acid generators (PAGs), catalysts, and combinations thereof, and removing the solvent (e.g., by a thermal bake and/or exposure to actinic light), thereby forming a second layer structure (second substrate) comprising an top orientation control layer. The orientation control layer comprises a covalently bound form of the random copolymer linked to an underlying layer of the first layered structure. Optionally, the second layered structure can be rinsed with a solvent to remove any un-bound random copolymer. The orientation control layer is neutral wetting with respect to the high-chi block copolymer for self-assembly, which comprises a polycarbonate block. The thermal bake can be performed at a temperature of about 100° C. to about 250° C. for about 1 second to about 24 hours, preferably about 120° C. to about 250° C. for 1 minute to 5 minutes.

Also disclosed are compositions for preparing the SA layers. The compositions comprise a solvent, a high-chi block copolymer, and an SAP. The block copolymer and the SAP are dissolved in the solvent. The compositions are suitable for forming a film layer (SA layer) comprising the block copolymer. The film layer is preferably disposed on an orientation control layer (underlayer). The film layer has a top surface in contact with the atmosphere. The film layer comprises the block copolymer and the polymer additive in non-covalent association.

The following schematic diagrams illustrate methods of forming substrates comprising underlayers for orientation control and their use in forming perpendicularly oriented lamellar domain patterns with high-chi block copolymers.

FIGS. 1A to 1F are cross-sectional layer diagrams illustrating a process of directed self-assembly of an SA layer comprising a high-chi block copolymer and SAP additive, which produces perpendicularly oriented lamellar domains without employing a lithographically prepared topographic or chemical pre-pattern. It should be understood that the layers and features are not drawn to scale.

Layered structure 10 of FIG. 1A comprises substrate 11 having substrate surface 12. Substrate 11 can comprise one or more layers (not shown). A solution comprising a disclosed random copolymer for orientation control, which is dissolved in a suitable solvent, is applied to substrate surface 12 (e.g., by spin coating), followed by removal of any solvent, resulting in layered structure 20 (FIG. 1B), also referred to as a "modified substrate". Layered structure 20 comprises underlayer 21 for orientation control, which comprises the random copolymer bound by at least one covalent bond to substrate 11. Optionally, layered structure 20 can be rinsed with a solvent to remove any un-bound random copolymer.

Figure 1C:
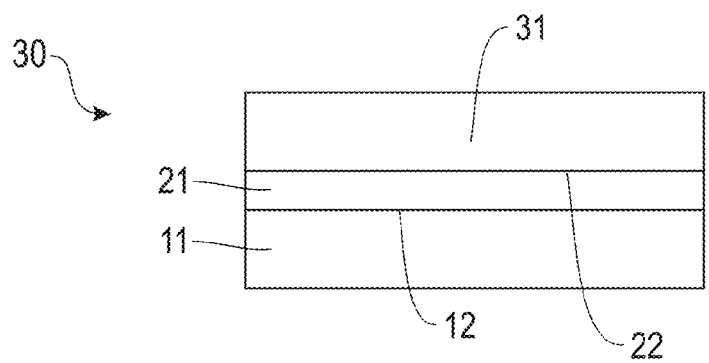
Figure 1D:
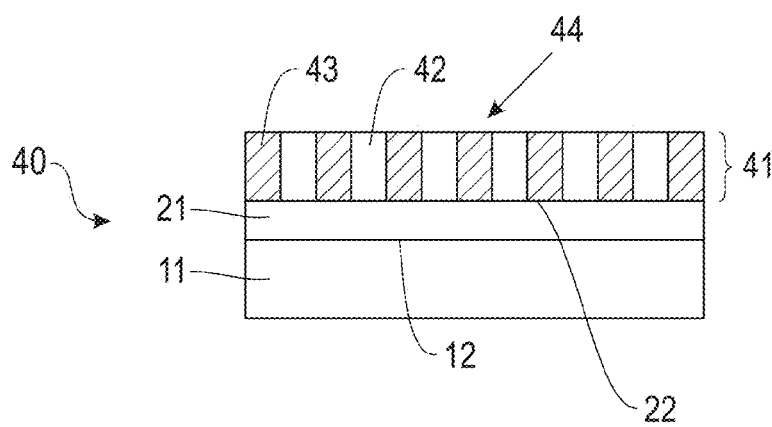
Figure 1E:
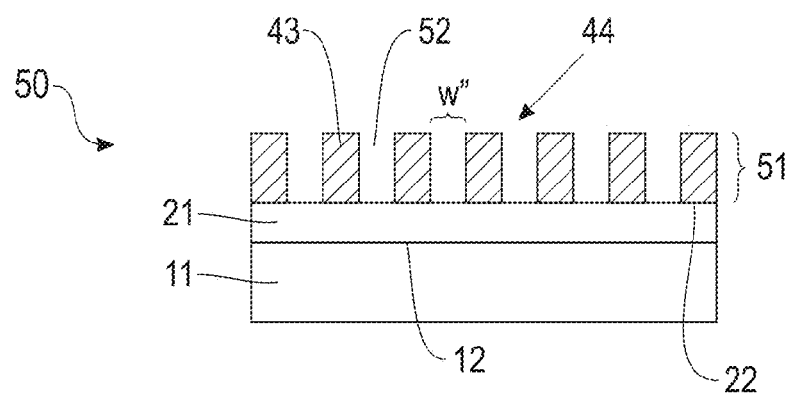
Figure 1F:
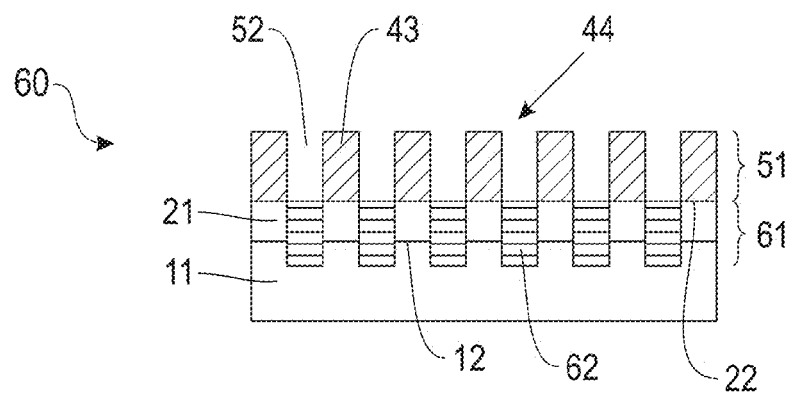

Underlayer 21 has underlayer surface 22. A solution comprising a disclosed high-chi block copolymer comprising a polycarbonate block for self-assembly (SA material), a disclosed SAP, and a solvent is applied to underlayer surface 22 using any suitable technique (e.g., spin coating). Removal of the solvent followed by an optional post-application bake (PAB) (e.g., 115° C. for 1 minute) produces layered structure 30 (FIG. 1C). Layered structure 30 comprises SA layer 31 comprising the block copolymer and SAP. SA layer 31 is disposed on underlayer surface 22. SA layer 31 is then subjected to conditions effective in inducing the block copolymer to self-assemble (e.g., annealing layered structure 30 at a temperature of 120° C. to 250° C. for about 1 minute to about 24 hours), thereby forming layered structure 40 (FIG. 1D). Layered structure 40 comprises perpendicularly oriented lamellar domain pattern 41 of self-assembled block copolymer disposed on underlayer surface 22. Domain pattern 41 comprises first lamellar domain 43 comprising a first block of the block copolymer (e.g., block A, polystyrene) and second lamellar domain 42 comprising a polycarbonate block (e.g., block B) of the high-chi block copolymer. Second lamellar domain 42 has a higher concentration of SAP than first lamellar domain 43 (not shown). In this instance the lamellae of each of the domains formed by the block copolymer are in contact with atmosphere interface 44 and underlayer surface 22. Self-assembly of SA layer is conducted with the top surface of SA layer 31 in contact atmosphere interface 44.

One of the domains can be selectively removed (e.g., etched) or modified in the presence of the other domain. As an example, dry etching using a suitable gas ($O_2$) or wet/chemical etching technique can be used to selectively etch second lamellar domain 42. As another example, second lamellar domain 42 (polycarbonate block) can be selectively etched by modifying second lamellar domain 42 by i) sequential infiltration synthesis (SIS) to infuse metal oxide precursors or ii) by solution infiltration of second lamellar domain 42 with metal salts, followed by ion-etching. Selective removal of one of the domains can also remove underlying orientation control material of the underlayer (not shown).

Selective removal of one of the domains produces layered structure 50 (FIG. 1E) comprising etched domain pattern 51. In this example, etched domain pattern 51 comprises first lamellar domain 43 disposed on underlayer surface 22, and openings 52 (shown). Alternatively, first lamellar domain 43 can be selectively removed leaving second lamellar domain 42 (not shown). Lamellae of first lamellar domain 43 can have different dimensions after removing second lamellar domain 42 compared to their dimensions before the selective removal. Openings 52 can have a width w" of about 0.5Lo, (e.g., for low-chi SA materials, w" is about 10 nm to about 100 nm). The selective removal process may be carried out by a thermal bake (for thermally decomposable materials), a reactive ion etch process, dissolution in a selective solvent, or a combination thereof. A chemical modification can be accomplished by a variety of known methods. For example, domains can be selectively reacted with silanes or silyl chlorides to introduce silicon content into a domain and thereby increase its plasma etch resistance. Alternatively, chemical agents can be used to bind or chemically couple to functional groups that are exclusively located in one type of self-assembled domain, to effect, for example, increased solubility property differences that can advantageously be used to selectively remove one domain in the presence of the other domain.

Lastly, etched domain pattern 51 can be transferred to substrate 11, thereby forming layered structure 60 (FIG. 1F) comprising transfer pattern 61. Patterned region 61 can be a pattern of lines, holes, pits, and/or a chemically altered state of the underlayer 21 and/or substrate 11, which are represented by areas 62. Patterned region 61 can extend into one or more layers, including the underlayer 21 and/or the substrate 11 (shown). The pattern transfer process can further comprise removal of first lamellar domain 43 (not shown).

FIGS. 2A to 2E are cross-sectional layer diagrams illustrating a lithographic process utilizing a pre-formed topographic pre-pattern with the disclosed underlayer and SA layer comprising a high-chi block copolymer and SAP. Layered structure 100 (FIG. 2A) comprises substrate 110 comprising underlayer 102 disposed on surface 103 of bottom layer 101 (e.g., silicon wafer). Topographic pre-pattern 104 is disposed on underlayer surface 105. Underlayer 102 comprises a form of the disclosed random copolymer bound by at least one covalent bond to surface 103. Bottom layer 101 can comprise one or more sub-layers (not shown). Topographic pre-pattern 104 comprises features 106 (e.g., resist features). Features 106 have sidewalls 107 of height h', and top surfaces 108 of width w'. Features 106 are separated by trenches 109 (recessed areas) which include bottom surfaces 112 comprising material of underlayer 102 in contact with an atmosphere. Pre-pattern 104 can be formed by any suitable lithographic technique. Features 106 can comprise any suitable material 111 for directing self-assembly. For example, features 106 can comprise a resist material, which can be a positive and/or negative tone resist material.

In the present invention, the topography of pre-pattern 104 is not essential for orientation control of the self-assembled lamellar domains of the high-chi block copolymer. The SA layer is allocated substantially or wholly within the trench areas 109 of features 106. Height h' of features 106 is typically greater than or comparable to the thickness of the SA layer. Bottom surface 112 is neutral wetting to the SA material (block copolymer), whereas the air interface is not neutral to the SA material. In this example, sidewalls 107 can be neutral wetting or non-neutral wetting to the block copolymer, with the proviso that the surface properties of the sidewalls do not adversely affect self-assembly and orientation of the domains formed.

Figure 2A:
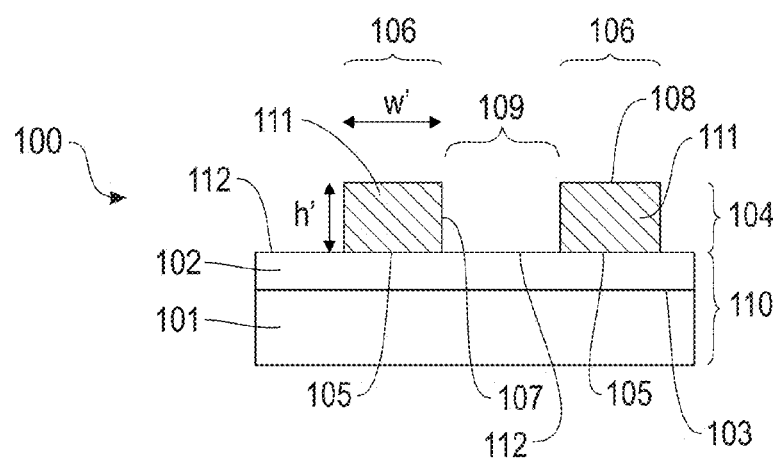
FIGS. 2A to 2E are cross-sectional layer diagrams showing a process of forming a perpendicularly oriented lamellar domain pattern in the presence of a topographic pre-pattern. The air interface is not neutral wetting to the block copolymer in the absence of the SAP. The air interface becomes neutral wetting to the block copolymer during self-assembly. The resist features can be non-neutral wetting to the SA layer comprising the high-chi block copolymer and SAP.
Figure 2B:
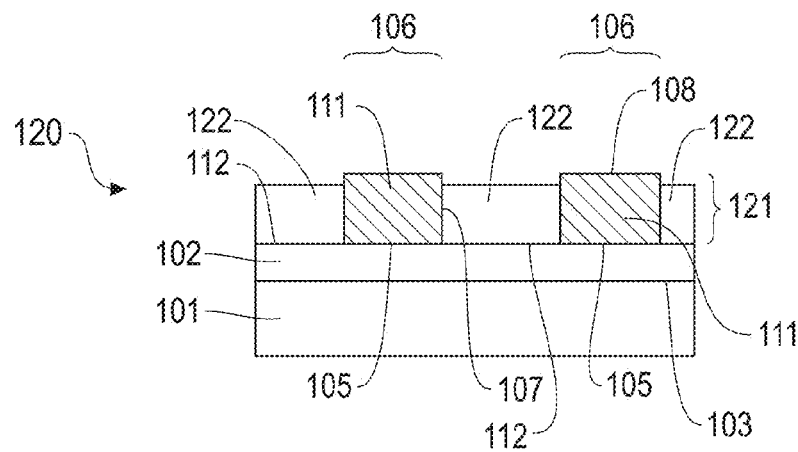
Figure 2C:
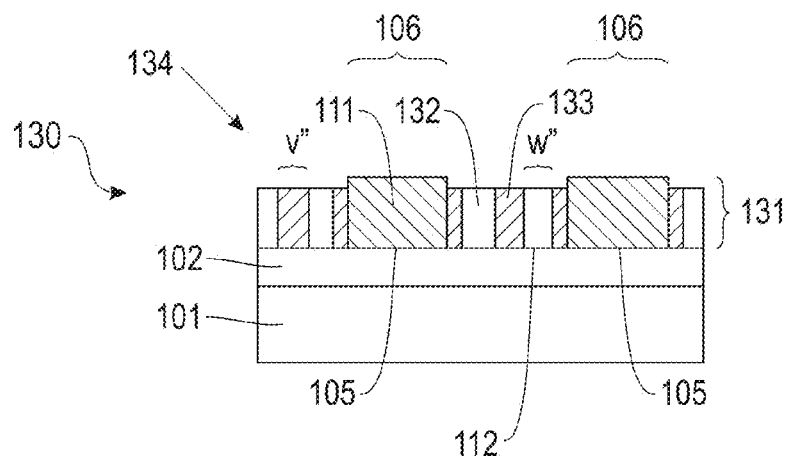

A coating mixture comprising the SA material (a high-chi block copolymer) and SAP dissolved in a solvent is applied to topographic pre-pattern 104 using any suitable technique (e.g., spin coating), thereby allocating the mixture substantially or exclusively in trench areas 109. Topographic pre-pattern 104 is insoluble in or substantially insoluble in the solvent used to prepare the mixture. Removal of the solvent from the applied coating mixture provides layered structure 120 comprising SA layer 121 (FIG. 2B). SA layer 121 comprises regions 122 comprising the SA material (high-chi block copolymer) and SAP. SA layer 121 is disposed on bottom surfaces 112 of trench areas 109.

Self-assembly of the high-chi block copolymer produces layered structure 130 (FIG. 2C) comprising perpendicularly oriented lamellar domain pattern 131. Self-assembly can be spontaneous and/or assisted by a thermally treating (annealing) layer 121. Domain pattern 131 comprises first lamellar domain 133 (e.g., PS) having a width of v'', and second lamellar domain 132 (e.g., polycarbonate) having a width w'' and disposed on bottom surface 112 of trench areas 109. Atmosphere interface 134 is indicated by the arrow. In this example, sidewalls 107 of features 106 have preferential affinity for first lamellar domains 133. Therefore, first lamellar domain 133 are positioned in contact with sidewalls 107. First lamellar domain 133 in contact with sidewalls 107 can have a width of about 0.5v''. In an embodiment, v'' and w'' are about equal to 0.5Lo.

Figure 2D:
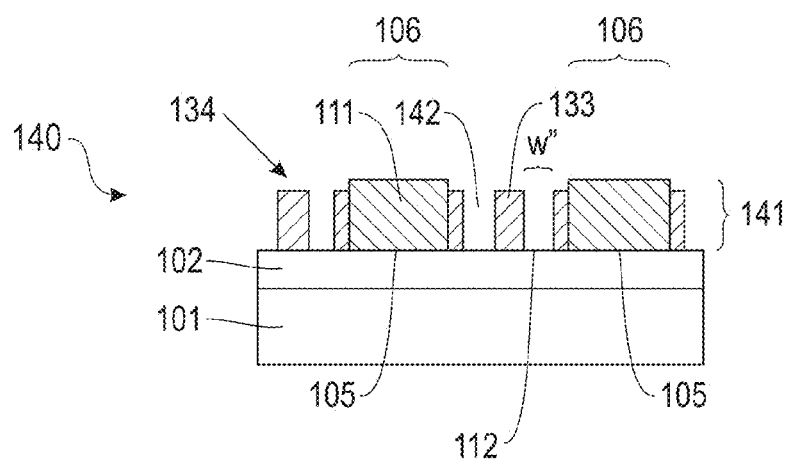

One of the domains, for example second lamellar domain 132 (e.g., polycarbonate block), can be selectively removed (e.g., ion-etched) or modified in the presence of the first lamellar domain 133 (e.g., PS block) to generate topographical or chemical contrast. Selective removal of one of the domains can also remove underlying orientation control material (not shown), producing layered structure 140 comprising etched domain pattern 141 (FIG. 2D). Etched domain pattern 141 comprises first lamellar domain 133 disposed on underlayer surface 112, openings 142, and features 106. Openings 142 can have a width w'' of about 0.5Lo (e.g., for a high-chi block copolymer, w'' can be about 2 nm to about 10 nm). The selective removal process may be carried out by a thermal bake (for thermally decomposable materials), a reactive ion etch process, dissolution in a selective solvent, or a combination thereof. A chemical modification may be accomplished by a variety of known methods as discussed above. The selective removal process can further remove features 106 (not shown).

Figure 2E:
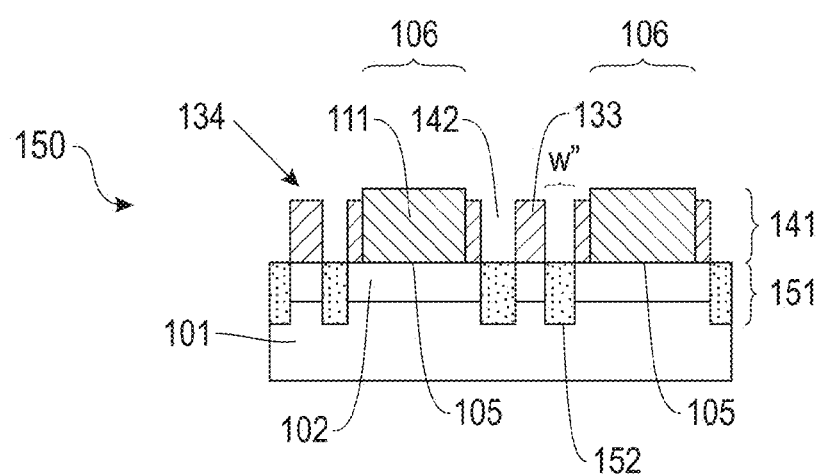
Figure 7:
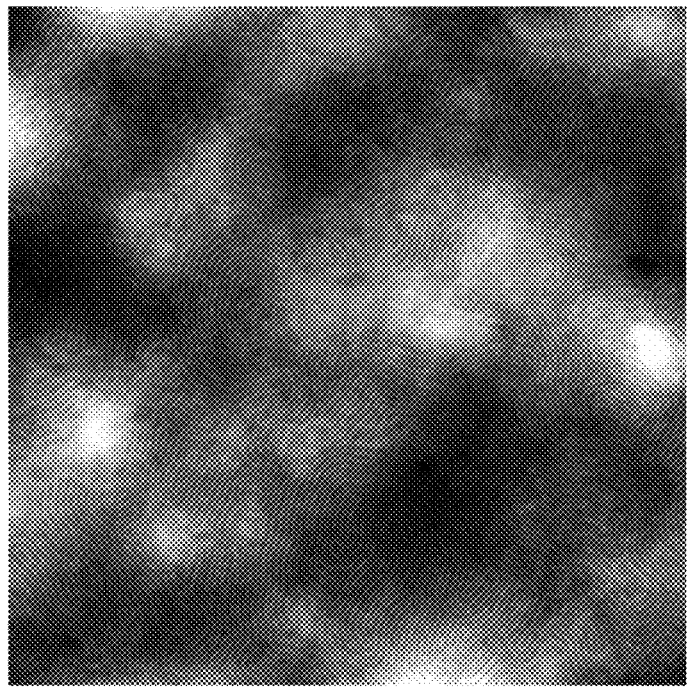
Figure 6:
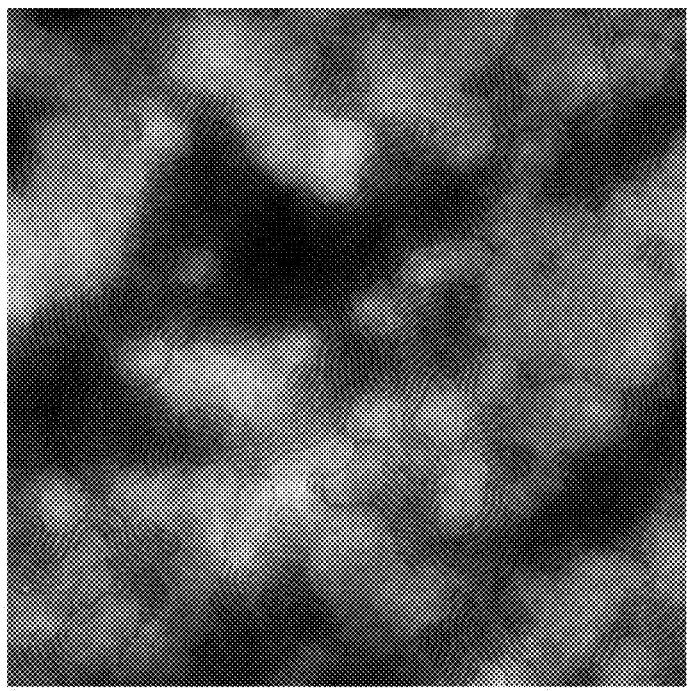
Figure 9:
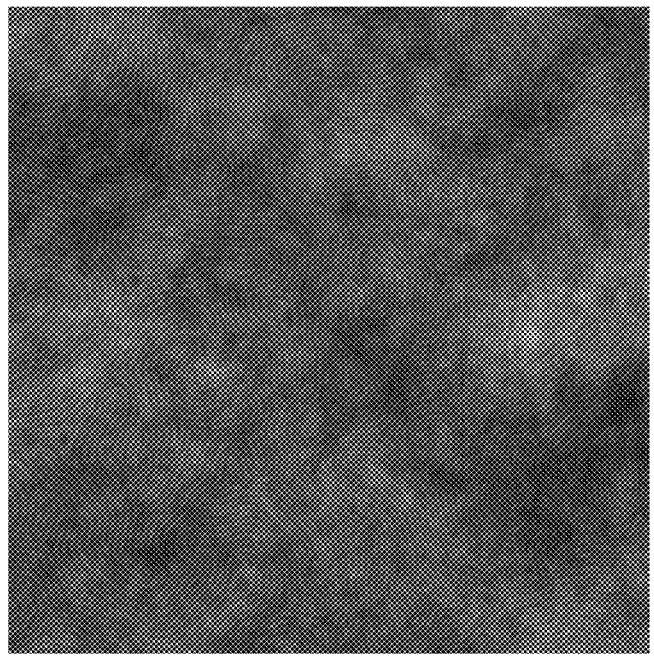
Figure 8:
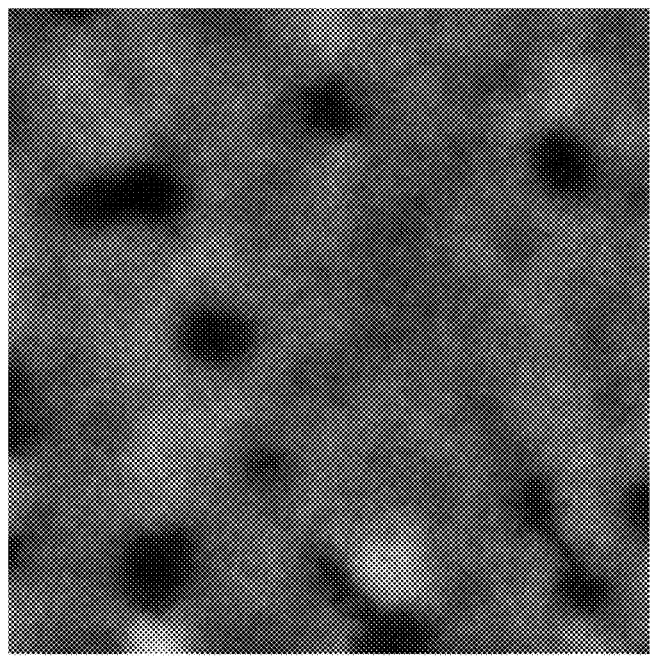
Figure 11:
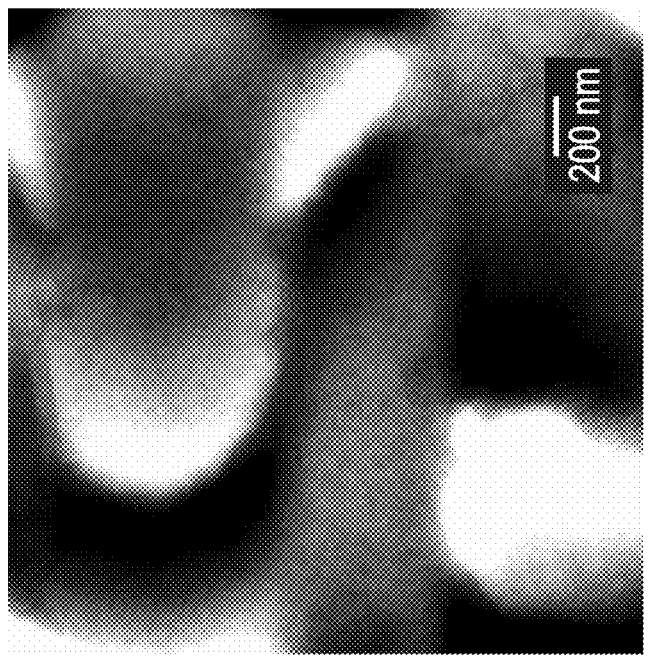
Figure 10:
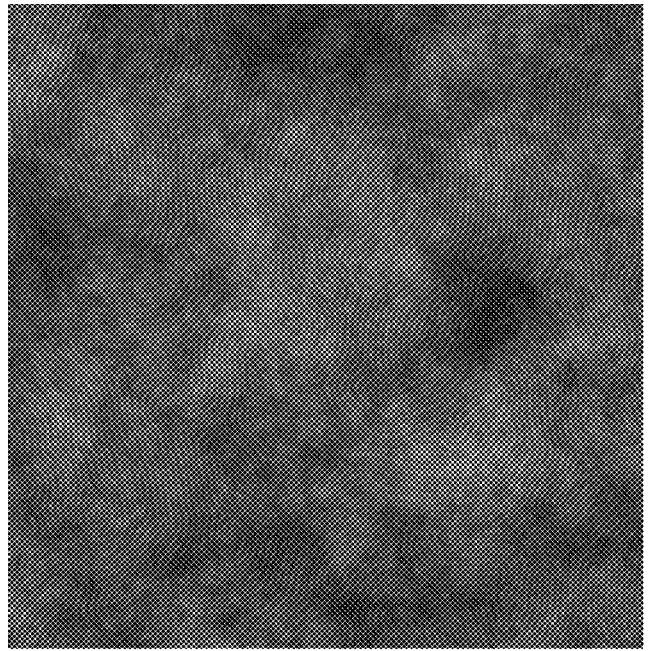
Figure 13:
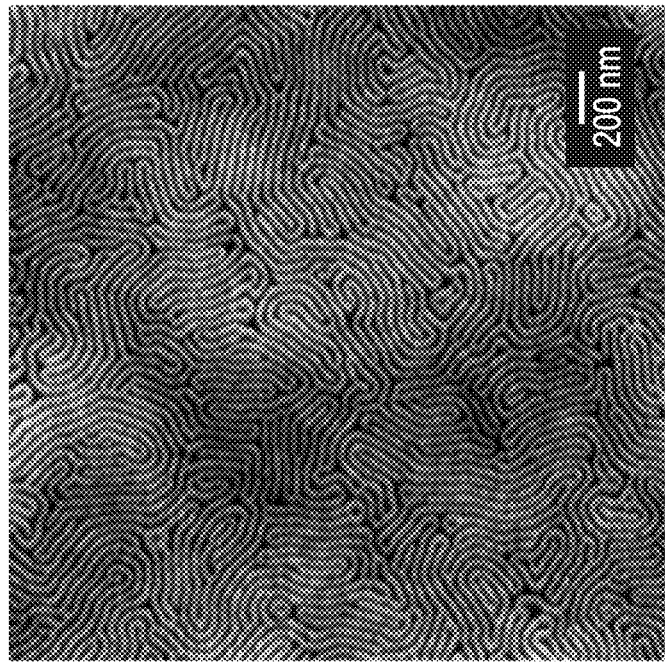
Figure 12:
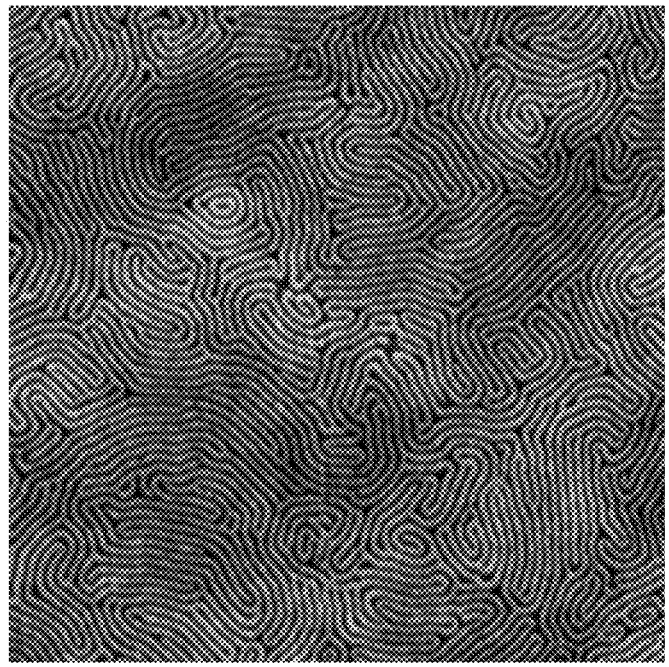
Figure 15:
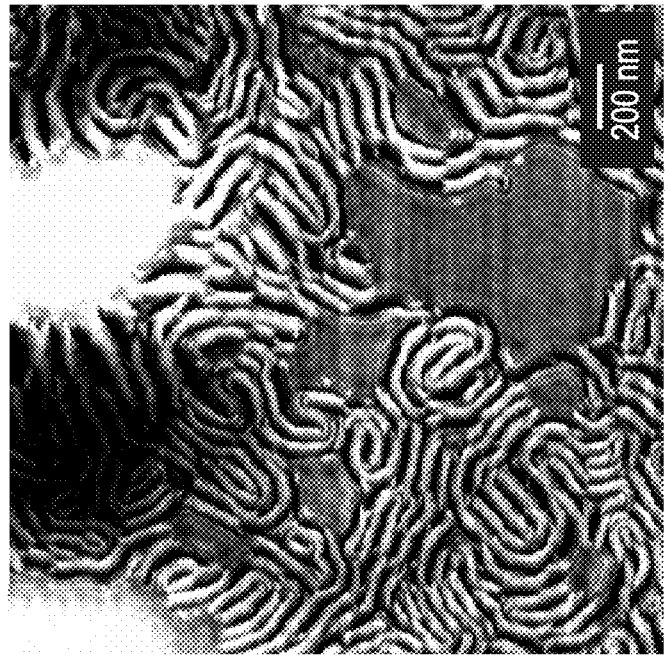
Figure 14:
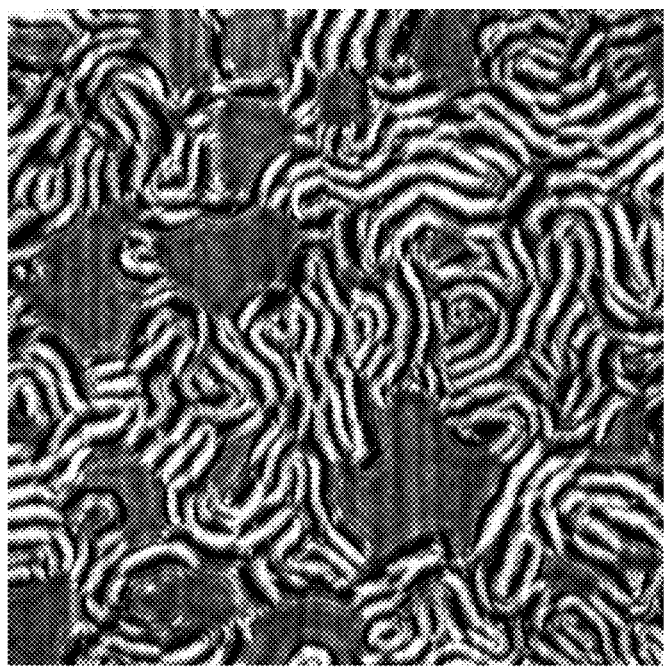
Figure 17:
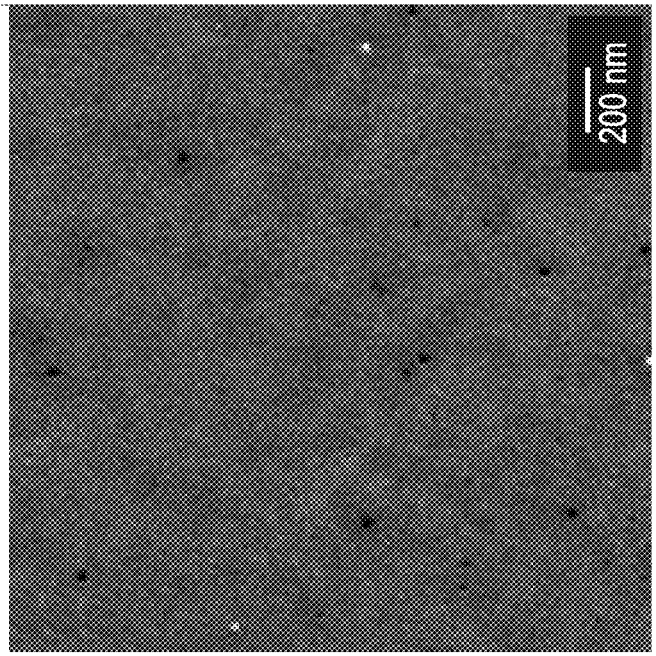
Figure 16:
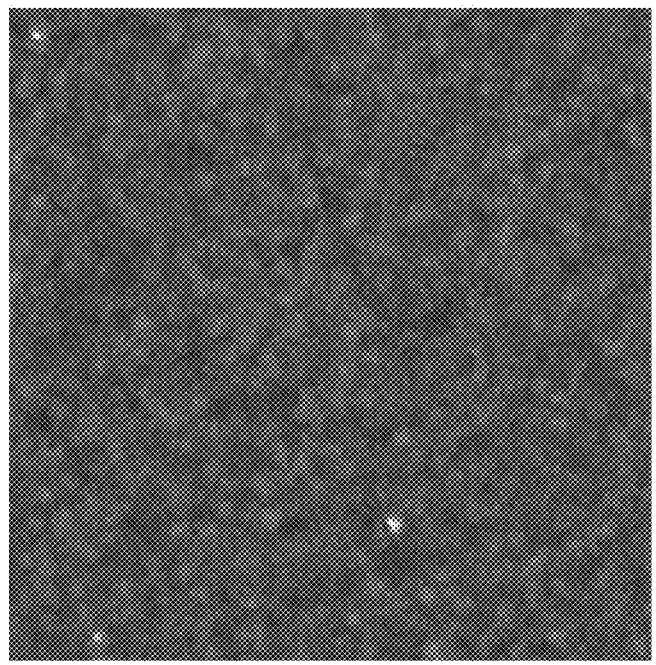
Figures 18, 19, 20:
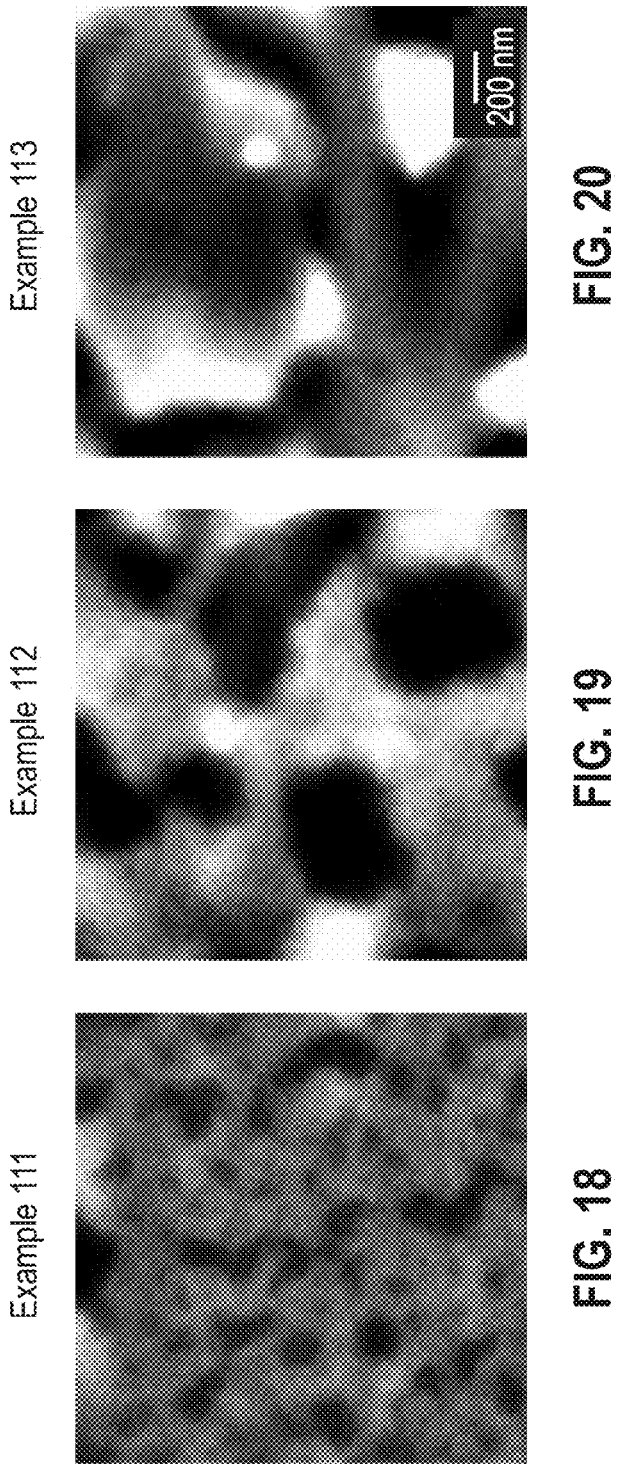
Figure 24:
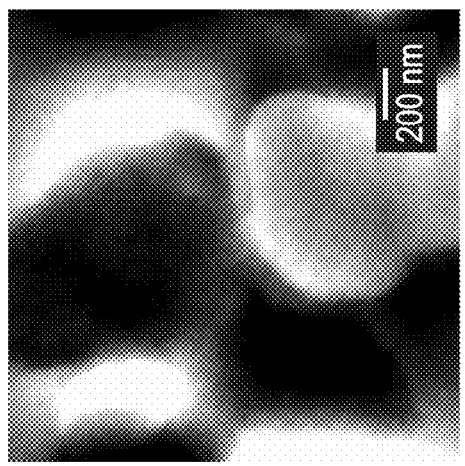
Figure 25:
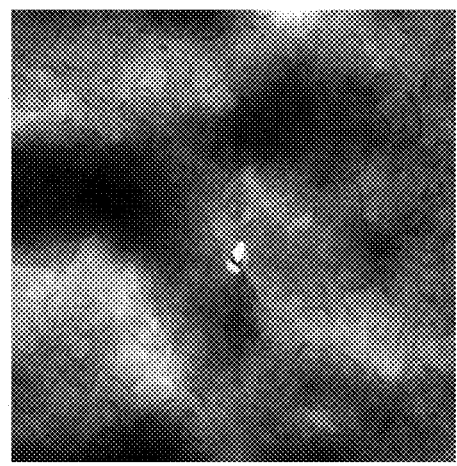
Figure 26:
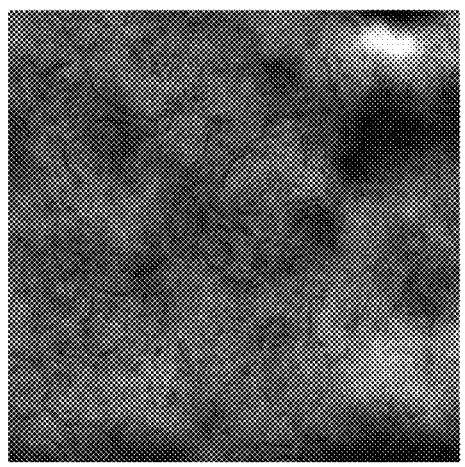
Figure 28:
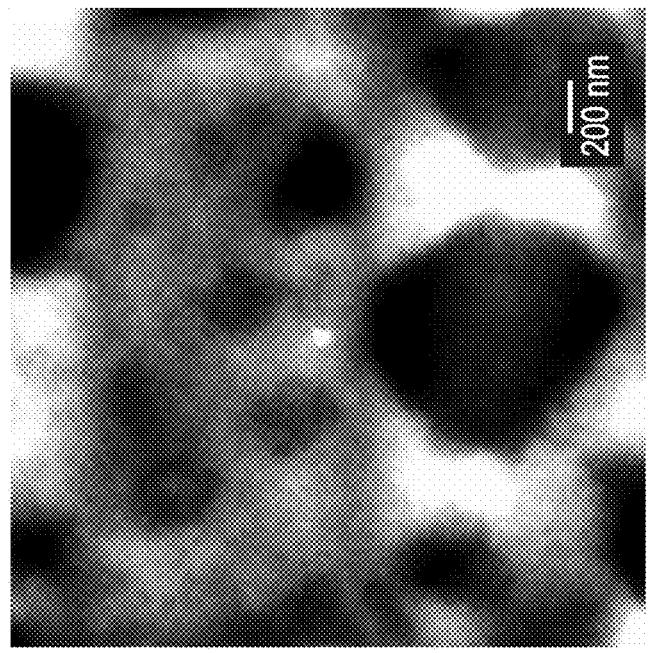
Figure 27:
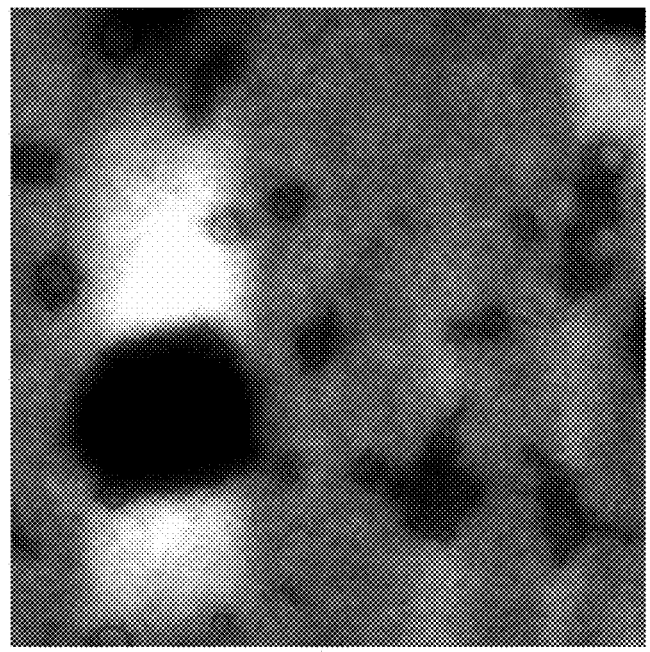
Figure 30:
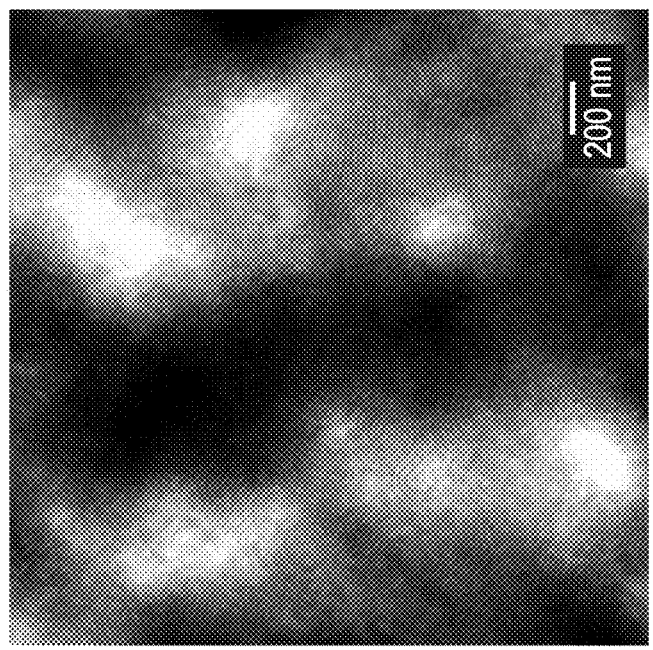
Figure 29:
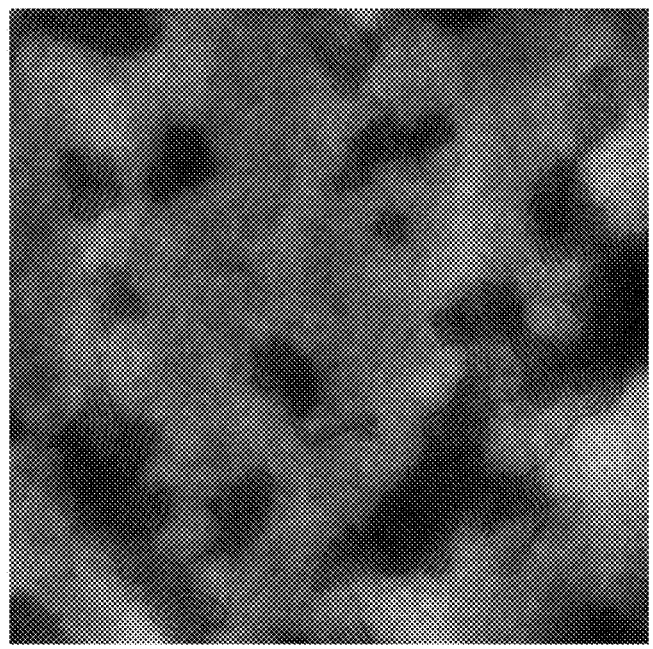
Figure 32:
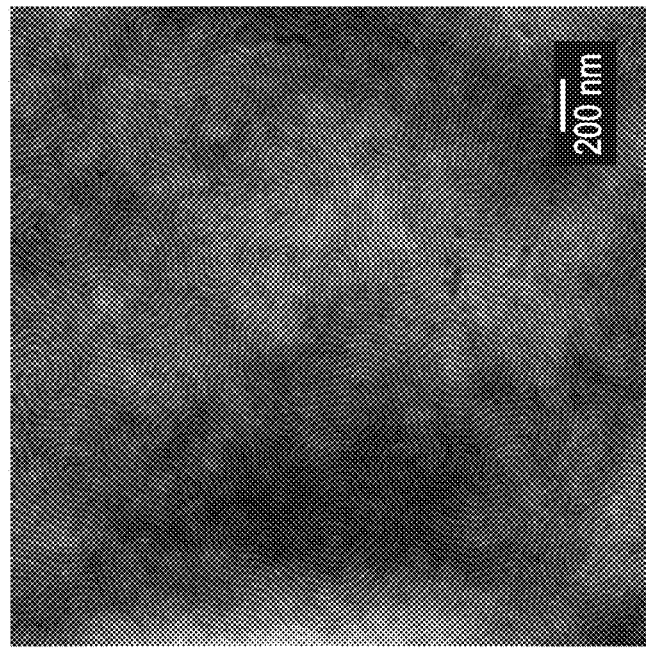
Figure 31:
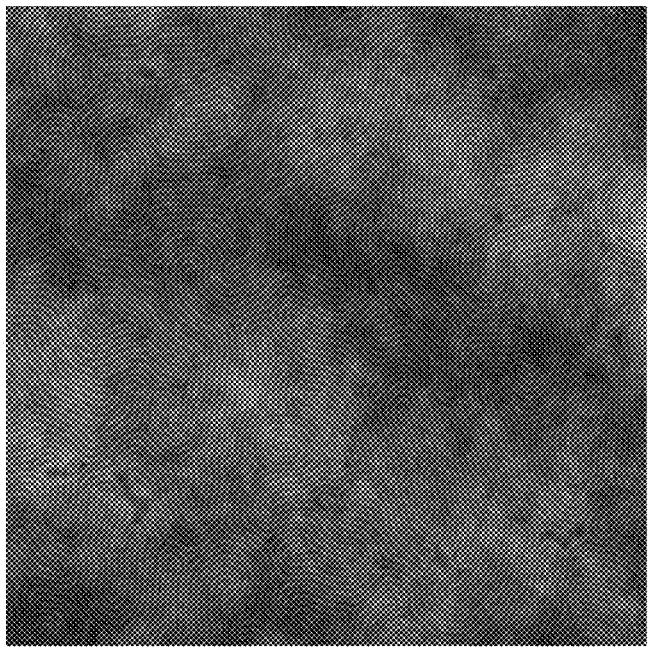
Figure 34:
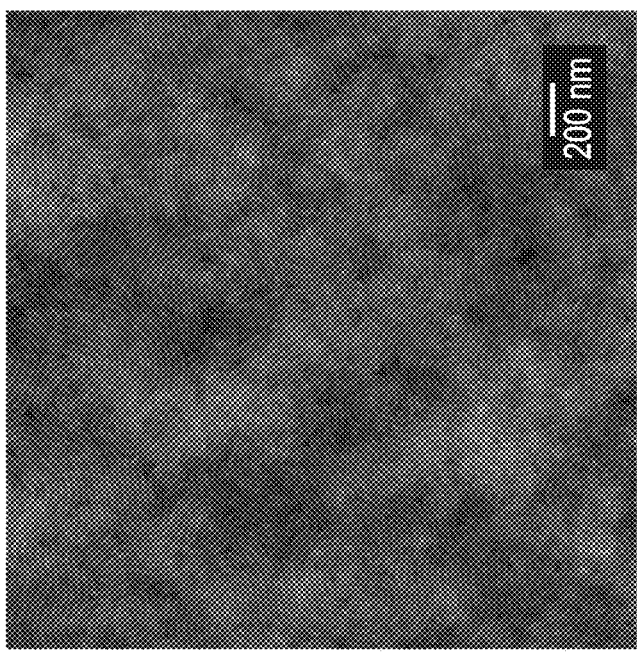
Figure 33:
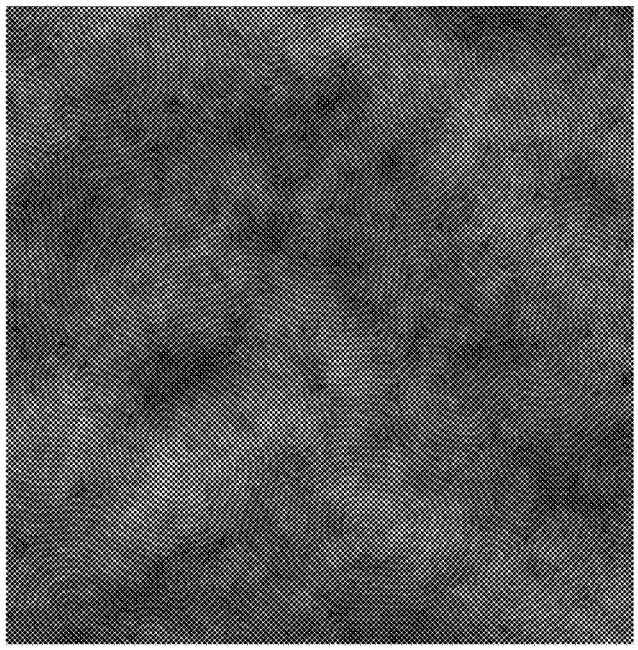
Figure 36:
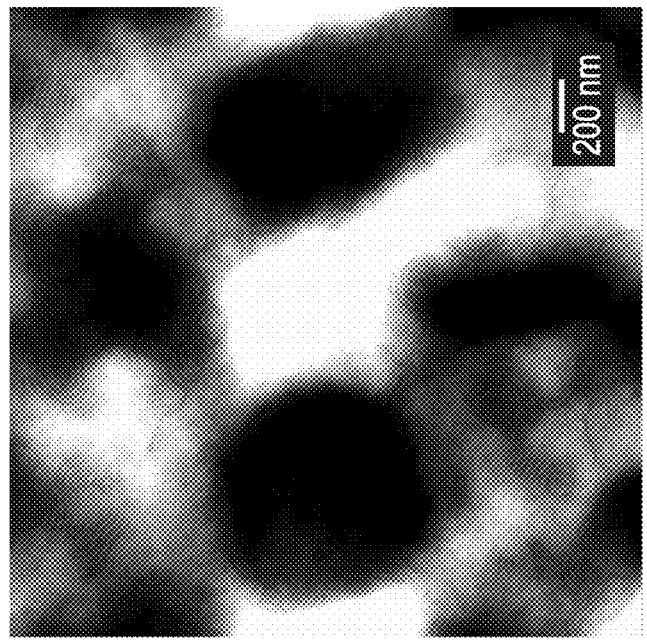
Figure 35:
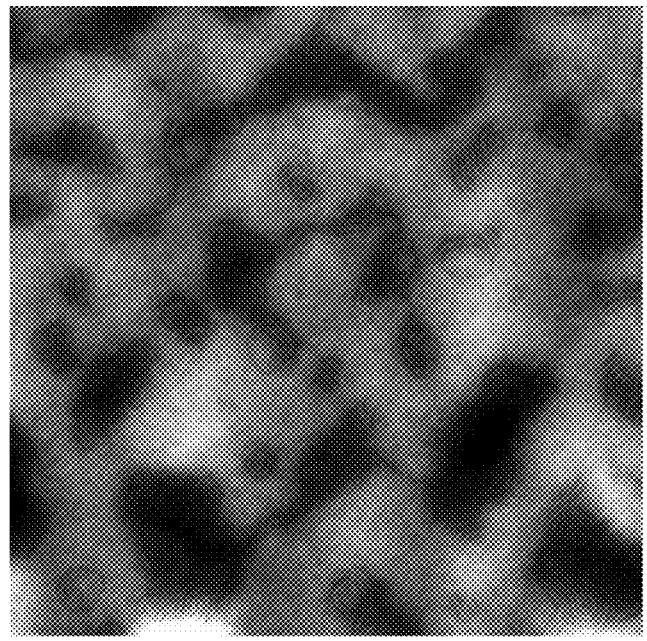
Figure 38:
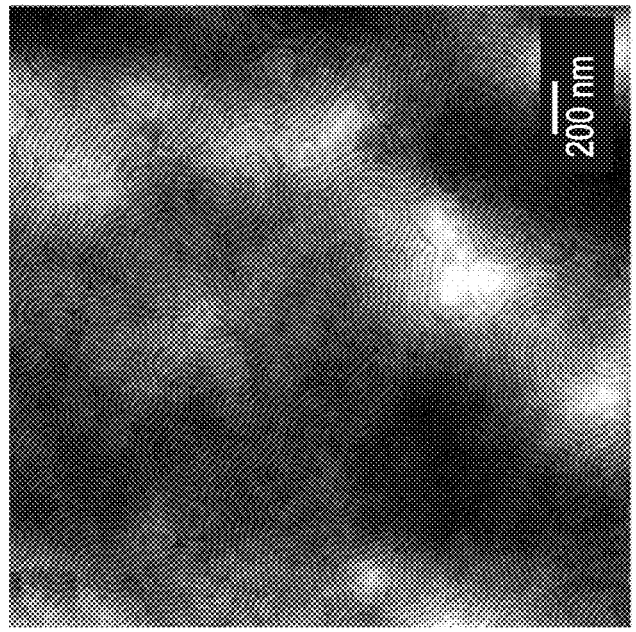
Figure 37:
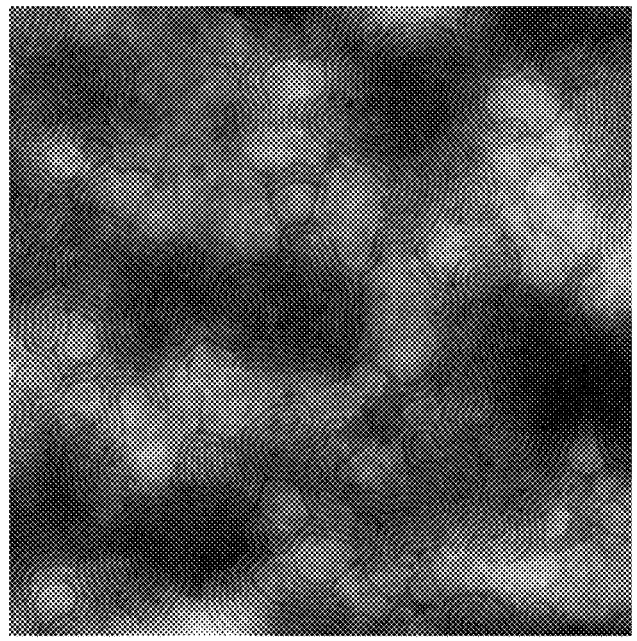
Figure 40:
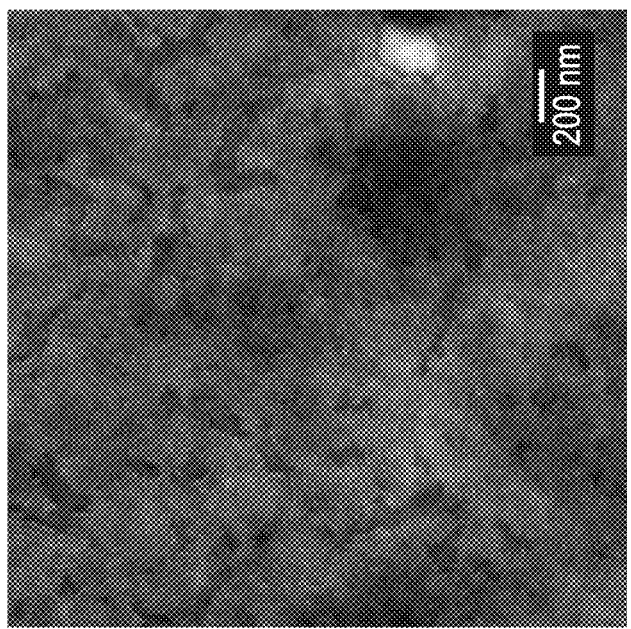
Figure 39:
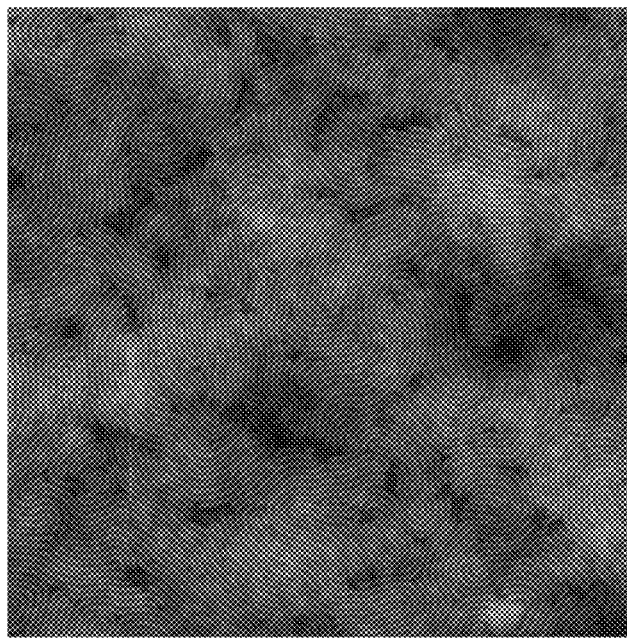
Figure 41:
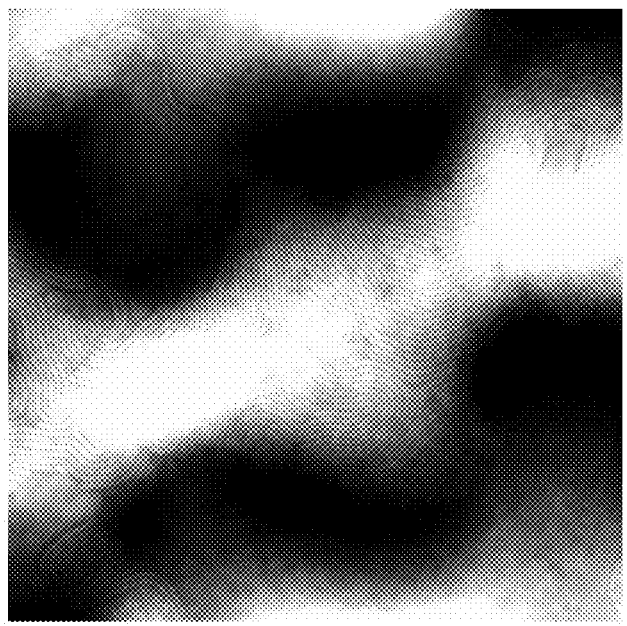
Figure 42:
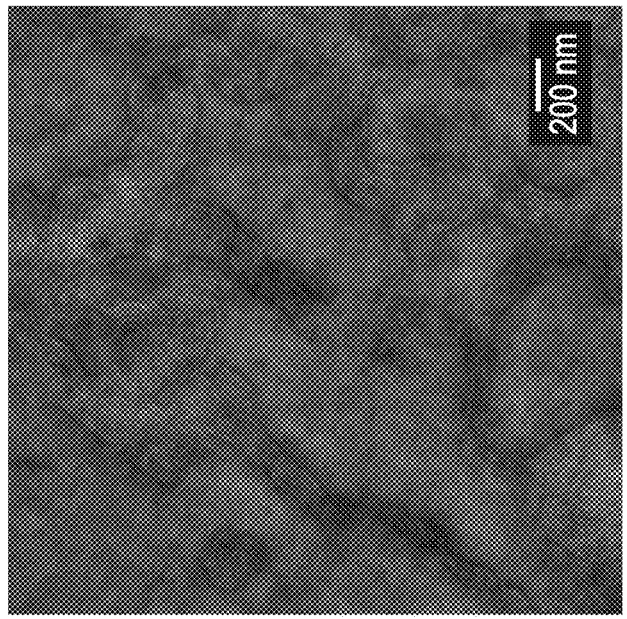
Figure 44:
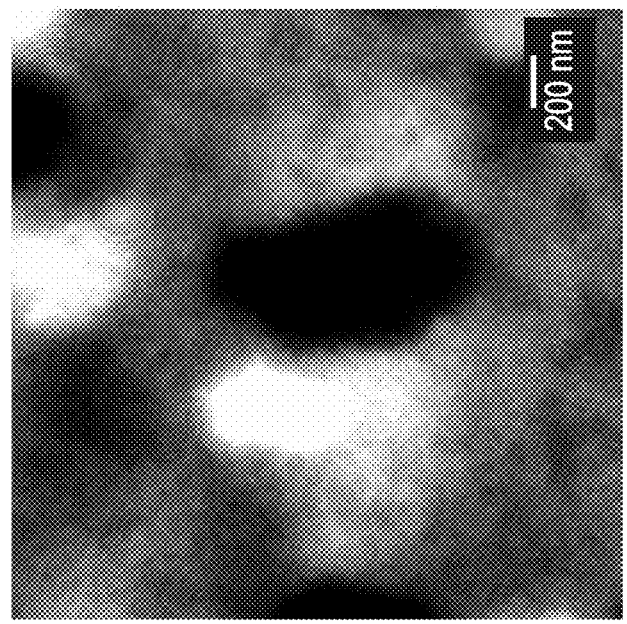
Figure 43:
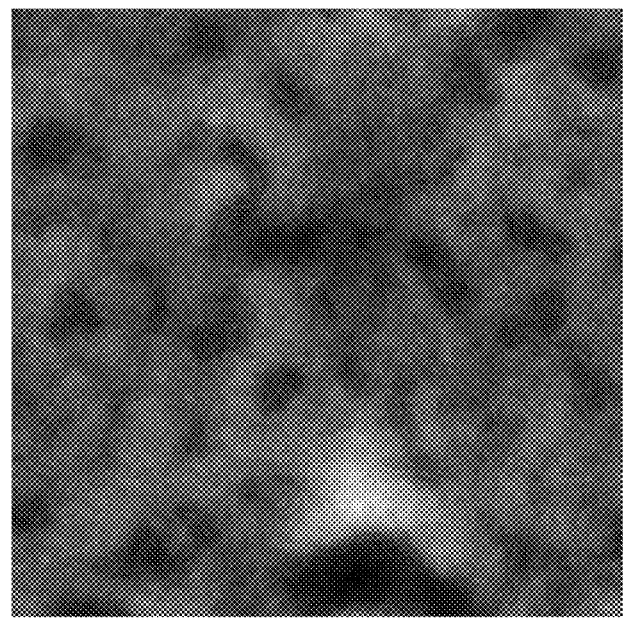
Figure 46:
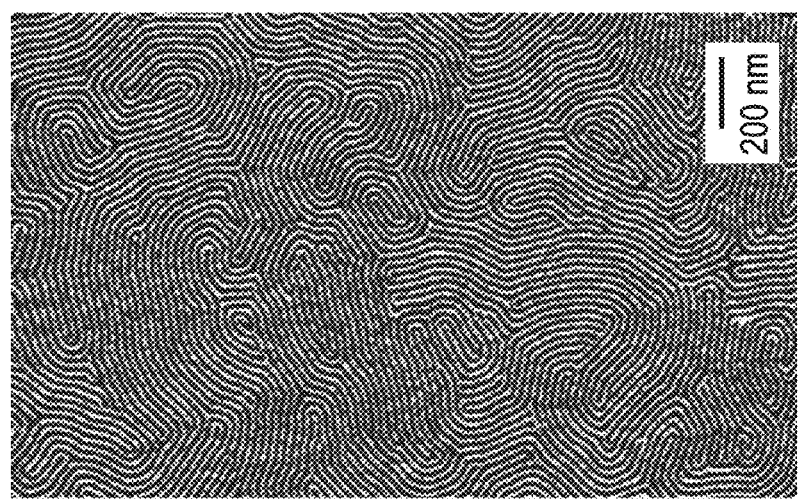
Figure 45:
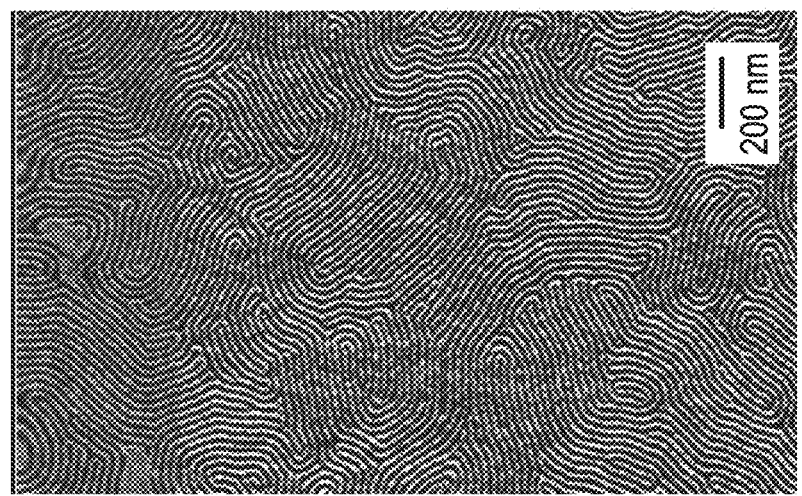
Figure 48:
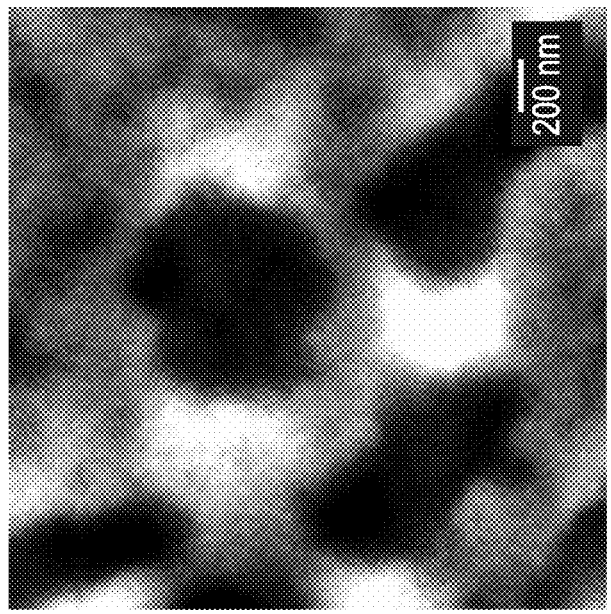
Figure 47:
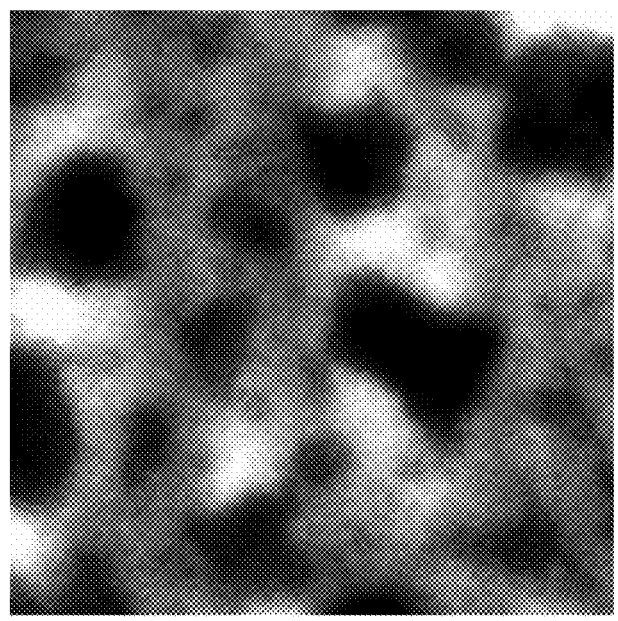
Figure 50:
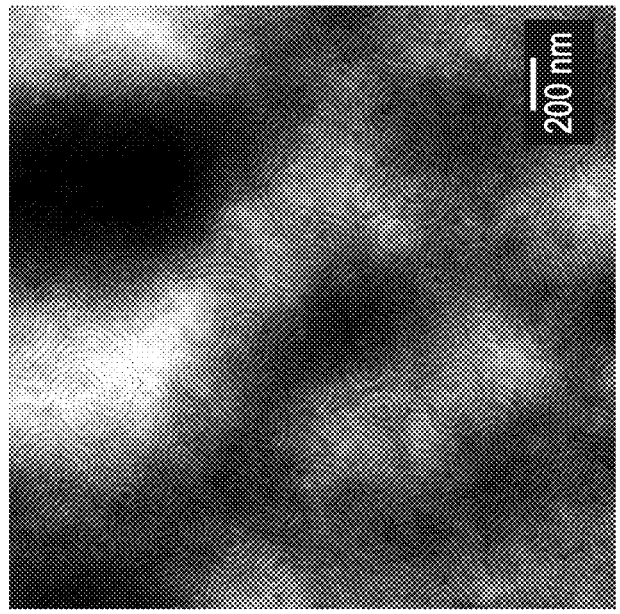
Figure 49:
Figure 52:
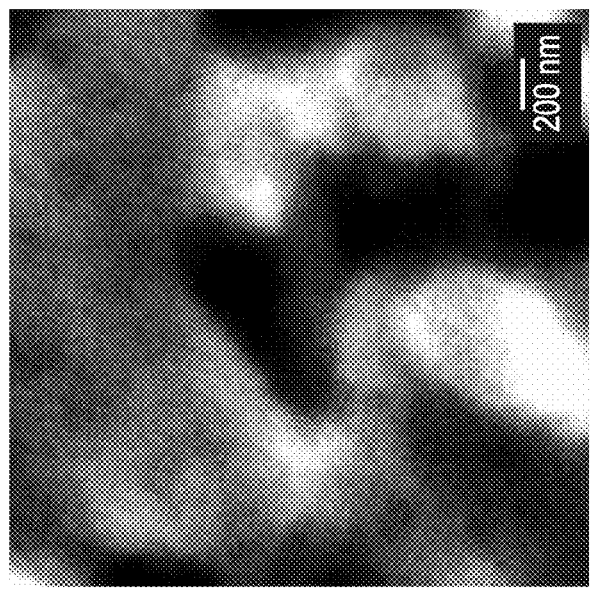
Figure 51:
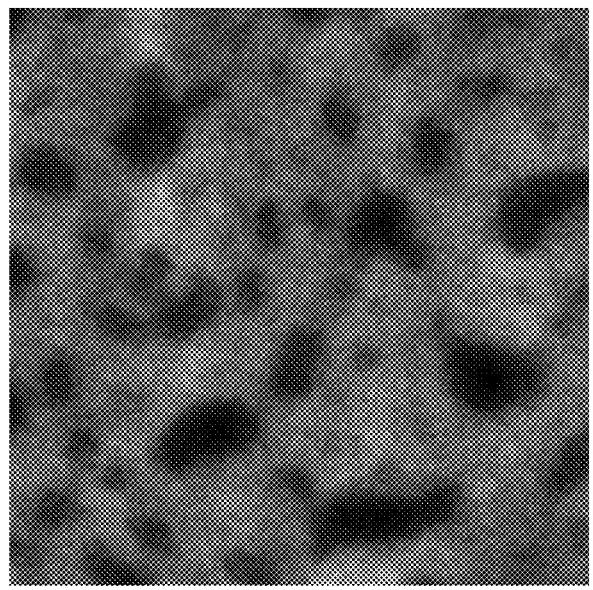
Figure 54:
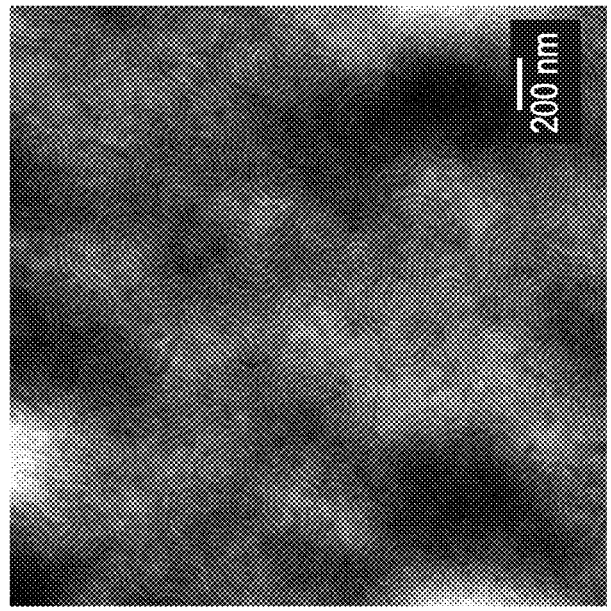
Figure 53:
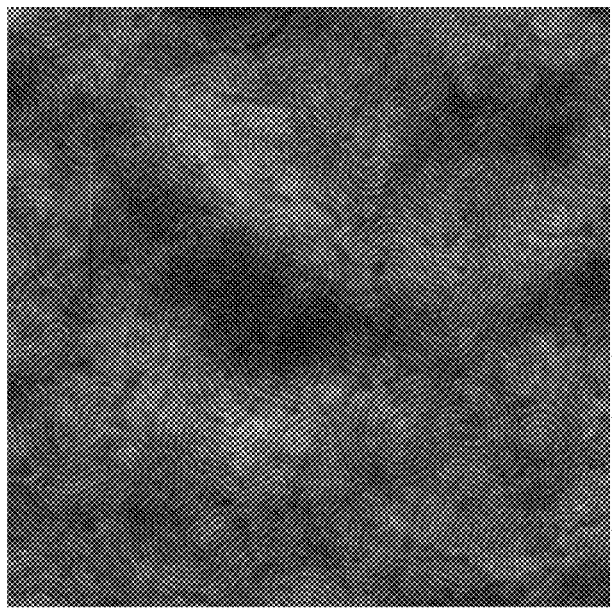
Figure 57:
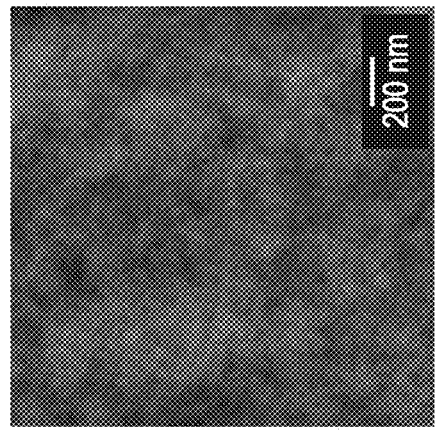
Figure 56:
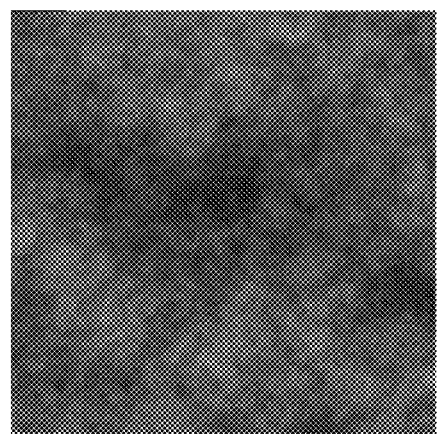
Figure 55:
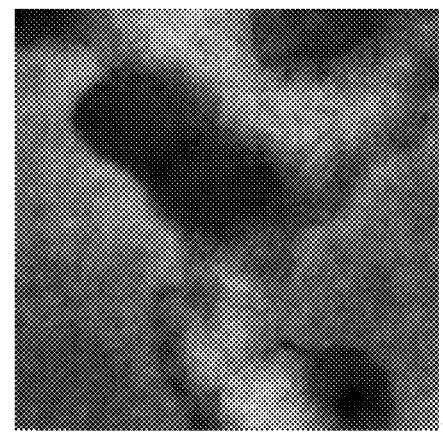
Figure 59:
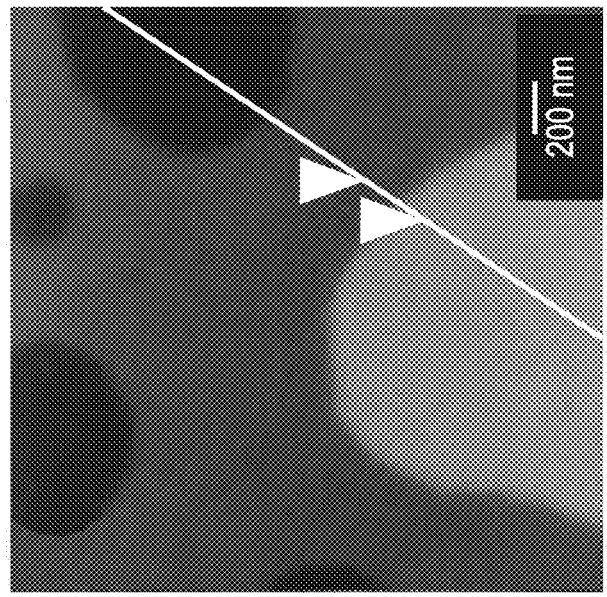
Figure 58:
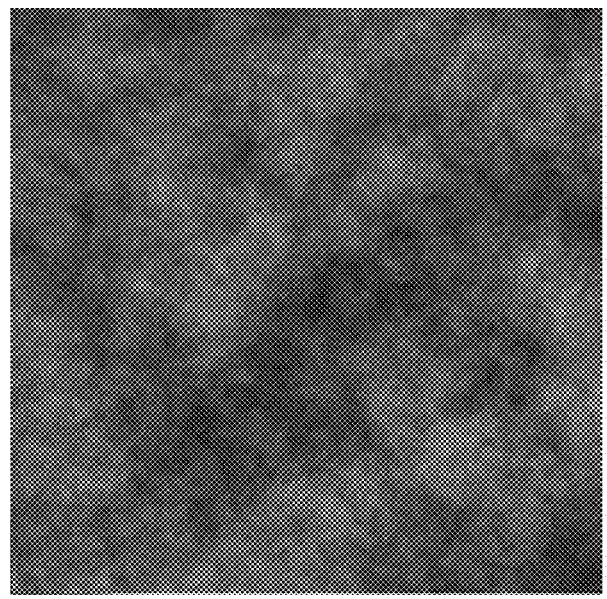
Figure 61:
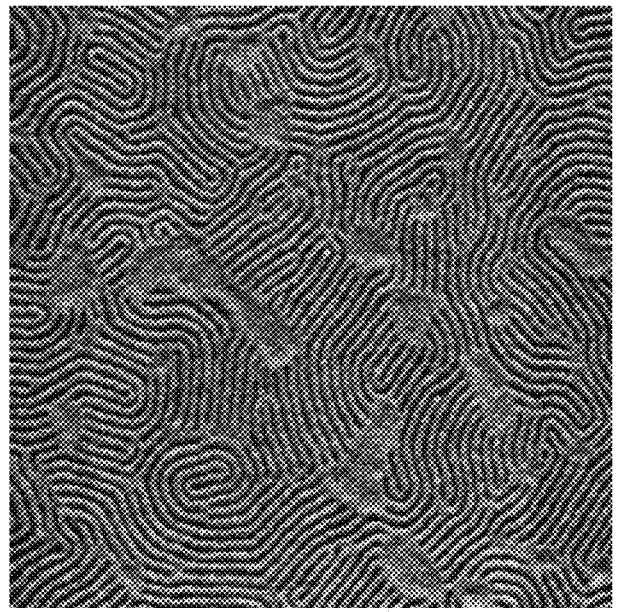
Figure 60:
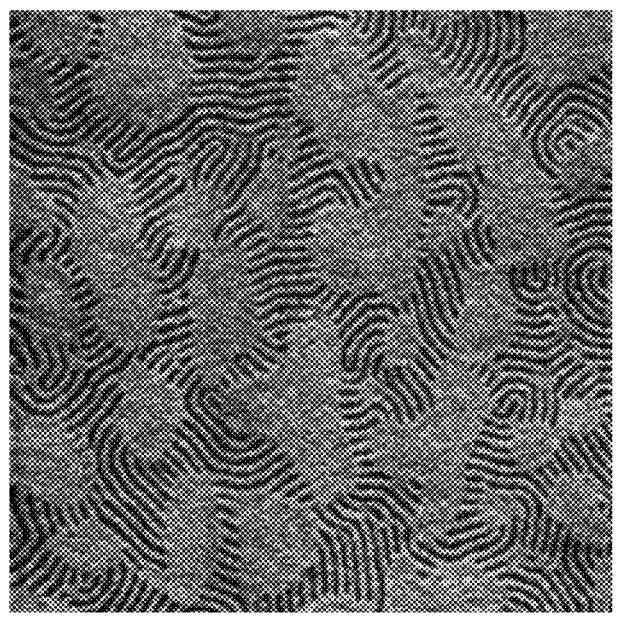
Figure 63:
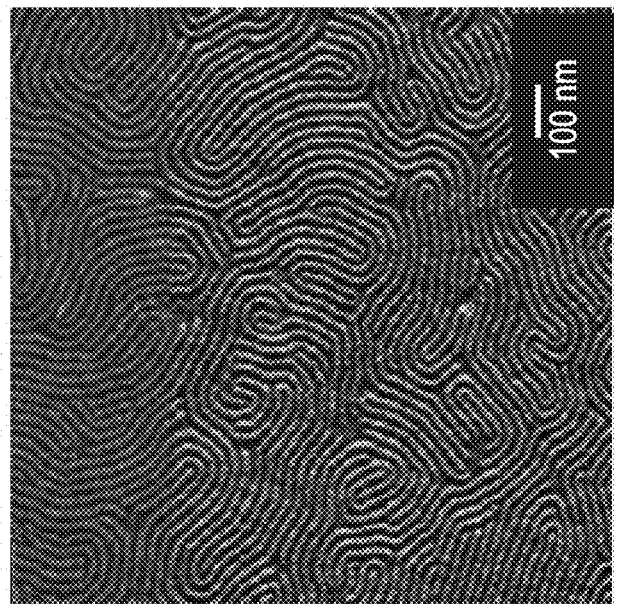
Figure 62:
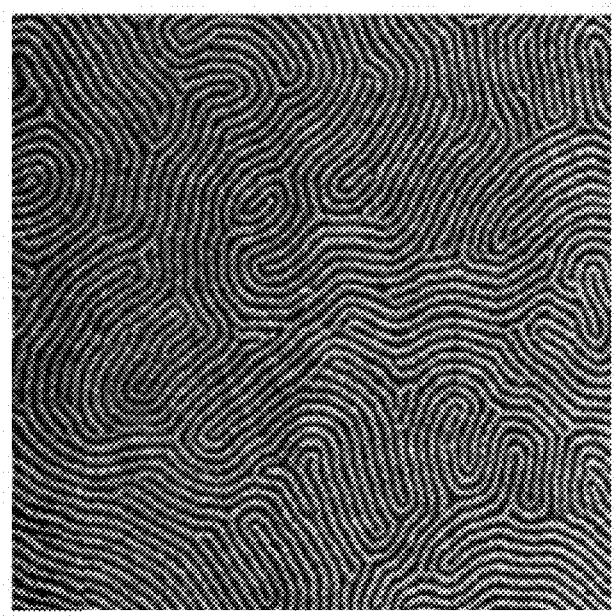
Figure 69:
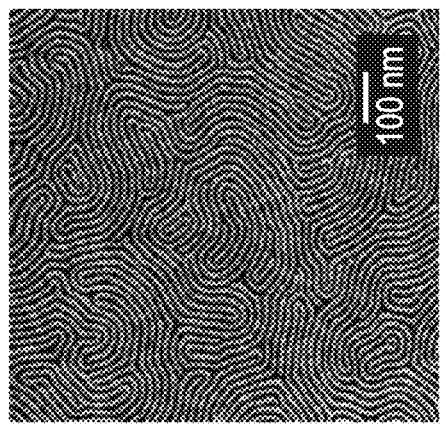
Figure 68:
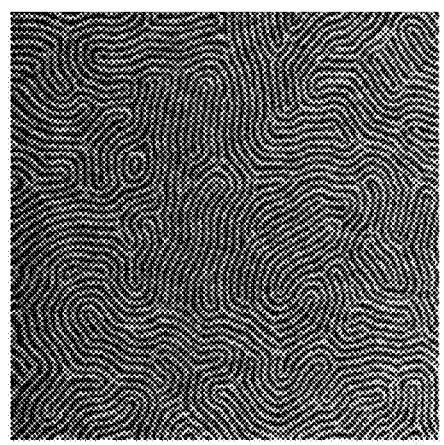
Figure 67:
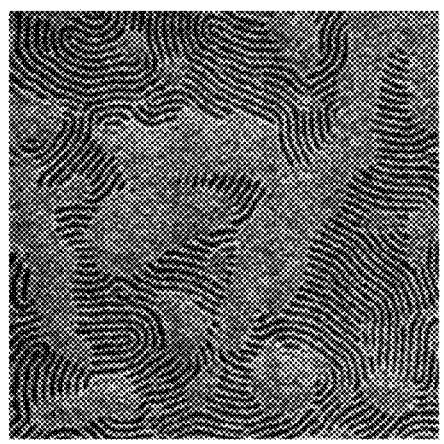
Figure 71:
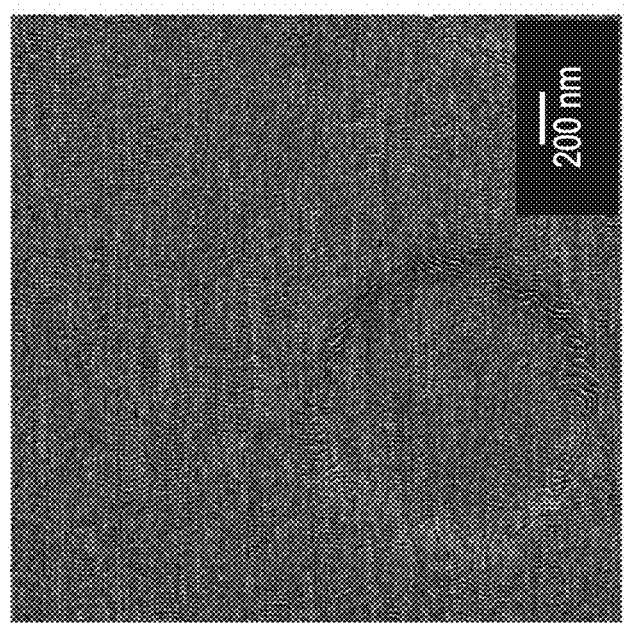
Figure 70:
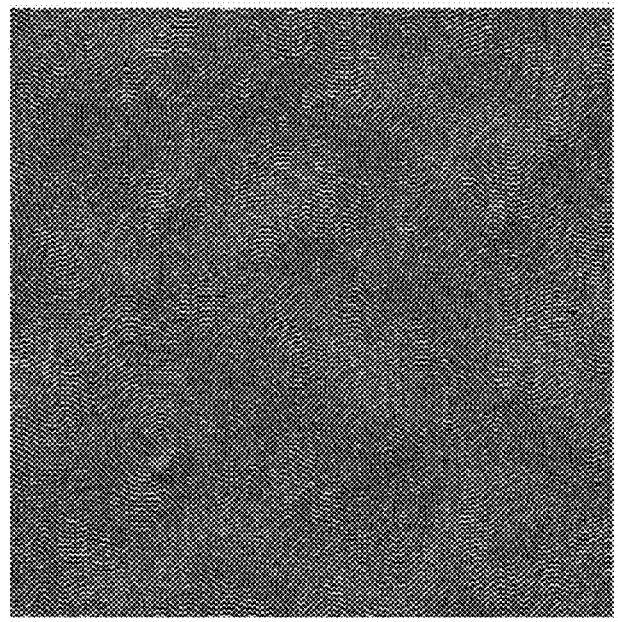
Figure 73:
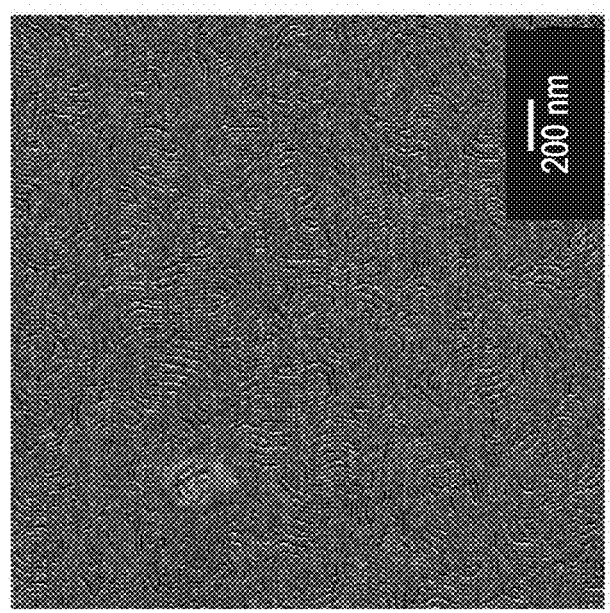
Figure 72:
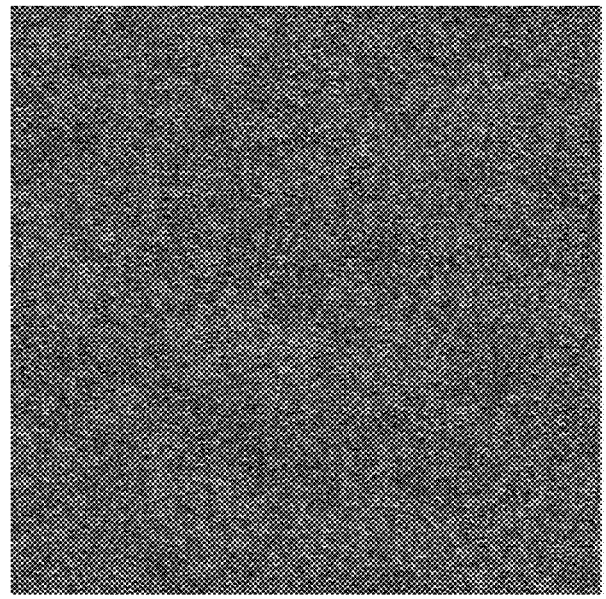
Figure 75:
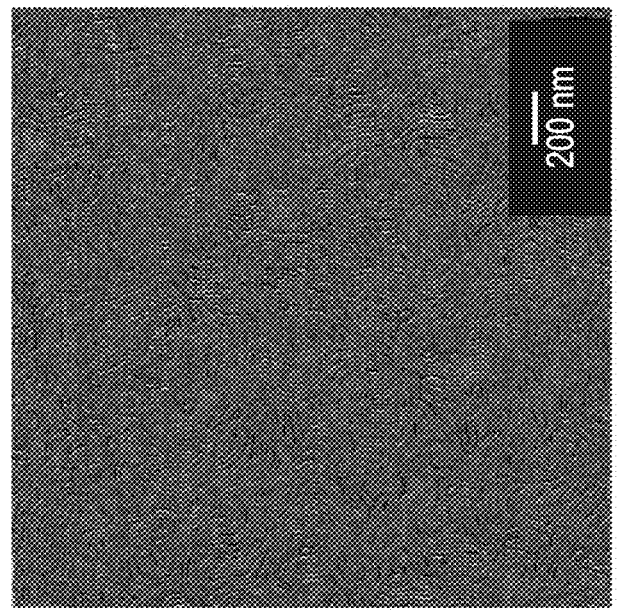
Figure 74:
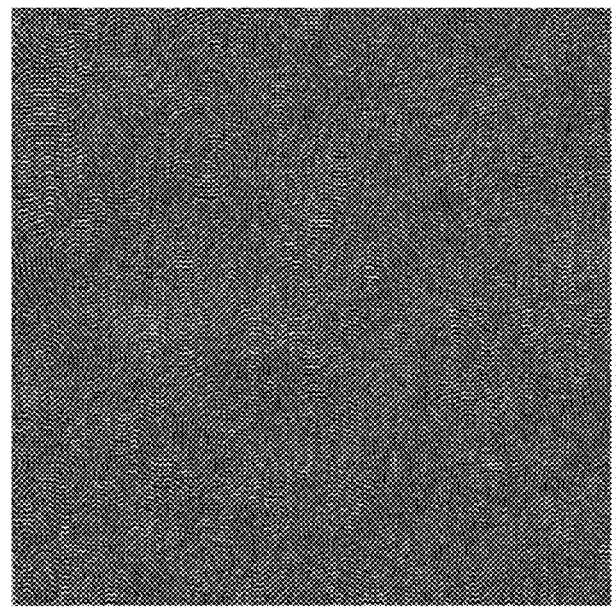
Figure 77:
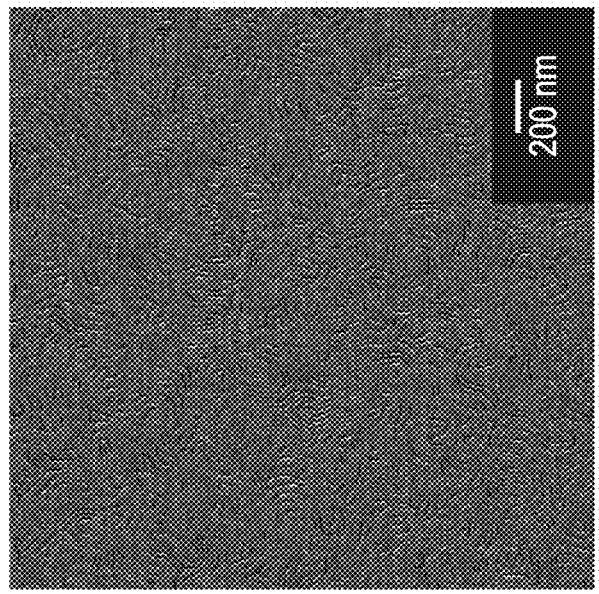
Figure 76:
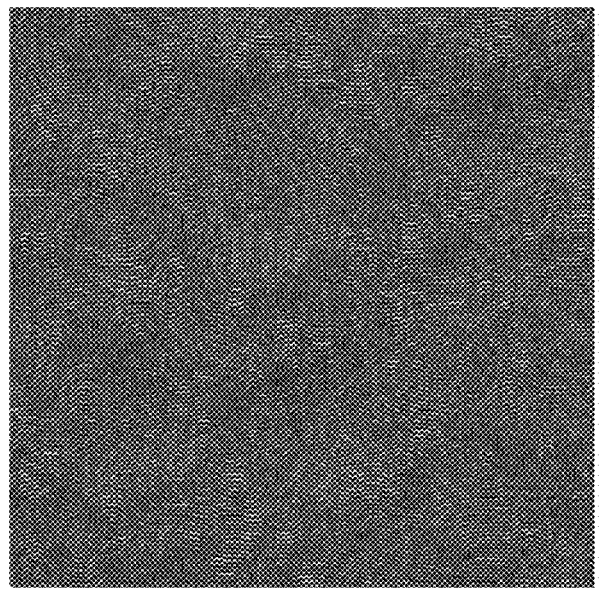
Figure 79:
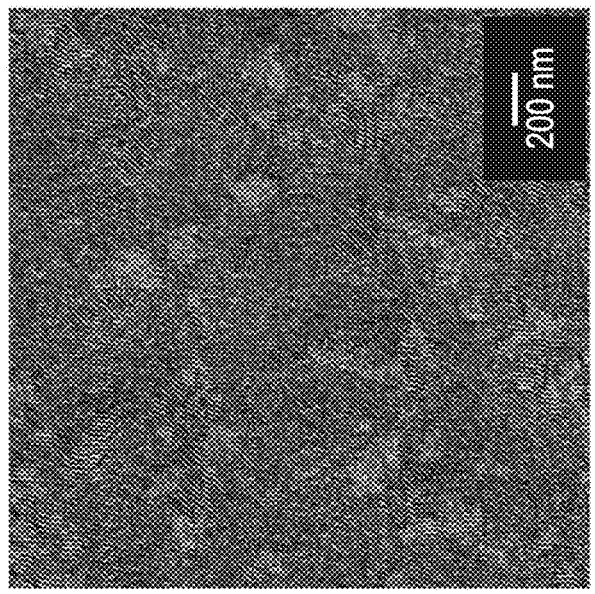
Figure 78:
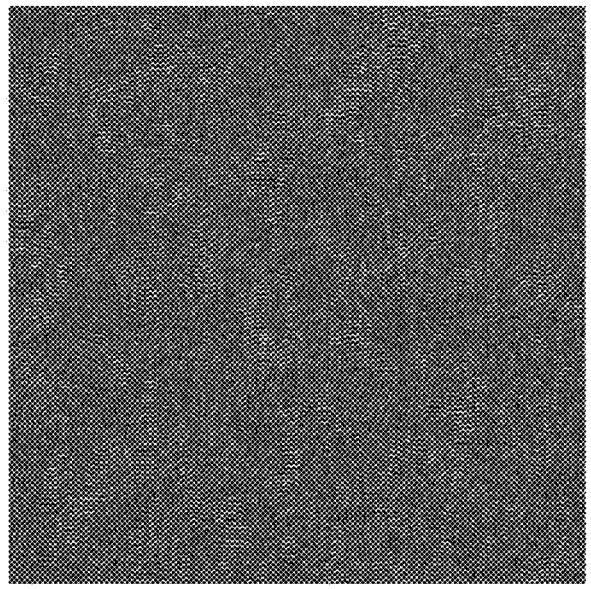
Figure 81:
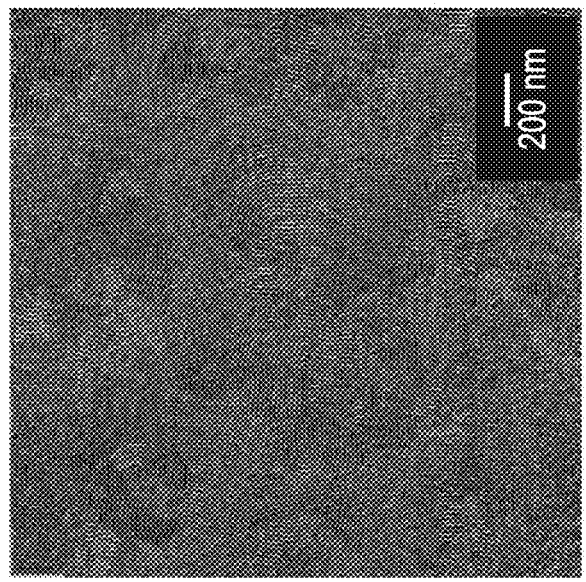
Figure 80:
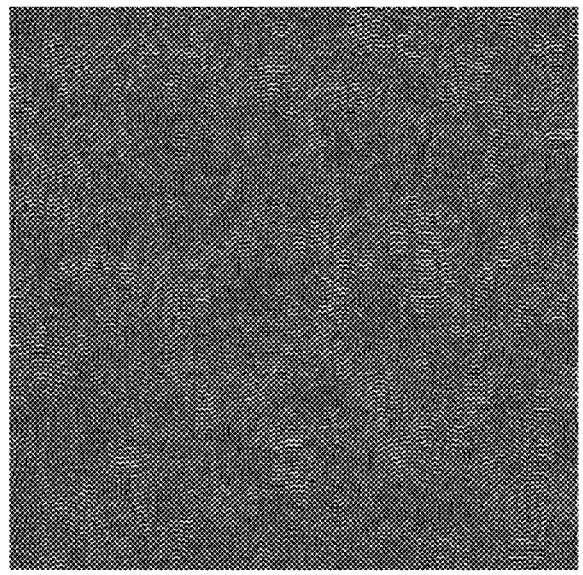

Finally, etched domain pattern 141 can be transferred to underlayer 102 and/or bottom layer 101, thereby forming layered structure 150 comprising patterned region 151 (FIG. 2E). Patterned region 151 can be a pattern of lines, holes, pits, and/or a chemically altered state of the substrate material represented by altered areas 152. Patterned region 151 can extend into one or more layers of bottom layer 101. The pattern transfer can be accomplished, for example, by using a reactive ion etch process. Features 106 and first lamellar domain 133 can be removed concomitantly or subsequently to formation of altered areas 152. The height of etched domain pattern 141 after the transfer can be less than the height of etched domain pattern 141 before the transfer.

The substrate, and more particularly the surface of the substrate, can comprise inorganic or organic materials such as metals, carbon, or polymers. More particularly, the substrate can comprise a semiconducting material including, for example, Si, SiGe, SiGeC, SiC, Ge alloys, GaAs, InAs, InP, silicon nitride, titanium nitride, hafnium oxide, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein.

The substrate can have an anti-reflection control layer (ARC layer) or a bottom ARC layer (BARC layer) to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

Auxiliary Polymers

The substrate, the underlayer and/or the SA layer referred to above can include other polymers, referred to as auxiliary polymers.

The auxiliary polymers can comprise a hydroxyl group. These include hydroxyl-terminated polymers (e.g., hydroxyl-terminated poly(styrene-co-methyl methacrylate and blends of hydroxyl-terminated poly(styrene), hydroxyl-terminated poly(methyl methacrylate), and poly(styrene-b-methyl methacrylate)), hydroxyl-functionalized polymers (e.g., poly(styrene-co-methyl methacrylate-co-2-hydroxyethyl methacrylate)).

Other auxiliary polymers include materials comprising reactive groups, such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly(styrene-co-methyl methacrylate-co-vinyl benzocyclobutane), and poly(alpha-methyl styrene-co-methyl methacrylate)). The reactive polymers may react as a result of thermal or photochemical treatment either alone or in conjunction with an additional crosslinking agent. In particular, a catalytic species such as a strongly acidic species may be used to facilitate reaction. The strongly acidic species may be directly incorporated into a coating composition. Alternatively, a thermal acid generator or photoacid generator molecule may be used to generate an acidic species as a result of thermal or photochemical treatment, respectively.

Other non-limiting examples of auxiliary polymers include materials used in ARC layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (optical constants, surface energy). The polymer components can also contain a plurality of reactive sites distributed along the polymer for reaction with a crosslinking component. More specific materials used in ARC layers include poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly(bisphenol AF)), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6- bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl endcapped poly(bisphenol A-co-epichlorohydrin), and silicon-containing anti-reflection coating A940 from Shin Etsu. Another more specific auxiliary polymer is poly(styrene-co-epoxydicyclopentadiene methacrylate) random copolymer, P(S-r-EDCPMA):

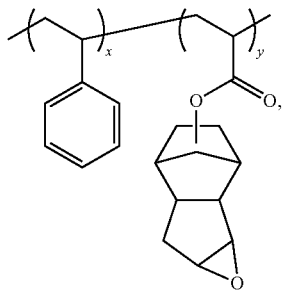

P(S-r-EDCPMA)

wherein x and y are each integers greater than 1. Other auxiliary polymers include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI). Other auxiliary polymers comprise polymer brush layers including those formed by hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing surface affinity materials. Other auxiliary polymers include other block copolymers capable of forming self-assembled monolayers.

The coating composition used to prepare the underlayer comprises at least a solvent and a disclosed random copolymer.

The coating composition used to prepare the SA layer comprising a disclosed block copolymer comprises at least a solvent, a disclosed high-chi block copolymer comprising a polycarbonate block, and a disclosed SAP.

The foregoing compositions can additionally comprise other materials including surfactants, polymers, photoacid generators, and thermal acid generators. For example, an organosilicate resin can be included in the composition for preparing an underlayer.

The compositions for preparing the underlayer and SA layer can be applied by any suitable method that is compatible with the processes and equipment used in microelectronics fabrication assembly lines. Exemplary non-limiting techniques include spin-coating, dip-coating, doctor blading, and spray coating.

Exemplary non-limiting casting solvents for preparing the above-described polymer base coating compositions include toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, and combinations of the foregoing solvents.

The random copolymer for the underlayer has a weight average molecular weight (Mw) of 3,000 to 200,000 g/mol. Similarly, the random copolymer has a number average molecular weight (Mn) of 1,000 to 80,000. The random copolymer can also have a polydispersity (Mw/Mn) of 1.01 to about 3.0. Molecular weight, both Mw and Mn, can be determined by, for example, gel permeation chromatography (GPC) using a universal calibration method, calibrated to polystyrene standards.

The high-chi block copolymer for the directed self-assembly (SA material) has a weight-average molecular weight (Mw) of 3,000 to 200,000 g/mol. Similarly, the high-chi block copolymer can have a number average molecular weight (Mn) of 1,000 to 80,000. The high-chi block copolymer can also have a polydispersity (Mw/Mn) of 1.01 to 3.

The surface active polymer (SAP) for the SA layer has a weight-average molecular weight (Mw) of 3,000 to 200,000 g/mol. Similarly, the SAP can have a number average molecular weight (Mn) of 1,000 to 80,000. The SAP can have a polydispersity (Mw/Mn) of 1.01 to 3.

The morphology (e.g., shape, dimension, and orientation) of the self-assembled domains from block copolymer thin films is a function of block copolymer architecture (diblock, triblock, star polymer, bottlebrush block copolymer, miktoarm polymer, and others), composition (e.g., material, molecular weight, and volume ratio of different blocks), annealing conditions (e.g., temperature, environment, and annealing time), the interface properties (e.g., polymer-air interface and polymer substrate interface) as well as the defined geometry (e.g., film thickness and topography of the confinement). Therefore, by adjusting one or more parameters, the morphology can be adjusted to the need of specific applications.

Self-assembly of the high-chi block copolymer (i.e., phase separation and alignment of domains) can occur during film formation, during a post-application bake, or during a subsequent annealing process. Suitable annealing processes include thermal annealing, thermal gradient annealing, solvent vapor annealing or annealing by other gradient fields. More particularly, the SA layer comprising a high-chi block copolymer is thermally annealed at a temperature that is above the glass transition temperature ($T_g$) of the block copolymer but below the decomposition or degradation temperature ($T_d$) of the block copolymer. The thermal annealing step can be carried out at an annealing temperature of about 80° C. to about 300° C. The thermal annealing can be performed for a period of more than 0 hours to about 100 hours, and more particularly for about 1 hour to about 15 hours. The thermally annealed block copolymer self-assembles to form ordered domains whose orientation is perpendicular to the underlying surface plane. In general, the SA layer can have a thickness of 50 to 10000 angstroms, more particularly 100 to 5000 angstroms, and even more particularly 100 to 3000 angstroms.

The difference in the etch rates between two ordered domain regions of the block copolymer allows the generation of additional patterns. Selectively removing by etching, solvent or other means, at least one self-assembled domain, creates a nano-scale relief pattern comprising, for example, a pattern of holes that can be transferred into the underlying substrate. Types of etching include any common etching applied in the manufacture of semiconductor devices, for example, dry-etching such as plasma etching, or wet-etching using selective solvents and/or vapors. Typically, dry etching processes are employed for etching at sub-50 nm dimensions. Prior to this pattern development/pattern transfer, the self-assembled layer of SA material can be optionally chemically modified to improve properties necessary for pattern transfer, such as etch resistance or mechanical properties.

The relief pattern of openings formed by selective removal of one of the domains can have a spatial frequency greater than that of a topographic pre-pattern used with the high-chi block copolymer.

Etch resistant materials can be applied to a substrate surface, underlayer surface, surface of a resist feature, and/or a domain pattern of the block copolymer for control of relative etch rates. The etch-resistant material can be deposited from the vapor phase by a process including, chemical vapor deposition (CVD), plasma enhanced CVD, atomic layer deposition (ALD), sequential infiltration synthesis (SIS), sequential infiltration of metal salts, sputtering, thermal evaporation, electron beam evaporation, pulsed laser deposition, or other suitable deposition method that is compatible with the processes and equipment used in microelectronics fabrication.

Also disclosed is a film comprising the self-assembled high-chi block polymer, the film comprising lamellar domains having a perpendicular orientation relative to the plane of the film. Further disclosed is a layered structure comprising substrate that includes an underlayer, and a film of self-assembled high-chi block copolymer disposed on the underlayer, the film comprising lamellar domains having a perpendicular orientation relative to the plane of the film. In an embodiment, the layered structure is a semiconductor device.

The above-described processes can be used to form layered structures comprising metal wiring lines, holes for contacts or vias, insulation sections (e.g., damascene trenches or shallow trench isolation), and trenches for capacitor structures suitable for the design of integrated circuit devices. The method is especially useful in the context of creating patterned layers of oxides, nitrides or polysilicon.

The above-described methods advantageously allow self-assembled structures having reduced feature width and increased periodicity. The domain feature width can be from 1 nm to about 30 nm, from 5 nm to about 18 nm, or more particularly from 5 nm to about 15 nm.

The following non-limiting examples are provided to further illustrate the disclosed polymers and their use in forming self-assembled layers.

EXAMPLES

Materials used in the following examples are listed in Table 1.

TABLE 1

| ABBREVIATION | DESCRIPTION | SUPPLIER |
| --- | --- | --- |
| DBU | 1,8-Diazabicyclo[5,4,0]undec-7-ene | Sigma-Aldrich |
| BisMPA | Dimethylolpropionoic acid | Perstorp |
| BzOH | Benzyl alcohol | Sigma-Aldrich |
| DCM | Dichloromethane | Sigma-Aldrich |
| AcCh | Acetyl Chloride | Sigma-Aldrich |
| TEA | Triethylamine | Sigma-Aldrich |
| BriBr | α-Bromoisobutyryl bromide | Sigma-Aldrich |
| THF | Tetrahydrofuran | Sigma-Aldrich |
| MeOH | Methanol | Sigma-Aldrich |
| Sty | Styrene, MW 104.15 | Sigma-Aldrich |
| GMA | Glycidyl methacrylate, MW 142.2 | Sigma-Aldrich |
| PFS | Pentafluorostyrene | Sigma-Aldrich |
| HFA-Sty | Hexafluoroalcohol Styrene | Central Glass Chemical Company |
| Tol | Toluene | Sigma-Aldrich |
| DPP | Diphenyl phosphate | Sigma-Aldrich |
| AIBN | Azobisisobutyronitrile | Sigma-Aldrich |
| EtG | Ethylene glycol | Sigma-Aldrich |
| AZPS1-OH | Hydroxyl-end-functional polystyrene, Mn 6200 | AZ Electronic Materials |
| AZPS2-OH | Hydroxyl-end-functional polystyrene, Mn 10000 | AZ Electronic Materials |
| HO-PSI1-OH | Dihydroxy two armed polystyrene Mn 11500 | Polymer Sources |
| EtG | Ethylene glycol | Sigma-Aldrich |
| TMC | Trimethylene carbonate | Richman Chemicals |
| CuBr | Copper (I) bromide | Sigma-Aldrich |
| PMDETA | N,N,N',N',N''-pentamethyldiethylenetriamine | Sigma-Aldrich |
| Anisole | Anisole | Sigma-Aldrich |
| Si Gel | Silica Gel | Sigma-Aldrich |
| EtiBr | Ethyl α-bromoisobutyrate | Sigma-Aldrich |
| HEMA | Hydroxyethyl methacrylate, MW 130.14 | Sigma-Aldrich |
| Lac | 3,6-Dimethyl-1,4-dioxane-2,5-dione | Sigma-Aldrich |
| Me6TREN | Tris[2-(dimethylamino)ethyl]amine | Sigma-Aldrich |

TABLE 1-continued

| ABBREVIATION | DESCRIPTION | SUPPLIER |
|---|---|---|
| Pf-OH | 1H,1H-Perfluorononan-1-ol | Synquest Labs |
| HEBIB | 2-Hydroxyethyl 2-bromoisobutyrate, MW 211.05 | Sigma-Aldrich |

Herein, Mn is the number average molecular weight, Mw is the weight average molecular weight, and MW is the molecular weight of one molecule.

Preparation of Diblock Polymers for Self-Assembly

Diblock polymers (Examples 1-3) were prepared according to Scheme 26.

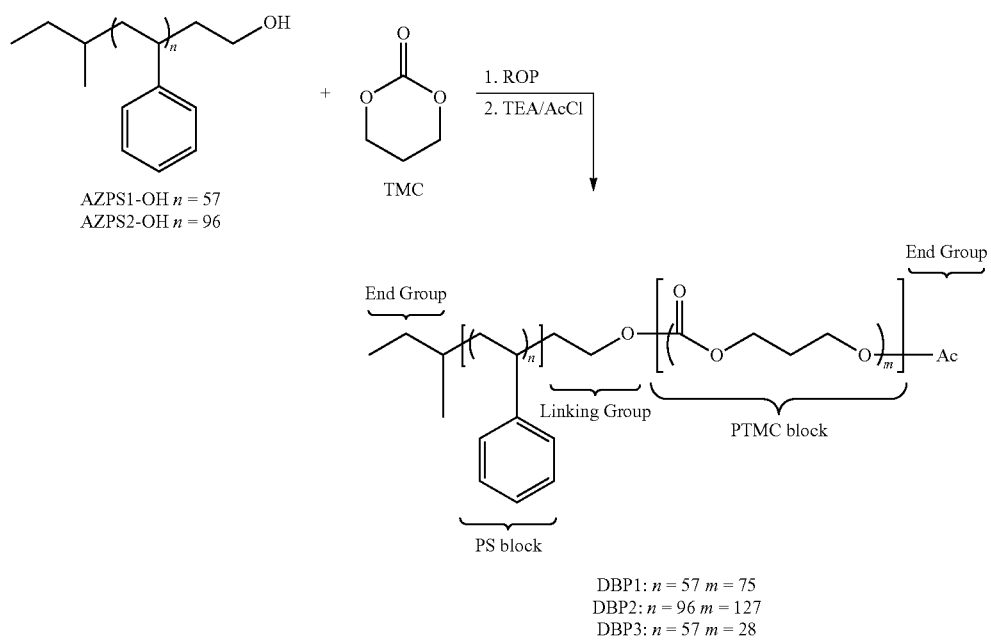

Example 1

Synthesis of diblock polymer DBP1, n=57, m=75 by ring opening polymerization (ROP) of trimethylene carbonate (TMC), with mono-alcohol initiator AZPS1-0H and ROP acid catalyst diphenylphosphate (DPP). To an oven dried 20 mL round bottom flask equipped with a magnetic stir bar, AZPS1-0H (0.70 g, 0.113 mmol, Mn=6200, PDI=1.02, n=57, obtained from AZ-Electronic Materials, Branchburg, N.J.), TMC (1.76 g, 17.25 mmol), and DCM (2.94 mL) were added. The reaction mixture was stirred until the AZPS1-0H macroinitiator and TMC were completely dissolved in DCM, upon which diphenylphosphate (DPP, 400 mg, 1.6 mmol, catalyst) was added. The reaction mixture was stirred at room temperature (r.t.) for 16 hours in a glove box. The reaction flask was brought out of the glove box and cooled at 0° C. by immersing it in an ice-water bath. The reaction was stopped by adding DCM (6 mL), TEA (0.7 mL, 02.72 mmol) and acetyl chloride (0.25 ml, 3.52 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. Mn (GPC)=17200, Mw=17700, PDI=1.029; Mn (NMR)=AZPS (6.2 k)-PMTC(7.8 k), n=57.4, m=75; TMC % conversion: about 50%. The resulting polymer was dissolved in THF to form a 20 wt % solution and the polymer was precipitated in methanol:acetonitrile (200 mL, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours to give DBP1. Mn (GPC)=17200, Mw=17600, PDI=1.02; Mn (NMR)=PS(6.2 k)-b-PTMC(7.7 k), n=57, m=75. The notation PS(6.2 k)-b-PTMC(7.7 k) means the poly(styrene) block (PS) has an Mn=6200 and the poly(trimethylene carbonate) block (PTMC) has an Mn=7700. This notation is also used in the examples that follow.

Example 2

Synthesis of DBP2 with DPP catalyst. This diblock polymer was prepared with AZPS2-OH (0.20 g, 0.02 mmol, Mn=10000, n=96), TMC (0.518 g, 5.078 mmol), and DPP (62.5 mg, 0.25 mmol) using the general procedure as outlined in Example 1. Mn (GPC)=24900, Mw=25800, PDI=1.03; Mn (NMR)=PS(10.0 k)-b-PTMC(13 k), n=96, m=127.

Example 3

Synthesis of DBP3 with DPP catalyst. This diblock polymer was prepared with AZPS1-OH (0.30 g, 0.048 mmol, Mn=6200, n=57), TMC (0.296 g, 2.90 mmol), and DPP (0.12 g, 0.483 mmol) using the general procedure as outlined in Example 1. Mn (GPC)=10800, Mw=11200, PDI=1.03; Mn (NMR)=PS(6.2 k)-b-PTMC(2.9 k), n=57, m=28.

Synthesis of Triblock Polymers

Example 4

Synthesis of triblock polymer TBP1 with DBU was prepared in 4 steps.

A) Preparation of Intermediate Polymer IP-1.

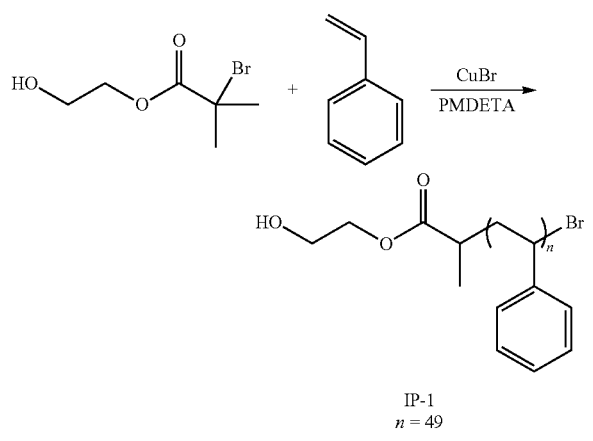

To a 100 mL Schlenk flask equipped with a stir bar, styrene (14.80 g, 0.142 mol), 2-hydroxyethyl 2-bromoisobutyrate (HEBIB, 0.20 g, 0.946 mmol, ATRP initiator), CuBr (0.126 g, 0.946 mmol) and anisole (15 g) were added. The flask was sealed with a rubber septum and was purged by bubbling nitrogen for one hour. At this point, PMDETA (0.168 g, 0.946 mmol) was added and the reaction flask was placed in an oil-bath set at 110° C. for 280 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer IP-1 was collected in a frit funnel and was dried under vacuum for 24 hours at 50° C. Mn=5500, Mw=6000, PDI=1.07, n=49.

B) Preparation of Intermediate Polymer IP-2.

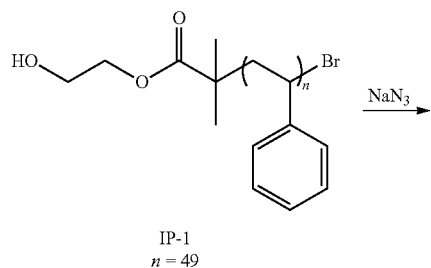

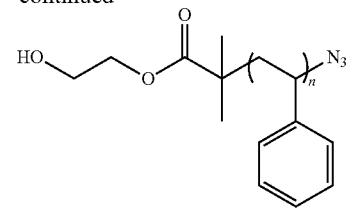

I-1 (3.0 g, 0.54 mmol), dimethylformamide (DMF) (100 mL) and sodium azide (0.354 g, 5.4 mmol) were combined in a 500 mL round bottom flask and the reaction was stirred at 80° C. for 12 hours. The reaction mixture was then cooled to room temperature and DMF was evaporated under vacuum. The resulting solid was dissolved in THF and precipitated twice in methanol. The polymer 1-2 was collected in a frit funnel and was dried under vacuum for 24 hours at 50° C. Mn=5500, Mw=6000, PDI=1.07, n=49.

C) Preparation of Intermediate Polymer IP-3.

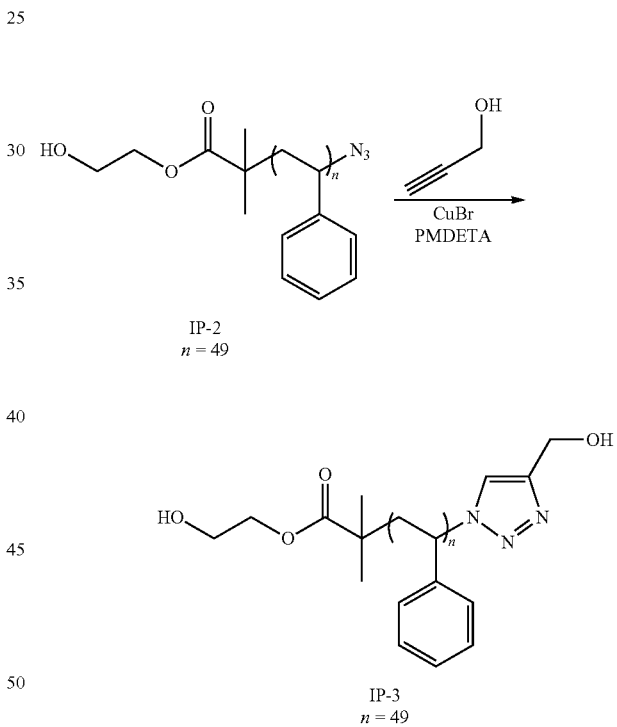

To a 100 mL round bottom flask equipped with a magnetic stir bar, IP-2 (1.73 g, 0.314 mmol), propargyl alcohol (0.14 g, 2.50 mmol), DMF (12 mL), PMDETA (90 mg, 0.524 mmol) and CuBr (75 mg, 0.524 mmol) were added. The reaction mixture was stirred under a nitrogen environment for 24 hours. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer was collected in a frit funnel and was dried under vacuum for 24 hours at 50° C. to obtain IP-3 Mn=6000, Mw=6600, PDI=1.07, n=49.

D) Preparation of Triblock Polymer TBP1.

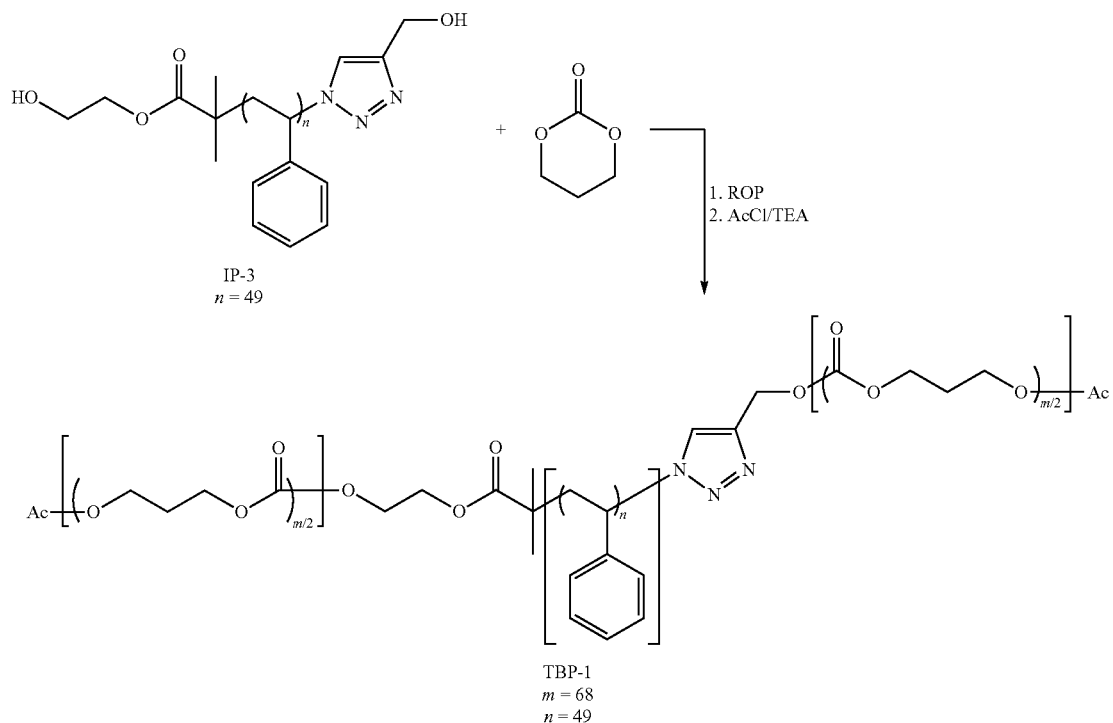

To an oven dried 4 mL vial equipped with a magnetic stir bar, IP-3 (0.20 g, 0.033 mmol, Mn=6000, PDI=1.07), trimethylene carbonate (TMC, 0.47 g, 4.6 mmol), and dichloromethane (DCM, 1.2 mL) were added. The reaction mixture was stirred until the OH-PS-OH macroinitiator and TMC were completely dissolved in DCM, upon which DBU (25 mg, 0.16 mmol) was added. The reaction mixture was stirred at room temperature for 3 hours in a glove box. The reaction was stopped by adding DCM (1 mL), triethylamine (TEA, 0.2 mL) and acetyl chloride (0.1 mL). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol: acetonitrile (200 mL, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours to give TBP1. Mn (GPC)=20600, Mw=22200, PDI=1.08; Mn (NMR)=PTMC (3.5 k)-b-PS(6.0 k)-b-PTMC(3.5 k). The volume fraction of the PTMC block, expressed as VfPTMC, was about 0.48.

Examples 5 and 6

Triblock polymers TBP2 and TBP3 (examples 5 and 6, respectively) were prepared according to Scheme 27.

Scheme 27.

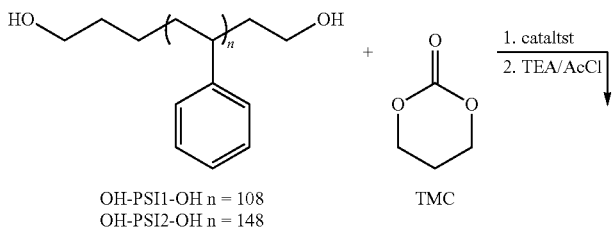

-continued

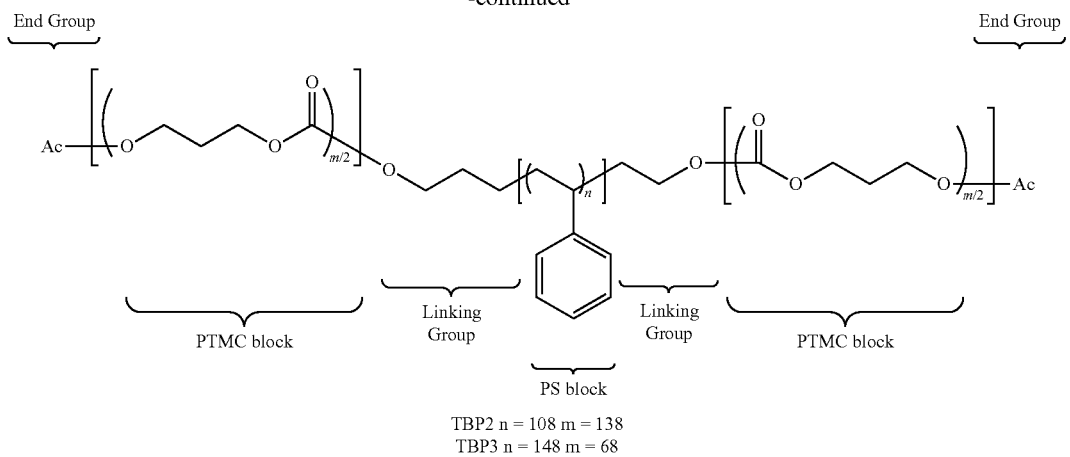

PTMC block — Linking Group — PS block — Linking Group — PTMC block

TBP2 n = 108 m = 138
TBP3 n = 148 m = 68

Example 5, TBP2, is representative using DPP catalyst. To an oven dried 4 mL vial equipped with a magnetic stir bar, OH-PSI1-OH (0.15 g, 0.013 mmol, Mn=11,500, n=108, obtained from Polymer Source Incorporated, Montreal, Canada), TMC (0.378 g, 3.70 mmol), and DCM (1.85 mL) were added. The reaction mixture was stirred until the HO-PSI1-OH macroinitiator and TMC were completely dissolved in DCM, upon which DPP (65 mg, 0.26 mmol) was added. The reaction mixture was stirred at room temperature for 15 hours in a glove box. The reaction was stopped by adding DCM (1 mL), TEA (0.2 mL) and acetyl chloride (0.1 mL). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol:acetonitrile (200 mL, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=27900, Mw=30300, PDI=1.09; Mn (NMR)=PTMC(7.05 k)-b-PS(11.5 k)-b-PTMC(7.05 k), n=108, m=138. VfPTMC~0.49.

Example 6

Synthesis of TBP3 with DPP catalyst. This polymer was prepared with HO-PSI2-OH (0.15 g, 0.0095 mmol, Mn 15700, n=148), TMC (0.155 g, 1.528 mmol), and DPP (24 mg, 0.095 mmol) using the general procedure as outlined in Example 5. Mn (GPC)=24200, Mw=26400, PDI=1.09; Mn (NMR)=PTMC(3.5 k)-b-PS(14.7 k)-b-PTMC(3.5 k), n=148, m=68. VfPTMC~0.26.

Table 2 summarizes the preparations and properties of the block copolymers of Examples 1-6.

TABLE 2

| Example | BCP Name | Monomer | Catalyst | Initiator | Temp | Time (hours) | Mn (kDa) GPC | Mw (kDa) GPC | PDI | PS block NMR (Mn, kDa) | PTMC block NMR (Mn, kDa) | Vf PTMC |
|---|---|---|---|---|---|---|---|---|---|---|---|---|
| 1 | DBP1 | TMC | DPP | AZPS1-OH | r.t. | 16 | 17.2 | 17.6 | 1.02 | 6.2 | 7.7 | 0.49 |
| 2 | DBP2 | TMC | DPP | AZPS2-OH | r.t. | 20 | 24.9 | 25.8 | 1.03 | 10.0 | 13 | 0.50 |
| 3 | DBP3 | TMC | DPP | AZPS1-OH | r.t. | 5 | 10.8 | 11.2 | 1.03 | 6.2 | 2.9 | 0.27 |
| 4 | TBP1 | TMC | DBU | IP-3 | r.t. | 3 | 13.5 | 20.6 | 1.07 | 6.0 | 7 | 0.48 |
| 5 | TBP2 | TMC | DPP | OH-PSI1-OH | r.t. | 15 | 27.9 | 30.3 | 1.09 | 11.5 | 14.1 | 0.49 |
| 6 | TBP3 | TMC | DPP | OH-PSI2-OH | r.t. | 23 | 24.2 | 26.4 | 1.09 | 15.7 | 7.0 | 0.26 |

Underlayer Random Copolymers Based on Styrene, TMC, and GMA

These random copolymers (Examples 7-18) have the prefix "G1" in the name.

Example 7

Synthesis of random copolymer P-1, Sty:HEMA:GMA mole ratio x:y:z=88:6:6, Sty:HEMA:GMA DP ratio x':y':z'=50.5:3.5:3.5.

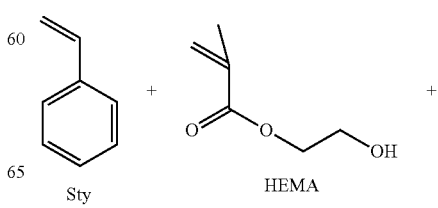

Sty + HEMA +

-continued

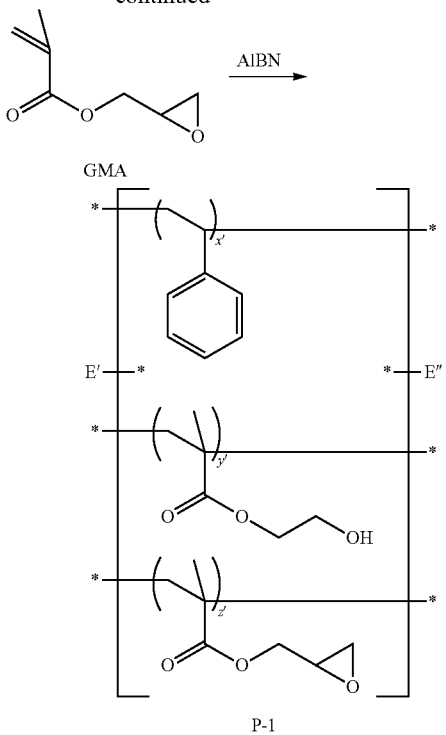

P-1

In the above notation, the vertical stacking of the repeat units within the square brackets indicates a random distribution of the repeat units in the polymer chain. End group E″ is linked to one of the starred bonds overlapping the left square bracket. End group E″ is linked to one of the starred bonds overlapping the right square bracket. It should be understood that for a given repeat unit, a starred bond that overlaps the left square bracket can be linked to a different repeat unit at the position indicated by the right starred bond overlapping the right square bracket, or to end group E′. Likewise, for a given repeat unit, a starred bond that overlaps the right square bracket can be linked to a different repeat unit at the position indicated by the left starred bond overlapping the left square bracket, or to end group E″. Unless otherwise indicated, subscripts x′, y′, and z′ represent the average number of the corresponding parenthesized repeat unit in the polymer. For P-1, the end groups E′ and E″ are not shown.

Styrene (Sty, 14.4 g, 138.0 mmol), hydroxy ethyl methacrylate (HEMA, 1.0 g, 7.68 mmol), glycidyl methacrylate (GMA, 1.09 g, 7.66 mmol), THF (50 g), and azobisisobutyronitrile (AIBN, 0.757 g, 4.61 mmol, 3 mol % based on total moles of vinyl monomers) were combined in a 250 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in MeOH, and was dried under vacuum at 50° C. for 24 hours. Mn=6200, Mw=8700, PDI=1.40. The product Sty:HEMA:GMA mole ratio x:y:z was calculated by $^{13}C$ inverse gated NMR as x:y:z=88:6:6. Based on the Mn and the product mole ratio, the degree of polymerization (DP) of each repeat units Sty:HEMA:GMA was calculated for P-1 to be x′:y′:z′=50.5:3.5:3.5, respectively.

Example 8

Synthesis of TMC-functional random graft copolymer G1-1 from macroinitiator P-1 (Example 7, STY:HEMA:GMA molar ratio x:y:z=88:6:6, DP ratio x′:y′:z′=50.5:3.5:3.5) for orientation control.

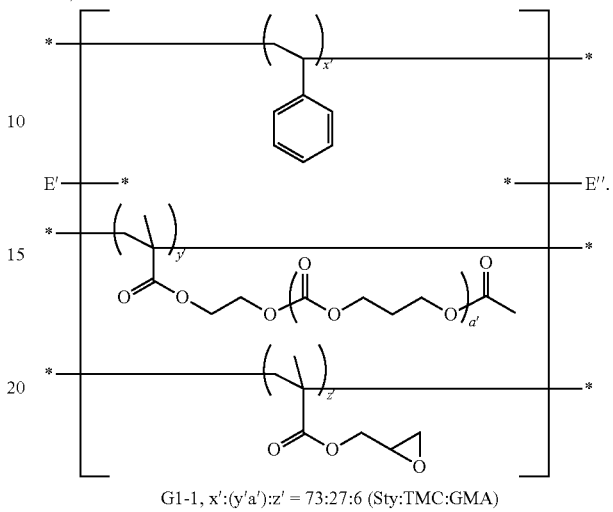

G1-1, x′:(y′a′):z′ = 73:27:6 (Sty:TMC:GMA)

The quantity y′a′ (i.e., y′ multiplied by a′) represents the total average number of repeat units derived from TMC in the random graft copolymer G1-1. In these calculations, Mn was not adjusted for the mass of end groups E′ and E″ when determining the DP of each repeat unit.

P-1 (0.2 g, Example 6), trimethylene carbonate (TMC, 0.060 g, 0.588 mmol) and dichloromethane (DCM, 0.2 g) were added to an oven dried 4 mL glass vial equipped with a magnetic stir bar. The reaction mixture was stirred until the macroinitiator and TMC were completely dissolved in DCM, upon which 1,8-diazabicyclo[5.4.0]undec-7-ene (DBU, ~10 mg) was added. The reaction mixture was stirred at room temperature (r.t.) for 1 hour in a glove box. The reaction was stopped by bringing the reaction vial out of the glove box and by adding DCM (0.5 ml), triethylamine (TEA, 0.27 g, 2.72 mmol) and acetyl chloride (~60 mg, 0.764 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol for two more times. The solids were collected in a frit funnel and dried under vacuum at 40° C. for two hours to obtain random graft copolymer G1-1, where the Sty:TMC mole ratio x′:y′a′=73:27 was determined by $^1H$ NMR. The average value of a′ was calculated as follows:

$x'/y'$=50.5/3.5 (DP ratio of the P-1 macroinitiator), $x'/(y'a')$=73/27 (Sty:TMC mole ratio of G1-1 by $^1H$ NMR), rearranging, $x'/y'$=73a′/27 substituting, 50.5/3.5=73a′/27, and solving, a′=5.33.

Therefore, G1-1 has a side chain polycarbonate having an average number of carbonate repeat units a′=5.33, based on the Mn of G1-1.

Examples 9-18

Preparation of underlayer random graft copolymers G1-2 to G1-11 for orientation control. These polymers were prepared using the general procedure of Example 8 and macroinitiator P-1 (Example 7) at various Sty:TMC molar ratios. G1-2 to G1-11 differ from G1-1 by a′, the average number of repeat units of TMC in the side chain. The results are summarized in Table 3.

TABLE 3

| Ex. | Random Graft Polymer Name | TMC (g) | DCM (g) | DBU (mg) | P-1 Initiator (g) | Temp | Time (hours) | GPC Mn | GPC Mw | GPC PDI | Sty:TMC Mole Ratio | a'[1] | Monomer % Conversion. |
|---|---|---|---|---|---|---|---|---|---|---|---|---|---|
| 8 | G1-1 | 0.06 | 0.2 | ~10 | 0.2 | r.t. | 1 | — | — | — | 73:27 | 5.3 | >99 |
| 9 | G1-2 | 0.1 | 0.32 | ~10 | 0.2 | r.t. | 1.5 | — | — | — | 60:40 | 9.6 | >99 |
| 10 | G1-3 | 0.46 | 1.50 | ~10 | 0.2 | r.t. | 2 | 23600 | 44000 | 1.87 | 24:76 | 45.7 | >99 |
| 11 | G1-4 | 0.035 | 0.52 | ~10 | 0.2 | r.t. | 0.45 | — | — | — | 88:12 | 2.0 | >99 |
| 12 | G1-5 | 0.06 | 0.37 | ~13 | 0.2 | r.t. | 1 | 9300 | 13500 | 1.44 | 73:27 | 5.3 | >99 |
| 13 | G1-6 | 0.1 | 0.45 | ~10 | 0.2 | r.t. | 1.5 | 11400 | 18000 | 1.57 | 59:41 | 10.0 | >99 |
| 14 | G1-7 | 0.06 | 0.72 | ~10 | 0.2 | r.t. | 1 | — | — | — | 73:27 | 5.3 | >99 |
| 15 | G1-8 | 0.1 | 0.9 | ~10 | 0.2 | r.t. | 1.4 | — | — | — | 66:34 | 7.4 | ~90 |
| 16 | G1-9 | 0.15 | 0.9 | ~16 | 0.2 | r.t. | 1 | 12100 | 15900 | 1.31 | 62:38 | 8.8 | ~50 |
| 17 | G1-10 | 0.15 | 0.9 | ~14 | 0.2 | r.t. | 0.75 | — | — | — | 62:38 | 8.8 | ~50 |
| 18 | G1-11 | 0.15 | 0.9 | ~14 | 0.2 | r.t. | 1.4 | — | — | — | 43:57 | 19.1 | ~65 |

[1] 'a' is based on Mn of the random graft copolymer, without correcting for end groups Synthesis of underlayers based on styrene, AcEMA, and GMA These random copolymers (Examples 19-25) have the prefix "GHS" in the name and have the general structure

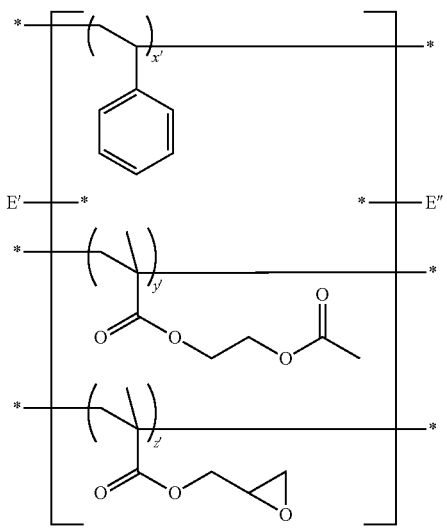

where average numbers of repeat units x', y' and z' are greater than 0. End groups E' and E" are not shown.

Example 19

Synthesis of poly(styrene-r-acetoxyethyl methacrylate-r-glycidyl methacrylate) underlayer GHS-1, x:y:z=77:19:4 (mole ratio), DP ratio x':y':z'=48.5:12.1:2.6.

Styrene (Sty, 4.0 g, 38.4 mmol, MW 104.2), acetoxyethyl methacrylate (AcEMA, 1.21 g, 7.02 mmol, MW 172.2), glycidyl methacrylate (GMA, 0.20 g, 1.40 mmol, MW 142.2), THF (22 g), and azobisisobutyronitrile (AIBN, 0.31 g, 1.87 mmol, 4 mol % based on total moles of vinyl monomers) were combined in a 250 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in MeOH, and was dried under vacuum at 50° C. for 24 hours to give GHS-1. Mn=7500, Mw=10,100, PDI=1.34. The product mole ratio of Sty:AcEMA:GMA was calculated by $^{13}C$ inverse gated NMR as x:y:z=77:19:4 (mole ratio). Based on Mn and without adjusting for end groups E' and E", the degree of polymerization ratio of Sty:AcEMA:GMA was x':y':z'=48.5:12.1:2.6, or 48:12:3 when rounded to zero decimal places.

Examples 20-25

Preparation of random graft copolymers GHS-2 to GHS-7 for underlayer orientation control. These polymers were prepared using the general procedure of Example 19 at various Sty:AcEMA:GMA molar ratios as summarized in Table 4.

TABLE 4

| Ex. | Random Graft Polymer Name | Sty (g, mmol) | AcEMA (g, mmol) | GMA (g, mmol) | AIBN (g, mmol) | THF (g) | Temp (° C.) | Time (hours) |
|---|---|---|---|---|---|---|---|---|
| 19 | GHS-1 | 4.0, 38.4 | 1.21, 7.02 | 0.20 1.40 | 0.31, 1.87 | 22 | 70 | 18 |
| 20 | GHS-2 | 1.40, 13.33 | 1.61, 9.38 | 0.1, 0.70 | 0.154, 0.94 | 10 | 70 | 18 |
| 21 | GHS-3 | 0.66, 6.33 | 2.82, 16.41 | 0.10, 0.70 | 0.154, 0.94 | 11 | 70 | 18 |
| 22 | GHS-4 | 1.27, 12.20 | 1.82, 10.55 | 0.10, 0.70 | 0.154, 0.94 | 10 | 70 | 18 |
| 23 | GHS-5 | 1.20, 11.5 | 1.94, 11.25 | 0.1, 0.70 | 0.154, 0.94 | 10 | 70 | 18 |
| 24 | GHS-6 | 0.55, 5.2 | 1.05, 6.1 | 0.05, 0.35 | 0.077, 0.47 | 5 | 70 | 18 |
| 25 | GHS-7 | 0.66, 6.32 | 0.87, 5.04 | 0.05, 0.35 | 0.077, 0.47 | 5 | 70 | 18 |

TABLE 4-continued

| Ex. | Feed Mole Ratio Sty:AcEMA:GMA | Product Mole Ratio Sty:AcEMA:GMA | Product Sty:AcEMA:GMA DP ratio | GPC Mn | Mw | PDI |
|---|---|---|---|---|---|---|
| 19 | 82:15:3 | 77:19:4 | 49:12:3 | 7500 | 10100 | 1.34 |
| 20 | 57:40:3 | 55:42:2 | 29:22:1 | 6900 | 12100 | 1.74 |
| 21 | 27:70:3 | 29:68:3 | 15:36:2 | 8100 | 14600 | 1.79 |
| 22 | 52:45:3 | 50:47:3 |  | 7200 | 11870 | 1.64 |
| 23 | 49:48:3 | 48:49:3 |  | 7570 | 12860 | 1.69 |
| 24 | 42:52:3 | 45:50:4 | 27:30:2 | 8400 | 13700 | 1.63 |
| 25 | 54:43:3 | 53:44:3 | 31:26:2 | 7900 | 12900 | 1.62 |

Synthesis of Surface Active Polymer Additives (SAP)

Example 26

Synthesis of SAP1, HFA-Sty homopolymer.

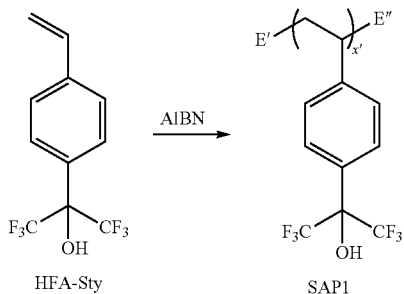

End groups E' and E" are not shown for SAP1. Hexafluoroalcohol styrene (HFA-Sty, 5.28 g, 19.54 mmol, MW 270.2), THF (16 g), and azobisisobutyronitrile (AIBN, 0.182 g, 1.10 mmol, 4 mol % based on total moles of vinyl monomer) were combined in a 100 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in hexanes, and was dried under vacuum at 50° C. for 24 hours. Mn=5800, Mw=12300, PDI=2.13. Based on Mn and without adjusting for end groups E' and E", the degree of polymerization x'=21.

Example 27

Synthesis of SAP2, homopolymer of BisHFACHMA.

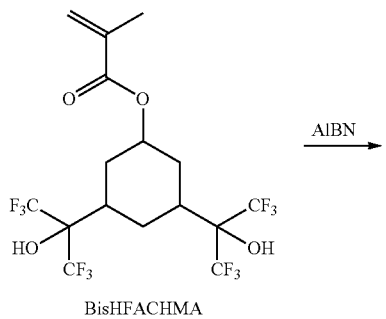

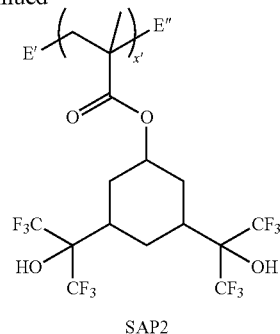

End groups E' and E" are not shown for SAP2. SAP2 was prepared according to the general procedure of Example 26 using BisHFACHMA (1.0 g, 2.19 mmol, MW 456.1), THF (4.0 g), and azobisisobutyronitrile (AIBN, 0.014 g, 0.0876 mmol, 4 mol % based on total moles of vinyl monomer). Mn=8200, Mw=11100, PDI=1.34. Based on Mn without adjusting for end groups, E' and E", the degree of polymerization x'=18.

Example 28

Synthesis of SAP3, homopolymer of iPrHFAMA.

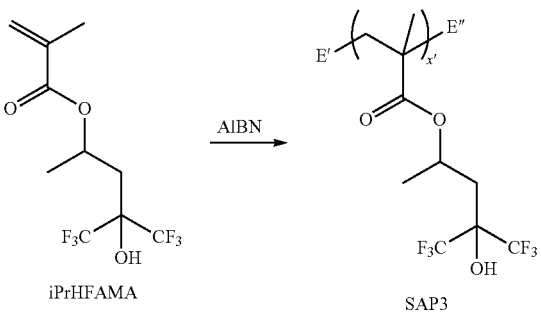

End groups E' and E" are not shown for SAP3. SAP3 was prepared according to the general procedure of Example 26 using iPrHFAMA (5.0 g, 17.0 mmol, MW 456.1), THF (15.0 g), and azobisisobutyronitrile (AIBN, 0.11 g, 0.68 mmol, 4 mol % based on total moles of vinyl monomer). Mn=8400, Mw=14500, PDI=1.73. Based on Mn without adjusting for end groups E' and E", the degree of polymerization x'=18.

Example 29

Synthesis of SAPS-20, random copolymer of styrene and HFA-Sty.

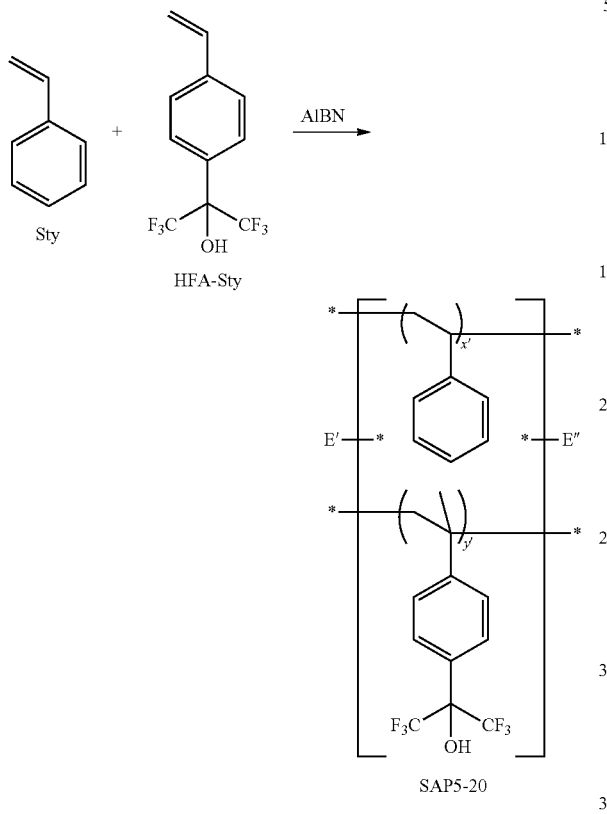

SAP5-20

Styrene (Sty, 0.29 g, 2.78 mmol, MW 104.2), hexafluoroalcohol styrene (HFA-Sty, 3.0 g, 11.1 mmol, MW 270.2), THF (10 g), and azobisisobutyronitrile (AIBN, 0.091 g, 0.55 mmol, 4 mol % based on total moles of vinyl monomers) were combined in a 100 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in hexanes, and was dried under vacuum at 50° C. for 24 hours. Mn=13100, Mw=22900, PDI=1.73. The product Sty:HFA-Sty x:y mole ratio was calculated by $^{13}$C inverse gated NMR as x:y=22:78 (mole ratio). Based on Mn without adjusting for end groups E' and E", the DP ratio x':y'=12.3:43.7, or 12:44.

Example 30

Synthesis of SAP6-20, random copolymer of pentafluorostyrene (PFS) and HFA-Sty

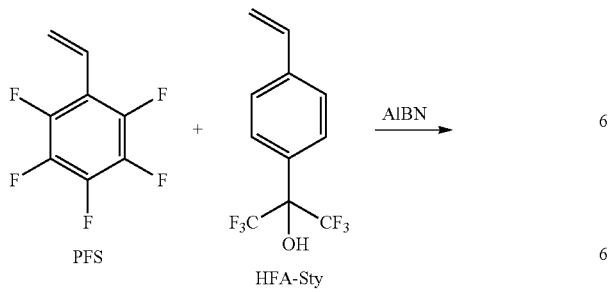

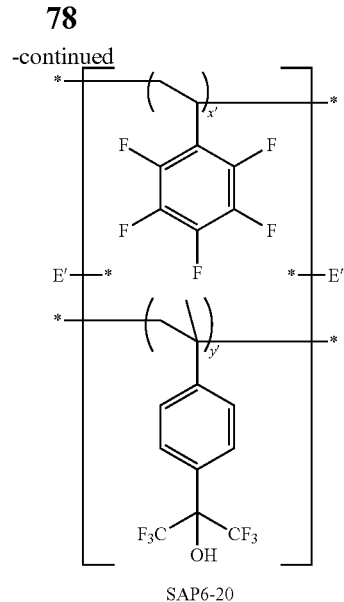

SAP6-20

Pentafluorostyrene (PFS, 0.54 g, 2.78 mmol, MW 194), hexafluoroalcohol styrene (HFA-Sty, 3.0 g, 11.1 mmol, MW 270.2), THF (10 g), and azobisisobutyronitrile (AIBN, 0.091 g, 0.55 mmol, 4 mol % based on total moles of vinyl monomers) were combined in a 100 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in hexanes, and was dried under vacuum at 50° C. for 24 hours. Mn=14500, Mw=26700, PDI=1.84. The product PFS:HFA-Sty x:y mole ratio was calculated by $^{13}$C inverse gated NMR as x:y=17:83 (mole ratio). Based on Mn and excluding end groups E' and E", the DP ratio x':y'=9.6:46.5.

Example 31-33

Synthesis of SAP6-40 to SAP6-80, respectively. These random copolymers of PFS and HFA-Sty were prepared using the general procedure of Example 30 at different molar ratios of PFS and HFA-Sty (see Table 5).

Example 34

Synthesis of Pf-OiBr, a fluorinated atom transfer radical polymerization (ATRP) initiator.

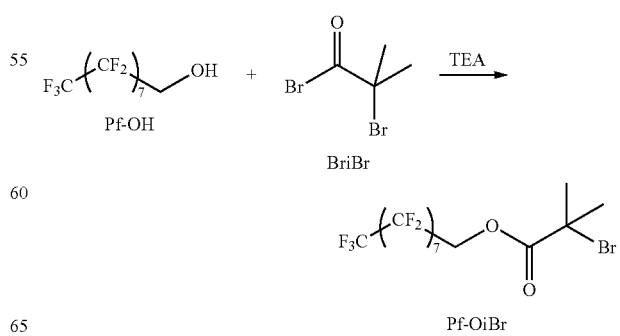

1H,1H-Perfluorononan-1-ol (Pf-OH, 3.0 g, 6.66 mmol), triethylamine (TEA, 1.01 g, 1.0 mmol), and THF (50 mL) were combined in a 250 mL round bottom flask equipped with a magnetic stir-bar. To this mixture a solution of bromoisobutryl bromide (BriBr, 1.83 g, 8.0 mmol) in THF (20 mL) was added drop-wise over 30 minutes at room temperature. The reaction mixture was stirred under nitrogen for 24 hours after which the reaction was stopped by exposing it to air. The solution was filtered through a filter paper to remove the triethylamine hydrobromide salt, and the THF was removed under vacuum. The resulting crude compound was purified using a silica-gel column chromatography with hexane:ethyl acetate (80:20) as the mixture to obtain pure perfluoro-tagged ATRP initiator Pf-OiBr.

Example 35

Synthesis of SAP7-C, a homopolymer of HFA-Sty having a multi-fluorinated end group, prepared by ATRP polymerization.

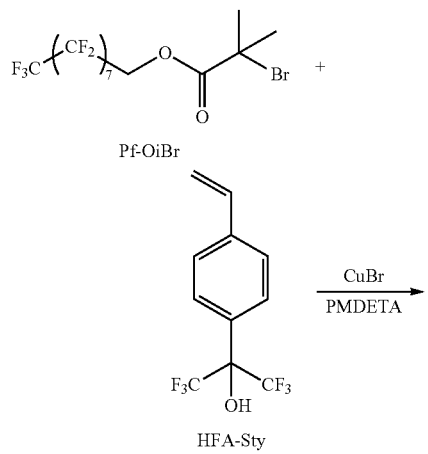

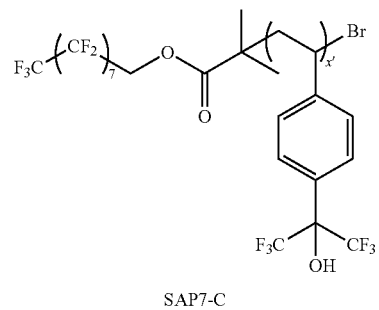

SAP7-C

To a 50 mL Schlenk flask equipped with a stir bar, HFA-Sty (3.0 g, 11.1 mmol, MW 270.2), ATRP initiator Pf-OiBr (0.443 g, 0.74 mmol, MW 598, Example 32), CuBr (0.106 g, 0.74 mmol) and anisole (3.0 g) were added. The flask was sealed with a rubber septum and was purged by bubbling nitrogen for one hour. At this point, PMDETA (0.128 g, 0.74 mmol) was added and the reaction flask was placed in an oil-bath set at 80° C. for 100 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in cold hexanes from THF. The polymer was collected in a frit funnel and was dried under vacuum for 24 hours at 50° C. Mn=3200, Mw=3600, PDI=1.08. Based on the Mn, x'=9.6.

Table 5 summarizes the preparations of surface active polymer Examples 26-33 prepared by free radical polymerization using AIBN initiator.

TABLE 5

| SAP additive Ex. name | Monomer 1 Name | (g, mmol) | Feed Mole % | Monomer 2 Name | (g, mmol) | Feed Mole % | AIBN (g, mmol) | THF (g) | Temp | Time (hours) |
|---|---|---|---|---|---|---|---|---|---|---|
| 26 SAP1 | HFA-Sty | 5.28, 19.54 | 100 | | | | 0.1822, 1.10 | 16 | 70 | 18 |
| 27 SAP2 | BisHFACHMA | 1.0, 2.19 | 100 | | | | 0.014, 0.087 | 4 | 70 | 18 |
| 28 SAP3 | iPrHFAMA | 5.0, 17.0 | 100 | | | | 0.11, 0.68 | 15 | 70 | 18 |
| 29 SAP5-20 | Sty | 0.29, 2.78 | 20 | HFA-Sty | 3.0, 11.1 | 80 | 0.091, 0.55 | 10 | 70 | 18 |
| 30 SAP6-20 | PFS | 0.54, 2.78 | 20 | HFA-Sty | 3.0, 11.1 | 80 | 0.091, 0.55 | 10 | 70 | 18 |
| 31 SAP6-40 | PFS | 0.60, 3.09 | 40 | HFA-Sty | 1.25, 4.63 | 60 | 0.05, 0.31 | 6 | 70 | 18 |
| 32 SAP6-60 | PFS | 0.70, 3.60 | 60 | HFA-Sty | 0.65, 2.40 | 40 | 0.039, 0.24 | 5 | 70 | 18 |
| 33 SAP6-80 | PFS | 1.50, 7.73 | 80 | HFA-Sty | 0.522, 1.93 | 20 | 0.065, 0.38 | 6 | 70 | 18 |

Table 6 summarizes the NMR and GPC analyses of surface active polymer Examples 26-33 and 35.

TABLE 6

| SAP additive Ex. name | Monomer 1 Name | Monomer 2 Name | SAP Monomer 1:Monomer 2 Mole Ratio | SAP Monomer 1:Monomer 2 DP Ratio | GPC Mn | Mw | PDI |
|---|---|---|---|---|---|---|---|
| 26 SAP1 | HFA-Sty | | 100 | 21 | 5800 | 12300 | 2.13 |
| 27 SAP2 | BisHFACHMA | | 100 | 18 | 8200 | 11100 | 1.34 |

TABLE 6-continued

| Ex. | SAP additive name | Monomer 1 Name | Monomer 2 Name | SAP Monomer 1:Monomer 2 Mole Ratio | SAP Monomer 1:Monomer 2 DP Ratio | GPC Mn | GPC Mw | GPC PDI |
|---|---|---|---|---|---|---|---|---|
| 28 | SAP3 | iPrHFAMA | | 100 | 18 | 8400 | 14500 | 1.73 |
| 29 | SAP5-20 | Sty | HFA-Sty | 22:78 | 12:44 | 13100 | 22900 | 1.73 |
| 30 | SAP6-20 | PFS | HFA-Sty | 17:83 | 10:47 | 14500 | 26700 | 1.84 |
| 31 | SAP6-40 | PFS | HFA-Sty | 43:57 | 31:41 | 17200 | 31200 | 1.81 |
| 32 | SAP6-60 | PFS | HFA-Sty | 59:41 | 54:38 | 20800 | 32000 | 1.53 |
| 33 | SAP6-80 | PFS | HFA-Sty | 80:20 | | | | |
| 35 | SAP7-C | HFA-Sty | | 100 | 10 | 3200 | 3600 | 1.08 |

Underlayer and Composite Layer Film Preparations

Examples 36-42

Thin Film preparation of underlayers (ULs) with random graft copolymers G1-2, G1-3, G1-7, G1-8 and G1-10 (see above Table 3)

The following general procedure was used to prepare a thin film underlayer on a silicon wafer. A solution was prepared by dissolving the random graft copolymer (95 parts by weight) and p-nitrobenzylsulphonic acid triflate salt (p-NBT, 5 parts by weight) in propylene glycol monomethyl ether acetate (PGMEA, 10,000 parts by weight) to form a 1.0 wt % solution based on total dry solids. p-NBT is a thermal acid generator and was added to promote the grafting and partial crosslinking of a thin film of the random graft copolymer on the silicon wafer substrate when baked (annealed). The solutions were passed through a 0.2 mm polytetrafluoroethylene (PTFE) filter prior to spin coating the solution on a silicon wafer at 2000 rpm spin rate. After forming the thin film, the coated wafer was baked at 200° C. for 3 minutes and cooled to room temperature. The initial baked thin film (underlayer) had a thickness of 20 nm, measured with a Nanospec Reflectometer. The underlayer was then given a solvent rinse by casting PGMEA on top of the coated wafer, letting the solvent puddle for 30 seconds, and spin drying the treated wafer at 2000 rpm for 30 seconds. The rinse was intended to remove any excess random graft copolymer that was not crosslinked or grafted to the wafer surface. The final film thickness of the underlayer was 10 nm after the solvent rinse. Table 7 summarizes the underlayer films UL-1 to UL-5 and UL-13 to UL-14 prepared with the random copolymers having a "G1" prefix in the name.

TABLE 7

| Example | UL Name | Random Copolymer | Sty:TMC mole ratio | Sty (x') DP[1] | HEMA (y') DP[1] | TMC (a') DP[1] |
|---|---|---|---|---|---|---|
| 36 | UL-1 | G1-3 | 24:76 | 50.5 | 3.5 | 45.7 |
| 37 | UL-2 | G1-2 | 60:40 | 50.5 | 3.5 | 9.6 |
| 38 | UL-3 | G1-10 | 62:38 | 50.5 | 3.5 | 8.8 |
| 39 | UL-4 | G1-8 | 66:34 | 50.5 | 3.5 | 7.4 |
| 40 | UL-5 | G1-7 | 73:27 | 50.5 | 3.5 | 5.3 |
| 41 | UL-13 | G1-11 | 43:57 | 50.5 | 3.5 | 8.8 |
| 42 | UL-14 | G1-4 | 88:12 | 50.5 | 3.5 | 19.1 |

[1] x', y', and a' are based on Mn of the random graft copolymer

Examples 43-49

Thin film preparation of underlayers (ULs) using random copolymers GHS-1 to GHS-7 (see above Table 4).

The following general procedure was used to prepare a thin film underlayer on a silicon wafer. A solution was prepared by dissolving the random graft copolymer (95 parts by weight) and p-nitrobenzylsulphonic acid triflate salt (p-NBT, 5 parts by weight) in propylene glycol monomethyl ether acetate (PGMEA, 10,000 parts by weight) to form a 1.0 wt % solution based on total dry solids. p-NBT is a thermal acid generator and was added to promote the grafting and partial crosslinking of a thin film of the random graft copolymer on the silicon wafer substrate when baked (annealed). The solutions were passed through a 0.2 mm polytetrafluoroethylene (PTFE) filter prior to spin coating the solution on a silicon wafer at 2000 rpm spin rate. After forming the thin film, the coated wafer was baked at 190° C. for 3 minutes and cooled to room temperature. The initial baked thin film (underlayer) had a thickness of 20 nm, measured with a Nanospec Reflectometer. The underlayer was then given a solvent rinse by casting PGMEA on top of the coated wafer, letting the solvent puddle for 30 seconds, and spin drying the treated wafer at 2000 rpm for 30 seconds. The rinse was intended to remove any excess random graft copolymer that was not crosslinked or grafted to the wafer surface. The final film thickness of the underlayer was 10 nm after the solvent rinse. Table 8 summarizes the underlayer films UL-6 to UL-12 prepared with GHS-1 to GHS-7, respectively.

TABLE 8

| Example | UL Name | Random Co-polymer | Sty:AcEMA:GMA mole ratio | Sty:AcEMA:GMA DP ratio |
|---|---|---|---|---|
| 43 | UL-6 | GHS-1 | 77:19:4 | 49:12:3 |
| 44 | UL-7 | GHS-2 | 55:43:2 | 29:22:1 |
| 45 | UL-8 | GHS-3 | 29:68:3 | 15:36:2 |
| 46 | UL-9 | GHS-4 | 50:47:3 | |
| 47 | UL-10 | GHS-5 | 48:49:3 | |
| 48 | UL-11 | GHS-6 | 45:50:4 | 27:30:2 |
| 49 | UL-12 | GHS-7 | 53:44:3 | 31:26:2 |

Formulation of Block Copolymer and SAP Additives

Examples 50-91

Preparation of coating formulations for self-assembly containing block copolymer of Examples 1 and 3-6, and surface active polymers (SAP) of Examples 26-33 and 35.

The following general procedure is representative. Separate block copolymer solutions were prepared for one coating. The block copolymer (0.01 g) for self-assembly was dissolved in PGMEA (0.823 g) to form a 1.2 wt % solution of the block copolymer. Surface active polymer (0.1 g, SAP Examples 26-33 and Example 35) was dissolved in PGMEA (8.23 g) to form a 1.2 wt % stock solution of the SAP polymer based on total weight of the solution. The SAP solution was filtered through 0.2 micrometer PTFE filter. A portion of the SAP stock solution was then added to the entire block copolymer solution containing to form a coating composition containing the desired SAP concentration. This solution was stirred at room temperature to form a homogeneous mixture upon which it was filtered through a 0.2 micrometer PTFE filter. Table 9 summarizes the prepared block copolymer coating formulations containing SAP additives.

Thin Film Self-Assembly of Formulated Block Copolymer Compositions on UL-1 to UL-14

Examples 92-177

The following general procedure was used to prepare thin films of formulated block copolymers on UL-1 to UL-14 substrates. A selected coating formulation prepared in Examples 50-91 was spin coated on a selected underlayer coated substrate of Examples 36-49 at a spin rate of 2000 rpm. The coated wafer was then baked (annealed) at a temperature of 140° C. or 170° C. for 5 minutes and immediately cooled to room temperature. The formulated block copolymer films were characterized by atomic force microscopy (AFM) using a Digital Instruments 3100 AFM with a 1 N/m spring constant silicon nitride cantilever operated in a tapping mode. Scan size and speed were set at 2 micrometer×2 micrometer area and 1 Hz respectively. Table 10 summarizes the coating and annealing conditions of the films prepared in Examples 92-177.

TABLE 9

| Example | BCP Ex. | BCP Name | BCP Type | Each Block Mn (NMR) (k = ×1000) | SAP Name | SAP Example | BCP Stock Sol'n (g) | SAP Stock Sol'n (g) | SAP (mg) | BCP (g) | PGMEA (g) | SAP wt % of total solids |
|---|---|---|---|---|---|---|---|---|---|---|---|---|
| 50 | 1 | DBP1 | Diblock | 6.2k-7.7k | SAP1 | 26 | 0.833 | 0.008 | 0.096 | 0.01 | 0.831 | 1 |
| 51 | 1 | DBP1 | Diblock | 6.2k-7.7k | SAP1 | 26 | 0.833 | 0.025 | 0.300 | 0.01 | 0.848 | 3 |
| 52 | 1 | DBP1 | Diblock | 6.2k-7.7k | SAP1 | 26 | 0.833 | 0.042 | 0.504 | 0.01 | 0.865 | 5 |
| 53 | 1 | DBP1 | Diblock | 6.2k-7.7k | SAP1 | 26 | 0.833 | 0.083 | 0.996 | 0.01 | 0.905 | 10 |
| 54 | 2 | DBP2 | Diblock | 10k-13k | SAP1 | 26 | 0.833 | 0.083 | 0.996 | 0.01 | 0.905 | 10 |
| 55 | 1 | DBP1 | Diblock | 6.2k-7.7k | SAP2 | 27 | 0.833 | 0.042 | 0.504 | 0.01 | 0.865 | 5 |
| 56 | 1 | DBP1 | Diblock | 6.2k-7.7k | SAP2 | 27 | 0.833 | 0.083 | 0.996 | 0.01 | 0.905 | 10 |
| 57 | 1 | DBP1 | Diblock | 6.2k-7.7k | SAP3 | 28 | 0.833 | 0.008 | 0.096 | 0.01 | 0.831 | 1 |
| 58 | 1 | DBP1 | Diblock | 6.2k-7.7k | SAP3 | 28 | 0.833 | 0.025 | 0.300 | 0.01 | 0.848 | 3 |
| 59 | 1 | DBP1 | Diblock | 6.2k-7.7k | SAP3 | 28 | 0.833 | 0.042 | 0.504 | 0.01 | 0.865 | 5 |
| 60 | 1 | DBP1 | Diblock | 6.2k-7.7k | SAP5-20 | 29 | 0.833 | 0.008 | 0.096 | 0.01 | 0.831 | 1 |
| 61 | 1 | DBP1 | Diblock | 6.2k-7.7k | SAP5-20 | 29 | 0.833 | 0.025 | 0.300 | 0.01 | 0.848 | 3 |
| 62 | 1 | DBP1 | Diblock | 6.2k-7.7k | SAP5-20 | 29 | 0.833 | 0.042 | 0.504 | 0.01 | 0.865 | 5 |
| 63 | 1 | DBP1 | Diblock | 6.2k-7.7k | SAP5-20 | 29 | 0.833 | 0.083 | 0.996 | 0.01 | 0.905 | 10 |
| 64 | 1 | DBP1 | Diblock | 6.2k-7.7k | SAP6-20 | 30 | 0.833 | 0.008 | 0.096 | 0.01 | 0.831 | 1 |
| 65 | 1 | DBP1 | Diblock | 6.2k-7.7k | SAP6-20 | 30 | 0.833 | 0.025 | 0.300 | 0.01 | 0.848 | 3 |
| 66 | 1 | DBP1 | Diblock | 6.2k-7.7k | SAP6-20 | 30 | 0.833 | 0.042 | 0.504 | 0.01 | 0.865 | 5 |
| 67 | 1 | DBP1 | Diblock | 6.2k-7.7k | SAP6-20 | 30 | 0.833 | 0.083 | 0.996 | 0.01 | 0.905 | 10 |
| 68 | 1 | DBP1 | Diblock | 6.2k-7.7k | SAP6-40 | 31 | 0.833 | 0.008 | 0.096 | 0.01 | 0.831 | 1 |
| 69 | 1 | DBP1 | Diblock | 6.2k-7.7k | SAP6-40 | 31 | 0.833 | 0.025 | 0.300 | 0.01 | 0.848 | 3 |
| 70 | 1 | DBP1 | Diblock | 6.2k-7.7k | SAP6-40 | 31 | 0.833 | 0.042 | 0.504 | 0.01 | 0.865 | 5 |
| 71 | 1 | DBP1 | Diblock | 6.2k-7.7k | SAP6-60 | 32 | 0.833 | 0.008 | 0.096 | 0.01 | 0.831 | 1 |
| 72 | 1 | DBP1 | Diblock | 6.2k-7.7k | SAP6-60 | 32 | 0.833 | 0.025 | 0.300 | 0.01 | 0.848 | 3 |
| 73 | 1 | DBP1 | Diblock | 6.2k-7.7k | SAP6-80 | 33 | 0.833 | 0.008 | 0.096 | 0.01 | 0.831 | 1 |
| 74 | 1 | DBP1 | Diblock | 6.2k-7.7k | SAP6-80 | 33 | 0.833 | 0.025 | 0.300 | 0.01 | 0.848 | 3 |
| 75 | 4 | TBP1 | Triblock | 3.5k-6k-3.5k | SAP6-40 | 31 | 0.833 | 0.025 | 0.300 | 0.01 | 0.848 | 3 |
| 76 | 5 | TBP2 | Triblock | 7.05k-11.5k-7.05k | SAP6-40 | 31 | 0.833 | 0.008 | 0.096 | 0.01 | 0.735 | 1 |
| 77 | 5 | TBP2 | Triblock | 7.05k-11.5k-7.05k | SAP6-40 | 31 | 0.833 | 0.013 | 0.156 | 0.01 | 0.680 | 1.5 |
| 78 | 5 | TBP2 | Triblock | 7.05k-11.5k-7.05k | SAP6-40 | 31 | 0.833 | 0.017 | 0.204 | 0.01 | 0.636 | 2 |
| 79 | 5 | TBP2 | Triblock | 7.05k-11.5k-7.05k | SAP6-40 | 31 | 0.833 | 0.025 | 0.3 | 0.01 | 0.548 | 3 |
| 80 | 5 | TBP2 | Triblock | 7.05k-11.5k-7.05k | SAP7-C | 35 | 0.833 | 0.008 | 0.096 | 0.01 | 0.735 | 1 |
| 81 | 5 | TBP2 | Triblock | 7.05k-11.5k-7.05k | SAP7-C | 35 | 0.833 | 0.017 | 0.204 | 0.01 | 0.636 | 2 |
| 82 | 5 | TBP2 | Triblock | 7.05k-11.5k-7.05k | SAP7-C | 35 | 0.833 | 0.025 | 0.3 | 0.01 | 0.548 | 3 |
| 83 | 3 | DBP3 | Diblock | 6.2k-2.9k | SAP1 | 26 | 0.833 | 0.008 | 0.096 | 0.01 | 0.831 | 1 |
| 84 | 3 | DBP3 | Diblock | 6.2k-2.9k | SAP3 | 28 | 0.833 | 0.008 | 0.096 | 0.01 | 0.831 | 1 |
| 85 | 3 | DBP3 | Diblock | 6.2k-2.9k | SAP6-20 | 30 | 0.833 | 0.008 | 0.096 | 0.01 | 0.831 | 1 |
| 86 | 3 | DBP3 | Diblock | 6.2k-2.9k | SAP6-40 | 31 | 0.833 | 0.008 | 0.096 | 0.01 | 0.831 | 1 |
| 87 | 3 | DBP3 | Diblock | 6.2k-2.9k | SAP6-60 | 32 | 0.833 | 0.008 | 0.096 | 0.01 | 0.831 | 1 |
| 88 | 3 | DBP3 | Diblock | 6.2k-2.9k | SAP6-80 | 33 | 0.833 | 0.008 | 0.096 | 0.01 | 0.831 | 1 |
| 89 | 6 | TBP3 | Triblock | 3.5k-15.7k-3.5k | SAP7-C | 35 | 0.833 | 0.004 | 0.05 | 0.01 | 0.778 | 0.5 |
| 90 | 6 | TBP3 | Triblock | 3.5k-15.7k-3.5k | SAP7-C | 35 | 0.833 | 0.008 | 0.096 | 0.01 | 0.735 | 1 |
| 91 | 6 | TBP3 | Triblock | 3.5k-15.7k-3.5k | SAP7-C | 35 | 0.833 | 0.017 | 0.204 | 0.01 | 0.636 | 2 |

TABLE 10

| | | | | BCP Thin Film layer for Self-Assembly | | | Coating/Annealing Conditions | | | |
|---|---|---|---|---|---|---|---|---|---|---|
| Film Example | Underlayer Name | Formulation Example | BCP Name | BCP Mn of each block (k = ×1000) | SAP name | SAP wt % of dry solids | Spin Speed RPM | Spin time Sec | Annealing Temp ° C. | Annealing Time (min) |
| 92 | UL-2 | 50 | DBP1 | 6.2k-7.7k | SAP1 | 1 | 2000 | 30 | 140 | 5 |
| 93 | UL-4 | 50 | DBP1 | 6.2k-7.7k | SAP1 | 1 | 2000 | 30 | 140 | 5 |
| 94 | UL-5 | 50 | DBP1 | 6.2k-7.7k | SAP1 | 1 | 2000 | 30 | 140 | 5 |
| 95 | UL-2 | 51 | DBP1 | 6.2k-7.7k | SAP1 | 3 | 2000 | 30 | 140 | 5 |
| 96 | UL-4 | 51 | DBP1 | 6.2k-7.7k | SAP1 | 3 | 2000 | 30 | 140 | 5 |
| 97 | UL-1 | 52 | DBP1 | 6.2k-7.7k | SAP1 | 5 | 2000 | 30 | 140 | 5 |
| 98 | UL-2 | 52 | DBP1 | 6.2k-7.7k | SAP1 | 5 | 2000 | 30 | 140 | 5 |
| 99 | UL-4 | 52 | DBP1 | 6.2k-7.7k | SAP1 | 5 | 2000 | 30 | 140 | 5 |
| 100 | UL-5 | 52 | DBP1 | 6.2k-7.7k | SAP1 | 5 | 2000 | 30 | 140 | 5 |
| 101 | UL-1 | 53 | DBP1 | 6.2k-7.7k | SAP1 | 10 | 2000 | 30 | 140 | 5 |
| 102 | UL-2 | 53 | DBP1 | 6.2k-7.7k | SAP1 | 10 | 2000 | 30 | 140 | 5 |
| 103 | UL-4 | 53 | DBP1 | 6.2k-7.7k | SAP1 | 10 | 2000 | 30 | 140 | 5 |
| 104 | UL-5 | 53 | DBP1 | 6.2k-7.7k | SAP1 | 10 | 2000 | 30 | 140 | 5 |
| 105 | UL-2 | 54 | DBP2 | 10k-13k | SAP1 | 10 | 2000 | 30 | 140 | 5 |
| 106 | UL-4 | 54 | DBP2 | 10k-13k | SAP1 | 10 | 2000 | 30 | 140 | 5 |
| 107 | UL-2 | 55 | DBP1 | 6.2k-7.7k | SAP2 | 5 | 2000 | 30 | 140 | 5 |
| 108 | UL-4 | 55 | DBP1 | 6.2k-7.7k | SAP2 | 5 | 2000 | 30 | 140 | 5 |
| 109 | UL-2 | 56 | DBP1 | 6.2k-7.7k | SAP2 | 10 | 2000 | 30 | 140 | 5 |
| 110 | UL-4 | 56 | DBP1 | 6.2k-7.7k | SAP2 | 10 | 2000 | 30 | 140 | 5 |
| 111 | UL-2 | 57 | DBP1 | 6.2k-7.7k | SAP3 | 1 | 2000 | 30 | 140 | 5 |
| 112 | UL-4 | 57 | DBP1 | 6.2k-7.7k | SAP3 | 1 | 2000 | 30 | 140 | 5 |
| 113 | UL-5 | 57 | DBP1 | 6.2k-7.7k | SAP3 | 1 | 2000 | 30 | 140 | 5 |
| 114 | UL-2 | 58 | DBP1 | 6.2k-7.7k | SAP3 | 3 | 2000 | 30 | 140 | 5 |
| 115 | UL-4 | 58 | DBP1 | 6.2k-7.7k | SAP3 | 3 | 2000 | 30 | 140 | 5 |
| 116 | UL-5 | 58 | DBP1 | 6.2k-7.7k | SAP3 | 3 | 2000 | 30 | 140 | 5 |
| 117 | UL-2 | 59 | DBP1 | 6.2k-7.7k | SAP3 | 5 | 2000 | 30 | 140 | 5 |
| 118 | UL-4 | 59 | DBP1 | 6.2k-7.7k | SAP3 | 5 | 2000 | 30 | 140 | 5 |
| 119 | UL-5 | 59 | DBP1 | 6.2k-7.7k | SAP3 | 5 | 2000 | 30 | 140 | 5 |
| 120 | UL-2 | 60 | DBP1 | 6.2k-7.7k | SAP5-20 | 1 | 2000 | 30 | 140 | 5 |
| 121 | UL-4 | 60 | DBP1 | 6.2k-7.7k | SAP5-20 | 1 | 2000 | 30 | 140 | 5 |
| 122 | UL-2 | 61 | DBP1 | 6.2k-7.7k | SAP5-20 | 3 | 2000 | 30 | 140 | 5 |
| 123 | UL-4 | 61 | DBP1 | 6.2k-7.7k | SAP5-20 | 3 | 2000 | 30 | 140 | 5 |
| 124 | UL-2 | 62 | DBP1 | 6.2k-7.7k | SAP5-20 | 5 | 2000 | 30 | 140 | 5 |
| 125 | UL-4 | 62 | DBP1 | 6.2k-7.7k | SAP5-20 | 5 | 2000 | 30 | 140 | 5 |
| 126 | UL-2 | 63 | DBP1 | 6.2k-7.7k | SAP5-20 | 10 | 2000 | 30 | 140 | 5 |
| 127 | UL-4 | 63 | DBP1 | 6.2k-7.7k | SAP5-20 | 10 | 2000 | 30 | 140 | 5 |
| 128 | UL-2 | 64 | DBP1 | 6.2k-7.7k | SAP6-20 | 1 | 2000 | 30 | 140 | 5 |
| 129 | UL-4 | 64 | DBP1 | 6.2k-7.7k | SAP6-20 | 1 | 2000 | 30 | 140 | 5 |
| 130 | UL-2 | 65 | DBP1 | 6.2k-7.7k | SAP6-20 | 3 | 2000 | 30 | 140 | 5 |
| 131 | UL-4 | 65 | DBP1 | 6.2k-7.7k | SAP6-20 | 3 | 2000 | 30 | 140 | 5 |
| 132 | UL-2 | 66 | DBP1 | 6.2k-7.7k | SAP6-20 | 5 | 2000 | 30 | 140 | 5 |
| 133 | UL-4 | 66 | DBP1 | 6.2k-7.7k | SAP6-20 | 5 | 2000 | 30 | 140 | 5 |
| 134 | UL-2 | 67 | DBP1 | 6.2k-7.7k | SAP6-20 | 10 | 2000 | 30 | 140 | 5 |
| 135 | UL-4 | 67 | DBP1 | 6.2k-7.7k | SAP6-20 | 10 | 2000 | 30 | 140 | 5 |
| 136 | UL-2 | 68 | DBP1 | 6.2k-7.7k | SAP6-40 | 1 | 2000 | 30 | 140 | 5 |
| 137 | UL-4 | 68 | DBP1 | 6.2k-7.7k | SAP6-40 | 1 | 2000 | 30 | 140 | 5 |
| 138 | UL-2 | 69 | DBP1 | 6.2k-7.7k | SAP6-40 | 3 | 2000 | 30 | 140 | 5 |
| 139 | UL-4 | 69 | DBP1 | 6.2k-7.7k | SAP6-40 | 3 | 2000 | 30 | 140 | 5 |
| 140 | UL-2 | 71 | DBP1 | 6.2k-7.7k | SAP6-60 | 1 | 2000 | 30 | 140 | 5 |
| 141 | UL-4 | 71 | DBP1 | 6.2k-7.7k | SAP6-60 | 1 | 2000 | 30 | 140 | 5 |
| 142 | UL-2 | 72 | DBP1 | 6.2k-7.7k | SAP6-60 | 3 | 2000 | 30 | 140 | 5 |
| 143 | UL-4 | 72 | DBP1 | 6.2k-7.7k | SAP6-60 | 3 | 2000 | 30 | 140 | 5 |
| 144 | UL-2 | 73 | DBP1 | 6.2k-7.7k | SAP6-80 | 1 | 2000 | 30 | 140 | 5 |
| 145 | UL-4 | 73 | DBP1 | 6.2k-7.7k | SAP6-80 | 1 | 2000 | 30 | 140 | 5 |
| 146 | UL-2 | 74 | DBP1 | 6.2k-7.7k | SAP6-80 | 3 | 2000 | 30 | 140 | 5 |
| 147 | UL-4 | 74 | DBP1 | 6.2k-7.7k | SAP6-80 | 3 | 2000 | 30 | 140 | 5 |
| 148 | UL-1 | 75 | TBP1 | 3.5k-6k-3.5k | SAP6-40 | 3 | 2000 | 30 | 170 | 5 |
| 149 | UL-2 | 75 | TBP1 | 3.5k-6k-3.5k | SAP6-40 | 3 | 2000 | 30 | 170 | 5 |
| 150 | UL-13 | 75 | TBP1 | 3.5k-6k-3.5k | SAP6-40 | 3 | 2000 | 30 | 170 | 5 |
| 151 | UL-5 | 75 | TBP1 | 3.5k-6k-3.5k | SAP6-40 | 3 | 2000 | 30 | 170 | 5 |
| 152 | UL-14 | 75 | TBP1 | 3.5k-6k-3.5k | SAP6-40 | 3 | 2000 | 30 | 170 | 5 |
| 153 | UL-2 | 76 | TBP2 | 7.05k-11.5k-7.05k | SAP6-40 | 1 | 2000 | 30 | 170 | 5 |
| 154 | UL-2 | 77 | TBP2 | 7.05k-11.5k-7.05k | SAP6-40 | 1.5 | 2000 | 30 | 170 | 5 |
| 155 | UL-2 | 78 | TBP2 | 7.05k-11.5k-7.05k | SAP6-40 | 2 | 2000 | 30 | 170 | 5 |
| 156 | UL-2 | 79 | TBP2 | 7.05k-11.5k-7.05k | SAP6-40 | 3 | 2000 | 30 | 170 | 5 |
| 157 | UL-10 | 78 | TBP2 | 7.05k-11.5k-7.05k | SAP6-40 | 2 | 2000 | 30 | 170 | 5 |
| 158 | UL-9 | 78 | TBP2 | 7.05k-11.5k-7.05k | SAP6-40 | 2 | 2000 | 30 | 170 | 5 |
| 159 | UL-12 | 78 | TBP2 | 7.05k-11.5k-7.05k | SAP6-40 | 2 | 2000 | 30 | 170 | 5 |
| 160 | UL-2 | 80 | TBP2 | 7.05k-11.5k-7.05k | SAP7-C | 1 | 2000 | 30 | 170 | 5 |
| 161 | UL-2 | 81 | TBP2 | 7.05k-11.5k-7.05k | SAP7-C | 2 | 2000 | 30 | 170 | 5 |
| 162 | UL-2 | 82 | TBP2 | 7.05k-11.5k-7.05k | SAP7-C | 3 | 2000 | 30 | 170 | 5 |
| 163 | UL-5 | 83 | DBP3 | 6.2k-2.9k | SAP1 | 1 | 2000 | 30 | 140 | 5 |
| 164 | UL-14 | 83 | DBP3 | 6.2k-2.9k | SAP1 | 1 | 2000 | 30 | 140 | 5 |
| 165 | UL-5 | 84 | DBP3 | 6.2k-2.9k | SAP3 | 1 | 2000 | 30 | 140 | 5 |

TABLE 10-continued

| Film Example | Underlayer Name | Formulation Example | BCP Name | BCP Mn of each block (k = ×1000) | SAP name | SAP wt % of dry solids | Spin Speed RPM | Spin time Sec | Annealing Temp ° C. | Annealing Time (min) |
|---|---|---|---|---|---|---|---|---|---|---|
| 166 | UL-14 | 84 | DBP3 | 6.2k-2.9k | SAP3 | 1 | 2000 | 30 | 140 | 5 |
| 167 | UL-5 | 85 | DBP3 | 6.2k-2.9k | SAP6-20 | 1 | 2000 | 30 | 140 | 5 |
| 168 | UL-14 | 85 | DBP3 | 6.2k-2.9k | SAP6-20 | 1 | 2000 | 30 | 140 | 5 |
| 169 | UL-5 | 86 | DBP3 | 6.2k-2.9k | SAP6-40 | 1 | 2000 | 30 | 140 | 5 |
| 170 | UL-14 | 86 | DBP3 | 6.2k-2.9k | SAP6-40 | 1 | 2000 | 30 | 140 | 5 |
| 171 | UL-5 | 87 | DBP3 | 6.2k-2.9k | SAP6-60 | 1 | 2000 | 30 | 140 | 5 |
| 172 | UL-14 | 87 | DBP3 | 6.2k-2.9k | SAP6-60 | 1 | 2000 | 30 | 140 | 5 |
| 173 | UL-5 | 88 | DBP3 | 6.2k-2.9k | SAP6-80 | 1 | 2000 | 30 | 140 | 5 |
| 174 | UL-14 | 88 | DBP3 | 6.2k-2.9k | SAP6-80 | 1 | 2000 | 30 | 140 | 5 |
| 175 | UL-5 | 89 | TBP3 | 3.5k-15.7k-3.5k | SAP7-C | 0.5 | 1200 | 30 | 140 | 5 |
| 176 | UL-5 | 90 | TBP3 | 3.5k-15.7k-3.5k | SAP7-C | 1 | 1200 | 30 | 140 | 5 |
| 177 | UL-5 | 91 | TBP3 | 3.5k-15.7k-3.5k | SAP7-C | 2 | 1200 | 30 | 140 | 5 |

Table 11 summarizes the properties of the self-assembled films prepared on various underlayers and the morphologies obtained by self-assembly. "I/H" means islands/holes (not desirable). "Partially ⊥ lamellae" means about 20% to less than 70% of the regions of the film contained perpendicular lamellae (not desirable). "Mostly ⊥ lamellae" means 70% to less than 95% of the regions of the film contained perpendicular lamellae (desirable). "∥ cylinders" means parallel cylinders (not desirable). "⊥ lamellae" means 95% to 100% of the regions of the film contained perpendicular lamellae (most desirable). "Flat" means there was no discernible structure in the film.

TABLE 11

| Example | Underlayer Name | Underlayer Polymer | Formulation Example | BCP Name | BCP Each Block Mn (k = ×1000) | SAP Name | SAP wt % of dry solids | Thin Film Morphology |
|---|---|---|---|---|---|---|---|---|
| Lamellae-forming Block Copolymers | | | | | | | | |
| 92 | UL-2 | G1-2 | 50 | DBP1 | 6.2k-7.7k | SAP1 | 1 | I/H |
| 93 | UL-4 | G1-8 | 50 | DBP1 | 6.2k-7.7k | SAP1 | 1 | I/H |
| 94 | UL-5 | G1-7 | 50 | DBP1 | 6.2k-7.7k | SAP1 | 1 | I/H |
| 95 | UL-2 | G1-2 | 51 | DBP1 | 6.2k-7.7k | SAP1 | 3 | Partially⊥lamellae |
| 96 | UL-4 | G1-8 | 51 | DBP1 | 6.2k-7.7k | SAP1 | 3 | Partially ⊥ lamellae |
| 97 | UL-1 | G1- | 52 | DBP1 | 6.2k-7.7k | SAP1 | 5 | I/H |
| 98 | UL-2 | G1-2 | 52 | DBP1 | 6.2k-7.7k | SAP1 | 5 | ⊥ lamellae |
| 99 | UL-4 | G1-8 | 52 | DBP1 | 6.2k-7.7k | SAP1 | 5 | ⊥ lamellae |
| 100 | UL-5 | G1-7 | 52 | DBP1 | 6.2k-7.7k | SAP1 | 5 | I/H |
| 101 | UL-1 | G1- | 53 | DBP1 | 6.2k-7.7k | SAP1 | 10 | I/H |
| 102 | UL-2 | G1-2 | 53 | DBP1 | 6.2k-7.7k | SAP1 | 10 | ⊥ lamellae |
| 103 | UL-4 | G1-8 | 53 | DBP1 | 6.2k-7.7k | SAP1 | 10 | ⊥ lamellae |
| 104 | UL-5 | G1-7 | 53 | DBP1 | 6.2k-7.7k | SAP1 | 10 | Partially ⊥ lamellae |
| 105 | UL-2 | G1-2 | 54 | DBP2 | 10k-13k | SAP1 | 10 | ⊥ lamellae |
| 106 | UL-4 | G1-8 | 54 | DBP2 | 10k-13k | SAP1 | 10 | ⊥ lamellae |
| 107 | UL-2 | G1-2 | 55 | DBP1 | 6.2k-7.7k | SAP2 | 5 | Partially ⊥ lamellae |
| 108 | UL-4 | G1-8 | 55 | DBP1 | 6.2k-7.7k | SAP2 | 5 | Partially ⊥ lamellae |
| 109 | UL-2 | G1-2 | 56 | DBP1 | 6.2k-7.7k | SAP2 | 10 | Flat |
| 110 | UL-4 | G1-8 | 56 | DBP1 | 6.2k-7.7k | SAP2 | 10 | Flat |
| 111 | UL-2 | G1-2 | 57 | DBP1 | 6.2k-7.7k | SAP3 | 1 | I/H |
| 112 | UL-4 | G1-8 | 57 | DBP1 | 6.2k-7.7k | SAP3 | 1 | I/H |
| 113 | UL-5 | G1-7 | 57 | DBP1 | 6.2k-7.7k | SAP3 | 1 | I/H |
| 114 | UL-2 | G1-2 | 58 | DBP1 | 6.2k-7.7k | SAP3 | 3 | Partially ⊥ lamellae |
| 115 | UL-4 | G1-8 | 58 | DBP1 | 6.2k-7.7k | SAP3 | 3 | Partially ⊥ lamellae |
| 116 | UL-5 | G1-7 | 58 | DBP1 | 6.2k-7.7k | SAP3 | 3 | I/H |
| 117 | UL-2 | G1-2 | 59 | DBP1 | 6.2k-7.7k | SAP3 | 5 | Partially ⊥ lamellae |
| 118 | UL-4 | G1-8 | 59 | DBP1 | 6.2k-7.7k | SAP3 | 5 | Partially ⊥ lamellae |
| 119 | UL-5 | G1-7 | 59 | DBP1 | 6.2k-7.7k | SAP3 | 5 | I/H |
| 120 | UL-2 | G1-2 | 60 | DBP1 | 6.2k-7.7k | SAP5-20 | 1 | I/H |
| 121 | UL-4 | G1-8 | 60 | DBP1 | 6.2k-7.7k | SAP5-20 | 1 | I/H |
| 122 | UL-2 | G1-2 | 61 | DBP1 | 6.2k-7.7k | SAP5-20 | 3 | Partially ⊥ lamellae |
| 123 | UL-4 | G1-8 | 61 | DBP1 | 6.2k-7.7k | SAP5-20 | 3 | Partially ⊥ lamellae |
| 124 | UL-2 | G1-2 | 62 | DBP1 | 6.2k-7.7k | SAP5-20 | 5 | ⊥ lamellae |
| 125 | UL-4 | G1-8 | 62 | DBP1 | 6.2k-7.7k | SAP5-20 | 5 | ⊥ lamellae |
| 126 | UL-2 | G1-2 | 63 | DBP1 | 6.2k-7.7k | SAP5-20 | 10 | ⊥ lamellae |
| 127 | UL-4 | G1-8 | 63 | DBP1 | 6.2k-7.7k | SAP5-20 | 10 | ⊥ lamellae |
| 128 | UL-2 | G1-2 | 64 | DBP1 | 6.2k-7.7k | SAP6-20 | 1 | Partially ⊥ lamellae |
| 129 | UL-4 | G1-8 | 64 | DBP1 | 6.2k-7.7k | SAP6-20 | 1 | Partially ⊥ lamellae |
| 130 | UL-2 | G1-2 | 65 | DBP1 | 6.2k-7.7k | SAP6-20 | 3 | Partially ⊥ lamellae |
| 131 | UL-4 | G1-8 | 65 | DBP1 | 6.2k-7.7k | SAP6-20 | 3 | Partially ⊥ lamellae |

TABLE 11-continued

| Example | Underlayer Name | Underlayer Polymer | Formulation Example | BCP Name | BCP Each Block Mn (k = ×1000) | SAP Name | SAP wt % of dry solids | Thin Film Morphology |
|---|---|---|---|---|---|---|---|---|
| 132 | UL-2 | G1-2 | 66 | DBP1 | 6.2k-7.7k | SAP6-20 | 5 | Mostly ⊥ lamellae |
| 133 | UL-4 | G1-8 | 66 | DBP1 | 6.2k-7.7k | SAP6-20 | 5 | Mostly ⊥ lamellae |
| 134 | UL-2 | G1-2 | 67 | DBP1 | 6.2k-7.7k | SAP6-20 | 10 | Partially ⊥ lamellae |
| 135 | UL-4 | G1-8 | 67 | DBP1 | 6.2k-7.7k | SAP6-20 | 10 | Partially ⊥ lamellae |
| 136 | UL-2 | G1-2 | 68 | DBP1 | 6.2k-7.7k | SAP6-40 | 1 | Partially ⊥ lamellae |
| 137 | UL-4 | G1-8 | 68 | DBP1 | 6.2k-7.7k | SAP6-40 | 1 | Partially ⊥ lamellae |
| 138 | UL-2 | G1-2 | 69 | DBP1 | 6.2k-7.7k | SAP6-40 | 3 | ⊥ lamellae |
| 139 | UL-4 | G1-8 | 69 | DBP1 | 6.2k-7.7k | SAP6-40 | 3 | ⊥ lamellae |
| 140 | UL-2 | G1-2 | 71 | DBP1 | 6.2k-7.7k | SAP6-60 | 1 | Partially ⊥ lamellae |
| 141 | UL-4 | G1-8 | 71 | DBP1 | 6.2k-7.7k | SAP6-60 | 1 | Partially ⊥ lamellae |
| 142 | UL-2 | G1-2 | 72 | DBP1 | 6.2k-7.7k | SAP6-60 | 3 | Mostly ⊥ lamellae |
| 143 | UL-4 | G1-8 | 72 | DBP1 | 6.2k-7.7k | SAP6-60 | 3 | Partially ⊥ lamellae |
| 144 | UL-2 | G1-2 | 73 | DBP1 | 6.2k-7.7k | SAP6-80 | 1 | Partially ⊥ lamellae |
| 145 | UL-4 | G1-8 | 73 | DBP1 | 6.2k-7.7k | SAP6-80 | 1 | Partially ⊥ lamellae |
| 146 | UL-2 | G1-2 | 74 | DBP1 | 6.2k-7.7k | SAP6-80 | 3 | Partially ⊥ lamellae |
| 147 | UL-4 | G1-8 | 74 | DBP1 | 6.2k-7.7k | SAP6-80 | 3 | Partially ⊥ lamellae |
| 148 | UL-1 | G1-3 | 75 | TBP1 | 3.5k-6k-3.5k | SAP6-40 | 3 | Partially ⊥ lamellae |
| 149 | UL-2 | G1-2 | 75 | TBP1 | 3.5k-6k-3.5k | SAP6-40 | 3 | ⊥ lamellae |
| 150 | UL-13 | G1-11 | 75 | TBP1 | 3.5k-6k-3.5k | SAP6-40 | 3 | ⊥ lamellae |
| 151 | UL-5 | G1-7 | 75 | TBP1 | 3.5k-6k-3.5k | SAP6-40 | 3 | ⊥ lamellae |
| 152 | UL-14 | G1-4 | 75 | TBP1 | 3.5k-6k-3.5k | SAP6-40 | 3 | I/H |
| 153 | UL-2 | G1-2 | 76 | TBP2 | 7.05k-11.5k-7.05k | SAP6-40 | 1 | Partially ⊥ lamellae |
| 154 | UL-2 | G1-2 | 77 | TBP2 | 7.05k-11.5k-7.05k | SAP6-40 | 1.5 | Partially ⊥ lamellae |
| 155 | UL-2 | G1-2 | 78 | TBP2 | 7.05k-11.5k-7.05k | SAP6-40 | 2 | ⊥ lamellae |
| 156 | UL-2 | G1-2 | 79 | TBP2 | 7.05k-11.5k-7.05k | SAP6-40 | 3 | ⊥ lamellae |
| 157 | UL-10 | GHS-5 | 78 | TBP2 | 7.05k-11.5k-7.05k | SAP6-40 | 2 | ⊥ lamellae |
| 158 | UL-9 | GHS-4 | 78 | TBP2 | 7.05k-11.5k-7.05k | SAP6-40 | 2 | ⊥ lamellae |
| 159 | UL-12 | GHS-7 | 78 | TBP2 | 7.05k-11.5k-7.05k | SAP6-40 | 2 | ⊥ lamellae |
| 160 | UL-2 | G1-2 | 80 | TBP2 | 7.05k-11.5k-7.05k | SAP7-C | 1 | Partially ⊥ lamellae |
| 161 | UL-2 | G1-2 | 81 | TBP2 | 7.05k-11.5k-7.05k | SAP7-C | 2 | ⊥ lamellae |
| 162 | UL-2 | G1-2 | 82 | TBP2 | 7.05k-11.5k-7.05k | SAP7-C | 3 | ⊥ lamellae |
| Cylinder-forming Block Copolymers | | | | | | | | |
| 163 | UL-5 | G1-7 | 83 | DBP3 | 6.2k-2.9k | SAP1 | 1 | Partially ⊥ cylinders |
| 164 | UL-14 | G1-4 | 83 | DBP3 | 6.2k-2.9k | SAP1 | 1 | ∥ cylinders |
| 165 | UL-5 | G1-7 | 84 | DBP3 | 6.2k-2.9k | SAP3 | 1 | Partially ⊥ cylinders |
| 166 | UL-14 | G1-4 | 84 | DBP3 | 6.2k-2.9k | SAP3 | 1 | ∥ cylinders |
| 167 | UL-5 | G1-7 | 85 | DBP3 | 6.2k-2.9k | SAP6-20 | 1 | ∥ cylinders |
| 168 | UL-14 | G1-4 | 85 | DBP3 | 6.2k-2.9k | SAP6-20 | 1 | ∥ cylinders |
| 169 | UL-5 | G1-7 | 86 | DBP3 | 6.2k-2.9k | SAP6-40 | 1 | ∥ cylinders |
| 170 | UL-14 | G1-4 | 86 | DBP3 | 6.2k-2.9k | SAP6-40 | 1 | ∥ cylinders |
| 171 | UL-5 | G1-7 | 87 | DBP3 | 6.2k-2.9k | SAP6-60 | 1 | ∥ cylinders |
| 172 | UL-14 | G1-4 | 87 | DBP3 | 6.2k-2.9k | SAP6-60 | 1 | Partially ⊥ cylinders |
| 173 | UL-5 | G1-7 | 88 | DBP3 | 6.2k-2.9k | SAP6-80 | 1 | ∥ cylinders |
| 174 | UL-14 | G1-4 | 88 | DBP3 | 6.2k-2.9k | SAP6-80 | 1 | Partially ⊥ cylinders |
| 175 | UL-5 | G1-7 | 89 | TBP3 | 3.5k-15.7k-3.5k | SAP7-C | 0.5 | ⊥ cylinders |
| 176 | UL-5 | G1-7 | 89 | TBP3 | 3.5k-15.7k-3.5k | SAP7-C | 1 | Partially ⊥ cylinders |
| 177 | UL-5 | G1-7 | 89 | TBP3 | 3.5k-15.7k-3.5k | SAP7-C | 2 | ∥ cylinders |

FIGS. 3-84 are atomic force microscopy (AFM) images of the self-assembled block copolymer films of Examples 92-100 and 105-177, respectively. SAP1, SAP6-40 and end-functionalized SAP7-C are preferred SAP compositions. The results of Table 11 show that perpendicular lamellae are formed using an SAP concentration of 2 wt % to 10 wt % based on total dry solids of the formulation used to prepare the SA layer. SAP6-40 and SAP7-C were effective in producing perpendicular lamellae when used in amounts of 2 wt % to 3 wt % based on total dry solids of the formulation used to prepare the SA layer. A SAP7-C concentration of 0.5 wt % was sufficient to obtain perpendicular cylinders in Example 175.

Graphoepitaxy Directed Self-Assembly (DSA)

Examples 178-181

In these examples, a topographic pre-pattern was formed on a neutral underlayer (UL-4) using a negative tone photoresist, followed by coating a thin film of formulated block copolymer onto the pre-pattern. The block copolymer was substantially confined to the trenches of the resist pre-pattern. The coated structure was then annealed, allowing the pre-pattern to direct self-assembly of the block copolymer.

The following procedure is representative. An underlayer solution was prepared by dissolving the random graft copolymer G1-8 (0.095 g, 95 parts by weight) and p-nitro benzylsulphonic acid triflate salt (p-NBT, 0.005 g, 5 parts by weight) in propylene glycol monomethyl ether acetate (PG-MEA, 9.90 g, 10,000 parts by weight) to form a 1.0 wt % solution based on total weight of the solution. The thermal acid generator p-NBT was added to promote the grafting and partial crosslinking of a thin film of the random graft copolymer on a silicon wafer substrate stack. The silicon wafer substrate stack comprised a silicon wafer bottom layer coated with ~30 nm thick amorphous carbon layer and 10 nm thick silicon nitride ($SiN_x$) layer. The underlayer solution was passed through a 0.2 micrometer polytetrafluoroethylene (PTFE) filter prior to spin coating the solution on the silicon wafer stack at 2000 rpm spin rate. After forming the thin film, the coated wafer was baked at 200° C. for 3 minutes and cooled to room temperature. The initial baked thin film (underlayer) had a thickness of 20 nm, measured with a Nanospec Reflectometer. The underlayer was then given a solvent rinse by casting PGMEA on top of the coated wafer, letting the solvent puddle for 30 seconds, and spin drying the treated wafer at 2000 rpm for 30 seconds. The rinse was intended to remove any excess random graft copolymer that was not crosslinked or grafted to the wafer surface. The final film thickness of the underlayer was 10 nm after the solvent rinse.

Next, a 60 nm thick layer of a commercial 193 nm negative-tone photoresist (JSR ARF7210JN-8) was disposed on this underlayer coated substrate followed by post application bake at 80° C. for 60 seconds. The photoresist layer was then exposed using a 193 nm immersion interference tool (IBM NEMO) with fixed dose of 4.67 mJ, baked at 95° C. for 60 sec, and developed for 60 seconds with 2-heptanone developer. The resulting 200 nm pitch patterned photoresist layer was then hard baked at 200° C. for 3 min prior to coating a block copolymer formulation.

The block copolymer formulation was prepared as follows. Diblock copolymer DBP1 (0.01 g) was dissolved in PGMEA (1.24 g, 10,000 parts by weight) to form a 0.8 wt % stock solution of the block copolymer based on total weight of the solution. The solution was passed through a 0.2 micrometer polytetrafluoroethylene (PTFE) filter. A separate stock solution was prepared by dissolving a selected SAP additive (0.1 g, see Table 12) in PGMEA (12.4 g) at 0.8 wt % SAP based on total weight of the solution. The SAP solution was passed through a 0.2 micrometer PTFE filter. A desired amount of SAP stock solution (Table 12) was added to the block copolymer solution and the mixture was stirred well to form a homogenous solution. The resulting solution containing block copolymer and SAP was spin coated on the patterned photoresist substrate described above. After spin coating, the coated wafer was baked at a temperature for a period time specified in Table 9, and immediately cooled to room temperature. The self-assembled domains of the block copolymer inside the guiding pre-pattern trenches were analyzed with top down and cross section SEM. The samples were etched with tetrafluoroethylene ($CF_4/H_2$) gas using RIE for 5 seconds on the top surface for top-down SEM and were subjected to perpendicular etch for 8 seconds at the cross section of the film for cross-section SEM. The samples were subjected to 20 seconds of Au sputtering with 20 mA current prior to SEM imaging. Table 12 summarizes the block copolymer formulation and coating conditions on the pre-pattern substrates.

SAP6-40 and end-functionalized SAP7-C are preferred SAP compositions for directed self-assembly.

Figure 85A:
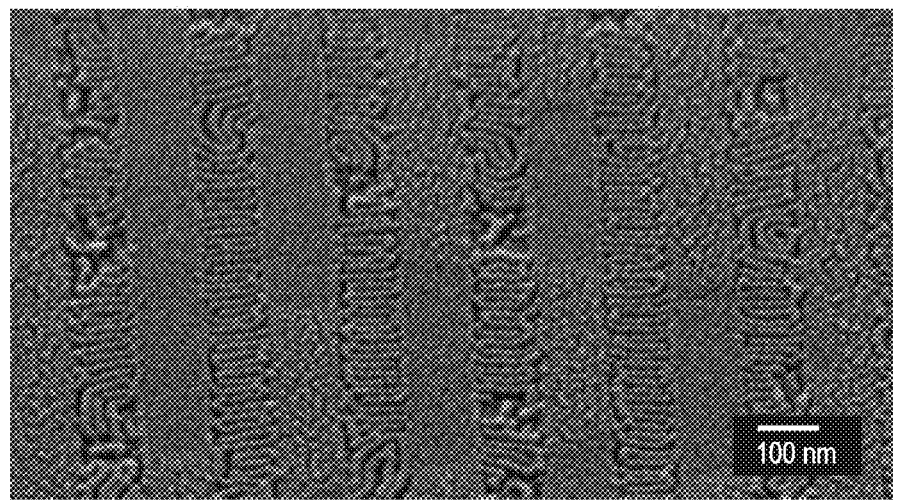
FIGS. 85A and 85B are scanning electron micrograph (SEM) images at different magnifications of the self-assembled block copolymer film formed with Example 178.
Figure 85B:
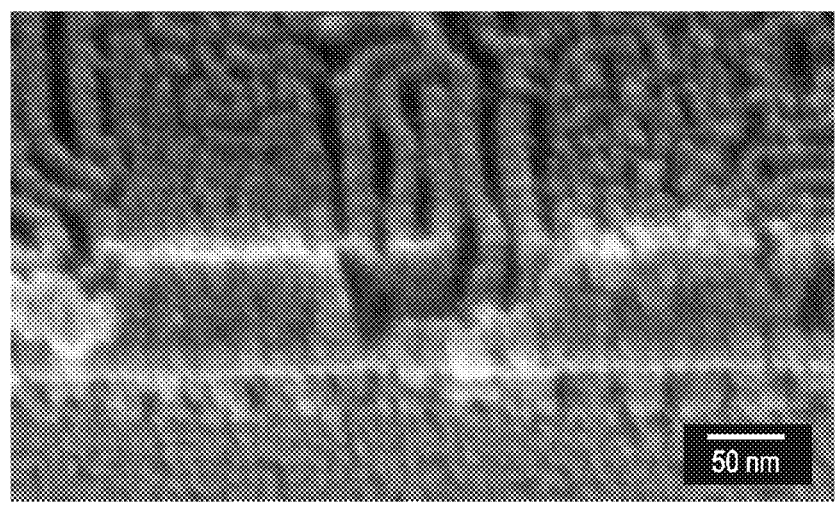

Example 178 (FIGS. 85A and 85B, SEMs) and Example 179 formed perpendicular oriented lamellae inside the trenches of the pre-pattern. However, the lamellae showed random lateral alignment with respect to the pre-pattern. Examples 99 and 103 correspond to Examples 178 and 179, respectively, without the pre-pattern.

Figure 86A:
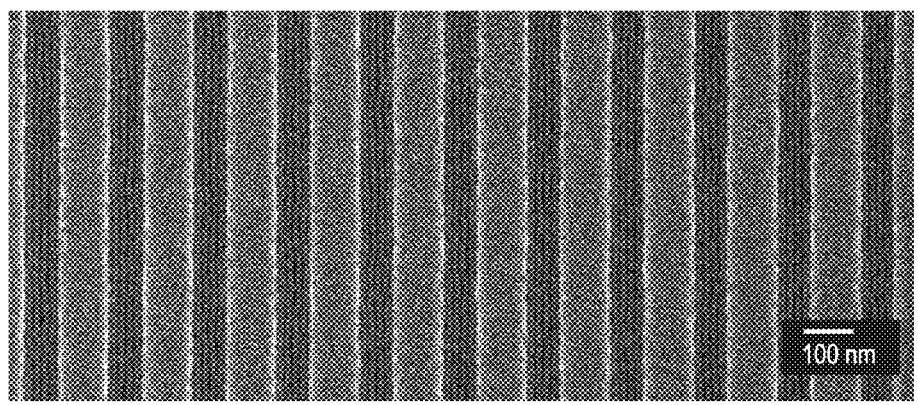
FIGS. 86A and 86B are SEMs at different magnifications of the self-assembled block copolymer film formed with Example 180.
Figure 86B:
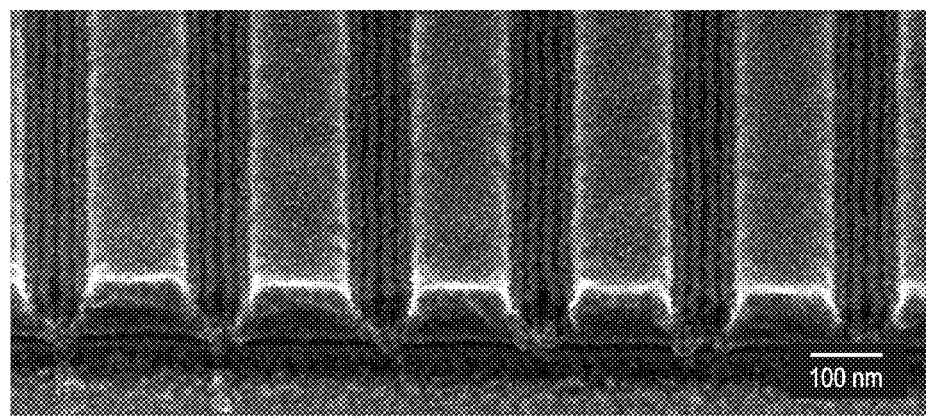
Figure 86C:
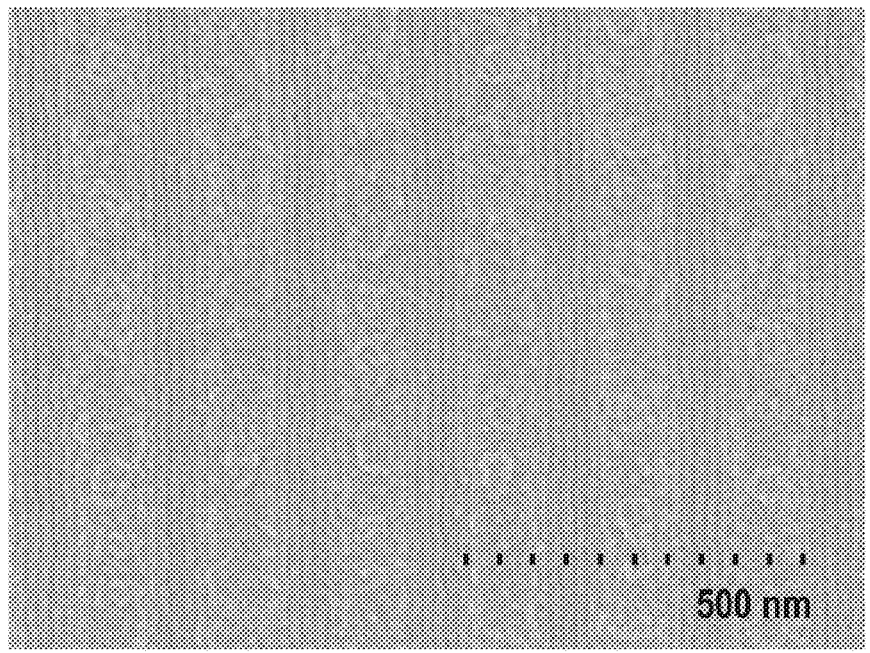
FIG. 86C is an SEM of the self-assembled block copolymer film formed with Example 181.

Example 180 (FIGS. 86A and 86B, SEMs) and Example 181 (FIG. 86C) formed perpendicular oriented lamellae inside the trenches of the pre-pattern. The lamellae were also laterally aligned parallel to the guiding pre-pattern. Example 139 further above corresponds to Example 180 but without the pre-pattern and slightly lower SAP wt %. No example without a pre-pattern was prepared corresponding to Example 181.

Block Copolymer Formulations without SAP Additives

Examples 182-187 (Comparative)

Block copolymer coating formulations using the block copolymers of Examples 1-6 were prepared without adding SAP additives. The following general procedure is representative. A 1.2 wt % solution of block copolymer in PGMEA was prepared as described above, and the resulting solution was filtered through a 0.2 micrometer PTFE filter. Table 13 summarizes the block copolymer formulations prepared without SAP additive.

TABLE 13

| Example | BCP Example | BCP Name | BCP amount (g) | PGMEA (g) | Coating Formulation wt % BCP |
|---|---|---|---|---|---|
| 182 | 1 | DBP1 | 0.01 | 0.83 | 1.2 |
| 183 | 2 | DBP2 | 0.01 | 0.83 | 1.2 |
| 184 | 3 | DBP3 | 0.01 | 0.83 | 1.2 |
| 185 | 4 | TBP1 | 0.01 | 0.83 | 1.2 |
| 186 | 5 | TBP2 | 0.01 | 0.83 | 1.2 |
| 187 | 6 | TBP3 | 0.01 | 0.83 | 1.2 |

Thin-Film Self-Assembly of Block Copolymers Formulations without SAP Additives

Examples 188-204 (Comparative)

The following general procedure was used to prepare thin films on various underlayer coated substrates of block copolymer formulation Examples 181-187 lacking the SAP additive. The coating formulation solution was spin coated

TABLE 12

| | | | | | Coating Formulation | | | | | |
|---|---|---|---|---|---|---|---|---|---|---|
| | | BCP Solution | | SAP Stock Sol'n 0.8 wt % | | BCP | SAP Sol'n | | | | SAP wt % |
| Example | UL Name | BCP Example. | BCP Name | SAP Ex. | SAP Name | Sol'n (g) | Amount (g) | BCP (g) | SAP (mg) | PGMEA (g) | of dry solids |
| 178 | UL-4 | 1 | DBP1 | 26 | SAP1 | 1.25 | 0.0625 | 0.01 | 0.5 | 1.302 | 5 |
| 179 | UL-4 | 1 | DBP1 | 26 | SAP1 | 1.25 | 0.125 | 0.01 | 1 | 1.364 | 10 |
| 180 | UL-4 | 1 | DBP1 | 31 | SAP6-40 | 1.25 | 0.0625 | 0.01 | 0.5 | 1.302 | 5 |
| 181 | UL-4 | 1 | DBP1 | 35 | SAP7-C | 1.25 | 0.0625 | 0.01 | 0.5 | 1.302 | 5 | on the underlayer coated substrates at the desired spin rate (Table 14). After forming the thin film, the coated wafer was baked at the desired time and temperatures and immediately cooled to room temperature. The block copolymer films were characterized by atomic force microscopy (AFM) using a Digital Instruments 3100 AFM with a 1 N/m spring constant silicon nitride cantilever operated in a tapping mode. Scan size and speed were set at 2 micrometers×2 micrometers area and 1 Hz respectively. Table 14 summarizes the coating and annealing conditions used and the resulting morphologies of the block copolymer thin film after self-assembly.

The following general procedure was used to prepare thin films of formulated diblock copolymer DBP1 (Example 1) with oleic acid or decafluorosuberic acid (DFS) on UL-3 substrates. A solution of DBP1 was prepared by dissolving the block copolymer (0.01 g) in PGMEA (0.823 g) to form a 1.2 wt % solution based on total dry solids. The solutions were passed through a 0.2 micrometer polytetrafluoroethylene (PTFE) filter. A desired amount of oleic acid or decafluorosuberic acid (DFS) was added to the block copolymer solutions made above and the mixture was stirred well to form a homogenous solution prior to spin coating the formulated block copolymer solution on the underlayer

TABLE 14

Coating and BCP Annealing conditions

| Example | Underlayer | BCP Formulation Example | BCP Name | Spin speed RPM | Spin time SEC | Annealing temp (° C.) | Annealing time (min) | BCP Morphology |
|---|---|---|---|---|---|---|---|---|
| 188 | UL-1 | 182 | DBP1 | 2000 | 30 | 170 C. | 5 | I/H |
| 189 | UL-2 | 182 | DBP1 | 2000 | 30 | 170 C. | 5 | I/H |
| 190 | UL-5 | 182 | DBP1 | 2000 | 30 | 170 C. | 5 | I/H |
| 191 | UL-1 | 183 | DBP2 | 2000 | 30 | 170 C. | 5 | I/H |
| 192 | UL-2 | 183 | DBP2 | 2000 | 30 | 170 C. | 5 | I/H |
| 193 | UL-5 | 183 | DBP2 | 2000 | 30 | 170 C. | 5 | I/H |
| 194 | UL-5 | 184 | DBP3 | 2000 | 30 | 170 C. | 5 | ∥ cylinders |
| 195 | UL-14 | 184 | DBP3 | 2000 | 30 | 170 C. | 5 | ∥ cylinders |
| 196 | UL-1 | 185 | TBP1 | 2000 | 30 | 170 C. | 5 | I/H |
| 197 | UL-13 | 185 | TBP1 | 2000 | 30 | 170 C. | 5 | I/H |
| 198 | UL-4 | 185 | TBP1 | 2000 | 30 | 170 C. | 5 | I/H |
| 199 | UL-14 | 185 | TBP1 | 2000 | 30 | 170 C. | 5 | I/H |
| 200 | UL-2 | 186 | TBP2 | 2000 | 30 | 170 C. | 5 | Flat |
| 201 | UL-9 | 186 | TBP2 | 2000 | 30 | 170 C. | 5 | I/H |
| 202 | UL-10 | 186 | TBP2 | 2000 | 30 | 170 C. | 5 | I/H |
| 203 | UL-11 | 186 | TBP2 | 2000 | 30 | 170 C. | 5 | I/H |
| 204 | UL-5 | 187 | TBP3 | 2000 | 30 | 170 C. | 5 | ∥ cylinders |

Figures 90, 91:
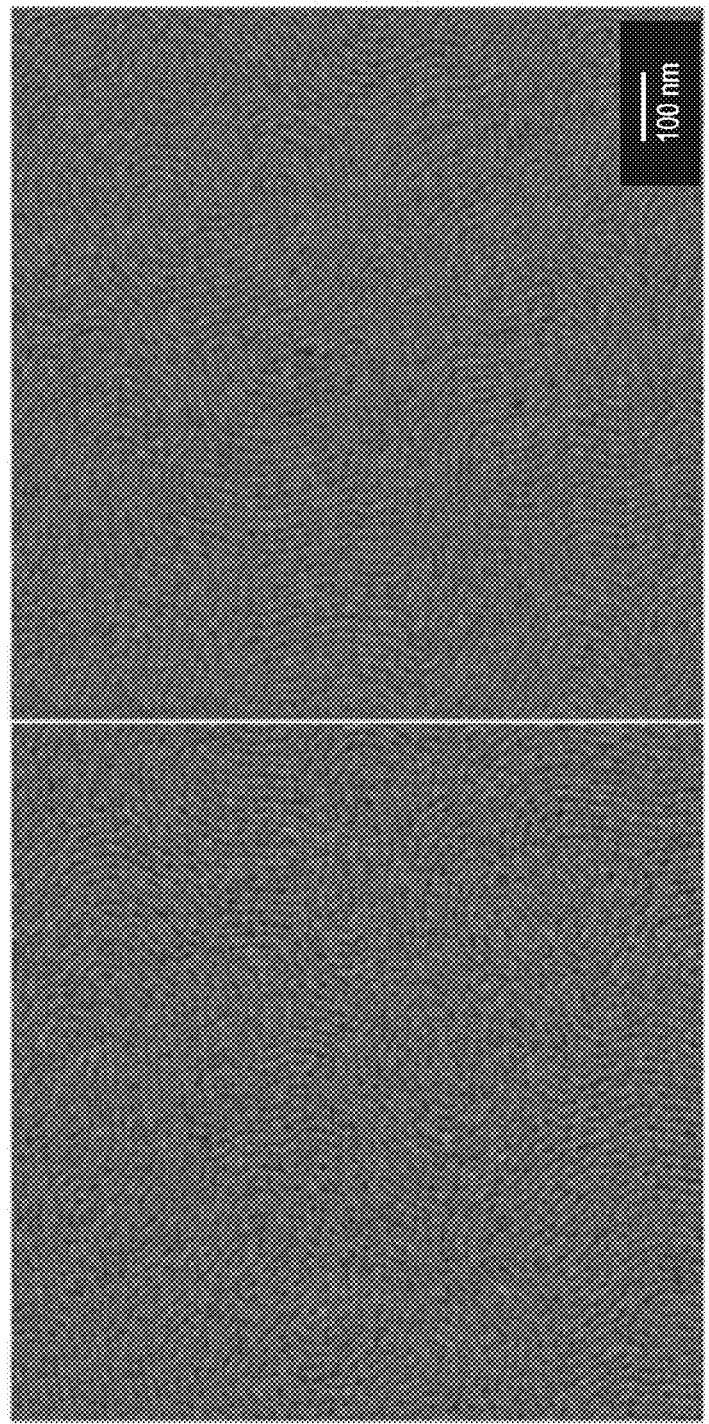
FIGS. 90-91 are AFM height images of the self-assembled block copolymer film Examples 194-195, respectively.
Figure 92:
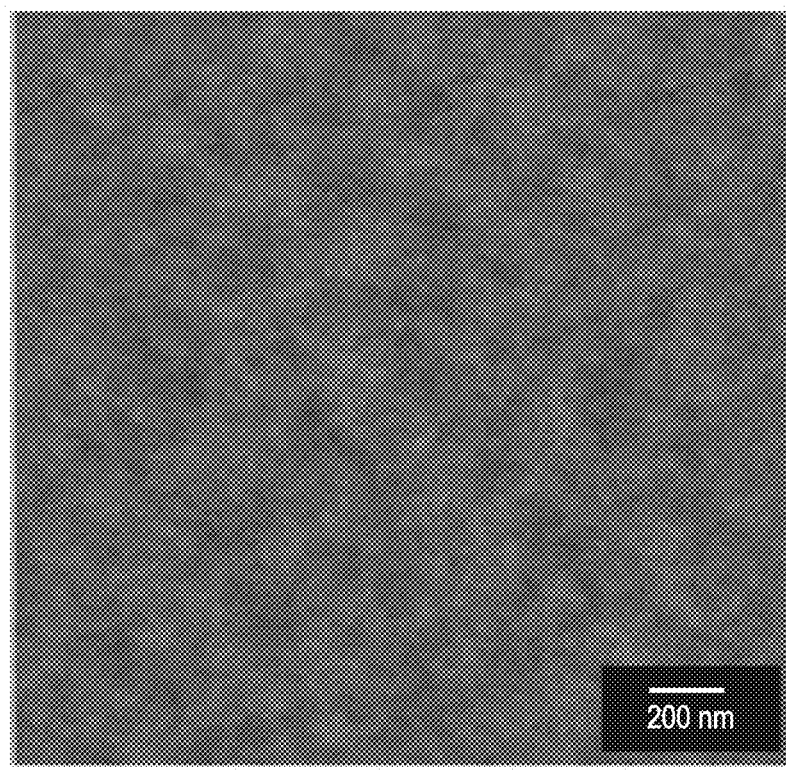
Figure 96:
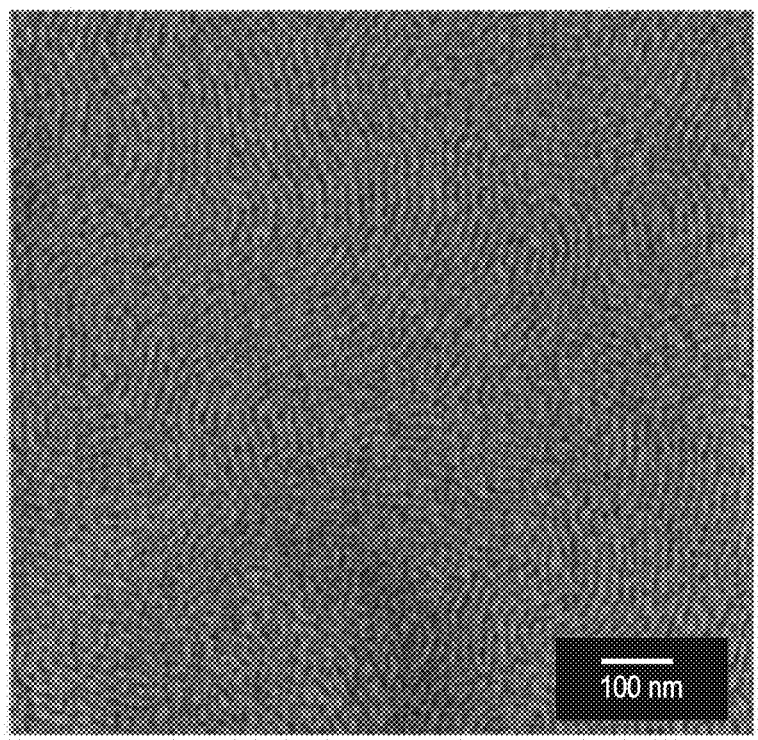
Figure 97:
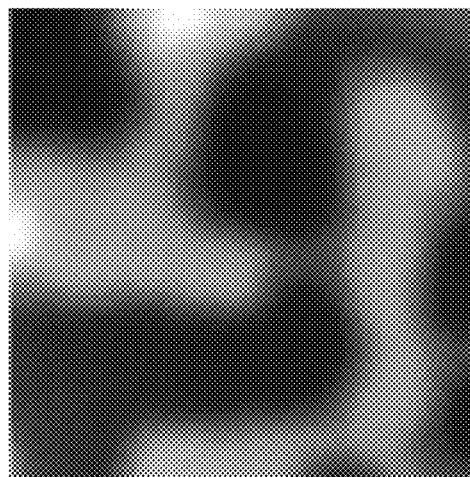
Figure 98:
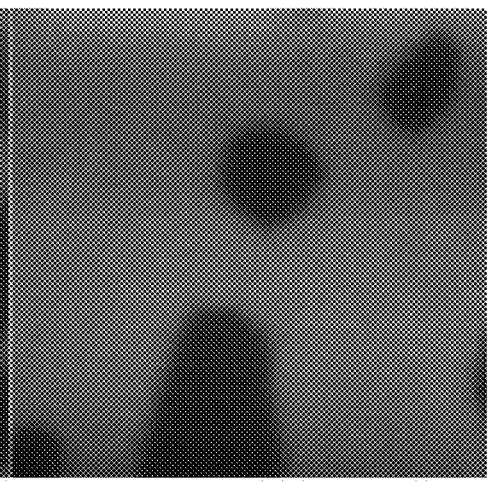
Figure 99:
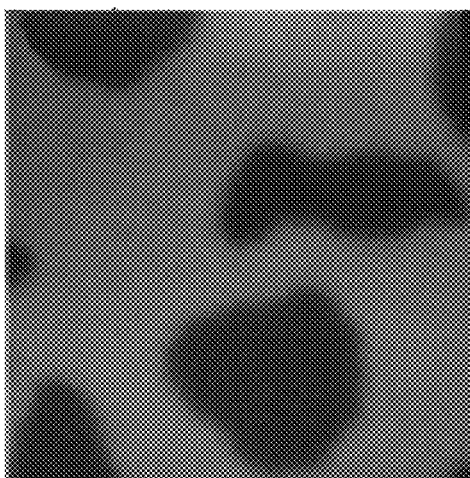
Figure 100:
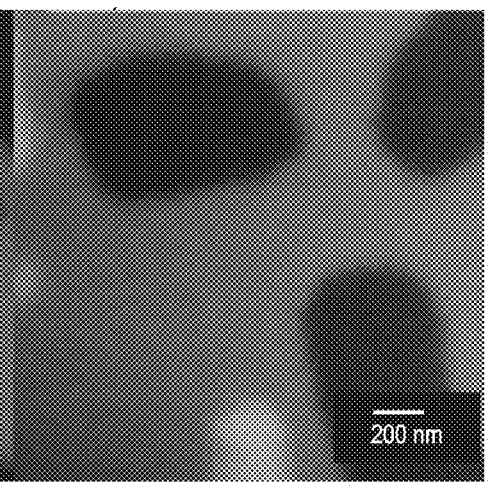

All of the films of Table 14 displayed island/hole or parallel cylinder morphology (undesirable). FIGS. 87-89 are AFM height images of Examples 188-190, respectively. FIGS. 90-91 are AFM height images of Examples 194-195, respectively. FIGS. 92-96 are AFM height images of Examples 200-204, respectively.

Oleic Acid as Surface Active Material

Examples 205-211 (Comparative)

Thin film preparation and characterization of formulated block copolymer compositions with oleic acid or decafluorosuberic acid (DFS) as additives on substrates having underlayer UL-3.

coated substrates at the desired spin rate. After forming the thin film, the coated wafer was baked at the desired time and temperatures and immediately cooled to room temperature. The formulated block copolymer films were characterized by atomic force microscopy (AFM) using a Digital Instruments 3100 AFM with a 1 N/m spring constant silicon nitride cantilever operated in a tapping mode. Scan size and speed were set at 2 micrometer×2 micrometer area and 1 Hz respectively. Table 15 summarizes the formulated block copolymer thin film self-assembly on UL-3 and the obtained morphologies. All the samples of Table 15 showed island/hole (I/H) morphology. FIGS. 97-103 are AFM height images of Examples 205-211, respectively.

TABLE 15

| | | Block | | | | Annealing Conditions | | | |
|---|---|---|---|---|---|---|---|---|---|
| Example | UL Name | Block Copolymer | Copolymer Conc. (wt %) | Additive Name | Additive wt % of dry solids | Spin Speed RPM | Spin time Sec | Annealing Temp ° C. | Annealing Time (min) | Thin Film Morphology |
| 205 | UL-3 | DBP1 | 1.2 | Oleic Acid | 1 | 2000 | 30 | 140 | 5 | I/H |
| 206 | UL-3 | DBP1 | 1.2 | Oleic Acid | 5 | 2000 | 30 | 140 | 5 | I/H |
| 207 | UL-3 | DBP1 | 1.2 | Oleic Acid | 10 | 2000 | 30 | 140 | 5 | I/H |
| 208 | UL-3 | DBP1 | 1.2 | Oleic Acid | 20 | 2000 | 30 | 140 | 5 | I/H |
| 209 | UL-3 | DBP1 | 1.2 | DFS | 5 | 2000 | 30 | 140 | 5 | I/H |
| 210 | UL-3 | DBP1 | 1.2 | DFS | 10 | 2000 | 30 | 140 | 5 | I/H |
| 211 | UL-3 | DBP1 | 1.2 | DFS | 20 | 2000 | 30 | 140 | 5 | I/H |

These results indicate that a surface active material having only hydrogen bonding OH groups (in this example, a carboxylic acid group) is not effective in forming perpendicular oriented lamellae compared to a surface active material comprising fluorine and hydrogen bonding OH groups.

Example 212 (Comparative)

Synthesis of SAP6-40A for use as an underlayer (UL-15)

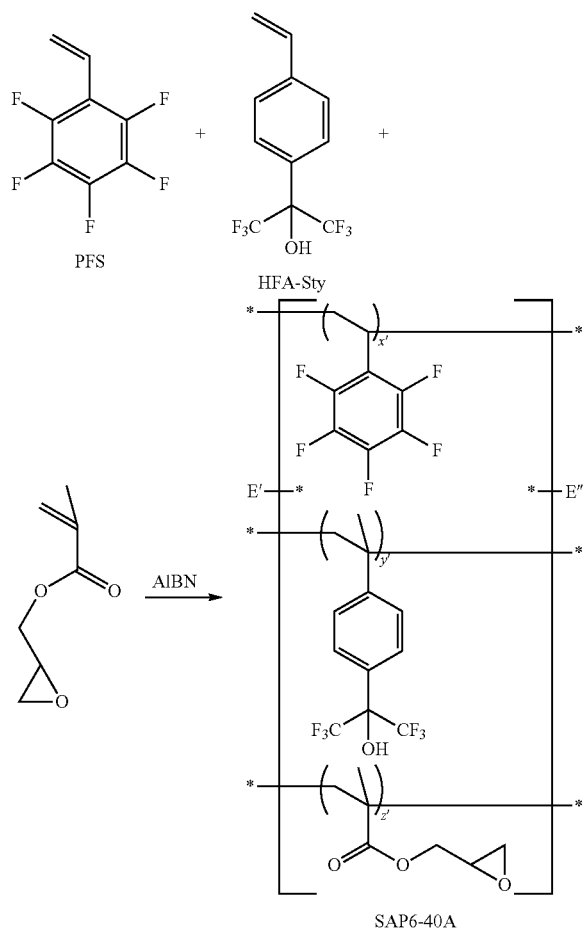

SAP6-40A, $x' = 0.42, y' = 0.57, z' = 0.01$

The end groups E' and E" are not shown. Pentafluorostyrene (PFS, 0.91 g, 4.69 mmol), styrene hexafluoroalcohol (HFA-Sty 1.80 g, 6.68 mmol), glycidyl methacrylate (GMA, 0.05 g, 0.351 mmol), THF (8 g), and azobisisobutyronitrile (AIBN, 0.077 g, 0.461 mmol, 4 mol % based on total moles of vinyl monomers) were combined in a 100 ml round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in MeOH, and was dried under vacuum at 50° C. for 24 hours. Mn=16300, Mw=27000, PDI=1.65.

Example 213 (Comparative)

Underlayer UL-15 preparation using SAP6-40a (Example 212).

A solution was prepared by dissolving the random graft copolymer SAP6-40A of Example 212 (95 parts by weight, 0.095 g) and p-NBT (5 parts by weight, 0.005 g) in PGMEA (9.90 g) to form a 1.0 wt % solution based on total dry solids. The solutions were passed through a 0.2 micrometer polytetrafluoroethylene (PTFE) filter prior to spin coating the solution on a silicon wafer at 2000 rpm (revolutions per minute) spin rate. After forming the thin film, the coated wafer was baked at 190° C. for 3 minutes and cooled to room temperature. The underlayer was then given a solvent rinse by casting PGMEA on top of the coated wafer, letting the solvent puddle for 30 seconds, and spin drying the treated wafer at 2000 rpm for 30 seconds. The rinse was intended to remove any excess random graft copolymer that was not crosslinked or grafted to the wafer surface.

Examples 214-215 (Comparative)

Diblock copolymer DBP1 (Example 1) thin film preparation and characterization on underlayer UL-15 without SAP additive.

Figure 105:
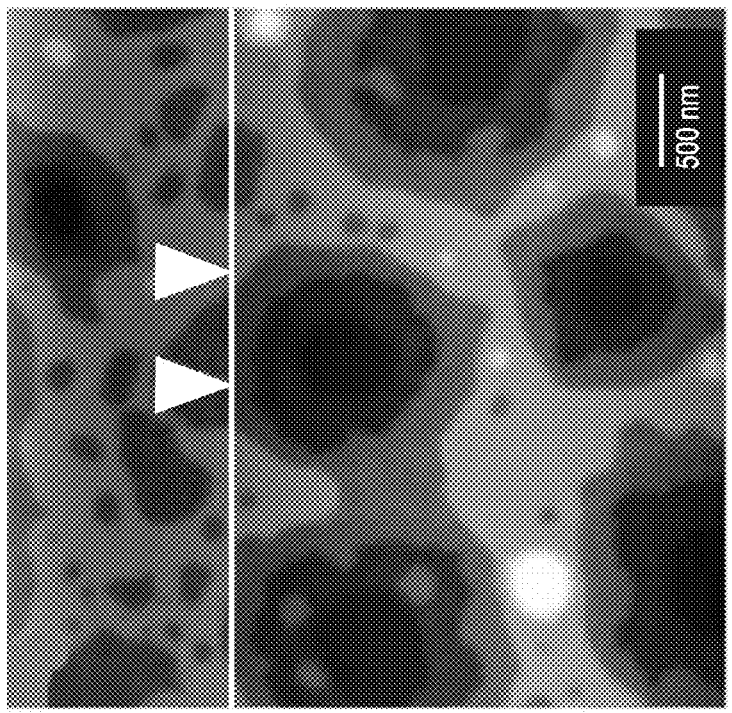
FIGS. 104-105 are AFM height images of the self-assembled block copolymer film Examples 214-215, respectively.
Figure 104:
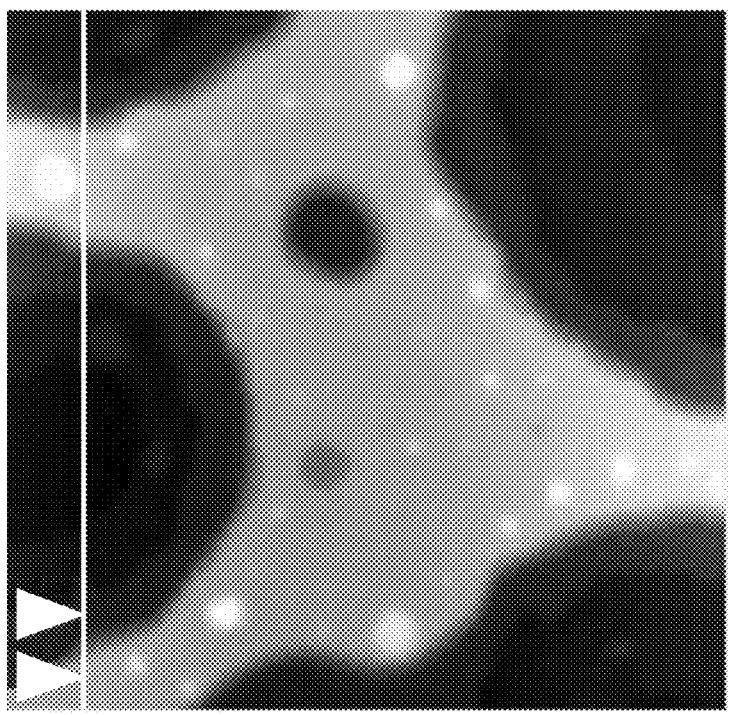

Diblock copolymer DBP1 of Example 1 (0.01 g) was dissolved in PGMEA (0.823 g) to form a 1.2 wt % solution based on total dry solids. The solutions were passed through a 0.2 micrometer polytetrafluoroethylene (PTFE) filter. The solution was spin coated on the underlayer (UL-15) coated substrate of Example 213 to form two samples at two different spin rates (2000 rpm and 3000 rpm). After forming the thin films, the coated wafers were baked at the desired time and temperatures and immediately cooled to room temperature. The block copolymer films were characterized by atomic force microscopy (AFM) using a Digital Instruments 3100 AFM with a 1 N/m spring constant silicon nitride cantilever operated in a tapping mode. Scan size and speed were set at 2 micrometer×2 micrometer area and 1 Hz respectively. Table 16 summarizes the diblock copolymer thin film self-assembly on UL-15 and the obtained morphologies. FIGS. 104-105 are AFM height images of Examples 214-215, respectively. Each of the self-assembled layers showed island/hole morphology, demonstrating an underlayer prepared with an SAP additive (SAP6-40) was non-neutral to DBP1

TABLE 16

| | | | | Annealing Conditions | | | | |
|---|---|---|---|---|---|---|---|---|
| Example | UL Name | Block Copolymer | Block Copolymer Conc. (wt %) | Spin Speed RPM | Spin time Sec | Annealing Temp ° C. | Annealing Time (min) | Thin Film Morphology |
| 214 | UL-15 | Example 1 | 1.2 | 2000 | 30 | 140 | 5 | I/H |
| 215 | UL-15 | Example 1 | 1.2 | 3000 | 30 | 140 | 5 | I/H |

Example 216

GISAXS characterization of thin film of Example 102.

Figure 106A:
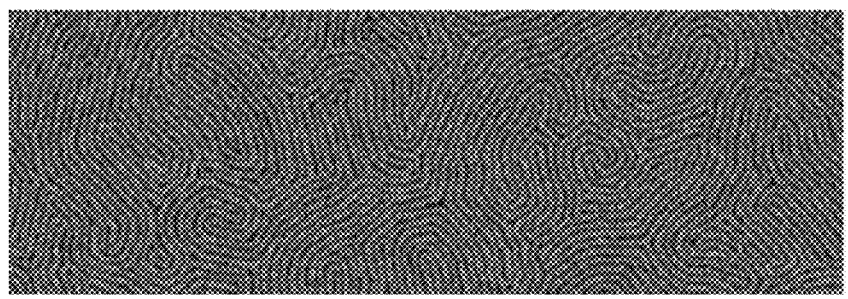
FIGS. 106A and 106B are top-down and cross-section SEM images, respectively, of the self-assembled block copolymer film of Example 102.
Figure 106B:
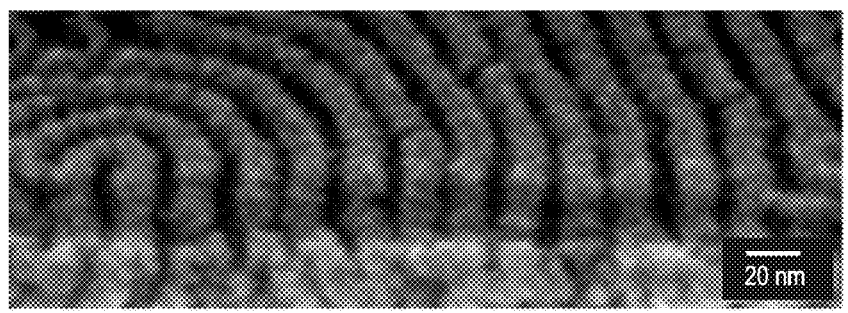
Figure 106C:
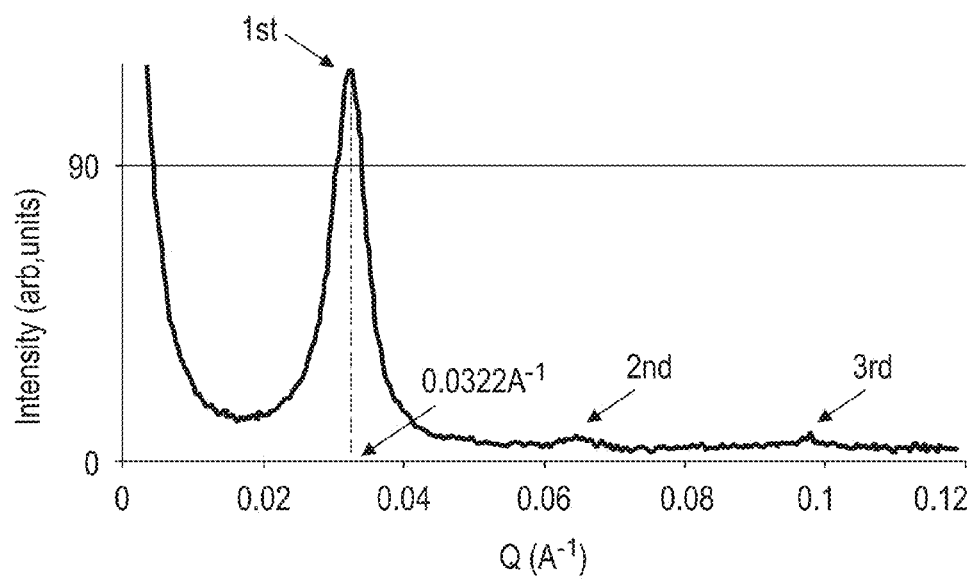
FIG. 106C is a graph of the background-corrected integrated scattering intensity above the Yoneda band plotted in Fourier space, obtained in Example 216 by GISAXS (Grazing incidence small angle X ray Scattering) analysis of the self-assembled block copolymer film of Example 102.

GISAXS (Grazing incidence small angle X ray Scattering) was used to confirm the orientation of the thin film of Example 102 over a large area (50 micrometers×millimeters). The sample was placed perpendicular to the detector during measurement. The background-corrected integrated scattering intensity above the Yoneda band was plotted in the Fourier space (FIG. 106C, graph). FIG. 106A and FIG. 106B show the corresponding SEM images of the sample, top-down and cross-section respectively. A sharp first order scattering peak and a weaker second and third order peak could be observed in the inverse space ratio of 1:2:3, which is characteristic of vertically oriented lamellar nanostructures. This indicates that self-assembly does not form a layer of additive at the air interface, and the lamellar domains are in contact with the air interface. The first order scattering peak, which occurs at a value of 0.03223 Å$^{-1}$, corresponded to a dominant spacing of 19.5 nm.

Example 217

Synthesis of PTMC homopolymer.

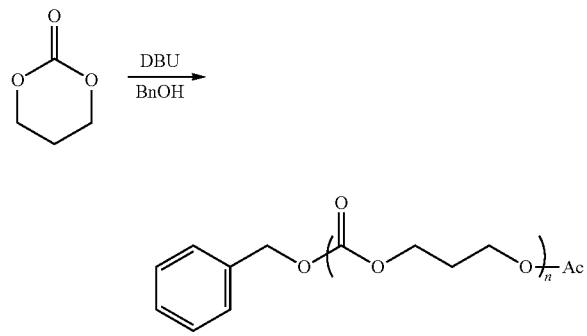

To an oven dried 4 ml glass vial equipped with a magnetic stir bar, as-purchased TMC (1.0 g, 9.8 mmol), benzyl alcohol (BnOH, 10 mg, 0.092 mmol), and DCM (2.4 ml) were added. The reaction mixture was stirred until TMC was completely dissolved in DCM, upon which DBU (22 mg, 0.147 mmol) was added. The reaction mixture was stirred at room temperature for 4 hours in a glove box. The reaction was stopped by bringing the reaction vial out of the glove box and by adding acetyl chloride (30 mg, 0.384 mmol) and further stirring the reaction mixture for 45 minutes at room temperature. The polymer was precipitated in cold methanol (0° C.). Methanol was decanted and the polymer was dried in a vacuum oven at room temperature. The dried polymer was further purified by dissolving in THF and reprecipitating in cold methanol (0° C.). Methanol was decanted and the polymer was dried in a vacuum oven at room temperature to obtain the final product. Mn=15.0 k, Mw=16.1 k, PDI=1.08, n=147.

Example 218-226

Thin film preparation of PS homopolymer, PTMC homopolymer and BCP+SAP for AFM/Adhesion test samples.

A) Underlayer UL-16 preparation using random poly (styrene-r-methyl methacrylate-r-glycidyl methacrylate) copolymer (PS-PMMA-GMA, 58/40/2 molar ratio). Random copolymer PS-PMMA-GMA (0.095 g) and p-NBT (0.005 g) were dissolved in PGMEA (9.90 g) to form a 1.0 wt % solution based on total dry solids. p-NBT is a thermal acid generator and was added to promote the grafting and partial crosslinking of the random graft copolymer on a silicon wafer. The solution was passed through a 0.2 micrometer polytetrafluoroethylene (PTFE) filter prior to spin coating the solution at 3000 rpm spin rate. After forming the thin film, the coated wafer was baked at 215° C. for 2 minutes and cooled to room temperature. The underlayer was then given a solvent rinse by casting PGMEA on top of the coated wafer, letting the solvent puddle for 30 seconds, and spin drying the treated wafer at 2000 rpm for 30 seconds. The rinse was intended to remove any excess random graft copolymer that was not crosslinked or grafted to the wafer surface. The final film thickness of the underlayer was 7 nm after the solvent rinse.

B) Thin film preparation of polystyrene homopolymer (PS), poly(trimethylene carbonate) homopolymer (PTMC) and BCP+SAP. Thin films of poly(styrene) homopolymer (Mw=5000 Da, Polymer Source), diblock copolymer DBP1 (Example 1), and SAP6-40 (Example 31) were prepared on underlayer UL-16. A thin film of poly(trimethylene carbonate (PTMC, Example 217, Mn 15000) was prepared on a silicon wafer. The processing conditions were summarized in Table 17.

TABLE 17

| Example | Homopolymer | BCP | SAP | SAP loading (%) | Coating conditions | | | Annealing conditions | |
| | | | | | Solution concentration (%) | Spin rate (rpm) | Spin time (sec) | Temp (° C.) | Time (min) |
| --- | --- | --- | --- | --- | --- | --- | --- | --- | --- |
| 218 | PS (5k) | — | — | — | 1.2 | 2000 | 30 | 90 | 1.5 |
| 219 | PS (5k) | — | — | — | 6 | 2000 | 50 | 90 | 1.5 |
| 220 | — | DBP1 | — | — | 1.2 | 2000 | 30 | 140 | 5 |
| 221 | — | DBP1 | SAP6-40 | 2.5 | 1.2 | 2000 | 30 | 140 | 5 |
| 222 | — | DBP1 | SAP6-40 | 3.5 | 1.2 | 2000 | 30 | 140 | 5 |
| 223 | — | DBP1 | SAP6-40 | 5 | 1.2 | 2000 | 30 | 140 | 5 |
| 224 | — | — | SAP6-40 | — | 1.2 | 2000 | 30 | 140 | 5 |
| 225 | PTMC (15k) | — | . | — | 10 | 2000 | 30 | 120 | 1.5 |
| 226 | PTMC (15k) | — | SAP6-40 | 3.5 | 10 | 2000 | 30 | 120 | 1.5 |

The prepared thin films were then characterized by AFM. The AFM characterization was performed with a Digital Instruments 3100 AFM with a 3.8211 N/m spring constant silicon nitride cantilever operated in a tapping mode. The characterization results are summarized in Table 18.

TABLE 18

| Example | Morphology | Wetting of BCP domains | | Adhesion (mV) | |
| --- | --- | --- | --- | --- | --- |
| | | UL-BCP | Air-BCP | PS | PTMC + SAP |
| 218 | Flat-one phase | — | — | 5.44 (2.38) | — |
| 219 | Flat-one phase | — | — | 5.48 (2.56) | — |
| 220 | 1Lo Island | PS | PS | 5.69 (2.38) | — |
| 221 | 0.5Lo Island-holes | PS | PS, PTMC + SAP | 5.01 (2.01) | 9.01 (2.75) |
| 222 | 0.5Lo Island-holes | PS | PS, PTMC + SAP | 5.43 (2.01) | 9.43 (2.93) |
| 223 | 0.5Lo Island-holes | PS | PS, PTMC + SAP | 5.36 (2.01) | 9.51 (2.93) |
| 224 | Flat-one phase | — | — | 4.65 (2.56) | — |
| 225 | Flat-one phase | — | — | — | 13 (2.75) |
| 226 | Flat-one phase | — | — | — | 11.6 (2.75) |

The adhesion values of the thin films of Examples 221, 222, and 223 (for DBP1+SAP6-40) were similar to Examples 218 and 219 (for PS homopolymer). PTMC has high adhesion to the tip while PS has relatively low adhesion to the tip. SAP has lowest adhesion response to the tip. PS domain without SAP and with various amount of SAP additive give similar adhesion response, suggesting that the SAP additive does not enrich the top surface of the PS domain of self-assembled DBP1, but rather the top surface of the PTMC domain. The significant decrease in the adhesion values of Example 226 (PTMC+SAP) and Examples 221, 222, and 223 (block copolymer DBP1+SAP) compared to the value of the pure PTMC homopolymer of Example 225 further supports the hypothesis that the SAP selectively enriches the top surface of the PTMC domain.

Example 227-232

SIMS characterization of BCP+SAP thin films.

The following general procedure was used to prepare thin films of formulated block copolymers on UL-2 substrates. Block copolymer DBP1 (0.01 g, Example 1) was dissolved in PGMEA (0.823 g) to form a 1.2 wt % solution based on total dry solids. The solutions were passed through a 0.2 micrometer polytetrafluoroethylene (PTFE) filter. A separate stock solution of 1.2 wt % SAP additives of Examples 26, 31, and 33 were prepared in PGMEA and passed through a 0.2 micrometer PTFE filter. Desired amount of this stock solution was added to the block copolymer solutions made above and the mixture was stirred well to form a homogenous solution prior to spin coating the formulated block copolymer solution on the UL-2 coated substrates at 2000 rpm for 30 seconds. After forming a thin film, the coated wafer was baked at 140° C. for 5 minutes and immediately cooled to room temperature.

SIMS (Secondary Ion Mass Spectroscopy) analysis was performed to obtain the Fluorine (F) depth profile in the BCP+SAP thin films listed in Table 19.

TABLE 19

| | | | | Coating conditions | | | | Annealing conditions | |
| --- | --- | --- | --- | --- | --- | --- | --- | --- | --- |
| | | | | SAP) | Solution | | | | |
| Example | BCP | SAP Example | SAP Name | loading (%) | concentration (%) | Spin rate (rpm) | Spin time (sec) | Temp (° C.) | Time (min) |
| 227 | DBP1 | 26 | SAP1 | 3 | 1.2 | 2000 | 30 | 140 | 5 |
| 228 | DBP1 | 26 | SAP1 | 5 | 1.2 | 2000 | 30 | 140 | 5 |
| 229 | DBP1 | 31 | SAP6-40 | 3 | 1.2 | 2000 | 30 | 140 | 5 |
| 230 | DBP1 | 31 | SAP6-40 | 5 | 1.2 | 2000 | 30 | 140 | 5 |
| 231 | DBP1 | 33 | SAP6-80 | 3 | 1.2 | 2000 | 30 | 140 | 5 |
| 232 | DBP1 | 33 | SAP6-80 | 5 | 1.2 | 2000 | 30 | 140 | 5 |

Secondary Ion Mass Spectrometry (SIMS) analysis of fluorine through the polymer film suggests that both SAP1 and SAP6 series participate in the self-assembly. The fluorine curve (F curve) indicates that the SAP6 series additives have higher partition near the polymer-air interface compared to SAP1. Also, higher partition of SAP6-80 compared to SAP6-40 indicates SAPs having different distribution profiles in a block copolymer domain can be designed by varying the ratios of F-containing moieties. FIGS. 107-112 are plots of the sputtering data for Examples 227, 229, 231, 228, 230, and 232, respectively.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A composition, comprising:
   i) a solvent;
   ii) a block copolymer comprising:
      a) a first block comprising a repeat unit of formula (B-1):

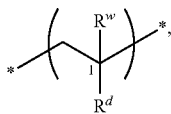
(B-1)

wherein I) $R^w$ is a monovalent radical selected from the group consisting of H, methyl, ethyl, and trifluoromethyl (*—$CF_3$) and II) $R^d$ is a monovalent radical comprising an aromatic ring linked to carbon 1, and
      b) an aliphatic polycarbonate second block (polycarbonate block) linked to the first block; and
   iii) a surface active polymer (SAP) comprising a fluoroalcohol repeat unit (HFA repeat unit), the HFA repeat unit comprising at least one hexafluoroisopropyl alcohol group (HFA group), the HFA group having a structure

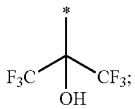

wherein the block copolymer and the SAP are dissolved in the solvent.

2. The composition of claim 1, wherein the composition is suitable for forming a layer for self-assembly (SA layer) disposed on an underlayer of a substrate, wherein
   the SA layer comprises the block copolymer and the SAP in non-covalent association,
   the SA layer has a top surface in contact with an atmosphere,
   the underlayer is neutral wetting to the block copolymer,
   the block copolymer of the SA layer is capable of self-assembly to form a phase separated domain pattern having a characteristic pitch Lo,
   the domain pattern comprises alternating domains comprising respective chemically distinct blocks of the block copolymer,
   each of the domains has contact with the underlayer and the atmosphere, and
   a domain comprising the polycarbonate block (polycarbonate domain) has a higher concentration of the SAP compared to a domain comprising the first block of the block copolymer.

3. The composition of claim 2, wherein the polycarbonate domain has lower surface energy compared to an otherwise identical polycarbonate domain lacking the SAP.

4. The composition of claim 2, wherein the domain pattern comprises lamellar domains, and each of the lamellar domains has a perpendicular orientation to the underlayer.

5. The composition of claim 2, wherein the domain pattern comprises cylindrical domains, and each of the cylindrical domains has a central axis oriented perpendicular to the underlayer.

6. The composition of claim 1, wherein the SAP is a homopolymer of the HFA repeat unit.

7. The composition of claim 1, wherein the HFA repeat unit is selected from the group consisting of:

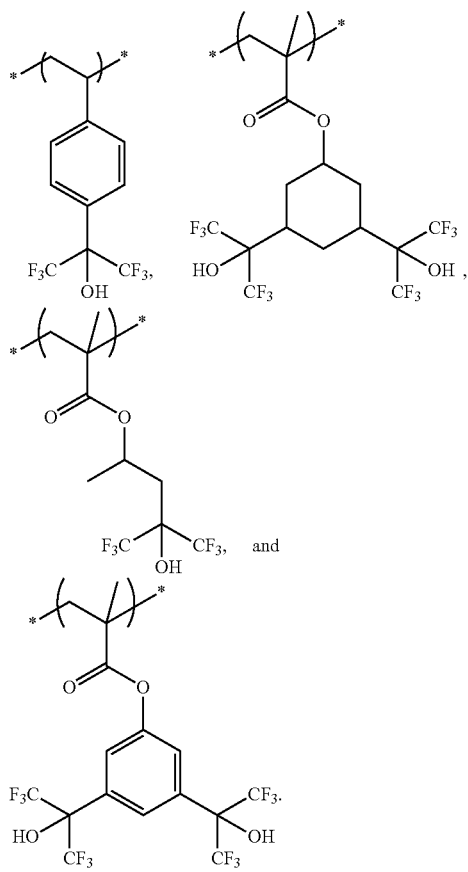

and

8. The composition of claim 1, wherein the SAP is a random copolymer comprising the HFA repeat unit.

9. The composition of claim 8, wherein the random copolymer comprises a diluent repeat unit selected from the group consisting of

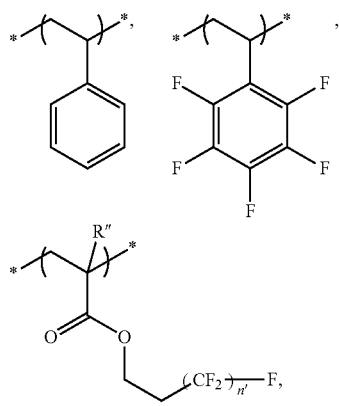

-continued

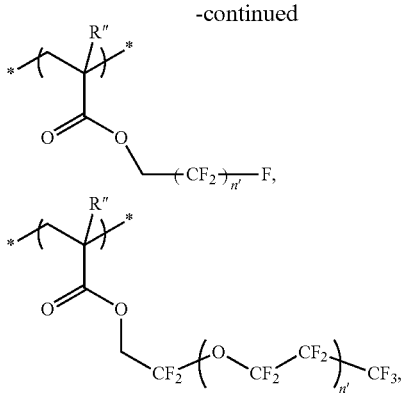

and combinations thereof, wherein each R" is independently selected from the group consisting of *—H, *-Me, *-Et, and *—$CF_3$, and each n' is an independent integer of 1 to 12.

10. The composition of claim 1, wherein the polycarbonate block of the block copolymer comprises a trimethylene carbonate repeat unit of structure:

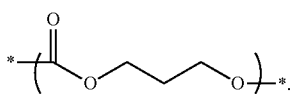

11. The composition of claim 10, wherein the polycarbonate block of the block copolymer is a homopolymer of the trimethylene carbonate repeat unit.

12. The composition of claim 1, wherein the first block of the block copolymer comprises repeat units of structure:

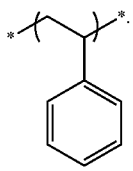

13. The composition of claim 1, wherein the first block of the block copolymer is poly(styrene) (PS) and the second block of the block copolymer is poly(trimethylene carbonate) (PTMC).

14. The composition of claim 1, wherein the block copolymer is a triblock copolymer.

15. The composition of claim 14, wherein the triblock copolymer comprises a divalent central poly(styrene) (PS) block linked at each end to two poly(trimethylene carbonate) (PTMC) blocks.

16. The composition of claim 1, wherein the composition comprises the SAP in an amount of more than 0 wt %, and up to about 10 wt % based on a total dry solids weight of the composition.

17. The composition of claim 1, wherein the composition comprises the SAP in an amount of 0.1 wt % to about 5 wt % based on total dry solids of the composition.

18. A method, comprising:
providing a first layered structure comprising a top layer (underlayer);
disposing the composition of claim 1 on the underlayer and removing any solvent, thereby forming a second layered structure comprising a film layer disposed on the underlayer, wherein the film layer comprises the block copolymer and the SAP in non-covalent association, and the film layer has a top surface in contact with an atmosphere, and wherein the block copolymer of the film layer comprises a) a first block comprising a repeat unit of formula (B-1):

wherein I) $R^w$ is a monovalent radical selected from the group consisting of H, methyl, ethyl, and trifluoromethyl (*—$CF_3$) and II) $R^d$ is a monovalent radical comprising an aromatic ring linked to carbon 1, and b) an aliphatic polycarbonate second block (polycarbonate block) linked to the first block, and the SAP of the film layer comprises a fluoro-alcohol repeat unit (HFA repeat unit), the HFA repeat unit comprising at least one hexafluoroisopropyl alcohol group (HFA group), the HFA group having a structure

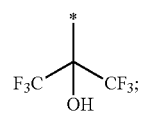

and
allowing or inducing the block copolymer of the film layer to self-assemble, thereby forming a third layered structure comprising a phase separated domain pattern having a characteristic pitch Lo, the domain pattern comprising alternating domains comprising respective chemically distinct blocks of the block copolymer;
wherein
each of the domains has contact with the underlayer and the atmosphere, and
a domain comprising the polycarbonate block has a higher concentration of the SAP compared to a domain comprising the first block of the block copolymer.

19. The method of claim 18, comprising selectively etching one of the domains, thereby forming a fourth layered structure comprising an etched domain pattern comprising one or more remaining domains.

20. The method of claim 18, comprising transferring the etched domain pattern to the substrate using a wet and/or dry etch process.

21. The method of claim 18, wherein the domain pattern is a lamellar domain pattern, and lamellae of each of the domains are oriented perpendicular to a main plane of the underlayer.

22. The method of claim 18, wherein the domain pattern is a cylindrical domain pattern comprising cylindrical domains having a central axis oriented perpendicular to a main plane of the underlayer.

23. The method of claim 18, wherein the underlayer comprises a random copolymer comprising:

a first repeat of structure:

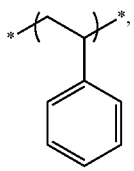

and
a second repeat unit of structure

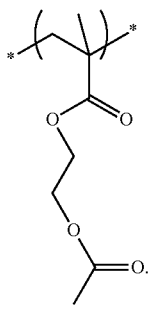

24. The method of claim 18, wherein the underlayer comprises a random copolymer comprising:
a first repeat of structure:

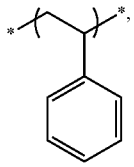

and
a second repeat unit of structure

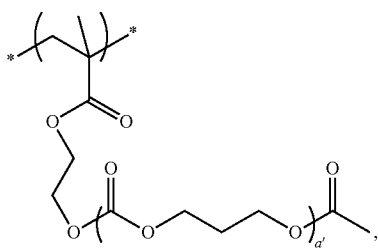

wherein a' has a value greater than or equal to 1.

25. The method of claim 18, wherein baking the film layer at a temperature of about 80° C. to about 220° C. for a period of time induces the block copolymer to self-assemble.

26. The method of claim 18, wherein a domain comprising the first block of the block copolymer has a top surface in contact with the atmosphere and the top surface is essentially free of the SAP.

27. The method of claim 18, wherein the method comprises forming a topographic resist pattern disposed on the underlayer before said disposing the composition of claim 1, wherein the film layer comprising the block copolymer for self-assembly is substantially confined to recessed regions of the topographic resist pattern.

28. A method, comprising:
providing a first layered structure comprising a top layer (underlayer);
forming a topographical resist pattern disposed on the underlayer, the resist pattern comprising features having recessed regions, the recessed regions having a bottom surface which is a portion of a surface of the underlayer;
disposing the composition of claim 1 substantially in the recessed regions of the resist pattern and removing any solvent, thereby forming a second layered structure comprising a film layer, the film layer comprising the block copolymer and the SAP, wherein the film layer is in contact with the bottom surface, the bottom surface is neutral wetting to the block copolymer of the film layer, and the film layer has a top surface in contact with an atmosphere, and wherein the block copolymer of the film layer comprises a) a first block comprising a repeat unit of formula (B-1):

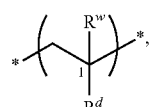

(B-1)

wherein I) $R^w$ is a monovalent radical selected from the group consisting of H, methyl, ethyl, and trifluoromethyl (*—$CF_3$) and II) $R^d$ is a monovalent radical comprising an aromatic ring linked to carbon 1, and b) an aliphatic polycarbonate second block (polycarbonate block) linked to the first block, and the SAP of the film layer comprises a fluoro-alcohol repeat unit (HFA repeat unit), the HFA repeat unit comprising at least one hexafluoroisopropyl alcohol group (HFA group), the HFA group having a structure

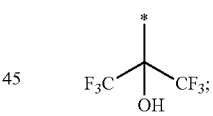

and
allowing or inducing the block copolymer of the film layer to self-assemble, thereby forming a third layered structure comprising a pattern of phase separated domains (domain pattern) of the block copolymer in the recessed regions, wherein each of the domains is in contact with the bottom surface and the atmosphere, and each of domains is oriented perpendicular to a main plane of the underlayer.

29. The method of claim 28, wherein the method further comprises selectively removing the resist pattern and/or one of the domains, thereby forming a fourth layered structure comprising an etched domain pattern, the etched domain pattern comprising one or more remaining domains.

30. The method of claim 28, wherein the resist pattern is formed using a negative tone resist.

* * * * *